United States Patent
Tamaki et al.

(10) Patent No.: US 8,575,707 B2
(45) Date of Patent: Nov. 5, 2013

(54) SEMICONDUCTOR POWER DEVICE HAVING A SUPER-JUNCTION STRUCTURE

(75) Inventors: Tomohiro Tamaki, Kanagawa (JP); Yoshito Nakazawa, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/337,647

(22) Filed: Dec. 27, 2011

(65) Prior Publication Data

US 2012/0161231 A1     Jun. 28, 2012

(30) Foreign Application Priority Data

Dec. 28, 2010   (JP) .................................. 2010-292119

(51) Int. Cl.
*H01L 27/088*        (2006.01)

(52) U.S. Cl.
USPC ........... 257/401; 257/341; 257/288; 438/197; 438/279

(58) Field of Classification Search
USPC ................... 257/E51.005, E27.099, E29.565, 257/E29.255, E23.079, E29.256, 288, 287, 257/292, 134, 205, 206, 350, 401, 135, 691, 257/492, 493, 409, 902, 903, 341, 342, 339, 257/335, 365, 559; 438/FOR. 163, 438/FOR. 190, FOR. 189, FOR. 194, 438/FOR. 424, 186, 197, 279, 309, 337, 478
See application file for complete search history.

(56) References Cited

U.S. PATENT DOCUMENTS

| | | |
|---|---|---|
| 4,691,224 A | 9/1987 | Takada |
| 5,804,864 A | 9/1998 | Akiyama |
| 5,804,868 A | 9/1998 | Kobayashi et al. |
| 6,844,592 B2 | 1/2005 | Yamaguchi et al. |
| 2002/0074596 A1 | 6/2002 | Suzuki et al. |
| 2003/0222327 A1 | 12/2003 | Yamaguchi et al. |
| 2004/0238884 A1 | 12/2004 | Tanaka et al. |
| 2005/0048701 A1 | 3/2005 | Minato et al. |
| 2005/0098826 A1 | 5/2005 | Yamaguchi et al. |
| 2006/0043478 A1 | 3/2006 | Yamaguchi et al. |
| 2006/0216896 A1 | 9/2006 | Saito et al. |
| 2007/0080422 A1 | 4/2007 | Falck et al. |

(Continued)

FOREIGN PATENT DOCUMENTS

| | | |
|---|---|---|
| JP | 59-76466 A | 1/1984 |
| JP | 6-97469 A | 4/1994 |
| JP | 2007-116190 A | 5/2007 |

OTHER PUBLICATIONS

T. Trajkovic et al. "The effect of static and dynamic parasitic charge in the termination area of high voltage devices and possible solutions", pp. 263-266, ISPSD' 2000, May 22-25, Toulouse, France.

*Primary Examiner* — Thanh Y Tran
(74) *Attorney, Agent, or Firm* — Miles & Stockbridge P.C.

(57) ABSTRACT

In a semiconductor power device such as a power MOSFET having a super-junction structure in each of an active cell region and a chip peripheral region, an outer end of a surface region of a second conductivity type coupled to a main junction of the second conductivity type in a surface of a drift region of a first conductivity type and having a concentration lower than that of the main junction is located in a middle region between an outer end of the main junction and an outer end of the super-junction structure in the chip peripheral region.

19 Claims, 108 Drawing Sheets

(56) References Cited

U.S. PATENT DOCUMENTS

| | | |
|---|---|---|
| 2007/0176244 A1 | 8/2007 | Yoshikawa |
| 2007/0290267 A1 | 12/2007 | Yoshikawa et al. |
| 2009/0079002 A1 | 3/2009 | Lee et al. |
| 2009/0085146 A1 | 4/2009 | Aoki |
| 2009/0236697 A1 | 9/2009 | Ono et al. |
| 2010/0032791 A1 | 2/2010 | Hozumi et al. |
| 2011/0115033 A1* | 5/2011 | Tamaki et al. ............... 257/409 |

* cited by examiner

SEMICONDUCTOR POWER DEVICE HAVING A SUPER-JUNCTION STRUCTURE

CROSS-REFERENCE TO RELATED APPLICATIONS

The disclosure of Japanese Patent Application No. 2010-292119 filed on Dec. 28, 2010 including the specification, drawings and abstract is incorporated herein by reference in its entirety.

BACKGROUND

The present invention relates to a technology which is effective when applied to a cell peripheral layout technique or a breakdown voltage enhancement technique in a semiconductor device (or a semiconductor integrated circuit device).

Japanese Unexamined Patent Publication No. 2007-116190 (Patent Document 1) or US Patent Publication No. 2005-098826 (Patent Document 2) corresponding thereto discloses various structures in regard to peripheral layout around a cell region in a power MOSFET (Metal Oxide Semiconductor Field Effect Transistor) having a Super-Junction structure manufactured by a Multi-Epitaxial method or a Trench insulating film filling method (in-trench ion implantation method). Examples of the structures include a P–Resurf region, a ring-like peripheral P-type drift region formed by an in-trench ion implantation, a vertically arranged linear peripheral P-type drift region and a divided and vertically/parallely arranged linear peripheral P-type drift region each formed by a trench insulating film filling method, and the like.

Japanese Unexamined Patent Publication No. Sho 59 (1984)-76466 (Patent Document 3) or U.S. Pat. No. 4,691,224 (Patent Document 4) corresponding thereto discloses a technique which arranges a plurality of Field Limiting Rings around a main junction in a silicon-based Planar semiconductor device and provides a Field Plate in the form of an insulating film coupled to the field limiting rings and inwardly extending toward the main junction of an active region, thereby improving a breakdown voltage.

Japanese Unexamined Patent Publication No. Hei 6 (1994)-97469 (Patent Document 5) or U.S. Pat. No. 5,804,868 (Patent Document 6) corresponding thereto discloses a technique which places field plates brought into a floating state, i.e., Floating Field Plates over, e.g., an insulating film around boundary regions between the main junction of an active region and field limiting rings in an IGBT (Insulated Gate Bipolar Transistor) so as to prevent the IGBT from being affected by external charge.

A paper written by Trajkovic and three others (Non-Patent Document 1) discloses a technique which provides the both ends of each of $P^+$-type field limiting rings with a shallow low-concentration P-type region (on the active region side) and a shallow low-concentration N-type region (on the chip-edge side) in a Termination area of a power MOSFET (Power Metal Oxide Semiconductor Field Effect Transistor), thereby preventing a reduction in breakdown voltage due to external charge.

RELATED ART DOCUMENTS

Patent Documents

[Patent Document 1]
Japanese Unexamined Patent Publication No. 2007-116190
[Patent Document 2]
US Patent Publication No. 2005-098826
[Patent Document 3]
Japanese Unexamined Patent Publication No. Sho 59 (1984)-76466
[Patent Document 4]
U.S. Pat. No. 4,691,224
[Patent Document 5]
Japanese Unexamined Patent Publication No. Hei 6 (1994)-97469
[Patent Document 6]
U.S. Pat. No. 5,804,868

Non-Patent Document

[Non-Patent Document 1]
T. Trajkovic and three others, "The effect of static and dynamic parasitic charge in the termination area of high voltage devices and possible solutions", pages 263-266, ISPSD' 2000, May 22-25, Toulouse, France.

SUMMARY

In regard to a drift region in a power MOSFET or the like, it has been an important task to avoid restrictions imposed by a related-art Silicon Limit and develop a high-breakdown-voltage FET having a low ON-resistance or the like. To achieve the task, various methods have been developed which introduce a super-junction structure alternately having relatively-high-concentration Slab-like N-type columns and P-type columns into the drift region. The methods which introduce the super-junction structure are roughly divided into three types of methods, i.e., the multi-epitaxial method, the trench insulating film filling method, and a trench fill method (trench filling method or trench epitaxial filling method). Among them, the multi-epitaxial method in which epitaxial growth and ion implantation are repeated multiple times has high process and design flexibility and accordingly complicated process steps, resulting in high cost. In the trench insulating film filling method, after oblique ion implantation into trenches is performed, the trenches are filled with a CVD (Chemical Vapor Deposition) insulating film. The trench insulating film filling method is simpler in terms of process, but is disadvantageous in terms of area due to the area of the trenches.

By contrast, the trench fill method has relatively low process and design flexibility due to constraints on growth conditions for filling epitaxial growth, but has the advantage of simple process steps. In view of this, the present inventors have studied problems associated with a device structure and mass production of a power MOSFET or the like in relation to a high breakdown voltage and a low ON-resistance to be achieved by the trench fill method or the like and found the following problem. That is, in the super-junction structure, the concentration of a main body cell portion (active region) is relatively high, and therefore it is difficult to ensure a breakdown voltage equal to or higher than that of the cell portion for a peripheral portion (peripheral region or junction termination area) using a related-art edge termination structure (Junction Edge Termination Structure) or a related-art Resurf (Reduced Surface Field) Structure. Specifically, the problem is such that, in an outer peripheral corner portion of a chip, due to electric field concentration, variations in breakdown voltage become sensitive to charge unbalance in the super-junction structure.

The present invention has been achieved in order to solve such a problem.

An object of the present invention is to provide a semiconductor device such as a solid-state active element having a high breakdown voltage and a low ON-resistance.

The above and other objects and novel features of the present invention will become apparent from a statement in the present specification and the accompanying drawings.

The following is a brief description of the outline of a representative embodiment of the invention disclosed in the present application.

That is, according to an aspect of the present invention, in a semiconductor power device such as a power MOSFET having a super-junction structure in each of an active cell region and a chip peripheral region, an outer end of a surface resurf region of a second conductivity type coupled to a main junction (impurity region surrounding the active cell region and integrated with a channel region) of the second conductivity type in a surface of a drift region of a first conductivity type and having a concentration lower than that of the main junction is located in a middle region between an outer end of the main junction and an outer end of the super-junction structure in the chip peripheral region.

The following is a brief description of an effect obtained according to the representative embodiment of the invention disclosed in the present application.

That is, in a semiconductor power device such as a power MOSFET having a super-junction structure in each of an active cell region and a chip peripheral region, an outer end of a surface resurf region of a second conductivity type coupled to a main junction (impurity region surrounding the active cell region and integrated with a channel region) of the second conductivity type in a surface of a drift region of a first conductivity type and having a concentration lower than that of the main junction is located in a middle region between an outer end of the main junction and an outer end of the super-junction structure in the chip peripheral region to allow a position where an electric field is concentrated to be located away from the outer end of the super-junction structure.

DETAILED DESCRIPTION

Outline of Embodiments

Figure 1:
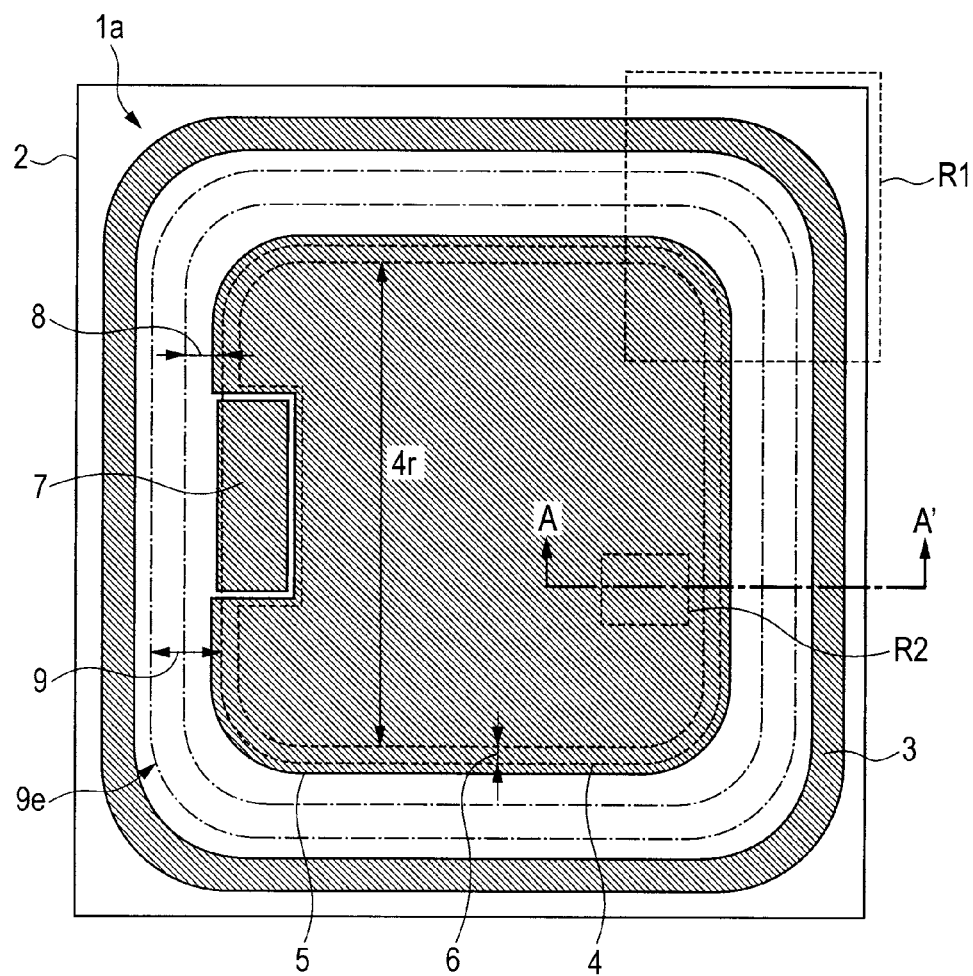
FIG. 1 is a top view of an entire chip (mainly of a surface region thereof) of a power MOSFET having a super-junction structure as an example of a semiconductor device of a first embodiment (peripheral 3D super-junction and half-range P− resurf layer) of a first part of the present invention.

First, a description will be given to the outline of representative embodiments (mainly related to a first part) of the invention disclosed in the present application.

1. A semiconductor device includes: (a) a semiconductor chip having a first main surface provided with a source electrode of a power MOSFET and a second main surface provided with a drain electrode of the power MOSFET; (b) a drift region of a first conductivity type provided in substantially the entire first main surface of the semiconductor chip; (c) a substantially rectangular active cell region provided substantially at a middle portion of the first main surface, peripheral side regions provided outside the active cell region along individual sides of the active cell region, and peripheral corner regions provided outside individual corner portions of the active cell region; (d) a first super-junction structure having a first orientation and provided in substantially the entire surface of the cell region and in the drift region; (e) second and third super-junction structures each having substantially the same width and orientation as those of the first super-junction structure and provided in the drift region of each of the peripheral side regions on both sides of the active cell region in a direction of the first orientation of the first super-junction structure so as to be coupled to the first super-junction structure; (f) fourth and fifth super-junction structures each having an orientation substantially orthogonal to that of the first super-junction structure and provided in the drift region of each of the peripheral side regions on both sides of the active cell region in a direction orthogonal to the first orientation of the first super-junction structure; (g) a main junction region of a second conductivity type which is an outer end portion of the active cell region and provided in a surface of the drift region so as to surround the active cell region; and (h) a surface resurf region of the second conductivity type provided in the surface of the drift region so as to be coupled to an outer end of the main junction region and surround the main junction region. In the semiconductor device, an outer end of the surface resurf region is located in a middle region between the outer end of the main junction region and an outer end of a peripheral super-junction region formed of the second to fifth super-junction structures.

2. In the semiconductor device according to article 1, the outer end of the surface resurf region is located substantially at a middle between the outer end of the main junction region and the outer end of the peripheral super-junction region formed of the second to fifth super-junction structures.

3. In the semiconductor device according to article 1 or 2, the first to fifth super-junction structures are formed by a trench epitaxial filling method.

4. In the semiconductor device according to any one of articles 1 to 3, over the peripheral super-junction region formed of the second to fifth super-junction structures, a plurality of floating field plates circularly extending over the region are provided.

5. In the semiconductor device according to article 4, each of the floating field plates shows a rectangular frame shape having corner portions each bent at a right angle.

6. In the semiconductor device according to article 4, each of the floating field plates shows a rectangular frame shape having corner portions each roundly curved.

7. In the semiconductor device according to any one of articles 1 to 6, each of the peripheral corner regions is provided with a corner-portion super-junction structure which is substantially line-symmetrical with respect to a diagonal line of the semiconductor chip extending through the corner-portion super-junction structure, and has a portion thereof proximate to the fourth super-junction structure with respect to the diagonal line and having substantially the same width and orientation as those of the fourth super-junction structure and a portion thereof proximate to the second super-junction structure with respect to the diagonal line and having substantially the same width and orientation as those of the second super-junction structure.

8. In the semiconductor device according to any one of articles 1 to 6, each of the peripheral corner regions is provided with a corner-portion super-junction structure having substantially the same width and orientation as those of the fourth super-junction structure.

9. In the semiconductor device according to article 8, the corner-portion super-junction structure has a trimmed outer portion.

10. A semiconductor device includes: (a) a semiconductor chip having a first main surface provided with a source electrode of a power MOSFET and a second main surface provided with a drain electrode of the power MOSFET; (b) a drift region of a first conductivity type provided in substantially the entire first main surface of the semiconductor chip; (c) a substantially rectangular active cell region provided substantially at a middle portion of the first main surface, peripheral side regions provided outside the active cell region along individual sides of the active cell region, and peripheral corner regions provided outside individual corner portions of the active cell region; (d) a first super-junction structure having a first orientation and provided in substantially the entire surface of the cell region and in the drift region; (e) second and third super-junction structures each having substantially the same width and orientation as those of the first super-junction structure and provided in the drift region of each of the peripheral side regions on both sides of the active cell region in a direction of the first orientation of the first super-junction structure so as to be coupled to the first super-junction structure; (f) fourth and fifth super-junction structures each having an orientation substantially orthogonal to that of the first super-junction structure and provided in the drift region of each of the peripheral side regions on both sides of the active cell region in a direction orthogonal to the first orientation of the first super-junction structure; (g) a main junction region of a second conductivity type which is an outer end portion of the active cell region and provided in a surface of the drift region so as to surround the active cell region; (h) a surface resurf region of the second conductivity type provided in the surface of the drift region so as to be coupled to an outer end of the main junction region and surround the main junction region; and (i) a corner-portion super-junction structure provided in each of the peripheral corner regions, substantially line-symmetrical with respect to a diagonal line of the semiconductor chip extending through the corner-portion super-junction structure, and having portion thereof proximate to the fourth super-junction structure with respect to the diagonal line and having substantially the same width and orientation as those of the fourth super-junction structure and a portion thereof proximate to the second super-junction structure with respect to the diagonal line and having substantially the same width and orientation as those of the second super-junction structure.

11. In the semiconductor device according to article 10, an outer end of the surface resurf region is located in a middle region between the outer end of the main junction region and an outer end of a peripheral super-junction region formed of the second to fifth super-junction structures.

12. In the semiconductor device according to article 10 or 11, the outer end of the surface resurf region is located substantially at a middle between the outer end of the main junction region and the outer end of the peripheral super-junction region formed of the second to fifth super-junction structures.

13. In the semiconductor device according to any one of articles 10 to 12, the first to fifth super-junction structures are formed by a trench epitaxial filling method.

14. In the semiconductor device according to any one of articles 10 to 13, over the peripheral super-junction region formed of the second to fifth super-junction structures, a plurality of floating field plates circularly extending over the region are provided.

15. A semiconductor device includes: (a) a semiconductor chip having a first main surface provided with a source electrode of a power MOSFET and a second main surface provided with a drain electrode of the power MOSFET; (b) a drift region of a first conductivity type provided in substantially the entire first main surface of the semiconductor chip; (c) a substantially rectangular active cell region provided substantially at a middle portion of the first main surface, peripheral side regions provided outside the active cell region along individual sides of the active cell region, and peripheral corner regions provided outside individual corner portions of the active cell region; (d) a first super-junction structure having a first orientation and provided in substantially the entire surface of the cell region and in the drift region; (e) second and third super-junction structures each having substantially the same width and orientation as those of the first super-junction structure and provided in the drift region of each of the peripheral side regions on both sides of the active cell region in a direction of the first orientation of the first super-junction structure so as to be coupled to the first super-junction structure; (f) fourth and fifth super-junction structures each having an orientation substantially orthogonal to that of the first super-junction structure and provided in the drift region of each of the peripheral side regions on both sides of the active cell region in a direction orthogonal to the first orientation of the first super-junction structure; (g) a main junction region of a second conductivity type which is an outer end portion of the active cell region and provided in a surface of the drift region so as to surround the active cell region; (h) a surface resurf region of the second conductivity type provided in the surface of the drift region so as to be coupled to an outer end of the main junction region and surround the main junction region; and (i) a corner-portion super-junction structure provided in each of the peripheral corner regions, having substantially the same width and orientation as those of the fourth super-junction structure, and a trimmed outer portion.

16. In the semiconductor device according to article 15, an outer end of the surface resurf region is located in a middle region between the outer end of the main junction region and an outer end of a peripheral super-junction region formed of the second to fifth super-junction structures.

17. In the semiconductor device according to article 15, the outer end of the surface resurf region is located substantially at a middle between the outer end of the main junction region and the outer end of the peripheral super-junction region formed of the second to fifth super-junction structures.

18. In the semiconductor device according to any one of articles 15 to 17, the first to fifth super-junction structures are formed by a trench epitaxial filling method.

19. In the semiconductor device according to any one of articles 15 to 18, over the peripheral super-junction region formed of the second to fifth super-junction structures, a plurality of floating field plates circularly extending over the region are provided.

Next, a description will be given to the outline of other embodiments (mainly related to a second part) of the invention disclosed in the present application.

1. A semiconductor device includes: (a) a semiconductor chip having a first main surface provided with a source electrode of a power MOSFET and a second main surface provided with a drain electrode of the power MOSFET; (b) a drift region of a first conductivity type provided in substantially the entire first main surface of the semiconductor chip; (c) a substantially rectangular active cell region provided substantially at a middle portion of the first main surface, peripheral side regions provided outside the active cell region along individual sides of the active cell region, and peripheral corner regions provided outside individual corner portions of the active cell region; (d) a first super-junction structure having a first orientation and provided in substantially the entire surface of the cell region and in the drift region; (e) second and third super-junction structures each having a second orientation orthogonal to that of the first super-junction structure provided in the drift region of each of the peripheral side regions on both sides of the active cell region in a direction of the first orientation of the first super-junction structure; (f) fourth and fifth super-junction structures each having an orientation substantially the same as that of the first super-junction structure and provided in the drift region of each of the peripheral side regions on both sides of the active cell region in a direction orthogonal to the first orientation of the first super-junction structure; (g) a main junction region of a second conductivity type which is an outer end portion of the active cell region and provided in a surface of the drift region so as to surround the active cell region; (h) a plurality of floating field plates provided over the first main surface via an insulating film and outside the main junction region so as to surround the active cell region; and (i) a resin molded body covering substantially the entire first main surface of the semiconductor chip. In the semiconductor device, each of the floating field plates widthwise extends in a range covering an outer end portion of a column circular region of the second conductivity type which is proximate to the floating field plate, extending over a middle line of the column circular region of the second conductivity type, and not extending over a vicinity of an inner end thereof closer to the active cell region.

2. The semiconductor device according to article 1 further includes: (j) a surface resurf region of the second conductivity type provided in the surface of the drift region so as to be coupled to an outer end of the main junction region and surround the main junction region.

3. In the semiconductor device according to article 1 or 2, the floating field plates are provided for each of the column circular regions of the second conductivity type.

4. In the semiconductor device according to any one of articles 1 to 3, each of the floating field plates shows a rectangular frame shape having corner portions each bent at a right angle.

5. In the semiconductor device according to any one of articles 1 to 3, each of the floating field plates shows a rectangular frame shape having corner portions each roundly curved.

6. The semiconductor device according to any one of articles 1 to 5 further includes: (k) a ring region of the first conductivity type provided in the surface of the drift region and outside the main junction region so as to surround the active cell region along the inner end of the column circular region of the second conductivity type which is proximate to the ring region of the first conductivity type.

7. In the semiconductor device according to any one of articles 1 to 6, the ring region of the first conductivity type is provided for each of the column circular regions of the second conductivity type.

8. The semiconductor device according to article 7 further includes: (l) a ring region of the second conductivity type provided in the surface of the drift region and outside the main junction region so as to surround the active cell region along an outer end of the column circular region of the second conductivity type which is proximate to the ring region of the second conductivity type.

9. In the semiconductor device according to any one of articles 1 to 8, each of the peripheral corner regions is provided with a corner-portion super-junction structure having substantially the same width and orientation as those of the second super-junction structure.

10. In the semiconductor device according to any one of articles 1 to 8, the corner-portion super-junction structure has a trimmed outer portion.

11. A semiconductor device includes: (a) a semiconductor chip having a first main surface provided with a source electrode of a power MOSFET and a second main surface provided with a drain electrode of the power MOSFET; (b) a drift region of a first conductivity type provided in substantially the entire first main surface of the semiconductor chip; (c) a substantially rectangular active cell region provided substantially at a middle portion of the first main surface, peripheral side regions provided outside the active cell region along individual sides of the active cell region, and peripheral corner regions provided outside individual corner portions of the active cell region; (d) a first super-junction structure having a first orientation and provided in substantially the entire surface of the cell region and in the drift region; (e) second and third super-junction structures each having a second orientation orthogonal to that of the first super-junction structure provided in the drift region of each of the peripheral side regions on both sides of the active cell region in a direction of the first orientation of the first super-junction structure; (f) fourth and fifth super-junction structures each having an orientation substantially the same as that of the first super-junction structure and provided in the drift region of each of the peripheral side regions on both sides of the active cell region in a direction orthogonal to the first orientation of the first super-junction structure; (g) a main junction region of a second conductivity type which is an outer end portion of the active cell region and provided in a surface of the drift region so as to surround the active cell region; (h) a ring region of the first conductivity type provided in the surface of the drift region and outside the main junction region so as to surround the active cell region along an inner end of a column circular region of the second conductivity type which is proximate to the ring region of the first conductivity type; and (i) a resin molded body covering substantially the entire first main surface of the semiconductor chip.

12. In the semiconductor device according to article 11, the ring region of the first conductivity type is provided for each of the column circular regions of the second conductivity type.

13. The semiconductor device according to article 11 or 12 further includes: (j) a surface resurf region of the second conductivity type provided in the surface of the drift region so as to be coupled to an outer end of the main junction region and surround the main junction region.

14. The semiconductor device according to any one of articles 11 to 13 further includes: (k) a plurality of floating field plates provided over the first main surface via an insulating film and outside the main junction region so as to surround the active cell region 15. In the semiconductor device according to article 14, the floating field plates are provided for each of the column circular regions of the second conductivity type.

16. The semiconductor device according to any one of articles 11 to 15 further includes: (l) a ring region of the second conductivity type provided in the surface of the drift region and outside the main junction region so as to surround the active cell region along an outer end of the column circular region of the second conductivity type which is proximate to the ring region of the second conductivity type.

17. In the semiconductor device according to any one of articles 11 to 16, each of the peripheral corner regions is provided with a corner-portion super-junction structure having substantially the same width and orientation as those of the second super-junction structure.

18. In the semiconductor device according to any one of articles 11 to 16, the corner-portion super-junction structure has a trimmed outer portion.

19. In the semiconductor device according to any one of articles 11 to 18, at least one of the floating field plates has a level difference in the insulating film.

Next, a description will be given also to the outline of still other embodiments (mainly related to a third part) of the invention disclosed in the present application.

1. A semiconductor device includes: (a) a semiconductor chip having a first main surface provided with a source electrode of a power MOSFET and a second main surface provided with a drain electrode of the power MOSFET; (b) a drift region of a first conductivity type provided in substantially the entire first main surface of the semiconductor chip; (c) a substantially rectangular active cell region provided substantially at a middle portion of the first main surface, peripheral side regions provided outside the active cell region along individual sides of the active cell region, and peripheral corner, regions provided outside individual corner portions of the active cell region; (d) a first super-junction structure having a first orientation and provided in substantially the entire surface of the cell region and in the drift region; (e) second and third super-junction structures each having substantially the same width and orientation as those of the first super-junction structure and provided in the drift region of each of the peripheral side regions on both sides of the active cell region in a direction of the first orientation of the first super-junction structure so as be coupled to the first super-junction structure; (f) fourth and fifth super-junction structures each having an orientation substantially orthogonal to that of the first super-junction structure and provided in the drift region of each of the peripheral side regions on both sides of the active cell region in a direction orthogonal to the first orientation of the first super-junction structure; (g) a main junction region of a second conductivity type which is an outer end portion of the active cell region and provided in a surface of the drift region so as to surround the active cell region; and (h) a corner-portion super-junction structure provided in the drift region in each of the peripheral corner regions. In the semiconductor device, the corner-portion super-junction structure is laid out so as to maintain local charge balance.

2. The semiconductor device according to article 1 further includes: (i) a surface resurf region of the second conductivity type provided in the surface of the drift region so as to be coupled to an outer end of the main junction region and surround the main junction region.

3. In the semiconductor device according to article 2, an outer end of the surface resurf region is located in a middle region between the outer end of the main junction region and an outer end of a peripheral super-junction region formed of the second to fifth super-junction structures.

4. In the semiconductor device according to article 2, the outer end of the surface resurf region is located substantially at a middle between the outer end of the main junction region and the outer end of the peripheral super-junction region formed of the second to fifth super-junction structures.

5. In the semiconductor device according to any one of articles 1 to 4, the first to fifth super-junction structures and the corner-portion super-junction structure are formed by a trench epitaxial filling method.

6. In the semiconductor device according to any one of articles 1 to 5, over the peripheral super-junction region formed of the second to fifth super-junction structures and the corner-portion super-junction structure, a plurality of floating field plates circularly extending over the region are provided.

7. In the semiconductor device according to article 6, each of the floating field plates shows a rectangular frame shape having corner portions each bent at a right angle.

8. In the semiconductor device according to article 6, each of the floating field plates shows a rectangular frame shape having corner portions each roundly curved.

9. In the semiconductor device according to any one of articles 1 to 8, the corner-portion super-junction structure has a trimmed outer portion.

10. In the semiconductor device according to any one of articles 1 to 9, the corner-portion super-junction structure does not include a micro-column.

11. A semiconductor device includes: (a) a semiconductor chip having a first main surface provided with a source electrode of a power MOSFET and a second main surface provided with a drain electrode of the power MOSFET; (b) a drift region of a first conductivity type provided in substantially the entire first main surface of the semiconductor chip; (c) a substantially rectangular active cell region provided substantially at a middle portion of the first main surface, peripheral side regions provided outside the active cell region along individual sides of the active cell region, and peripheral corner regions provided outside individual corner portions of the active cell region; (d) a first super-junction structure having a first orientation and provided in substantially the entire surface of the cell region and in the drift region; (e) second and third super-junction structures each having a second orientation orthogonal to that of the first super-junction structure provided in the drift region of each of the peripheral side regions on both sides of the active cell region in a direction of the first orientation of the first super-junction structure; (f) fourth and fifth super-junction structures each having an orientation substantially the same as that of the first super-junction structure and provided in the drift region of each of the peripheral side regions on both sides of the active cell region in a direction orthogonal to the first orientation of the first super-junction structure; (g) a main junction region of a second conductivity type which is an outer end portion of the active cell region and provided in a surface of the drift region so as to surround the active cell region; and (h) a corner-portion super-junction structure provided in the drift region in each of the peripheral corner regions. In the semiconductor device, the corner-portion super-junction structure is laid out so as to maintain local charge balance.

12. The semiconductor device according to article 11 further includes: (i) a surface resurf region of the second conductivity type provided in the surface of the drift region so as to be coupled to an outer end of the main junction region and surround the main junction region.

13. The semiconductor device according to article 11 or 12 further includes: (j) a plurality of floating field plates provided over the first main surface via an insulating film and outside the main junction region so as to surround the active cell region; and (k) a resin molded body covering substantially the entire first main surface of the semiconductor chip.

14. In the semiconductor device according to article 13, each of the floating field plates widthwise extends in a range covering an outer end portion of a column circular region of the second conductivity type which is proximate to the floating field plate, extending over a middle line of the column circular region of the second conductivity type, and not extending over a vicinity of an inner end thereof closer to the active cell region.

15. In the semiconductor device according to article 13 or 14, the floating field plates are provided for each of the column circular regions of the second conductivity type.

16. In the semiconductor device according to any one of articles 11 to 15, the first to fifth super-junction structures and the corner-portion super-junction structure are formed by a trench epitaxial filling method.

17. In the semiconductor device according to any one of articles 13 to 16, each of the floating field plates shows a rectangular frame shape having corner portions each bent at a right angle.

18. In the semiconductor device according to any one of articles 13 to 16, each of the floating field plates shows a rectangular frame shape having corner portions each roundly curved.

19. The semiconductor device according to any one of articles 11 to 18, further includes: (l) a ring region of the first conductivity type provided in the surface of the drift region and outside the main junction region so as to surround the active cell region along an inner end of the column circular region of the second conductivity type which is proximate to the ring region of the first conductivity type.

20. In the semiconductor device according to article 19, the ring region of the first conductivity type is provided for each of the column circular regions of the second conductivity type.

21. The semiconductor device according to any one of articles 11 to 20 further includes: (m) a ring region of the second conductivity type provided in the surface of the drift region and outside the main junction region so as to surround the active cell region along the outer end of the column circular region of the second conductivity type which is proximate to the ring region of the second conductivity type.

22. In the semiconductor device according to any one of articles 11 to 21, the corner-portion super-junction structure has a trimmed outer portion.

23. In the semiconductor device according to any one of articles 11 to 22, the corner-portion super-junction structure does not include a micro-column.

Explanation of Description Form, Basic Terminology, and Use Thereof in Present Application 1. In the present application, if necessary for the sake of convenience, the description of an embodiment may be such that the embodiment is divided into a plurality of parts or sections in the description thereof. However, they are by no means independent of or distinct from each other unless particularly explicitly described otherwise, and one of the individual parts of a single example is details, variations, and so forth of part or the whole of the others. In principle, a repeated description of like parts will be omitted. Each constituent element in the embodiment is not indispensable unless particularly explicitly described otherwise, unless the constituent element is theoretically limited to a given number, or unless it is obvious from the context that the constituent element is indispensable.

Also in the present application, when a "semiconductor device" is mentioned, it primarily refers to various stand-alone transistors (active elements) or to a device in which a resistor, a capacitor, and the like are integrated around such a stand-alone transistor over a semiconductor chip or the like (e.g., a single-crystal silicon substrate). Representative examples of the various transistors that can be shown include MISFETs (Metal Insulator Semiconductor Field Effect Transistors) represented by a MOSFET (Metal Oxide Semiconductor Field Effect Transistor). Representative examples of the various stand-alone transistors that can be shown include a power MOSFET and an IGBT (Insulated Gate Bipolar Transistor).

Note that, in the present application, a "semiconductor active element" indicates a transistor, a diode, or the like.

2. Likewise, even when such wording as "X comprised of A" is used in association with a material, a composition, or the like in the description of the embodiment or the like, it does not exclude a material, a composition, or the like which contains an element other than A as one of the main constituent elements thereof unless particularly explicitly described otherwise or unless it is obvious from the context that it excludes such a material, a composition, or the like. For example, when a component is mentioned, the wording means "X containing A as a main component" or the like. It will be appreciated that, even when, e.g., a "silicon member" or the like is mentioned, it is not limited to pure silicon, and a member containing a SiGe alloy, another multi-element alloy containing silicon as a main component, another additive, or the like is also included. Likewise, it will also be appreciated that, even when a "silicon oxide film", "silicon-oxide-based insulating film", or the like is mentioned, it includes not only a relatively pure Undoped Silicon Dioxide, but also a thermal oxide film of FSG (Fluorosilicate Glass), TEOS-based silicon oxide, SiOC (Silicon Oxicarbide), Carbon-doped Silicon oxide, OSG (Organosilicate glass), PSG (Phosphorus Silicate Glass), BPSG (Borophosphosilicate Glass), or the like, a CVD oxide film, a coated silicon oxide such as SOG (Spin ON Glass) or NCS (Nano-Clustering Silica), a silica-based Low-k insulating film (porous insulating film) obtained by introducing voids into the same member as mentioned above, a composite film with another silicon-based insulating film which contains any of these mentioned above as a main constituent element thereof, and the like.

As a silicon-based insulating film commonly used in a semiconductor field along with a silicon-oxide-based insulating film, there is a silicon-nitride-based insulating film. Materials belonging to this system include SiN, SiCN, SiNH, SiCNH, and the like. Here, when "silicon nitride" is mentioned, it includes both of SiN and SiNH unless particularly explicitly described otherwise. Likewise, when "SiCN" is mentioned, it includes both of SiCN and SiCNH unless particularly explicitly described otherwise.

SiC has properties similar to those of SiN while, in most cases, SiON should rather be categorized into a silicon-oxide-based insulating film.

3. Likewise, it will also be appreciated that, although a preferred example is shown in association with a graphical figure, a position, an attribute, or the like, the graphical figure, position, attribute, or the like is not strictly limited thereto unless particularly explicitly described otherwise or unless it is obvious from the context that the graphical figure, position, attribute, or the like is strictly limited thereto.

4. Further, when a specific numerical value or numerical amount is mentioned, it may be a value more or less than the specific numerical value unless particularly explicitly described otherwise, unless the numerical value is theoretically limited to a given number, or unless it is obvious from the context that the numeral value is limited to a given number.

5. When a "wafer" is mentioned, it typically refers to a single-crystal silicon wafer over which a semiconductor device (the same as a semiconductor integrated circuit device or an electronic device) is formed, but it will be appreciated that the "wafer" also includes a composite wafer of an insulating substrate and a semiconductor layer or the like, such as an epitaxial wafer, a SOI substrate, or an LCD glass substrate.

6. In general, a super-junction structure is such that, into a semiconductor region of a given conductivity type, columnar or plate-like column regions of the opposite conductivity type have been substantially equidistantly inserted so as to maintain charge balance. In the present application, when a "super-junction structure" formed by a trench fill method is mentioned, it refers to a structure in which, into a semiconductor region of a given conductivity type, plate-like "column regions" (which typically have plate-like shapes but may also be curved or bent) of the opposite conductivity type have been substantially equidistantly inserted in principle so as to maintain charge balance. In the embodiment, a description will be given to a structure formed by equidistantly placing P-type columns in parallel in an N-type semiconductor layer (e.g., a drift region). The thicknesses Wp (of, e.g., FIG. 54) of the P-type columns in the individual portions may be different from each other depending on the locations thereof but, when the super-junction structure is manufactured by the trench fill method, the P-type columns preferably have the same thickness Wp (width). This is because, if the widths of trenches are different, a filling property differs from portion to portion.

With regard to the super-junction structure, "orientation" indicates a longitudinal direction of a P-type column or an N-type column forming the super-junction structure when the P-type or N-type column is two-dimensionally viewed (in a plane parallel with the main surface of a chip or wafer) in correspondence to the main surface of the chip.

Also, a "peripheral super-junction region" refers to a region which is a peripheral region outside an active cell region, i.e., an Edge Termination Area and in which the super-junction structure is provided.

Also, in the present application, a structure in which the degree of freedom with which a depletion layer extends in the main region of the peripheral super-junction region (except for a part thereof including corners and the like) is 3 is referred to as a "3D-Resurf structure", and a structure in which the degree of freedom is 2 is referred to as a "2D-Resurf structure".

In the present application, in regard to a Resurf (Reduced Surface Field) structure, a surface resurf region (specifically a "P⁻-type resurf region" or "Junction Termination Extension") refers to a region formed in a surface area of a drift region, coupled to an end portion of a P-type body region (P-type well region) forming a channel region, and having the same conductivity type as that of the P-type body region and an impurity concentration (concentration of a level at which the region is completely depleted when a reverse voltage is applied to a main junction) lower than that thereof. Typically, the surface resurf region is formed in a ring-like shape so as to surround a cell portion. A general Field Plate refers to a portion which is a conductor film pattern coupled to a source potential or a potential equivalent thereto, extends over the surface (device surface) of the drift region via an insulating film, and surrounds the cell portion in a ring-like configuration. On the other hand, a Floating Field Plate refers to a field plate similar to the general field plate, but is brought into a floating state.

Also, a Floating Field Ring or a Field Limiting Ring refers to an impurity region or a group of impurity regions each provided over the surface (device surface) of the drift region separately from the P-type body region (P-type well region), having the same conductivity type as that of the P-type body region and a concentration similar to that thereof (concentration of a level at which the impurity region is not completely depleted when a reverse voltage is applied to the main junction), and surrounding the cell portion in a single-ring or double-ring configuration.

Also, in the present application, the wording "maintain local charge balance" indicates that, e.g., when the chip main surface is two-dimensionally viewed, charge balance is achieved in a distance range of the order of the thickness (Wp or Wn) of the column.

Details of Embodiments

The embodiments will be described in greater detail. Hereinbelow, the details of the embodiments will be described by dividing the present invention into a plurality of parts. Unless particularly mentioned, "Sections", "Embodiments", and the like which are referenced refer to those belonging to the same part in principle.

In the drawings, the same or like parts are designated by the same or similar marks or reference numerals, and a description thereof will not be repeated in principle.

In the accompanying drawings, hatching or the like may be omitted even in a cross section when hatching or the like results in complicated illustration or when the distinction between a portion to be hatched and a vacant space is distinct. In relation thereto, even a two-dimensionally closed hole may have a background outline thereof omitted when it is obvious from the description or the like that the hole is two-dimensionally closed, and so forth. On the other hand, even though not shown in a cross section, a portion other than a vacant space may be hatched to clearly show that the hatched portion is not a vacant space.

Note that, for the convenience of illustration, the number of the P-type columns shown in each of the drawings is, e.g., about 3 to 5 in a peripheral side region or the like. However, the number of the P-type columns may actually exceed about 10 (it is considered that the number of the P-type columns in the entire chip typically ranges from several hundreds to several tens of hundreds but, for the convenience of illustration, they are represented by a smaller number of the P-type columns). The example shown herein will be described by taking an item having a breakdown voltage of about several hundred volts for instance. In the follow example, a product having a breakdown voltage of about several hundred volts (specifically, e.g., about 600 volts) will be described by way of example.

Note that examples of a patent application concerning a MOSFET having a super-junction structure filed by the present inventors include Japanese Patent Application No. 2009-263600 (filed on Nov. 19, 2009), Japanese Patent Application No. 2010-109957 (filed on May 12, 2010), Japanese Patent Application No. 2010-81905 (filed on Mar. 31, 2010), and the like.

<First Part: Portion Mainly Related to 3D-Resurf Structure>

0. Outline of First Part

In regard to a drift region in a power MOSFET or the like, it has been an important task to avoid restrictions imposed by a related-art Silicon Limit and develop a high-breakdown-voltage FET having a low ON-resistance or the like. To achieve the task, various methods have been developed which introduce a super-junction structure alternately having relatively-high-concentration Slab-like N-type columns and P-type columns into the drift region. The methods which introduce the super-junction structure are roughly divided into three types of methods, i.e., the multi-epitaxial method, the trench insulating film filling method, and a trench fill method (trench filling method or trench epitaxial filling method). Among them, the multi-epitaxial method in which epitaxial growth and ion implantation are repeated multiple times has high process and design flexibility and accordingly complicated process steps, resulting in high cost. In the trench insulating film filling method, after oblique ion implantation into trenches is performed, the trenches are filled with a CVD (Chemical Vapor Deposition) insulating film. The trench insulating film filling method is simpler in terms of process, but is disadvantageous in terms of area due to the area of the trenches.

By contrast, the trench fill method has relatively low process and design flexibility due to constraints on growth conditions for filling epitaxial growth, but has the advantage of simple process steps. In view of this, the present inventors have studied problems associated with a device structure and mass production of a power MOSFET or the like in relation to a high breakdown voltage and a low ON-resistance to be achieved by the trench fill method or the like and found the following problem. That is, in the super-junction structure, the concentration of a main body cell portion (active region) is relatively high, and therefore it is difficult to ensure a breakdown voltage equal to or higher than that of the cell portion for a peripheral portion (peripheral region or junction termination area) using a related-art edge termination structure (Junction Edge Termination Structure) or a related-art Resurf (Reduced Surface Field) Structure. Specifically, the problem is such that, in an outer peripheral corner portion of a chip, due to electric field concentration, variations in breakdown voltage become sensitive to charge unbalance in the super-junction structure.

The following is a brief description of the outline of a representative embodiment of the invention disclosed in the present part.

That is, according to an aspect of the invention in the present part, in a semiconductor power device such as a power MOSFET having a super-junction structure in each of an active cell region and a chip peripheral region, an outer end of a surface resurf region of a second conductivity type coupled to a main junction (impurity region surrounding the active cell region and integrated with a channel region) of the second conductivity type in a surface of a drift region of a first conductivity type and having a concentration lower than that of the main junction is located in a middle region between an outer end of the main junction and an outer end of the super-junction structure in the chip peripheral region.

The following is a brief description of an effect obtained according to the representative embodiment of the invention disclosed in the present part.

That is, in a semiconductor power device such as a power MOSFET having a super-junction structure in each of an active cell region and a chip peripheral region, an outer end of a surface resurf region of a second conductivity type coupled to a main junction (impurity region surrounding the active cell region and integrated with a channel region) of the second conductivity type in a surface of a drift region of a first conductivity type and having a concentration lower than that of the main junction is located in a middle between an outer end of the main junction and an outer end of the super-junction structure in the chip peripheral region to allow a position where an electric field is concentrated to be located away from the outer end of the super-junction structure.

1. Description of Device Structure (Peripheral 3D Super-Junction and Half-Range P− Resurf Layer) of Power MOSFET with Super-Junction Structure, Etc. as Example of Semiconductor Device of First Embodiment of Present Invention (See Mainly FIGS. 1 to 7)

In this example, a specific description will be given using a planar power MOSFET formed in a silicon-based semiconductor substrate and having a source/drain breakdown voltage of about 600 volts as an example (with regard to the planar power MOSFET, the same also holds true in the following sections). However, it will be appreciated that the present invention is also applicable to a power MOSFET having another breakdown voltage value and other devices.

Figure 2:
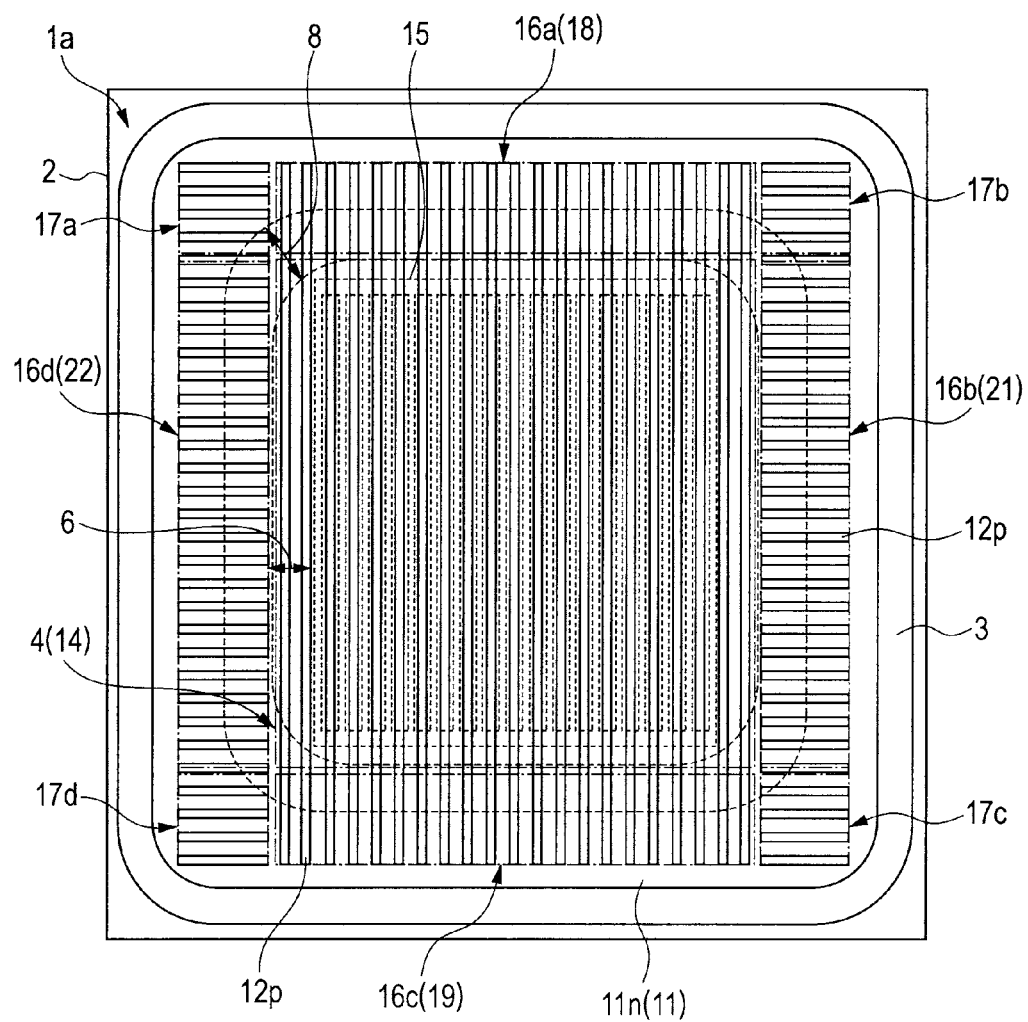
FIG. 2 is a top view of the entire chip (mainly of an impurity doped structure thereof or the like) of the power MOSFET having the super-junction structure as the example of the semiconductor device of the first embodiment of the first part of the present invention.
Figure 3:
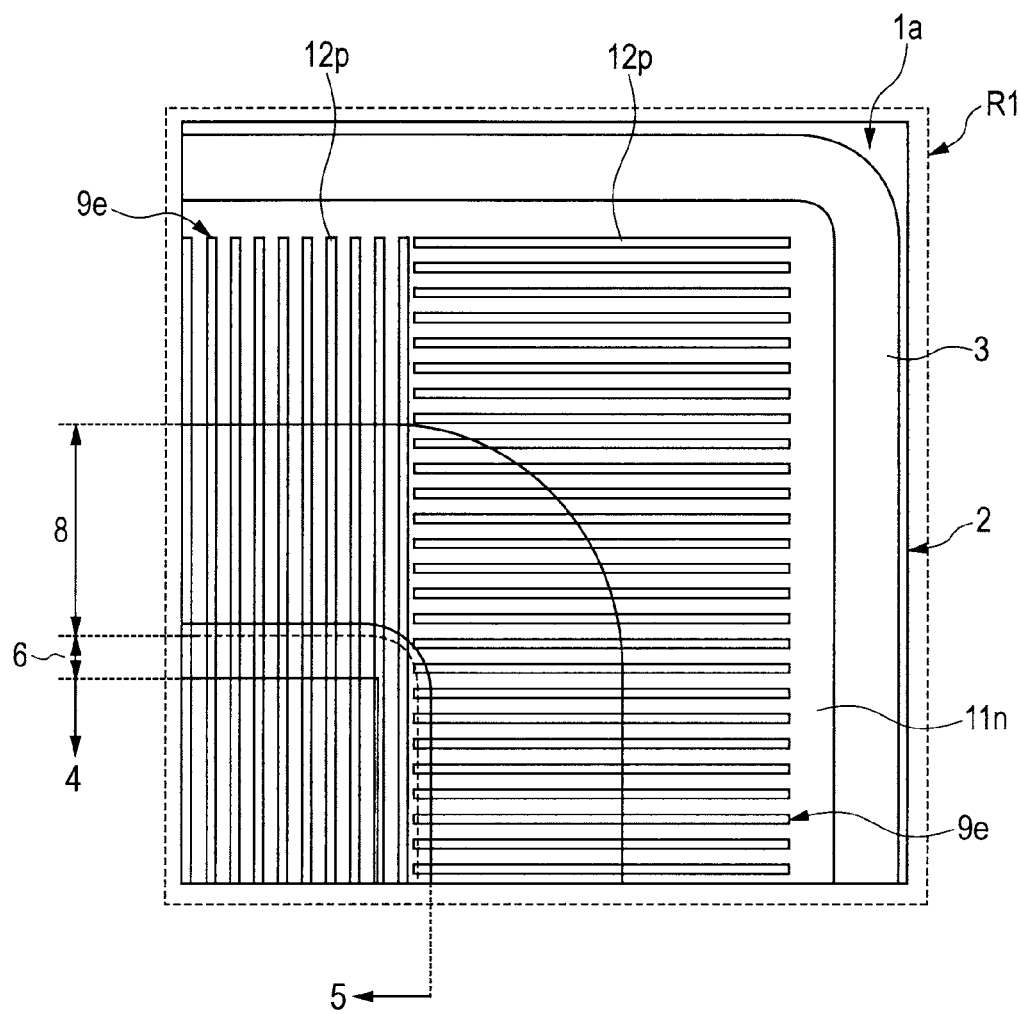
FIG. 3 is a top view (closer to a real equivalent) of a local portion of the chip corresponding to a cut-away region R1 of the chip corner portion of FIG. 1.
Figure 4:
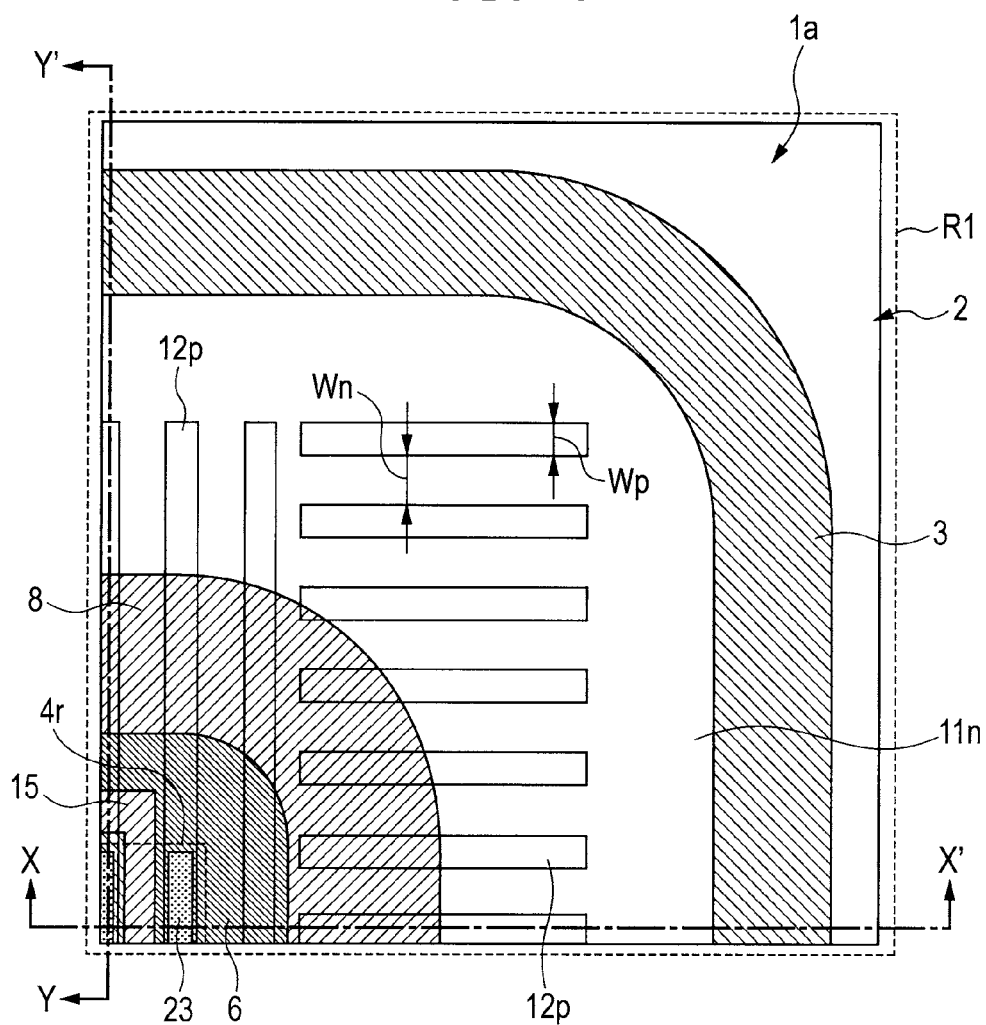
FIG. 4 is a top view (schematic diagram for illustration) of the local portion of the chip corresponding to the cut-away region R1 of the chip corner portion of FIG. 1.
Figure 5:
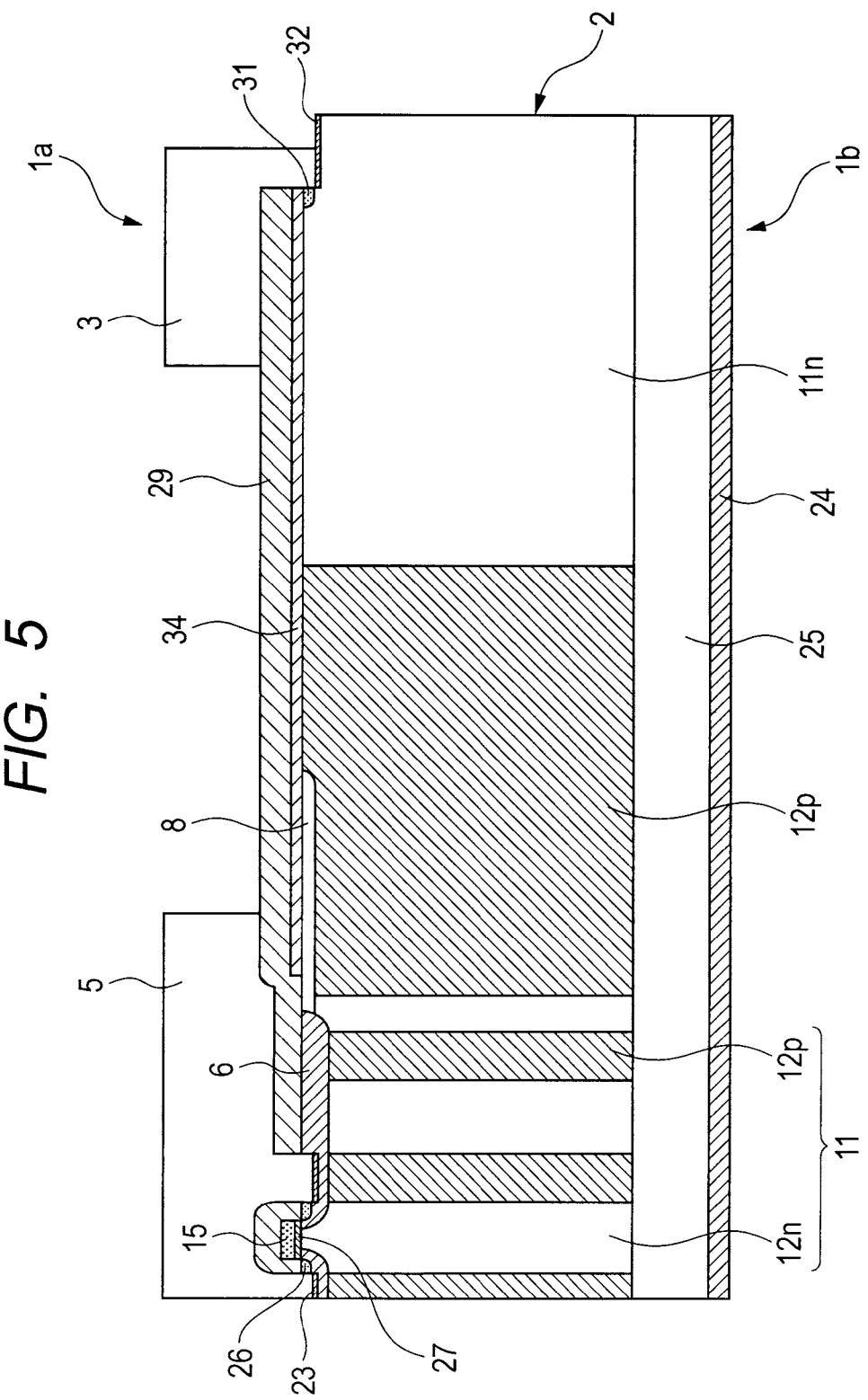
FIG. 5 is a cross-sectional view of a local portion of the chip corresponding to the X-X' cross section of FIG. 4.
Figure 6:
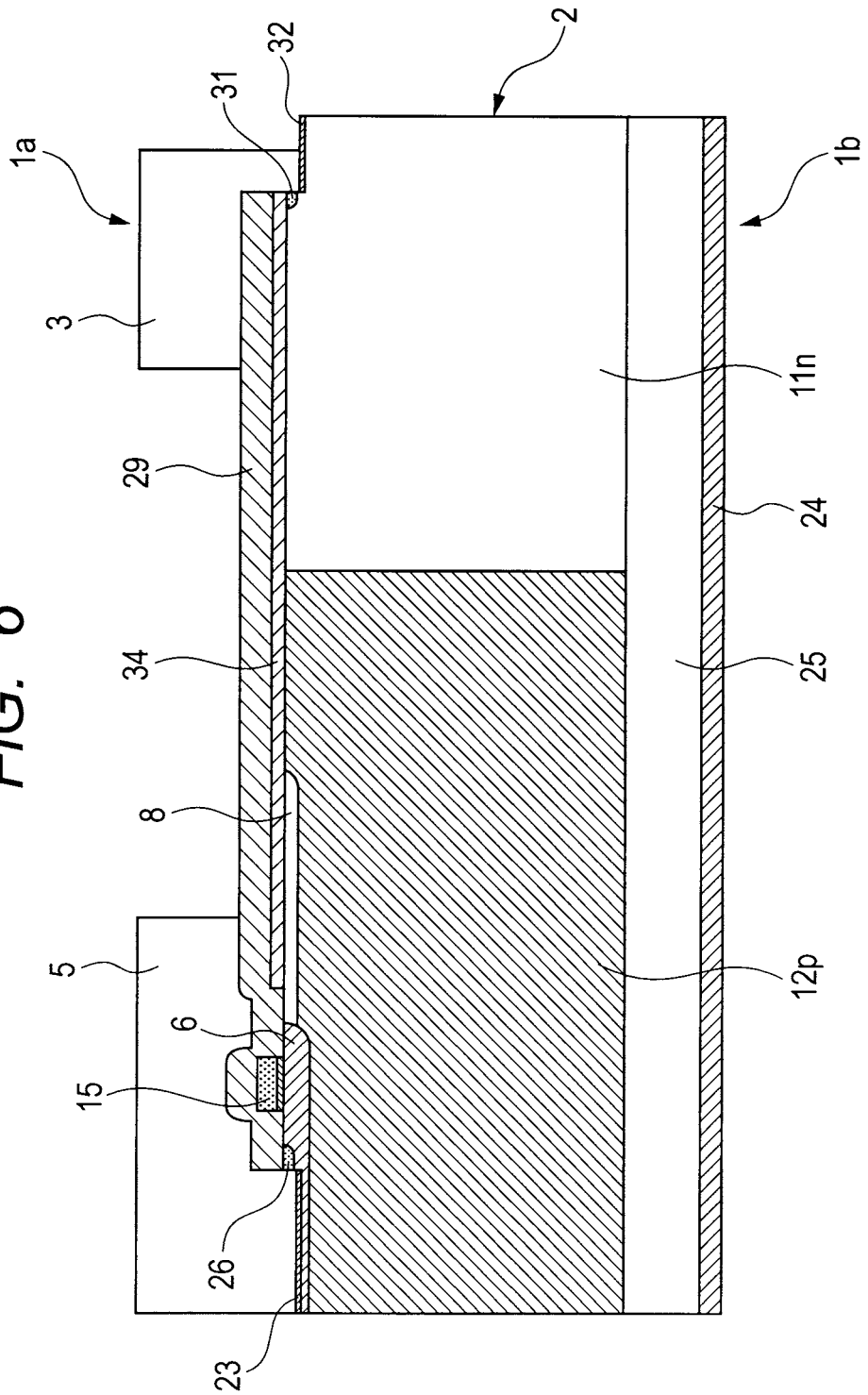
FIG. 6 is a cross-sectional view of a local portion of the chip corresponding to the Y-Y' cross section of FIG. 4.
Figure 7:
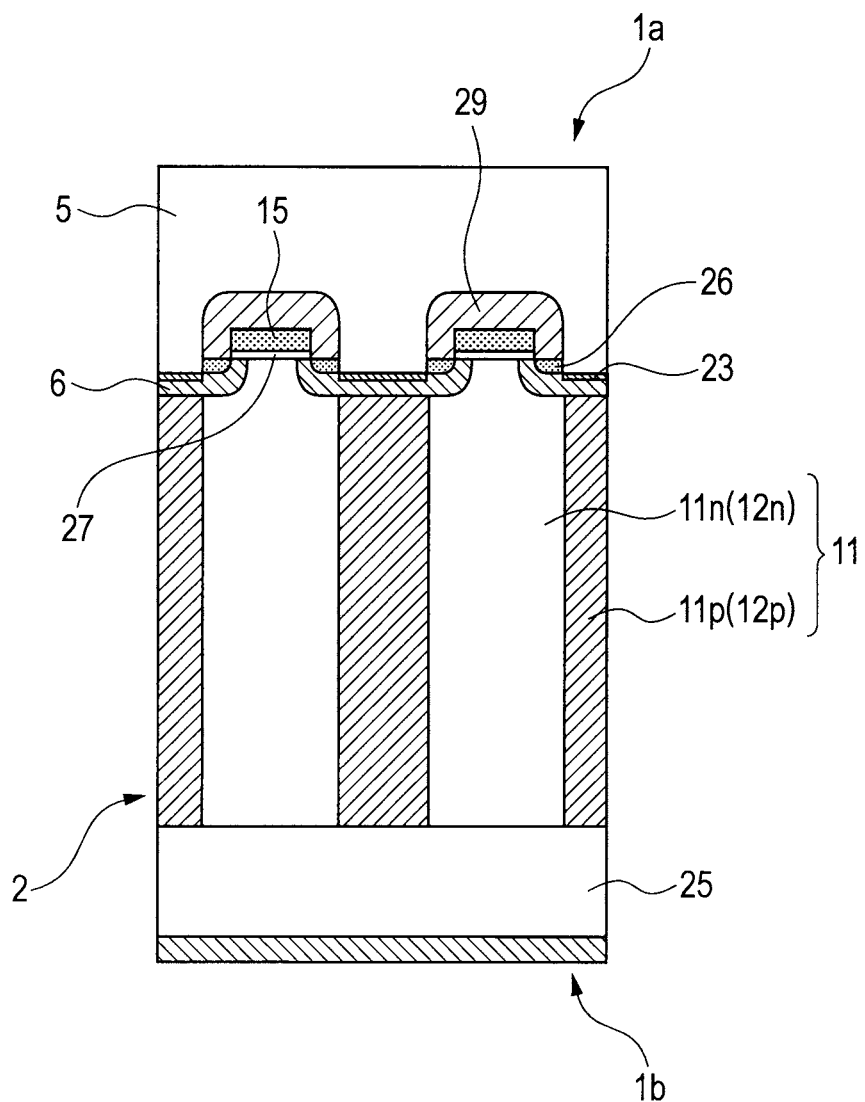
FIG. 7 is a cross-sectional view of a local portion of the chip (corresponding to two active cells) corresponding to the A-A' cross section of a cut-away region R2 of the active cell portion of FIG. 1.

FIG. 1 is a top view of an entire chip (mainly of a surface region thereof) of a power MOSFET having a super-junction structure as an example of a semiconductor device of a first embodiment (peripheral 3D super-junction and half-range P− resurf layer) of the present invention. FIG. 2 is a top view of the entire chip (mainly of an impurity doped structure thereof or the like) of the power MOSFET having the super-junction structure as the example of the semiconductor device of the first embodiment of the present invention. FIG. 3 is a top view (closer to a real equivalent) of a local portion of the chip corresponding to a cut-away region R1 of the chip corner portion of FIG. 1. FIG. 4 is a top view (schematic diagram for illustration) of the local portion of the chip corresponding to the cut-away region R1 of the chip corner portion of FIG. 1. FIG. 5 is a cross-sectional view of a local portion of the chip corresponding to the X-X' cross section of FIG. 4. FIG. 6 is a cross-sectional view of a local portion of the chip corresponding to the Y-Y' cross section of FIG. 4. FIG. 7 is a cross-sectional view of a local portion of the chip (corresponding to two active cells) corresponding to the A-A' cross section of a cut-away region R2 of the active cell portion of FIG. 1. Based on these drawings, a description will be given to a device structure (peripheral 3D super-junction and half-range P− resurf layer) of the power MOSFET having the super-junction structure or the like as the example of the semiconductor device of the first embodiment of the present invention.

First, a description will be given to a schematic layout of the upper surface of the chip (typically several millimeters square). As shown in FIG. 1, in a power MOSFET element chip 2 in which elements are formed over a silicon-based semiconductor substrate (which is a wafer 1 before being divided into the individual chips 2) in the form of a square or rectangular plate, a metal source electrode 5 (aluminum-based electrode) located in a center portion occupies a major area. Under the metal source electrode 5, an active cell region 4 is provided, and the outer end portion thereof is a P-type main junction 6 (the outer edge portion of a P body region. Note that the super-junction structure, under active cells extends under substantially the entire P-type main junction 6). Inside the P-type main junction 6, a repetitive structure portion 4r of the active cell region 4 (the P body region is formed in the surface area of the entire repetitive structure portion 4r located between gate electrodes and shows a two-dimensional multifoil structure from which gate electrode portions are periodically and slitwise missing) is provided. Outside the ring-like P-type main junction 6, a P−-type surface resurf region 8 similarly having a ring-like shape is provided. In addition, over a region including the P−-type surface resurf region 8 and an outside region thereof, a peripheral super-junction region 9 (region where linear P columns 12p and an N-type drift region 11n located therebetween are periodically and substantially equidistantly arranged in a peripheral drift region 11 or a combined region thereof) is provided. Here, the outer end of the P−-type surface resurf region 8 is located in a middle region between an outer end 9e of the peripheral super-junction region 9 and the outer end of the P-type main junction 6. More preferably, the outer end of the P−-type surface resurf region 8 is substantially at a middle between the outer end 9e of the peripheral super-junction region 9 and the outer end of the P-type main junction 6.

Further, around the peripheral super-junction region 9, an aluminum-based metal guard ring 3 is provided. Between the aluminum-based metal guard ring 3 and the metal source electrode 5, a metal gate electrode 7 for retrieving polysilicon gate electrodes to the outside is provided. Note that, in FIG. 1 (the same also holds true in FIGS. 2 to 4), the metal gate electrode 7 is exaggeratingly depicted wider than the real equivalent for easy understanding of a structure of the Edge Termination Area.

Next, a description will be given to a two-dimensional diffusion structure of the chip 2 and a device layout thereof. As shown in FIG. 2, in a center portion of the chip 1, the active cell region 4 (under which an active-cell-portion super-junction structure 14, i.e., a first super-junction structure exists) is provided. Inside the active cell region 4, a large number of linear polysilicon gate electrodes 15 are provided. In addition, outside the ring-like P-type main junction 6 which is the outer edge portion of the active cell region 4 and surrounds the active cell region 4, the ring-like P−-type surface resurf region 8 coupled to the P-type main junction 6 and surrounding the active cell region 4 is provided.

Next, a description will be given to a super-junction structure around the active-cell-portion super-junction structure 14, i.e., the first super-junction structure, i.e., the peripheral super-junction structure 9 (FIG. 1). In peripheral side regions 16a and 16c, a second super-junction structure 18 and a third super-junction structure 19 each of which is coupled to the active-cell-portion super-junction structure 14 and has the same orientation as that of the active-cell-portion super-junction structure 14 are provided. On the other hand, in peripheral side regions 16b and 16d, a fourth super-junction structure 21 and a fifth super-junction structure 22 each of which is not coupled to the active-cell-portion super-junction structure 14 and has an orientation orthogonal to that of the active-cell-portion super-junction structure 14 are provided. Note that, in the column layout, individual peripheral corner regions 17a, 17b, 17c, and 17d form periodic extension regions of the peripheral side regions 16b and 16d located therebelow or thereabove.

FIG. 3 shows an enlarged view of the portion of FIG. 2 corresponding to the cutaway region R1 of the chip corner portion of FIG. 1. As shown in FIG. 3, the outer end of the P⁻-type surface resurf region 8 is substantially at a middle between the outer end 9e of the peripheral super-junction region 9 and the outer end of the P-type main junction 6 around the entire periphery thereof.

Next, FIG. 4 is a more schematic depiction of FIG. 3 (in which the number of the P columns 12p is reduced to clearly show the relations among individual elements). As shown in FIG. 4, the repetitive structure portion 4r in the active cell region is provided with a periodic structure (one-dimensional periodic structure) in which P+ body contact regions 23 and the polysilicon gate electrodes 15 alternately repeat. The thickness Wn (or width) of each N column is, e.g., about 6 micrometers, and the thickness Wp (or width) of each P column is, e.g., about 4 micrometers. Accordingly, the pitch of the super-junction is about 10 micrometers. In this example, the thickness Wn (or width) of the N column and the thickness Wp (or width) of the P column are substantially constant in the entire chip region 2. Such parameters may also be varied depending on locations. However, in the trench fill method, substantially constant parameters are advantageous in terms of process. The impurity (e.g., antimony) concentration of each of the N columns 12n is, e.g., about $3.3 \times 10^{15}/\text{cm}^3$, and the impurity (e.g., boron) concentration of each of the P columns 12p is, e.g., about $5.0 \times 10^{15}/\text{cm}^3$.

FIG. 5 shows the X-X' cross section of FIG. 4, while FIG. 6 shows the Y-Y' cross section of FIG. 4. As shown in FIGS. 5 and 6, on the surface of an N+ drain region 25 (N-type single-crystal silicon substrate) of a back surface 1b of the chip 2, a metal back-surface drain electrode 24 is provided. Over the N+ drain region 25, the drift region 11 is provided and formed of the N columns 12n, the P columns 12b (P-type drift regions), the N-type drift region 11n, and the like. In the surface area of the drift region 11, the P-type main junction 6 (P well, P body region, or the outer edge portion thereof) is provided. In the P body region 6, N+ source regions 26, the P+ body contact regions 23, and the like are provided. Outside the P-type main junction 6, the P⁻-type surface resurf region 8 is provided to be coupled thereto. In the surface area of the N-type drift region 11n in an end portion of the chip 2, an N+ channel stop region 31, a P+ chip peripheral contact region 32, and the like are provided. Over a semiconductor surface between the pair of N+ source regions 26, the polysilicon gate electrode 15 is provided via a gate insulating film 27. Over the polysilicon gate electrode 15 and a field insulating film 34, an interlayer insulating film 29 is provided. Over the interlayer insulating film 29, aluminum-based electrode films including the metal source electrode 5 and the metal guard ring 3 are formed and each electrically coupled to the P+ body contact regions 23, the N+ channel stop region 31, the P+ chip peripheral contact region 32, or the like. Note that the respective widths (thicknesses) of the N column 12n and the P column 12p are, e.g., about 6 micrometers and about 4 micrometers.

The respective doses of the N column 12n and the P column 12p are, e.g., about $3.3 \times 10^{15}/\text{cm}^3$ and about $5.0 \times 10^{15}/\text{cm}^3$.

FIG. 7 shows the A-A' cross section (corresponding to 2 periods of the repetitive structure) of the cutaway region R2 of the active cell portion of FIG. 1. As shown in FIG. 7, on the surface of the N+ drain region 25 (N-type single-crystal silicon substrate) of the back surface 1b of the chip 2, the metal back-surface drain electrode 24 is provided. Over the N+ drift region 25, the drift region 11 is provided and formed of the N columns 12n (N-type drift region 11n) and the P columns 12p (P-type drift region 11p). In the surface area of the drift region 11, the P body region 6 is provided. In the P body region 6, the N+ source regions 26, the P+ body contact regions 23, and the like are provided. Over the semiconductor surface between the pair of N+ source regions 26, the polysilicon gate electrode 15 is provided via the gate insulating film 27. Over the polysilicon gate electrode 15, the interlayer insulating film 29 is provided. Over the interlayer insulating film 29, the aluminum-based electrode films including the metal source electrode 5 are formed and electrically coupled to the P+ body contact regions 23.

2. Description of Wafer Process Corresponding to Semiconductor Device of First Embodiment of Present Invention, Etc. (See Mainly FIGS. 8 to 22)

In this section, a process corresponding to the structure of the first section will be described. However, these process steps are basically common to other structures so that the following description will not be repeated in principle for the other structures.

Figure 8:
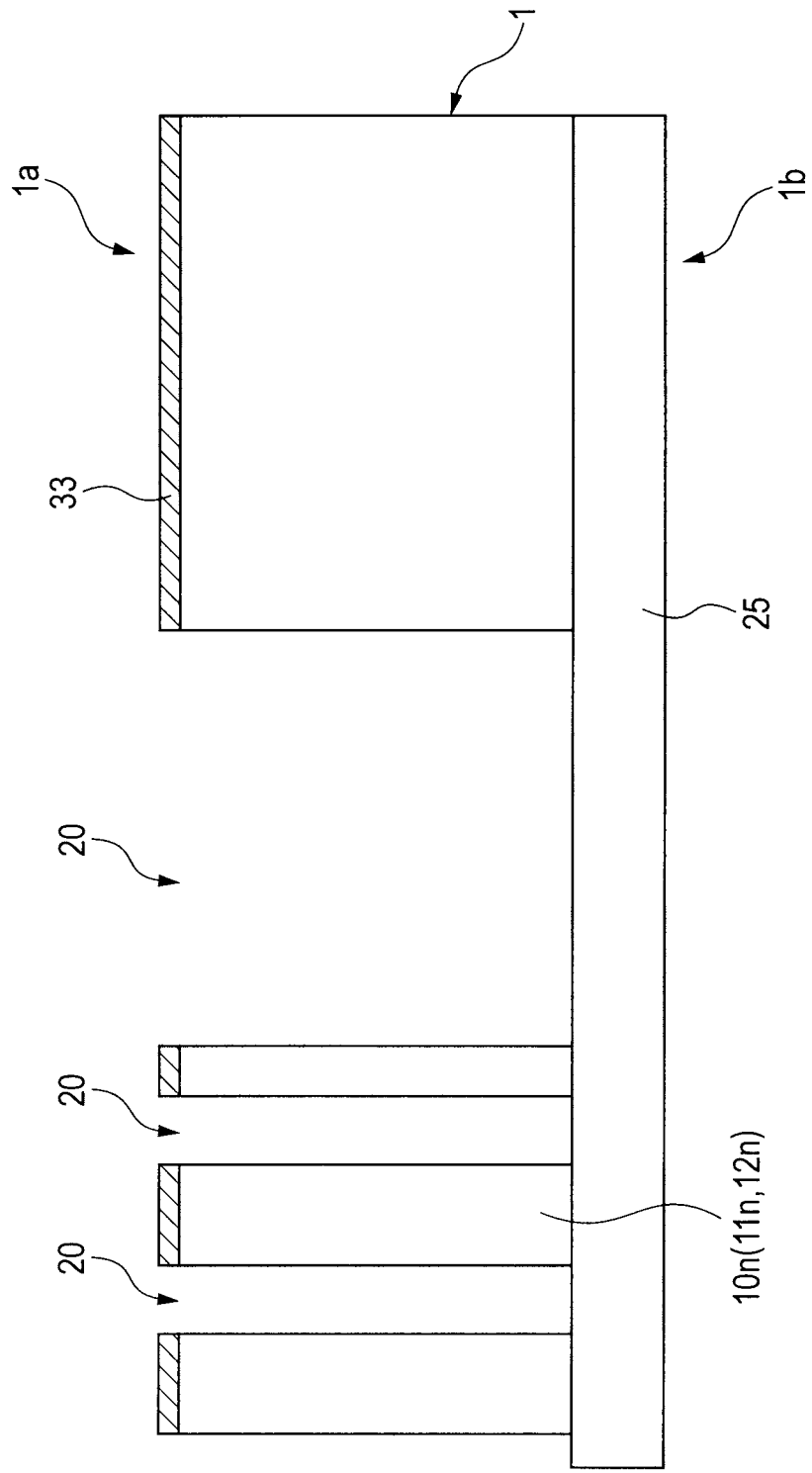
FIG. 8 is a wafer cross-sectional view of a device portion shown in FIG. 5 for illustrating a wafer process (step of forming trenches) corresponding to the semiconductor device of the first embodiment of the first part of the present invention.
Figure 9:
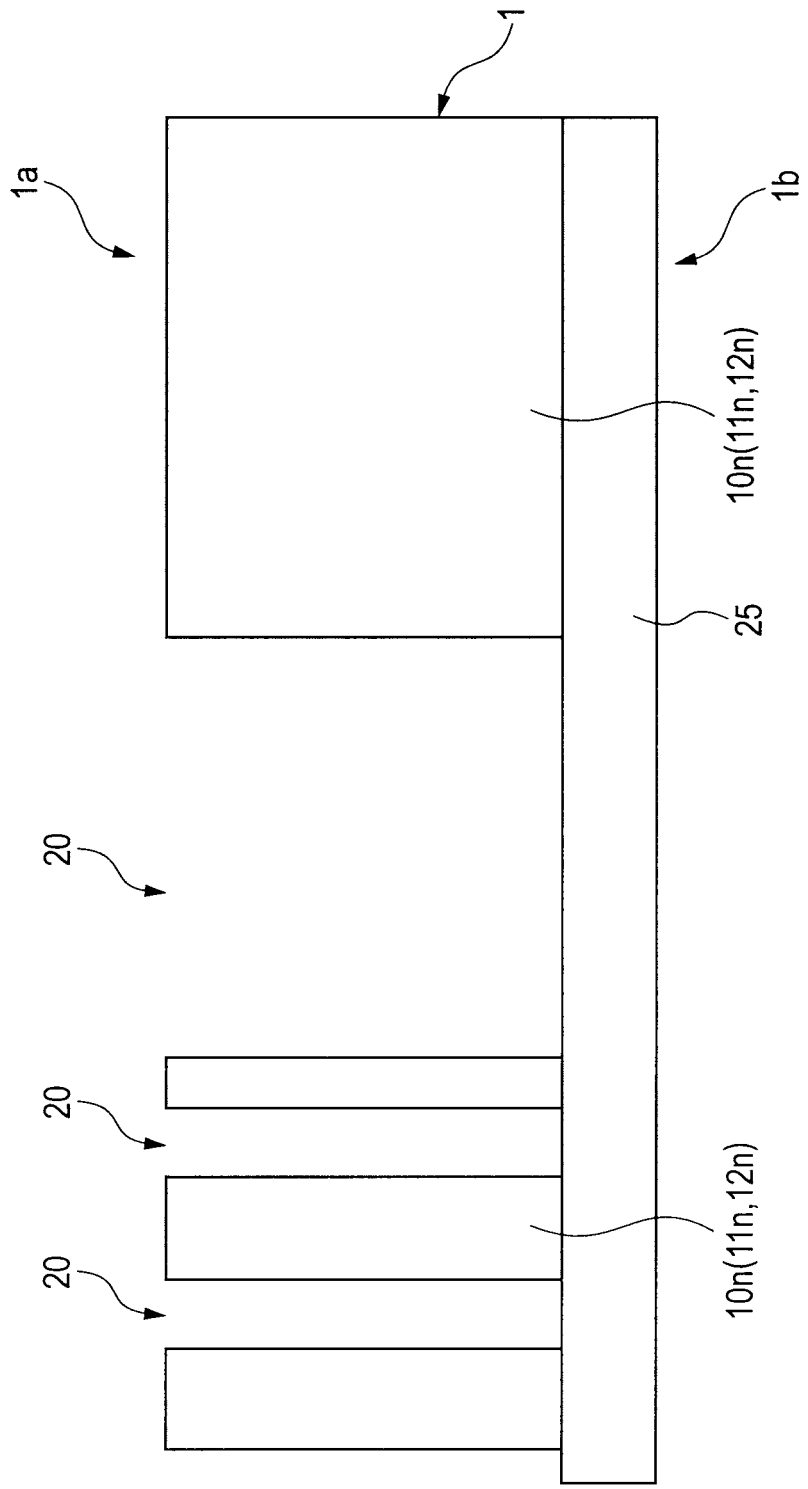
FIG. 9 is a wafer cross-sectional view of the device portion shown in FIG. 5 for illustrating the wafer process (step of removing a hard mask for forming the trenches) corresponding to the semiconductor device of the first embodiment of the first part of the present invention.
Figure 10:
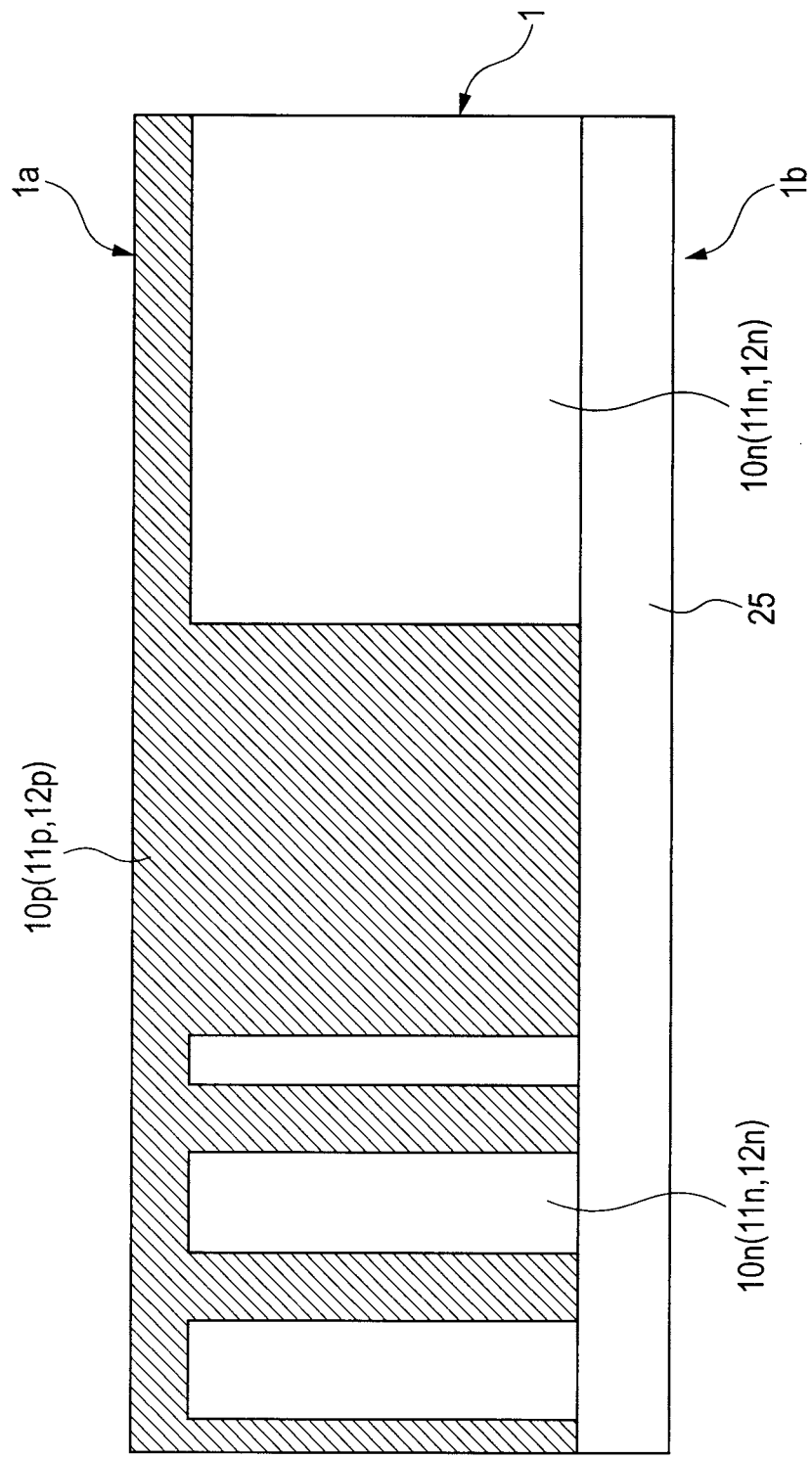
FIG. 10 is a wafer cross-sectional view of the device portion shown in FIG. 5 for illustrating the wafer process (step of filling the trenches with a P-type epitaxial layer) corresponding to the semiconductor device of the first embodiment of the first part of the present invention.
Figure 11:
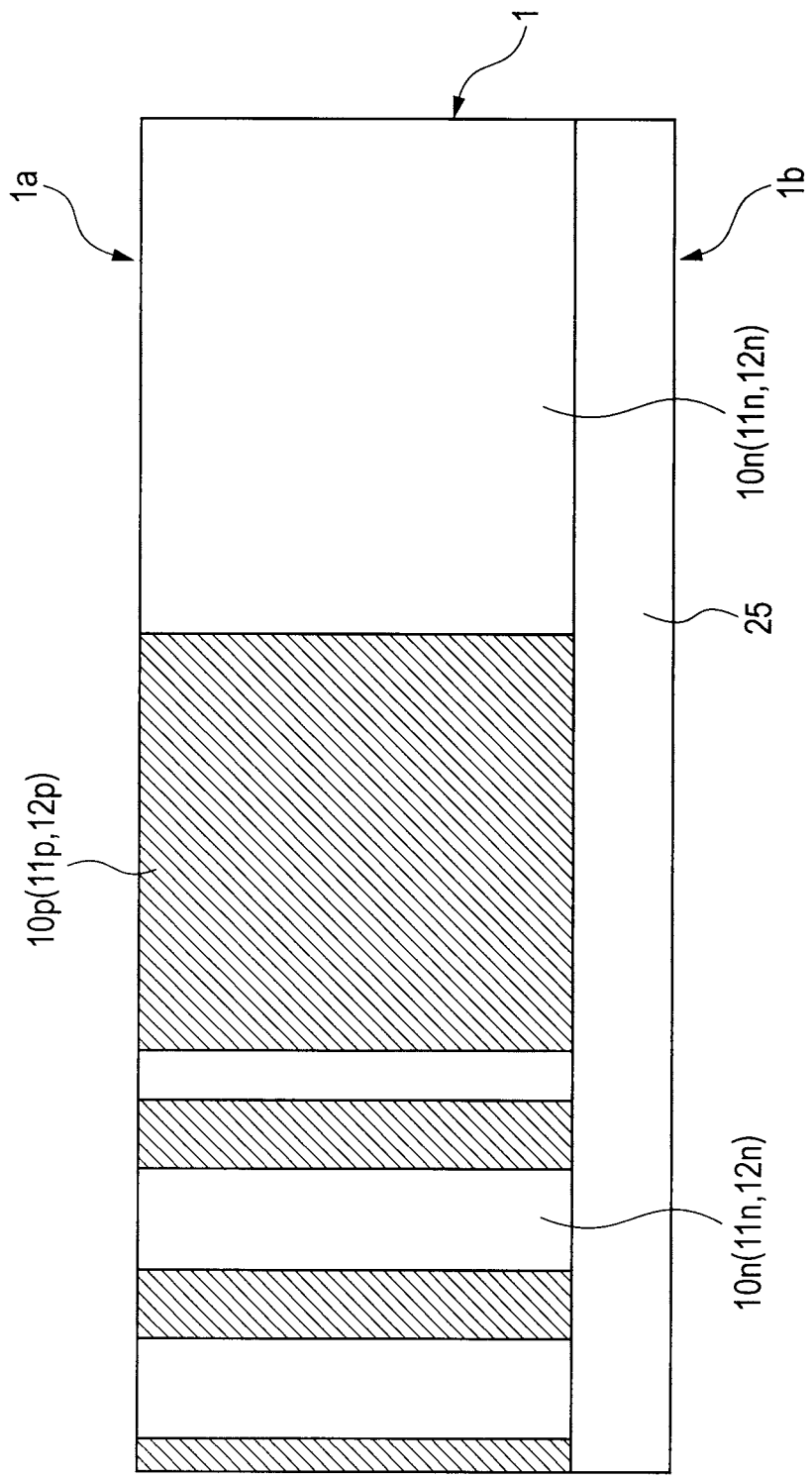
FIG. 11 is a wafer cross-sectional view of the device portion shown in FIG. 5 for illustrating the wafer process (CMP step) corresponding to the semiconductor device of the first embodiment of the first part of the present invention.
Figure 12:
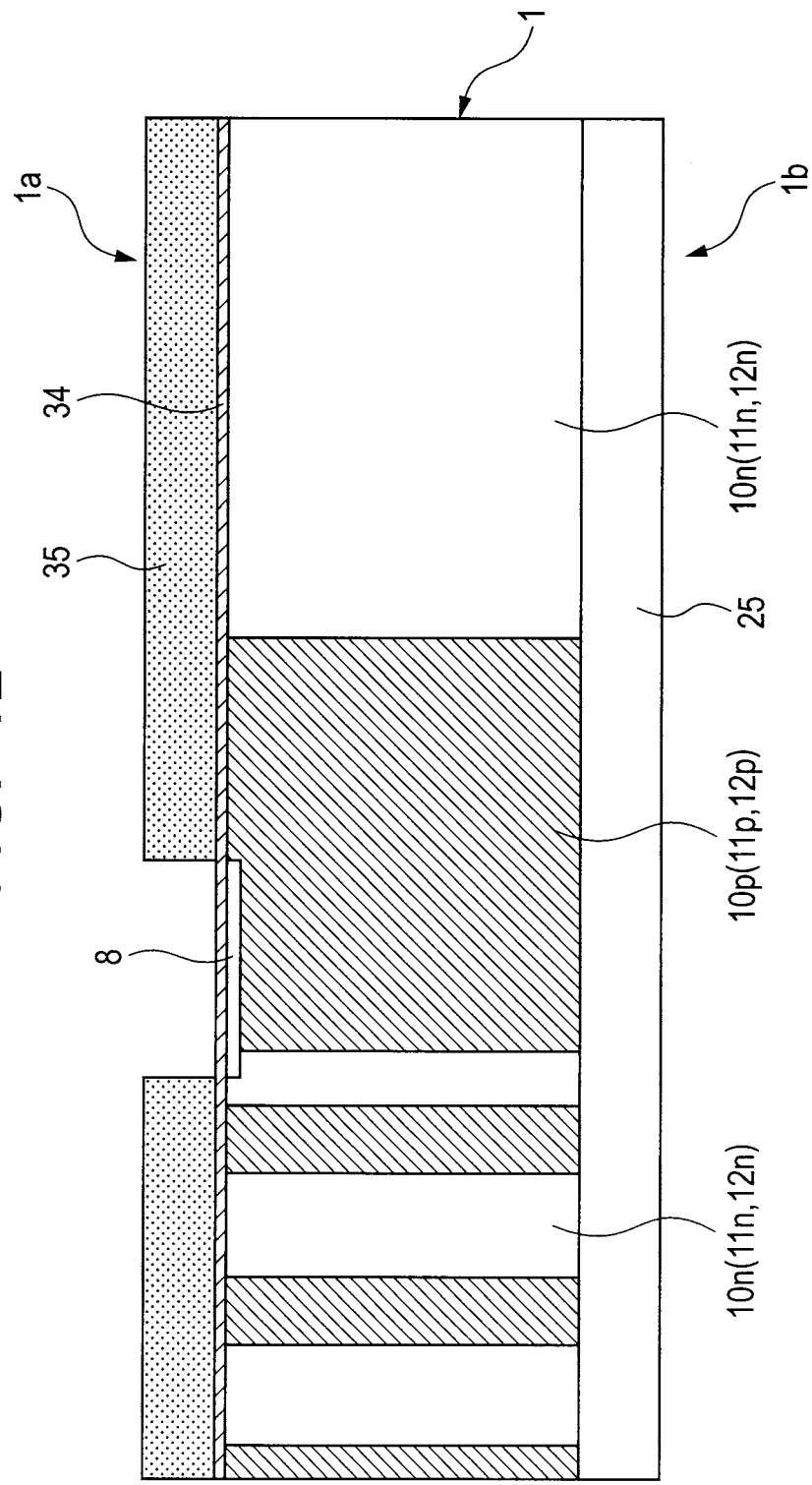
FIG. 12 is a wafer cross-sectional view of the device portion shown in FIG. 5 for illustrating the wafer process (step of introducing a $P^-$-type surface resurf region) corresponding to the semiconductor device of the first embodiment of the first part of the present invention.
Figure 13:
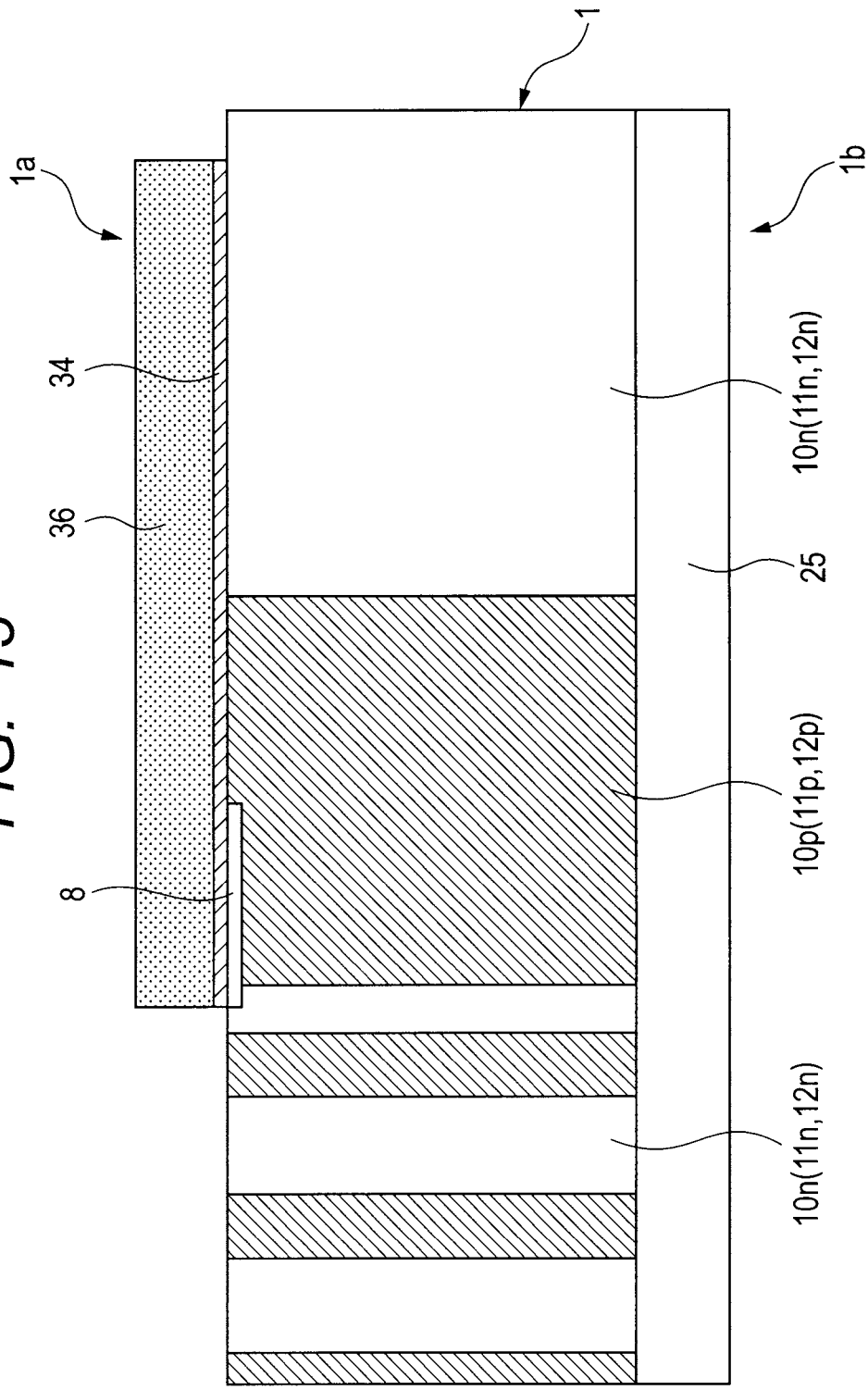
FIG. 13 is a wafer cross-sectional view of the device portion shown in FIG. 5 for illustrating the wafer process (step of patterning a field oxide film) corresponding to the semiconductor device of the first embodiment of the first part of the present invention.
Figure 14:
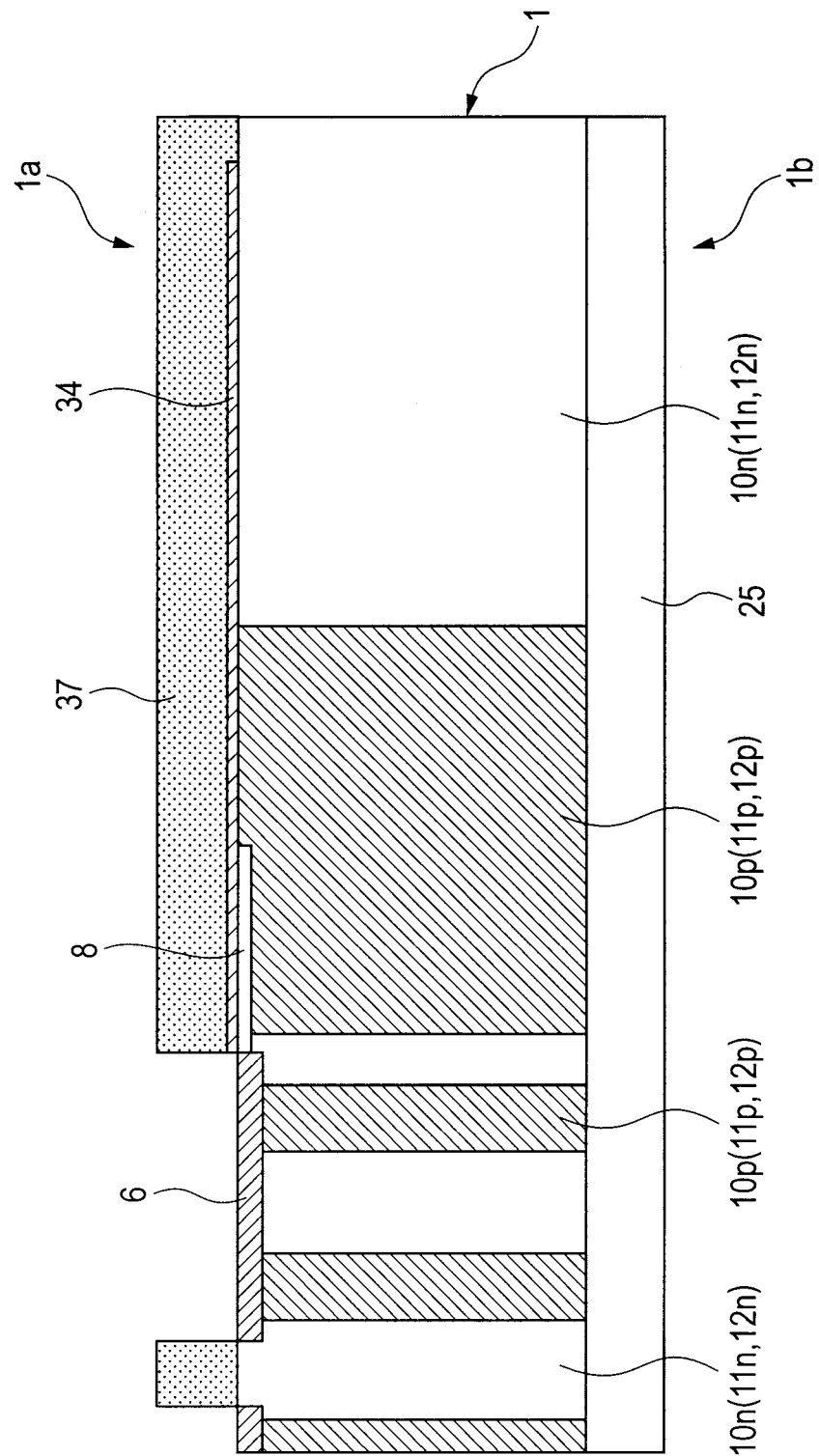
FIG. 14 is a wafer cross-sectional view of the device portion shown in FIG. 5 for illustrating the wafer process (step of introducing a P body region) corresponding to the semiconductor device of the first embodiment of the first part of the present invention.
Figure 15:
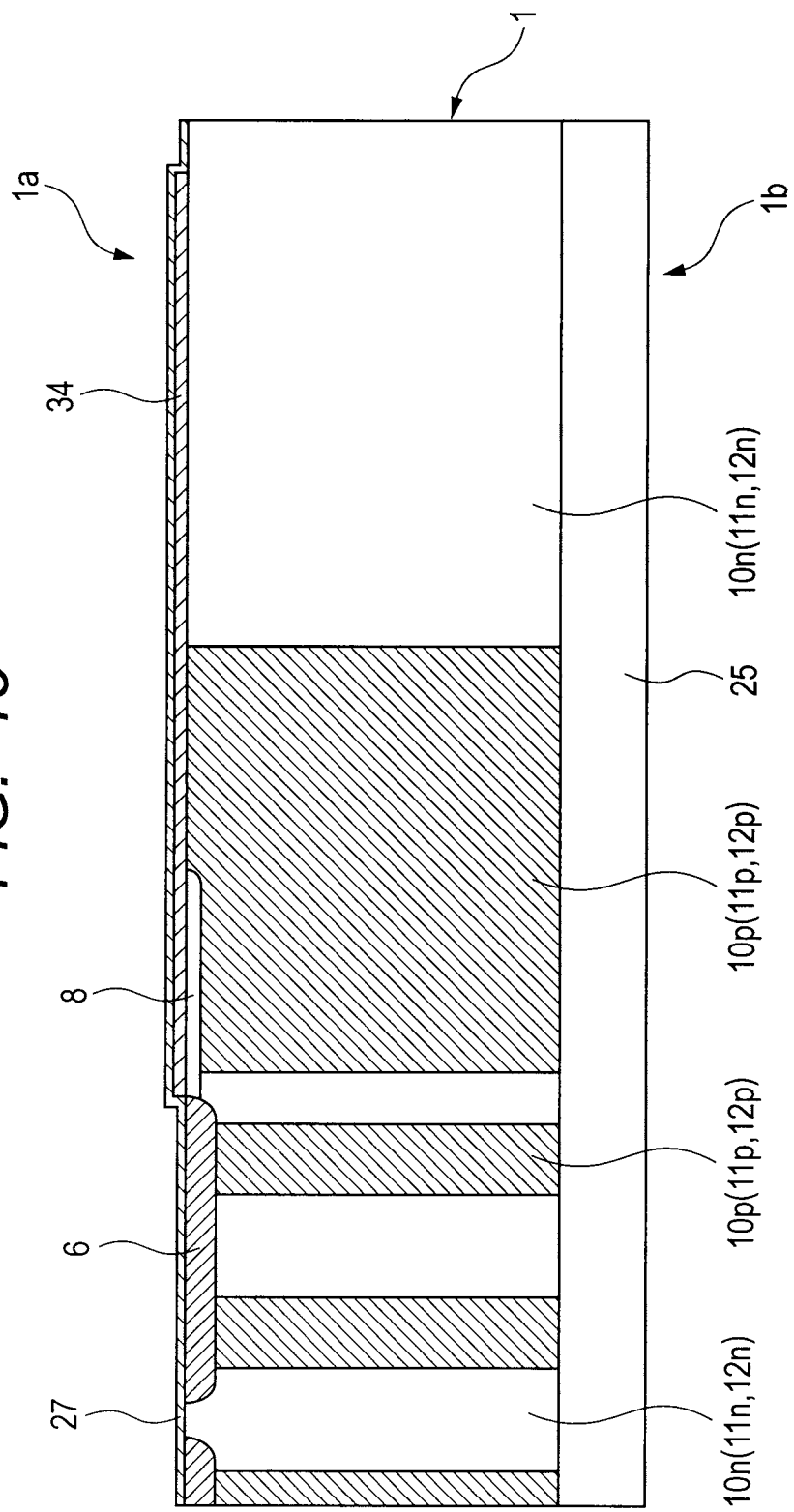
FIG. 15 is a wafer cross-sectional view of the device portion shown in FIG. 5 for illustrating the wafer process (step of forming a gate insulating film) corresponding to the semiconductor device of the first embodiment of the first part of the present invention.
Figure 16:
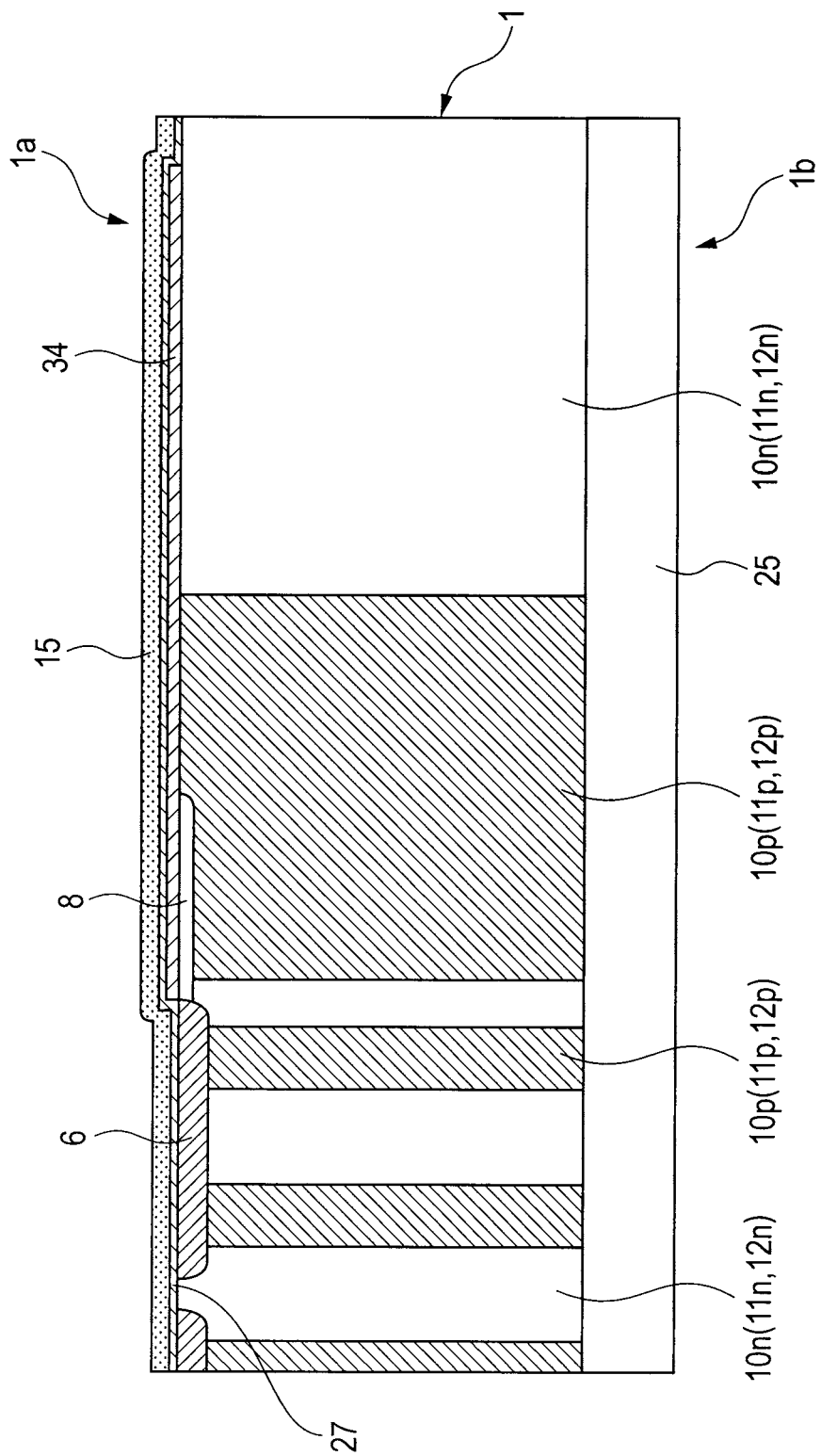
FIG. 16 is a wafer cross-sectional view of the device portion shown in FIG. 5 for illustrating the wafer process (step of forming a gate polysilicon film) corresponding to the semiconductor device of the first embodiment of the first part of the present invention.
Figure 17:
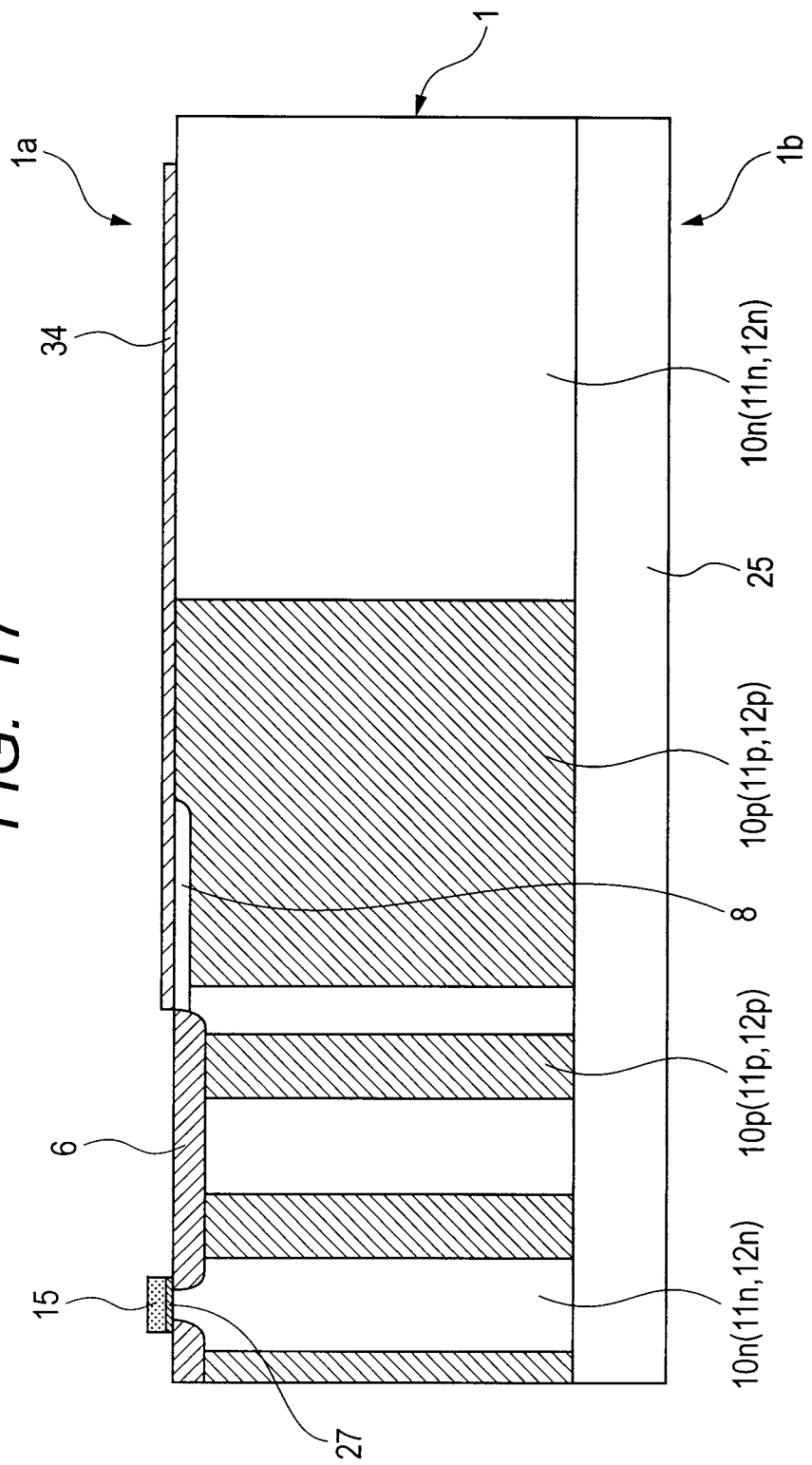
FIG. 17 is a wafer cross-sectional view of the device portion shown in FIG. 5 for illustrating the wafer process (step of patterning the gate polysilicon film into gate electrodes) corresponding to the semiconductor device of the first embodiment of the first part of the present invention.
Figure 18:
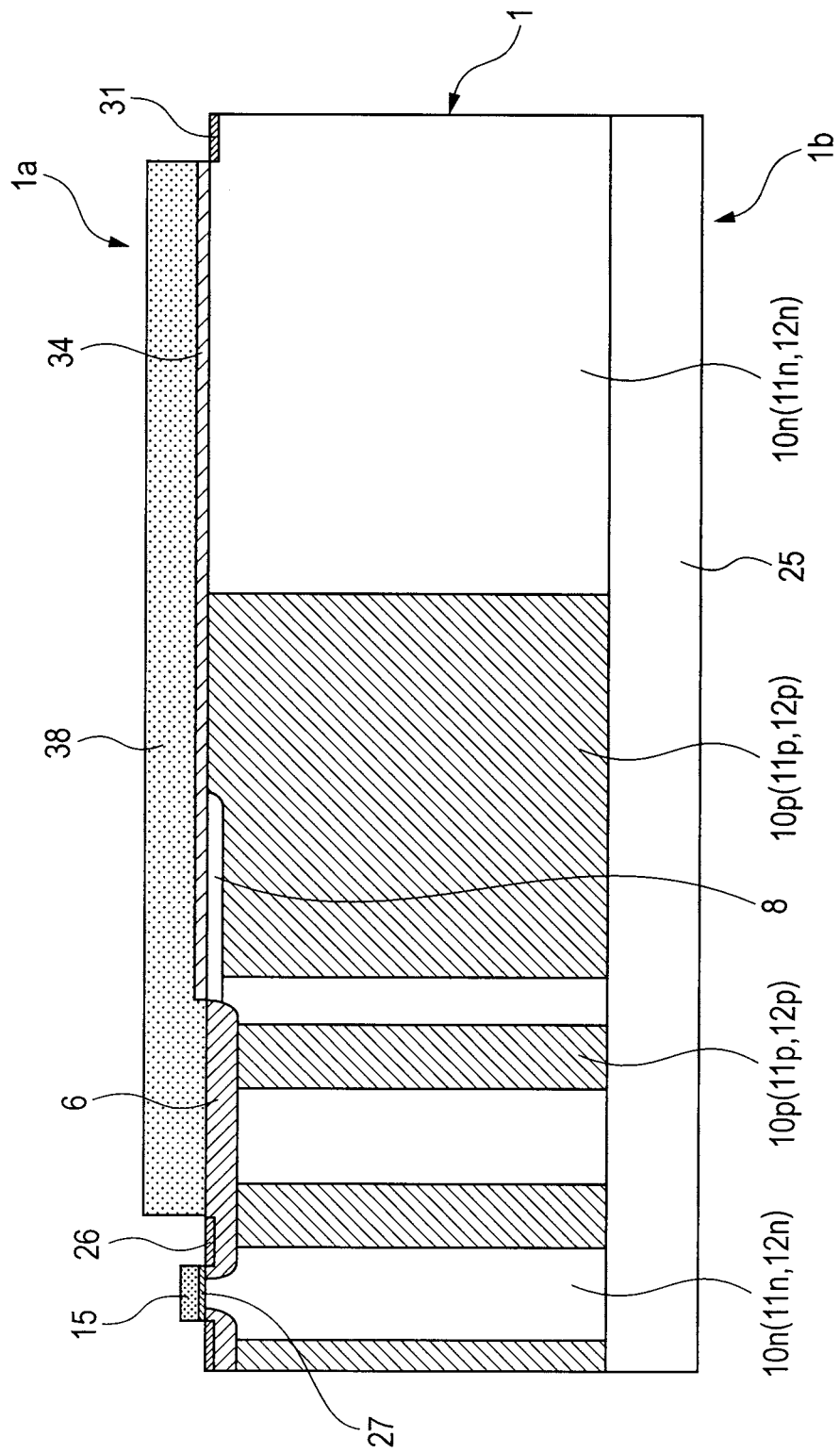
FIG. 18 is a wafer cross-sectional view of the device portion shown in FIG. 5 for illustrating the wafer process (step of forming source regions) corresponding to the semiconductor device of the first embodiment of the first part of the present invention.
Figure 19:
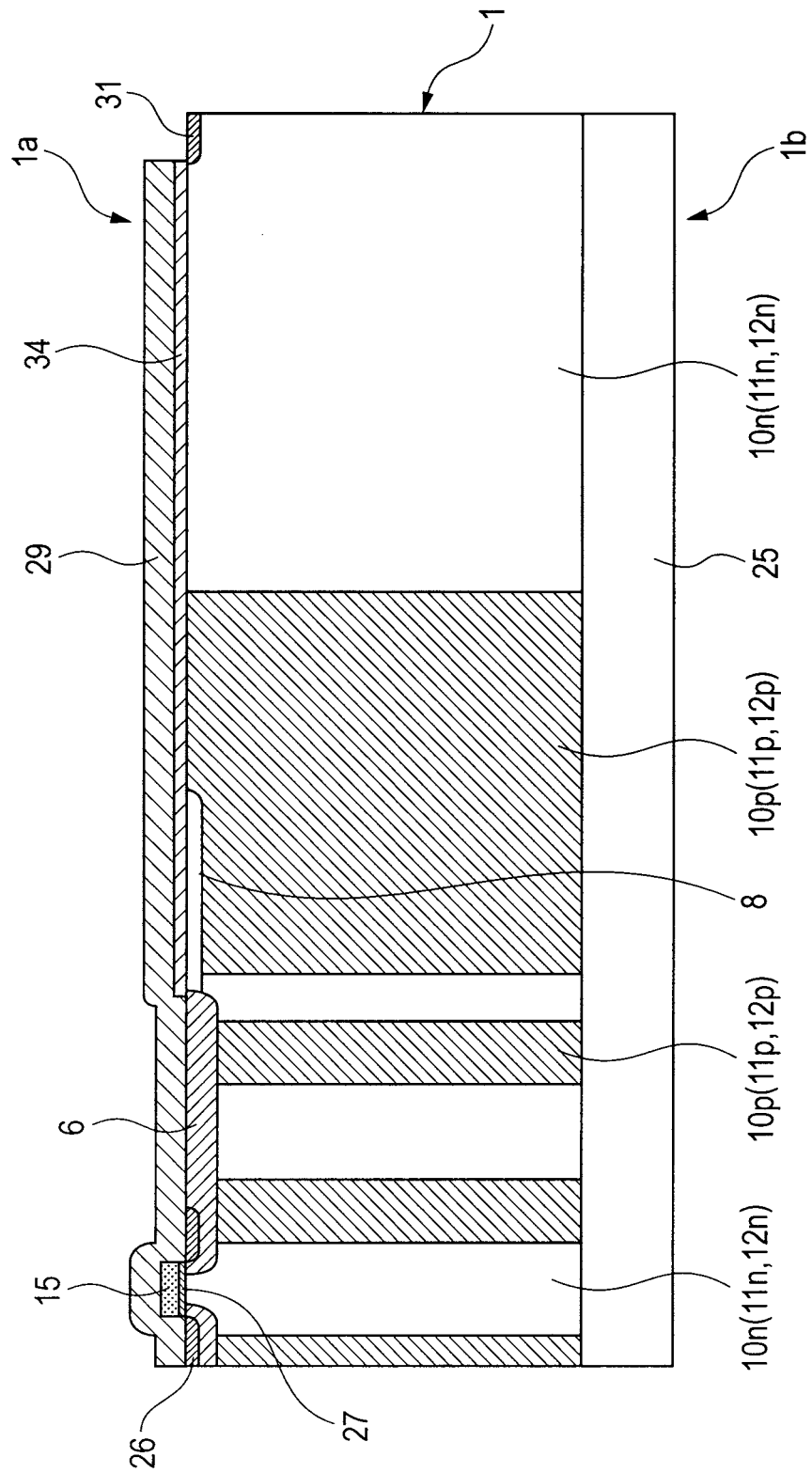
FIG. 19 is a wafer cross-sectional view of the device portion shown in FIG. 5 for illustrating the wafer process (step of forming an interlayer insulating film) corresponding to the semiconductor device of the first embodiment of the first part of the present invention.
Figure 20:
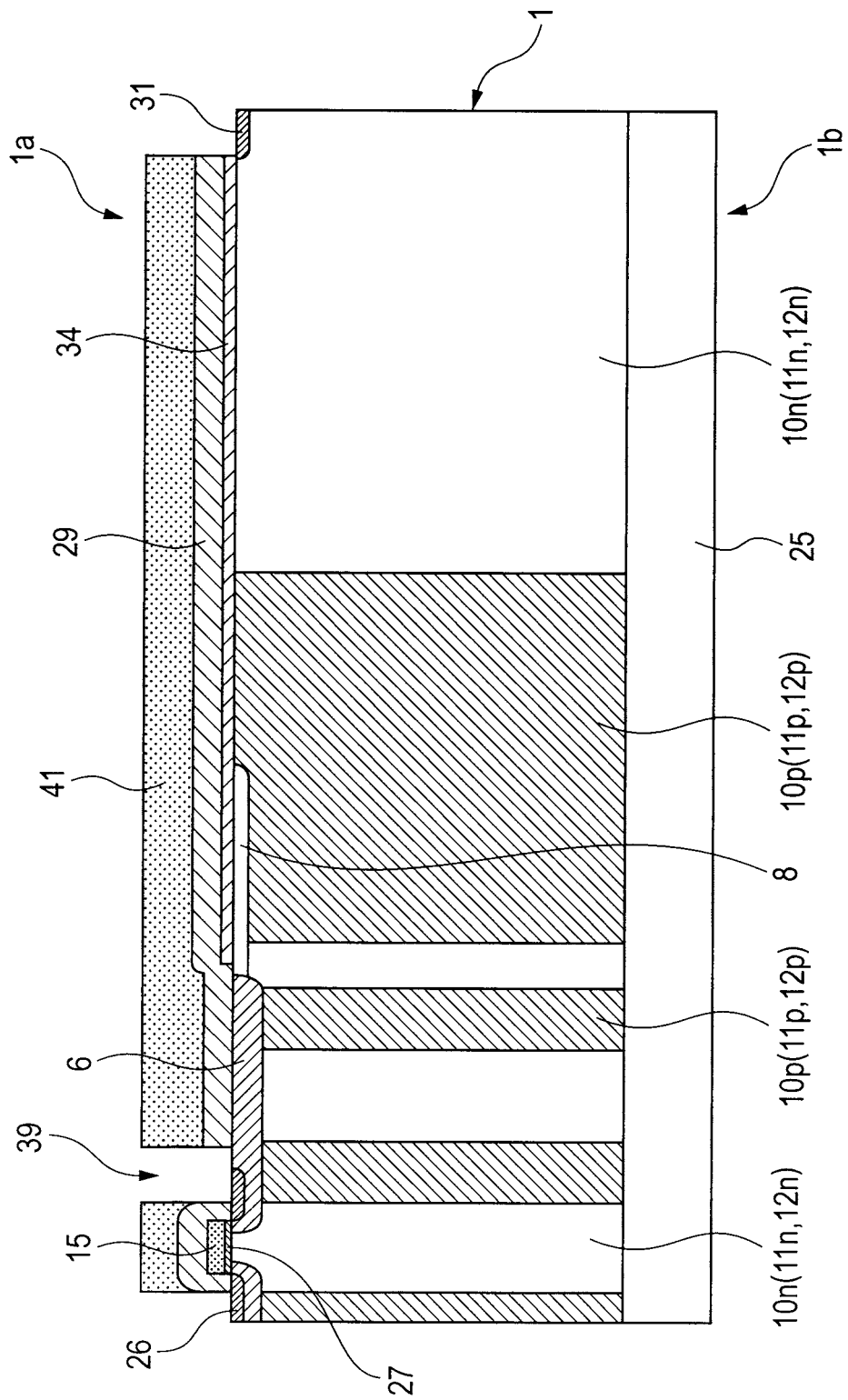
FIG. 20 is a wafer cross-sectional view of the device portion shown in FIG. 5 for illustrating the wafer process (step of forming contact holes) corresponding to the semiconductor device of the first embodiment of the first part of the present invention.
Figure 21:
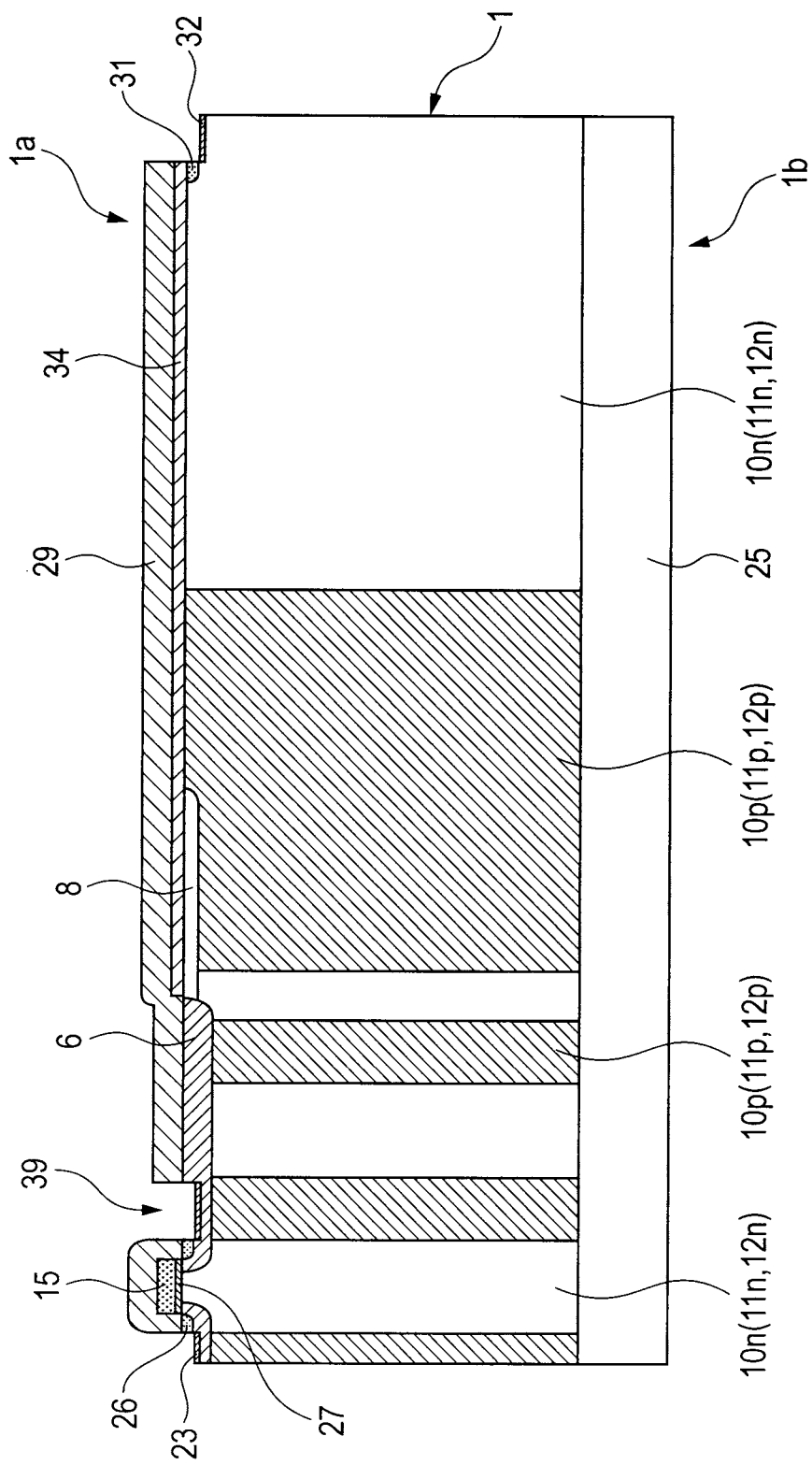
FIG. 21 is a wafer cross-sectional view of the device portion shown in FIG. 5 for illustrating the wafer process (step of extending the contact holes and introducing body contact regions) corresponding to the semiconductor device of the first embodiment of the first part of the present invention.
Figure 22:
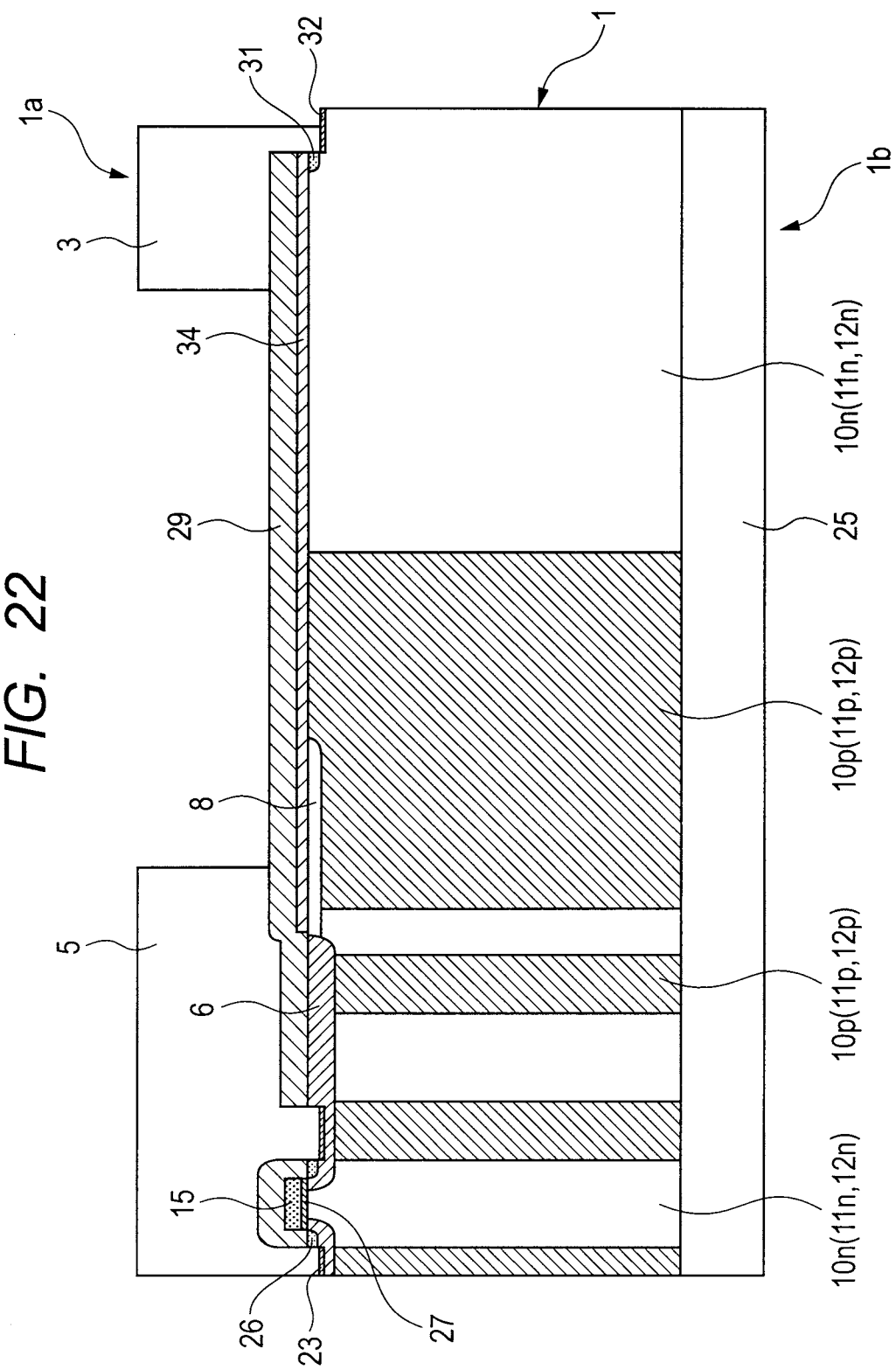
FIG. 22 is a wafer cross-sectional view of the device portion shown in FIG. 5 for illustrating the wafer process (step of forming an aluminum-based conductive film) corresponding to the semiconductor device of the first embodiment of the first part of the present invention.

FIG. 8 is a wafer cross-sectional view of a device portion shown in FIG. 5 for illustrating a wafer process (step of forming trenches) corresponding to the semiconductor device of the first embodiment of the present invention. FIG. 9 is a wafer cross-sectional view of the device portion shown in FIG. 5 for illustrating the wafer process (step of removing a hard mask for forming the trenches) corresponding to the semiconductor device of the first embodiment of the present invention. FIG. 10 is a wafer cross-sectional view of the device portion shown in FIG. 5 for illustrating the wafer process (step of filling the trenches with a P-type epitaxial layer) corresponding to the semiconductor device of the first embodiment of the present invention. FIG. 11 is a wafer cross-sectional view of the device portion shown in FIG. 5 for illustrating the wafer process (CMP step) corresponding to the semiconductor device of the first embodiment of the present invention. FIG. 12 is a wafer cross-sectional view of the device portion shown in FIG. 5 for illustrating the wafer process (step of introducing the P⁻-type surface resurf region) corresponding to the semiconductor device of the first embodiment of the present invention. FIG. 13 is a wafer cross-sectional view of the device portion shown in FIG. 5 for illustrating the wafer process (step of patterning the field oxide film) corresponding to the semiconductor device of the first embodiment of the present invention. FIG. 14 is a wafer cross-sectional view of the device portion shown in FIG. 5 for illustrating the wafer process (step of introducing the P body region) corresponding to the semiconductor device of the first embodiment of the present invention. FIG. 15 is a wafer cross-sectional view of the device portion shown in FIG. 5 for illustrating the wafer process (step of forming the gate insulating film) corresponding to the semiconductor device of the first embodiment of the present invention. FIG. 16 is a wafer cross-sectional view of the device portion shown in FIG. 5 for illustrating the wafer process (step of forming a gate polysilicon film) corresponding to the semiconductor device of the first embodiment of the present invention. FIG. 17 is a wafer cross-sectional view of the device portion shown in FIG. 5 for illustrating the wafer process (step of patterning the gate polysilicon film into the gate electrodes) corresponding to the semiconductor device of the first embodiment of the present invention. FIG. 18 is a wafer cross-sectional view of the device portion shown in FIG. 5 for illustrating the wafer process (step of forming the source regions) corresponding to the semiconductor device of the first embodiment of the present invention. FIG. 19 is a wafer cross-sectional view of the device portion shown in FIG. 5 for illustrating the wafer process (step of forming the interlayer insulating film) corresponding to the semiconductor device of the first embodiment of the present invention. FIG. 20 is a wafer cross-sectional view of the device portion shown in FIG. 5 for illustrating the wafer process (step of forming contact holes) corresponding to the semiconductor device of the first embodiment of the present invention. FIG. 21 is a wafer cross-sectional view of the device portion shown in FIG. 5 for illustrating the wafer process (step of extending the contact holes and introducing the body contact regions) corresponding to the semiconductor device of the first embodiment of the present invention. FIG. 22 is a wafer cross-sectional view of the device portion shown in FIG. 5 for illustrating the wafer process (step of forming an aluminum-based conductive film) corresponding to the semiconductor device of the first embodiment of the present invention. Based on these drawings, a description will be given to a wafer process corresponding to the semiconductor device of the first embodiment of the present invention or the like.

First, as shown in FIG. 8, the semiconductor wafer 1 is prepared in which, over the N-type single-crystal silicon substrate 25 (which is, e.g., a 200 mm wafer but may also have a wafer diameter of 150 mm, 300 mm, or 450 mm) doped with, e.g., antimony (at a concentration of the order of, e.g., about $10^{18}/cm^3$ to $10^{19}/cm^3$), a phosphorus-doped N-epitaxial layer 10n (drift region at a concentration of the order of, e.g., about $10^{15}/cm^3$, which is a portion serving as the N-type drift region 11n and also partly serving as the N columns 12n) having a thickness of, e.g., about 45 micrometers is formed. Over a device surface 1a (main surface opposite to the back surface 1b) of the semiconductor wafer 1, a hard mask film 33 for forming P-type column trenches made of, e.g., P-TEOS (Plasma-Tetraethylorthosilicate) or the like is formed. Next, as shown in FIG. 8, using the hard mask 33 for forming P-type column trenches as a mask, the N epitaxial layer 10n and the like are dry-etched to form P-type column trenches 20. Examples of a dry etching atmosphere that can be shown include an atmosphere containing, e.g., Ar, $SF_6$, $O_2$, and so forth as main gas components. Examples of the range of the depth of dry etching that can be shown include a range of, e.g., about 40 to 55 micrometers. Note that the P-type column trenches 20 preferably reach the N-type single-crystal silicon substrate 25. However, the P-type column trenches 20 need not necessarily reach the N-type single-crystal silicon substrate 25 as long as they are proximate thereto.

Next, as shown in FIG. 9, the hard mask 33 that is no longer needed is removed.

Next, as shown in FIG. 10, filling epitaxial growth (in-trench epitaxial filling method) is performed with respect to the P-type column trenches 20 to form a P-type filling epitaxial layer 10p (dopant is boron at a concentration of the order of, e.g., about $10^{15}/cm^3$). The P-type epitaxial region 10p is a portion serving as the P-type drift region 11p and also serving as the P columns 12p. Examples of conditions for the filling epitaxial growth that can be shown include a processing pressure of, e.g., about $1.3 \times 10^4$ Pascal to $1.0 \times 10^5$ Pascal, a raw material gas of silicon tetrachloride, trichlorosilane, dichlorosilane, monosilane, or the like.

Next, as shown in FIG. 11, the P-type filling epitaxial layer 10p located outside the P-type column trenches 20 is removed by a planarizing step, e.g., CMP (Chemical Mechanical Polishing), while the surface 1a of the semiconductor wafer 1 is simultaneously planarized. Note that, here, a super-junction structure as shown in FIG. 11 may also be formed by a multi-epitaxial method besides the trench fill method.

Next, as shown in FIG. 12, the silicon oxide film 34 (field insulating film) is formed by thermal oxidation over substantially the entire top surface 1a of the semiconductor wafer 1, and a resist film 35 for introducing $P^-$-type resurf region is formed thereover by lithography. Examples of the thickness of the field insulating film 34 that can be shown include about 350 nm.

Subsequently, using the resist film 35 for introducing $P^-$-type resurf region as a mask, the $P^-$-type surface resurf region 8 is introduced by ion implantation (of, e.g., boron). Examples of conditions for the ion implantation that can be shown include an ion species of boron, an implantation energy in a preferred range around, e.g., 200 keV, and a dose in a preferred range of, e.g., about $1 \times 10^{11}/cm^2$ to $1 \times 10^{12}/cm^2$. Thereafter, the resist film 35 that is no longer needed is removed.

Next, as shown in FIG. 13, over the top surface 1a of the semiconductor wafer 1, a resist film 36 for etching silicon oxide film is formed by lithography. Subsequently, using the resist film 36 as a mask, the field insulating film 34 is patterned by dry etching using, e.g., a fluorocarbon-based etching gas or the like. Thereafter, the resist film 36 that is no longer needed is entirely removed.

Next, as shown in FIG. 14, a resist film 37 for introducing P body region is formed over the top surface 1a of the semiconductor wafer 1 by lithography (typically, prior to the formation of the resist film 37, a protective film against ion implantation such as a thermal oxidation film of, e.g., about 10 nm is formed over the top surface 1a of the semiconductor wafer 1, but a depiction thereof is omitted to prevent complicated illustration, which is also the same in other portions). Subsequently, using the resist film 37 for introducing P body region as a mask, the P body region 6 is introduced by ion implantation. Examples of conditions for the ion implantation that can be shown include: (1) an ion species of boron, an implantation energy in a preferred range around, e.g., 200 keV, and a dose in a preferred range around the order of, e.g., $10^{13}/cm^2$, which are for a first step; and (2) an ion species of boron, an implantation energy in a preferred range around, e.g., 75 keV, and a dose in a preferred range around the order of, e.g., $10^{12}/cm^2$ (a concentration is on the order of, e.g., about $10^{17}/cm^3$), which are for a second step. Thereafter, as shown in FIG. 14, the resist film 37 that is no longer needed is entirely removed.

Next, as shown in FIG. 15, over the top surface 1a of the semiconductor wafer 1, the gate oxide film 27 (gate insulating film) is formed. An exemplary thickness of the gate insulating film 27 that can be shown ranges from, e.g., about 50 nm to 200 nm, though it depends on a breakdown voltage. Examples of film deposition method that can be shown include a CVD (Chemical Vapor Deposition), a thermal oxidation method, and the like. Note that, to wafer cleaning prior to gate oxidation, wet cleaning can be applied which uses, e.g., a first cleaning solution, i.e., a mixed solution of ammonia, hydrogen peroxide, and pure water at 1:1:5 (volume ratio) and a second cleaning solution, i.e., a mixed solution of hydrochloric acid, hydrogen peroxide, and pure water at 1:1:6 (volume ratio).

Next, as shown in FIG. 16, over the gate oxide film 27, a gate electrode polysilicon film 15 (having a thickness of, e.g., about 200 nm to 800 nm) is formed by, e.g., low-pressure CVD (Chemical Vapor Deposition).

Next, as shown in FIG. 17, the gate electrode polysilicon film 15 is patterned by dry etching into the gate electrodes 15.

Next, as shown in FIG. 18, a resist film 38 for introducing N+ source regions is formed by lithography and, using the resist film 38 as a mask, the N+ source regions 26 and the N+ channel stopper region 31 in the chip edge portion are introduced by ion implantation. Examples of conditions for the ion implantation that can be shown include an ion species of arsenic, an implantation energy in a preferred range around, e.g., 40 keV, and a dose in a preferred range around the order of, e.g., $10^{15}/cm^2$ (a concentration is on the order of, e.g., about $10^{20}/cm^3$). Thereafter, the resist film 38 that is no longer needed is entirely removed.

Next, as shown in FIG. 19, over substantially the entire surface of the top surface 1a of the semiconductor wafer 1, the PSG (Phospho-Silicate-Glass) film 29 (interlayer insulating film) is deposited by CVD or the like. Note that, as the interlayer insulating film 29, a BPSG film, a TEOS film, a SOG film, a HDP (High Density Plasma) silicon oxide film, a PSG film, or a laminate film of a plurality of any of the foregoing films may also be used besides the PSG film. Preferred examples of the total thickness of the interlayer insulating film 29 that can be shown include about 900 nm.

Next, as shown in FIG. 20, over the top surface 1a of the semiconductor wafer 1, a resist film 41 for forming source contact holes is formed and, using the resist film 41 as a mask, source contact holes 39 and the like are opened by dry etching. Subsequently, the resist film 41 that is no longer needed is entirely removed.

Next, as shown in FIG. 21, the silicon substrate is etched and then, by ion implantation, the P+ body contact regions 23 and the P+ chip peripheral contact region 32 are introduced. Examples of conditions for ion implantation that can be shown include an ion species of $BF_2$, an implantation energy in a preferred range around, e.g., 30 keV, and a dose in a preferred range around the order of, e.g., $10^{15}/cm^2$ (a concentration is on the order of, e.g., about $10^{19}/cm^3$).

Next, as shown in FIG. 22, an aluminum-based metal layer is deposited by sputtering or the like via a barrier metal film of TiW or the like and patterned to form the metal source electrode 5, the guard ring electrode 3, and the like.

Then, as necessary, a final passivation film such as, e.g., an inorganic final passivation film or an organic-inorganic final passivation film is formed in an upper layer, and pad openings and gate openings are formed therein. As the final passivation film, a single-layer film such as an inorganic final passivation film or an organic-inorganic final passivation film may be formed or, besides, an organic-inorganic final passivation film or the like may also be laminated over an under-layer inorganic final passivation film.

Next, a back grinding treatment is performed to reduce the original wafer thickness (e.g., about 750 micrometers) to, e.g., about 80 to 280 micrometers (i.e., a thickness less than 300 micrometers).

In addition, over the back surface 1b of the wafer 1, the metal back-surface drain electrode 24 (see FIGS. 5 to 7) is deposited by sputtering film deposition. The back-surface metal electrode film 24 includes, e.g., a back-surface titanium film (diffusion preventing layer of gold and nickel), a back-surface nickel film (adhesive layer to a chip bonding material), a back-surface gold film (oxidation preventing layer of nickel) which are mentioned in order of increasing distance from the wafer 1, and the like. Thereafter, the wafer 1 is divided into individual chips, resulting in a device as shown in FIG. 1.

3. Description of Device Structure (Peripheral 3D Super-Junction, Half-Range P– Resurf Layer, and Floating Field Plates) of Power MOSFET with Super-Junction Structure, Etc. as Example of Semiconductor Device of Second Embodiment of Present Invention (See Mainly FIGS. 23 to 26)

An example described in this section is the same as the structure described in the first section (e.g., FIGS. 1, 2, and 7 are the same) except for floating field plates so that a description will be given only to a different portion. In a device which does not have a super-junction structure in the periphery thereof, it is normally effective to dispose a ring-like floating field ring (field limiting ring) in a single-ring or double-ring configuration and thereby prevent undesired electric field concentration. However, in a device having a super-junction structure, it is generally difficult to use a floating field ring which is not completely depleted when a reverse voltage is applied to a main junction (in an OFF state). Therefore, here, a description will be given to the use of floating field plates as a replacement.

Figure 23:
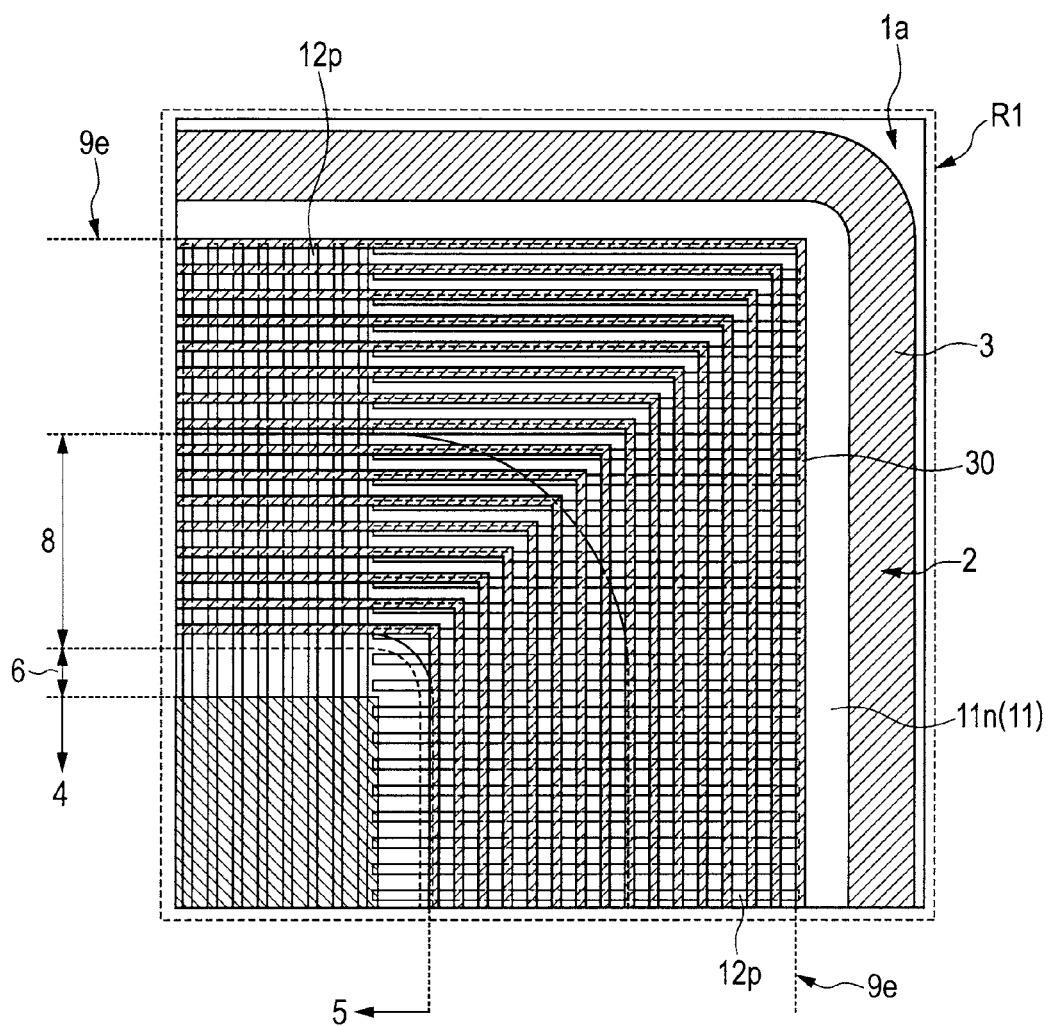
FIG. 23 is a top view (closer to a real equivalent) of a local portion of a chip corresponding to the cut-away region R1 of the chip corner portion of FIG. 1 of a power MOSFET having a super-junction structure as an example of a semiconductor device of a second embodiment (peripheral 3D super-junction, half-range P− resurf layer, and floating field plates) of the present invention.
Figure 24:
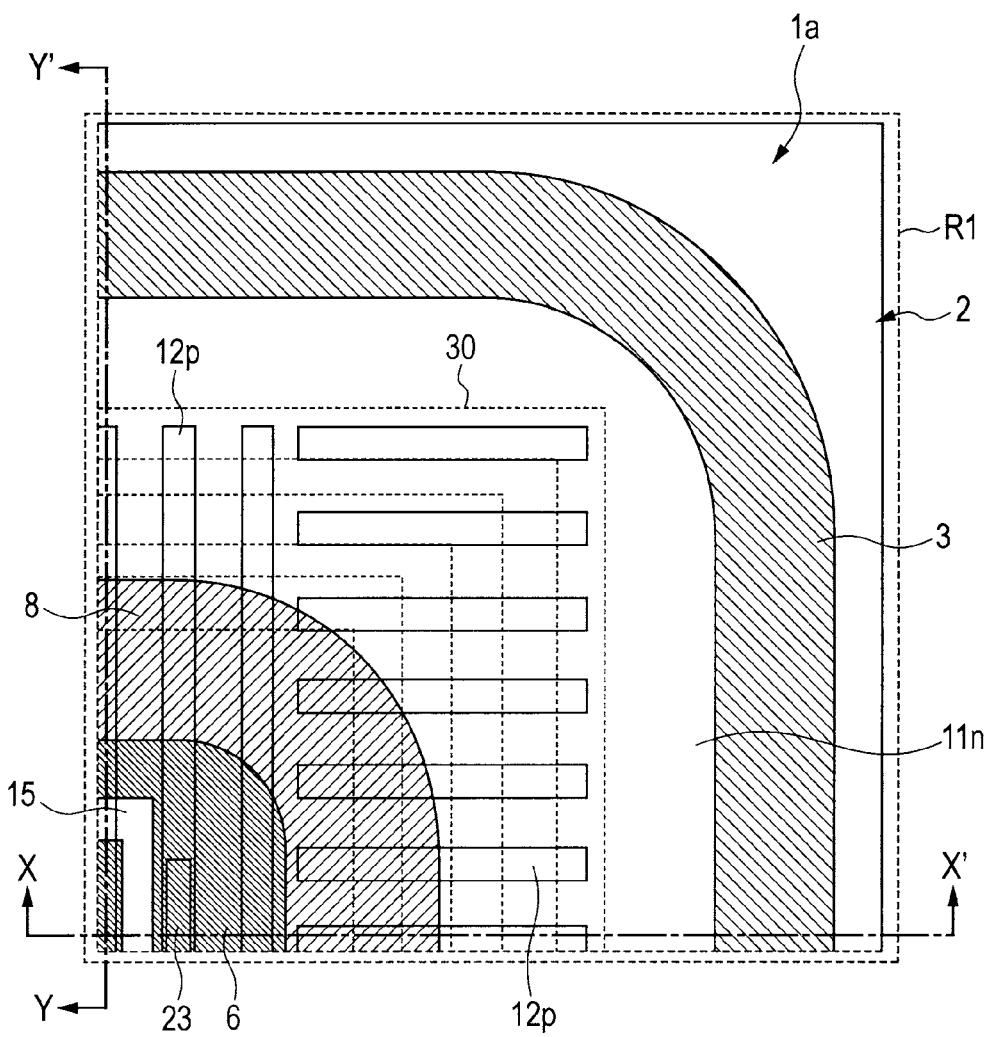
FIG. 24 is a top view (schematic diagram for illustration) of the local portion of the chip corresponding to the cut-away region R1 of the chip corner portion shown in FIG. 23.
Figure 25:
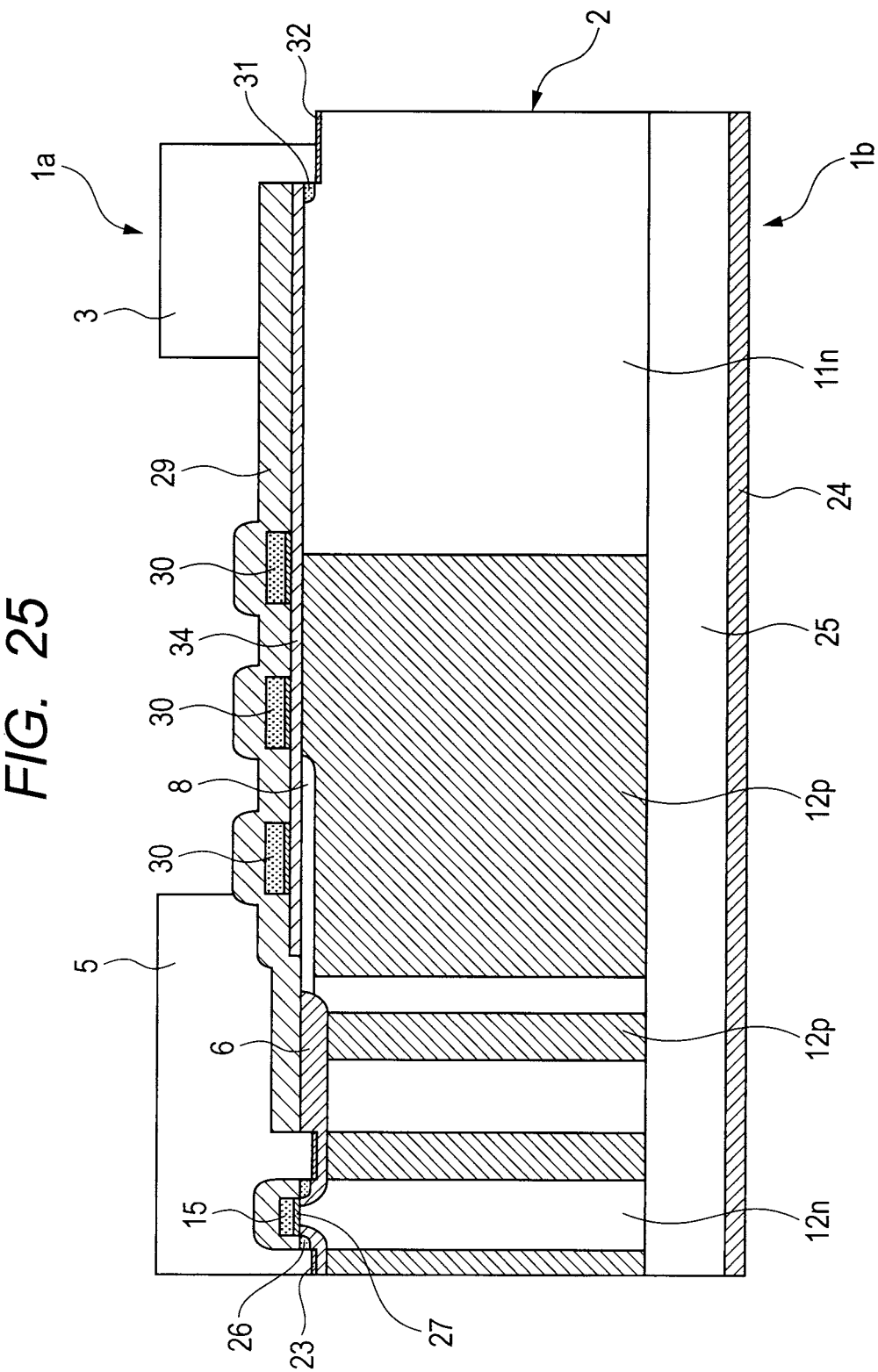
FIG. 25 is a cross-sectional view of a local portion of the chip corresponding to the X-X' cross section of FIG. 24.
Figure 26:
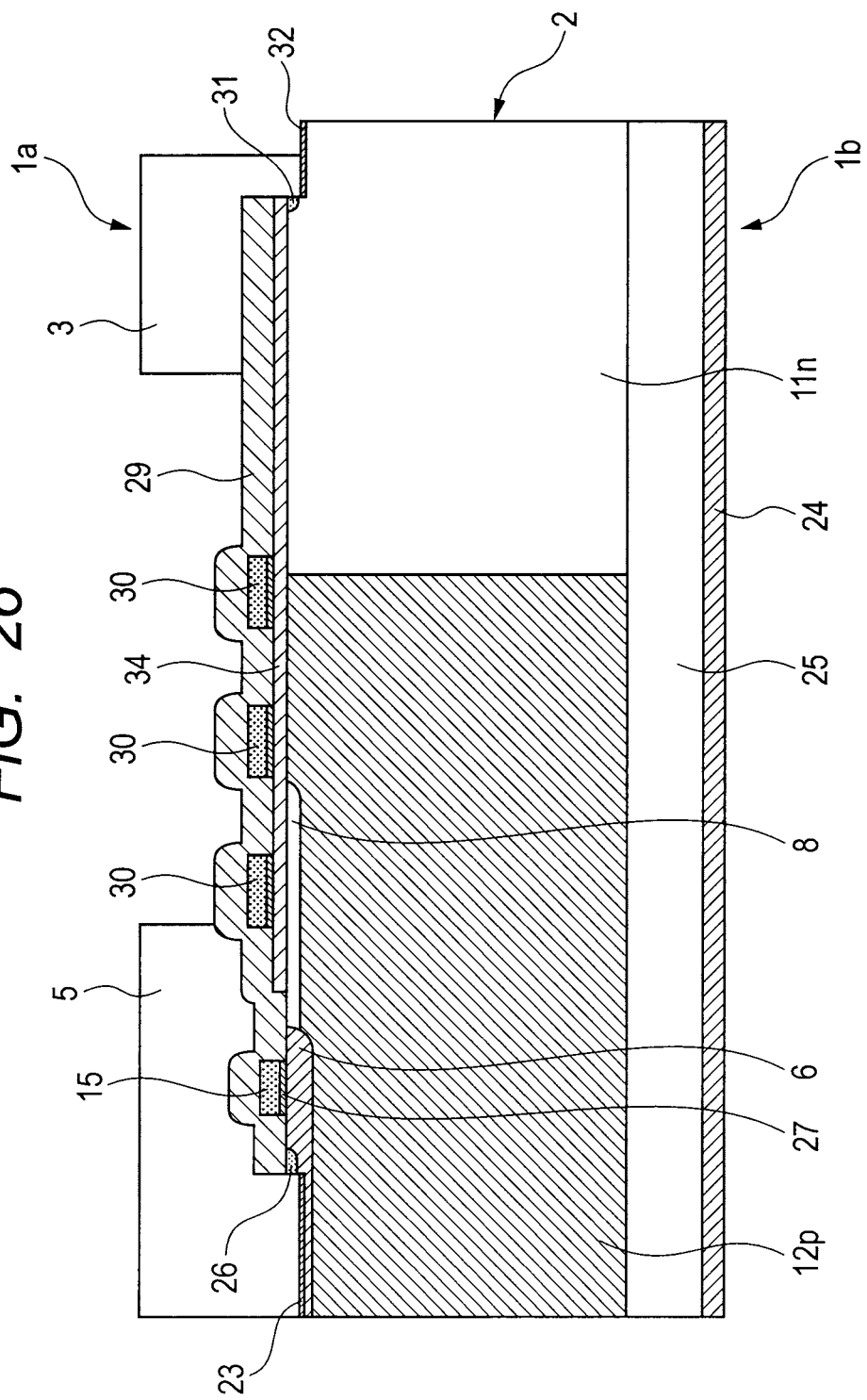
FIG. 26 is a cross-sectional view of a local portion of the chip corresponding to the Y-Y' cross section of FIG. 24.

FIG. 23 (corresponding to FIG. 3) is a top view (closer to a real equivalent) of a local portion of a chip corresponding to the cut-away region R1 of the chip corner portion of FIG. 1 of a power MOSFET having a super-junction structure as an example of a semiconductor device of a second embodiment (peripheral 3D super-junction, half-range P– resurf layer, and floating field plates) of the present invention. FIG. 24 (corresponding to FIG. 4) is a top view (schematic diagram for illustration) of the local portion of the chip corresponding to the cut-away region R1 of the chip corner portion shown in FIG. 23. FIG. 25 (corresponding to FIG. 5) is a cross-sectional view of a local portion of the chip corresponding to the X-X' cross section of FIG. 24. FIG. 26 (corresponding to FIG. 6) is a cross-sectional view of a local portion of the chip corresponding to the Y-Y' cross section of FIG. 24. Based on these drawings, a description will be given to a device structure (peripheral 3D super-junction, half-range P– resurf layer, and floating field plates) of a power MOSFET having a super-junction structure or the like as an example of the semiconductor device of the second embodiment of the present invention.

As shown in FIGS. 23 to 26, ring-like floating field plates 30 extending around the active cell region 4 (P-type main junction 6) are arranged in a multiple ring configuration to thereby reduce electric field concentration in the surface area of the drift region 11 without impairing the function of the super-junction structure. In this example, the floating field plates 30 are formed of, e.g., the same polysilicon layer as that of each of the gate polysilicon electrodes 15 so that a high-concentration impurity (e.g., phosphorus or arsenic in the case of adding an N-type impurity) has been added thereto. As shown in FIGS. 25 and 26, the floating field plates 30 are provided over, e.g., the field oxide film 34. Note that, since the plan configuration of each of the floating field plates 30 extends along the periphery of the chip 2, it has a substantially rectangular frame shape (ring shape), but the corner portions thereof may be rounded or shaped otherwise as necessary.

4. Description of Wafer Process Corresponding to Semiconductor device of second embodiment of present invention, Etc. (See Mainly FIGS. 27 to 33)

Basically, a process in this section is substantially the same as in the second section so that, hereinbelow, a description will be given only to a different portion. That is, FIGS. 8 to 15 are completely the same so that the description thereof will not be repeated. Therefore, the following description starts from the completion of the formation of the gate insulating film in FIG. 15.

Figure 27:
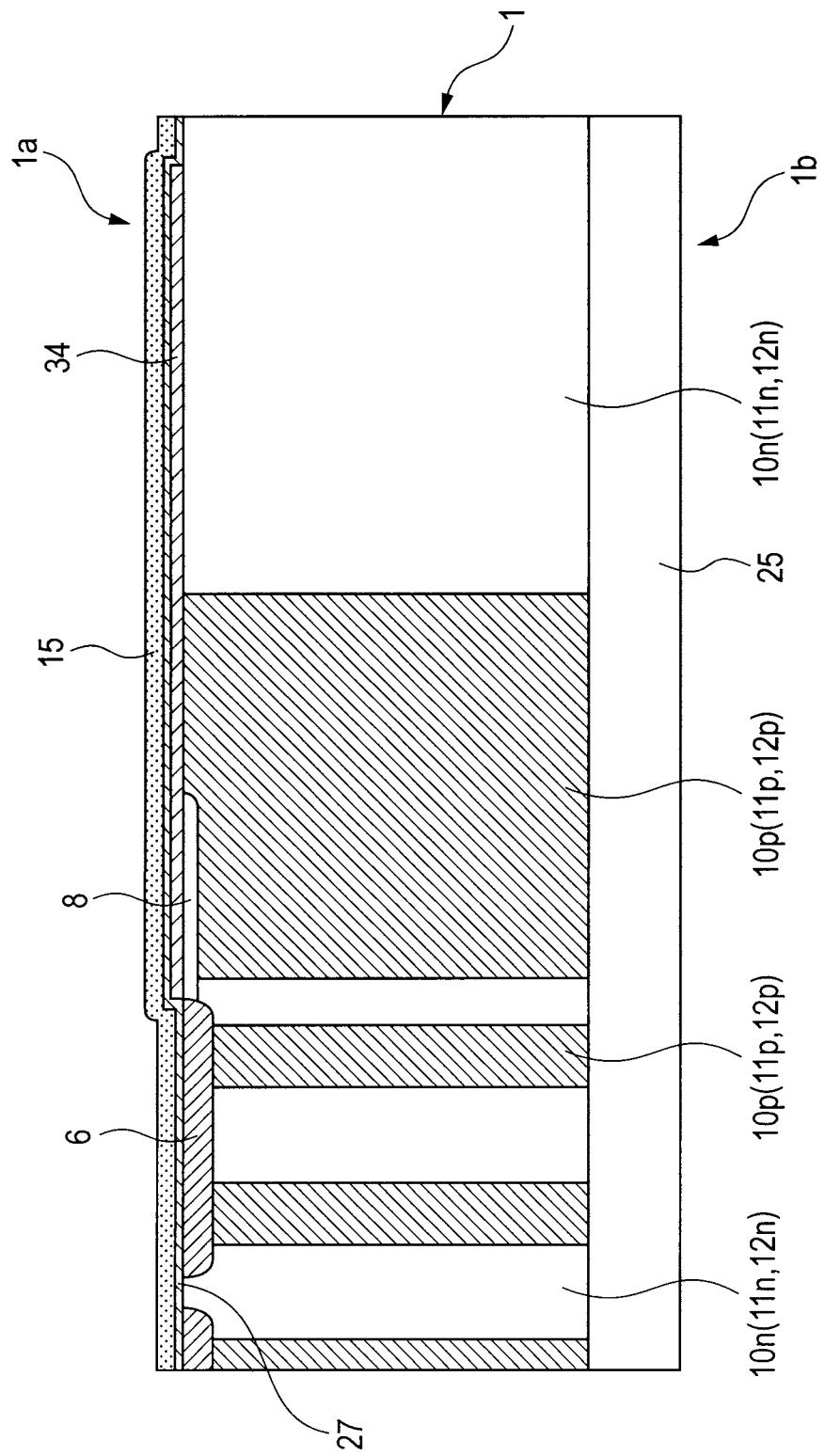
FIG. 27 is a wafer cross-sectional view (corresponding to FIG. 16 of the first embodiment of the first part) of the device portion shown in FIG. 25 for illustrating a wafer process (step of forming a gate polysilicon film) corresponding to the semiconductor device of the second embodiment of the present invention.
Figure 28:
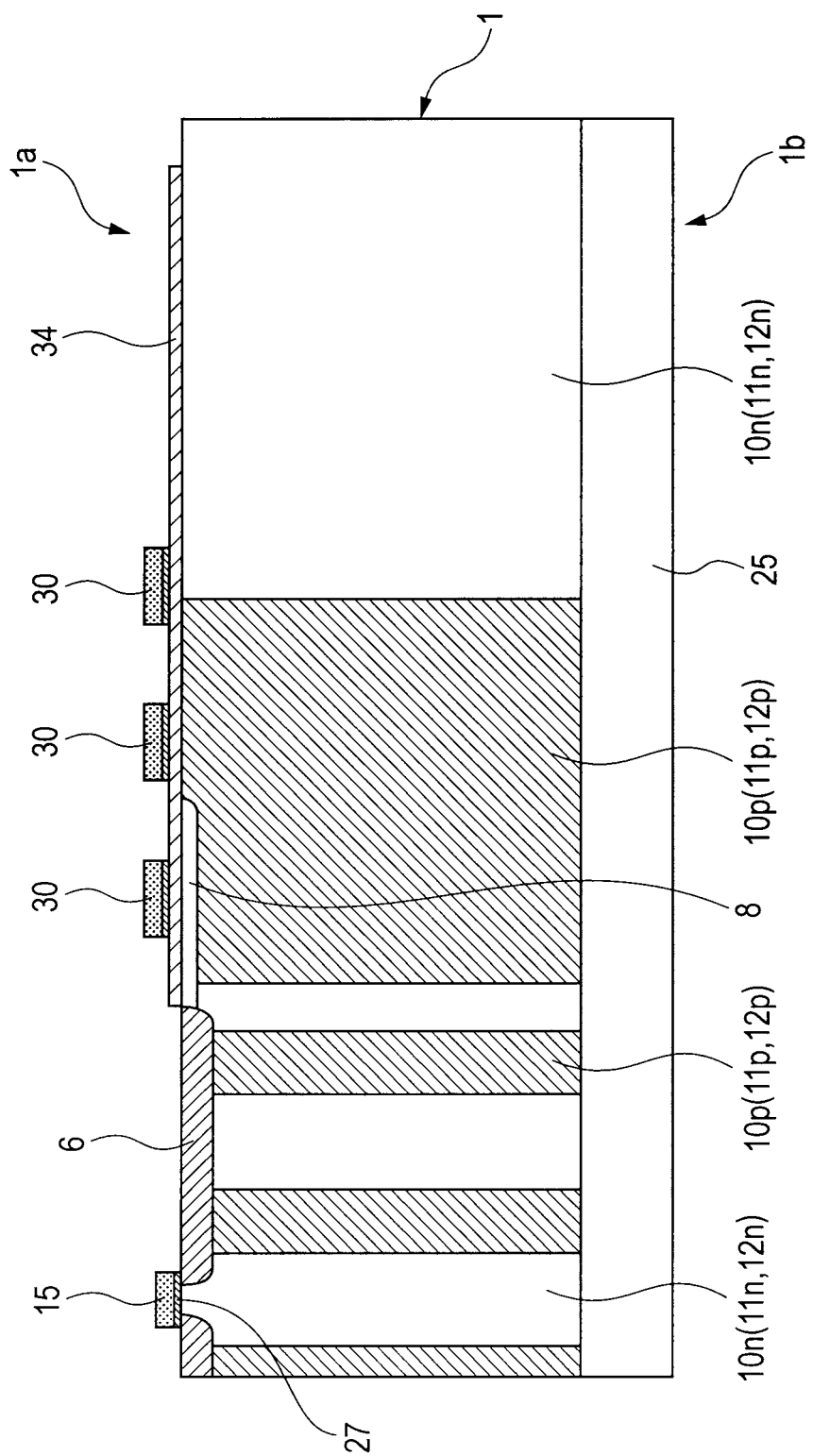
FIG. 28 is a wafer cross-sectional view (corresponding to FIG. 17 of the first embodiment of the first part) of the device portion shown in FIG. 25 for illustrating the wafer process (step of patterning the gate polysilicon film into gate electrodes) corresponding to the semiconductor device of the second embodiment of the present invention.
Figure 29:
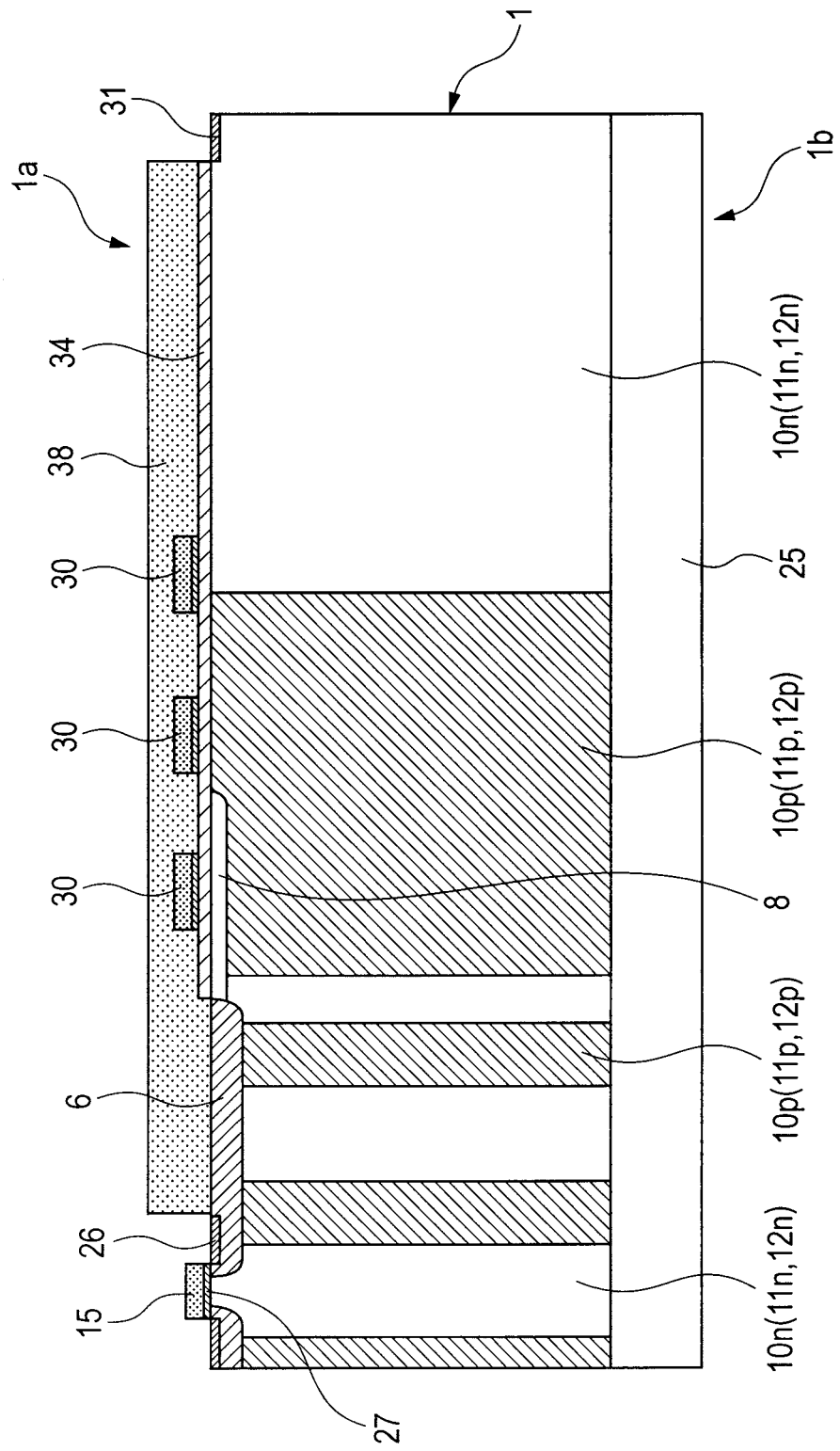
FIG. 29 is a wafer cross-sectional view (corresponding to FIG. 18 of the first embodiment of the first part) of the device portion shown in FIG. 25 for illustrating the wafer process (step of forming source regions) corresponding to the semiconductor device of the second embodiment of the present invention.
Figure 30:
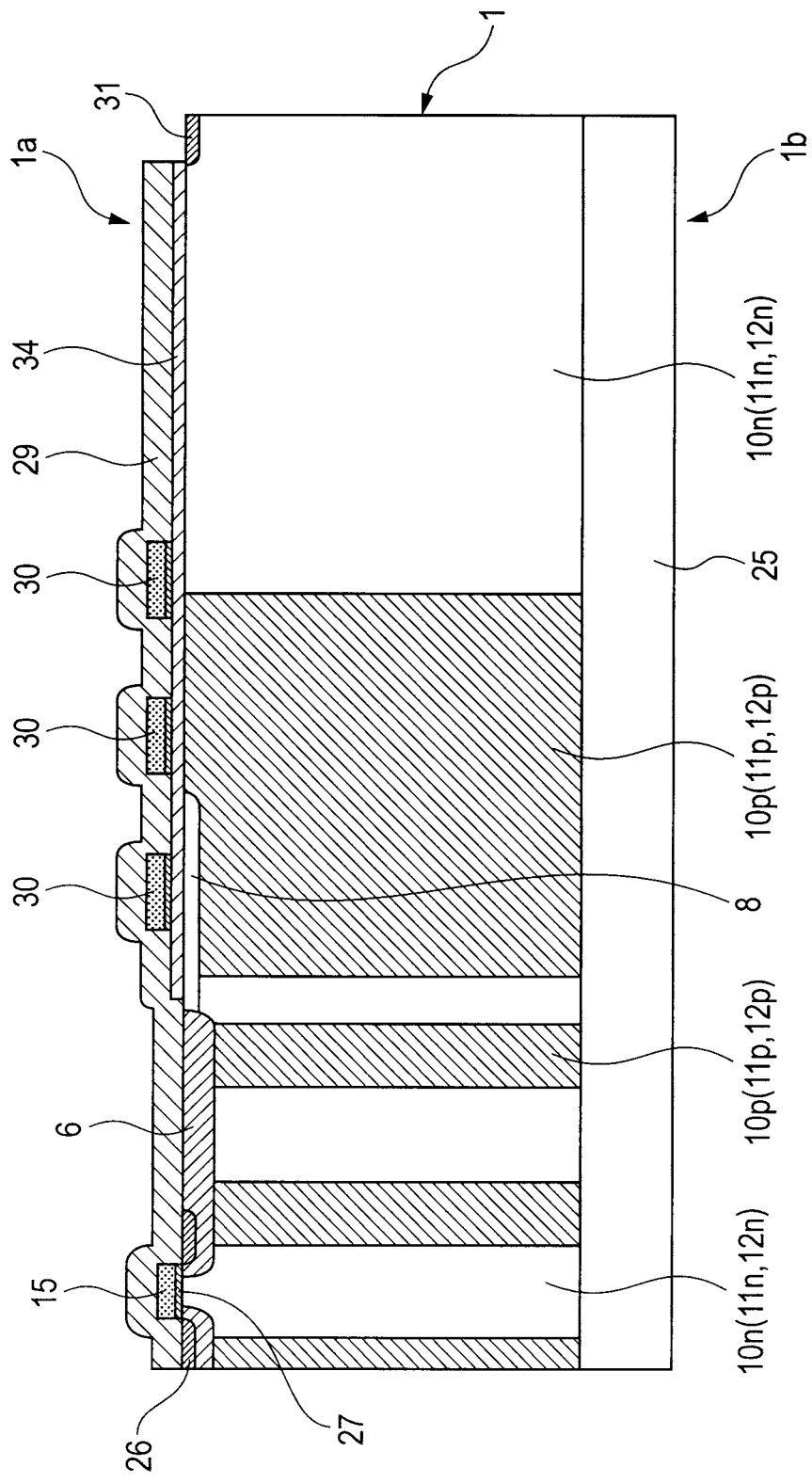
FIG. 30 is a wafer cross-sectional view (corresponding to FIG. 19 of the first embodiment of the first part) of the device portion shown in FIG. 25 for illustrating the wafer process (step of forming an interlayer insulating film) corresponding to the semiconductor device of the second embodiment of the present invention.
Figure 31:
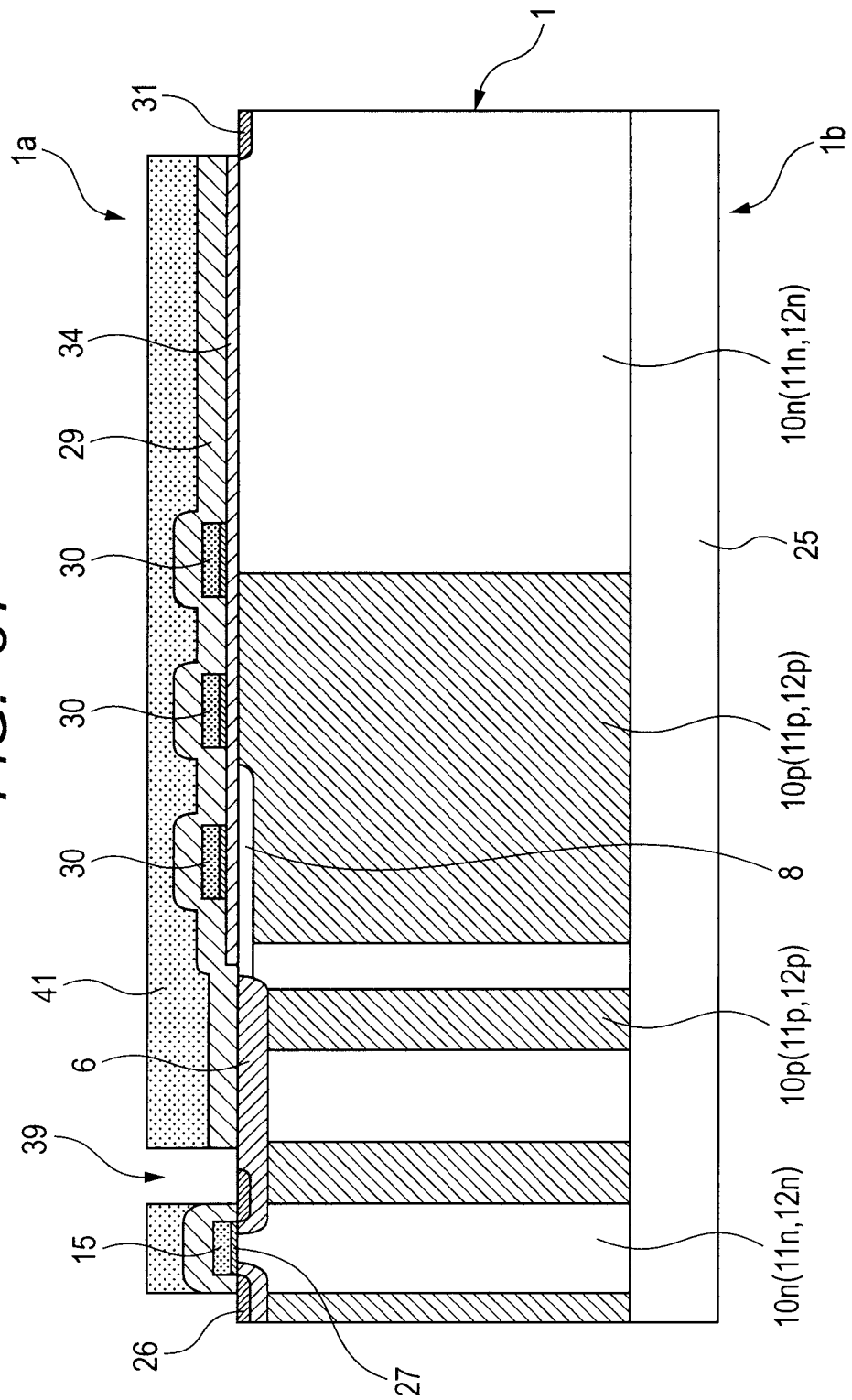
FIG. 31 is a wafer cross-sectional view (corresponding to FIG. 20 of the first embodiment of the first part) of the device portion shown in FIG. 25 for illustrating the wafer process (step of forming contact holes) corresponding to the semiconductor device of the second embodiment of the present invention.
Figure 32:
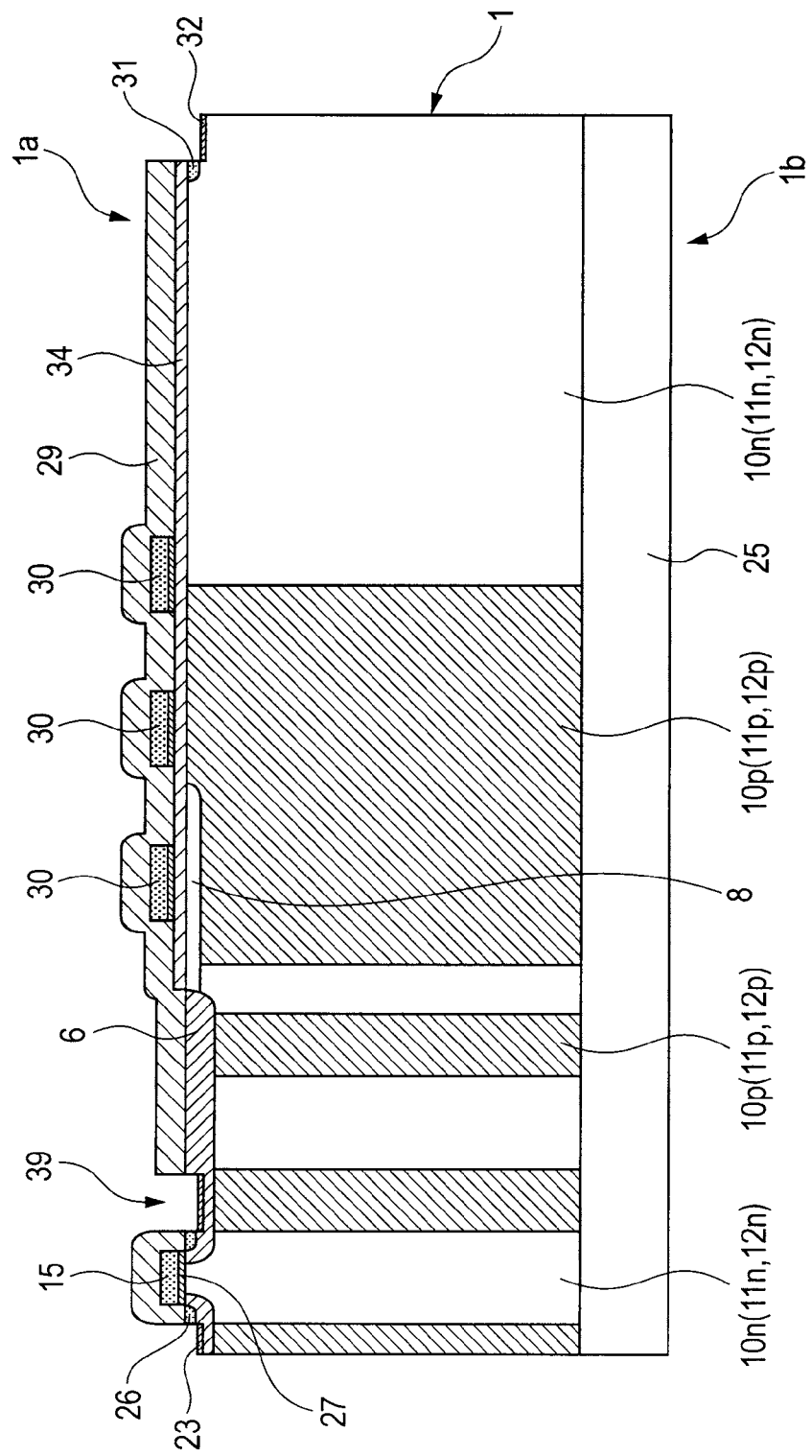
FIG. 32 is a wafer cross-sectional view (corresponding to FIG. 21 of the first embodiment of the first part) of the device portion shown in FIG. 25 for illustrating the wafer process (step of extending the contact holes and introducing body contact regions) corresponding to the semiconductor device of the second embodiment of the present invention.
Figure 33:
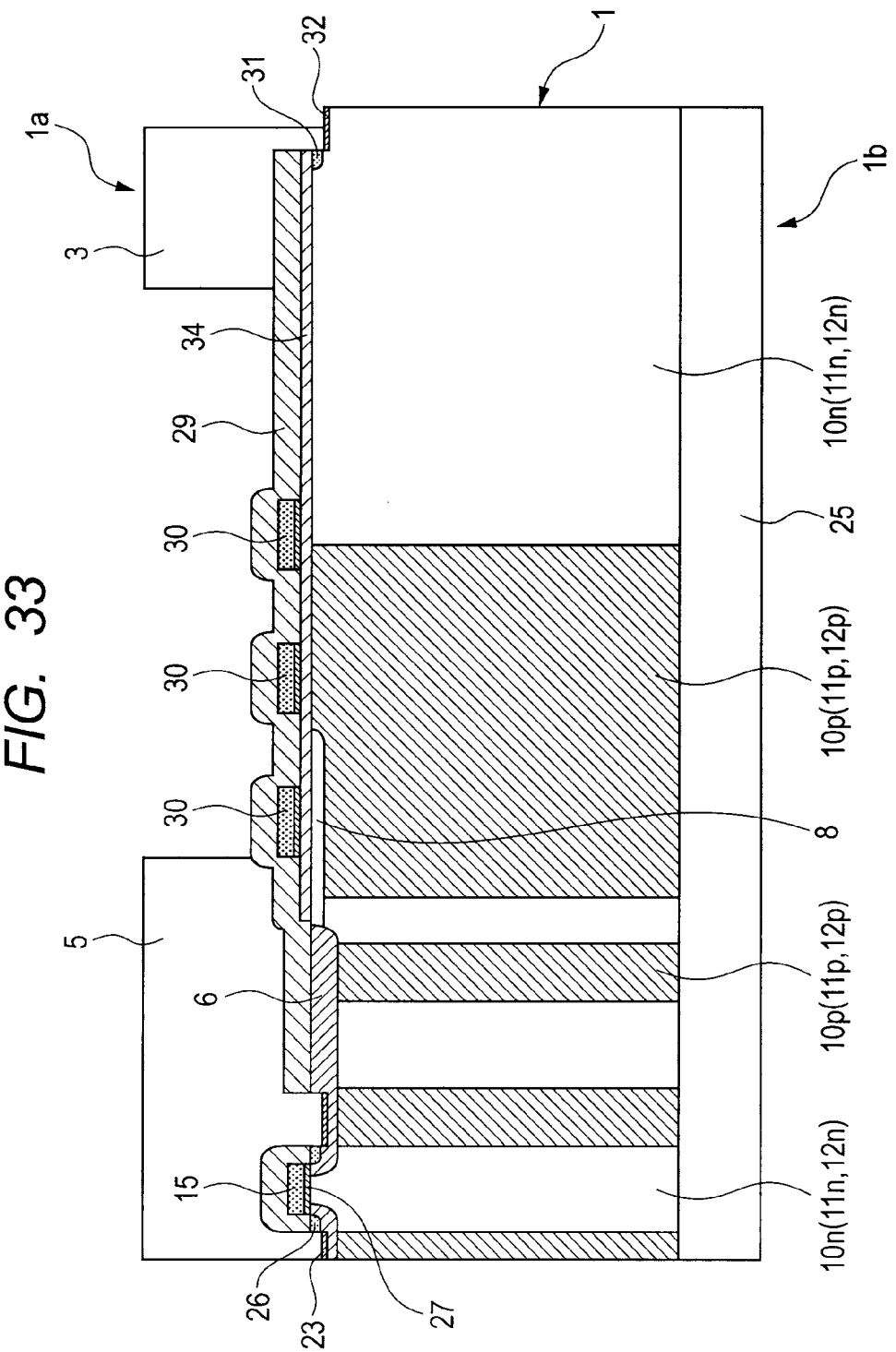
FIG. 33 is a wafer cross-sectional view (corresponding to FIG. 22 of the first embodiment of the first part) of the device portion shown in FIG. 25 for illustrating the wafer process (step of forming an aluminum-based conductive film) corresponding to the semiconductor device of the second embodiment of the present invention.

FIG. 27 is a wafer cross-sectional view (corresponding to FIG. 16 of the first embodiment) of the device portion shown in FIG. 25 for illustrating a wafer process (step of forming a gate polysilicon film) corresponding to the semiconductor device of the second embodiment of the present invention. FIG. 28 is a wafer cross-sectional view (corresponding to FIG. 17 of the first embodiment) of the device portion shown in FIG. 25 for illustrating the wafer process (step of patterning the gate polysilicon film into the gate electrodes) corresponding to the semiconductor device of the second embodiment of the present invention. FIG. 29 is a wafer cross-sectional view (corresponding to FIG. 18 of the first embodiment) of the device portion shown in FIG. 25 for illustrating the wafer process (step of forming source regions) corresponding to the semiconductor device of the second embodiment of the present invention. FIG. 30 is a wafer cross-sectional view (corresponding to FIG. 19 of the first embodiment) of the device portion shown in FIG. 25 for illustrating the wafer process (step of forming an interlayer insulating film) corresponding to the semiconductor device of the second embodiment of the present invention. FIG. 31 is a wafer cross-sectional view (corresponding to FIG. 20 of the first embodiment) of the device portion shown in FIG. 25 for illustrating the wafer process (step of forming contact holes) corresponding to the semiconductor device of the second embodiment of the present invention. FIG. 32 is a wafer cross-sectional view (corresponding to FIG. 21 of the first embodiment) of the device portion shown in FIG. 25 for illustrating the wafer process (step of extending the contact holes and introducing body contact regions) corresponding to the semiconductor device of the second embodiment of the present invention. FIG. 33 is a wafer cross-sectional view (corresponding to FIG. 22 of the first embodiment) of the device portion shown in FIG. 25 for illustrating the wafer process (step of forming an aluminum-based conductive film) corresponding to the semiconductor device of the second embodiment of the present invention. Based on these drawings, a description will be given to a wafer process corresponding to the semiconductor device of the second embodiment of the present invention.

Next, as shown in FIG. 27, over the gate oxide film 27, the gate electrode polysilicon film 15 (having a thickness of, e.g., about 200 nm to 800 nm) is formed by, e.g., low-pressure CVD (Chemical Vapor Deposition).

Next, as shown in FIG. 28, the gate electrode polysilicon film 15 is patterned by dry etching into the gate electrodes 15 and the floating field plates 30.

Next, as shown in FIG. 29, the resist film 38 for introducing N+ source regions is formed by lithography and, using the resist film 38 as a mask, the N+ source regions 26 and the N+ channel stopper region 31 in the chip edge portion are introduced by ion implantation. Examples of conditions for the ion implantation that can be shown include an ion species of arsenic, an implantation energy in a preferred range around, e.g., 40 keV, and a dose in a preferred range around the order of, e.g., $10^{15}/cm^2$ (a concentration is on the order of, e.g., about $10^{20}/cm^3$). Thereafter, the resist film 38 that is no longer needed is entirely removed.

Next, as shown in FIG. 30, over substantially the entire surface of the top surface 1a of the semiconductor wafer 1, the PSG (Phospho-Silicate-Glass) film 29 (interlayer insulating film) is deposited by CVD or the like. Note that, as the interlayer insulating film 29, a BPSG film, a TEOS film, a SOG film, a HDP (High Density Plasma) silicon oxide film, a PSG film, or a laminate film of a plurality of any of the foregoing films may also be used besides the PSG film. Preferred examples of the total thickness of the interlayer insulating film 29 that can be shown include about 900 nm.

Next, as shown in FIG. 31, over the top surface 1a of the semiconductor wafer 1, the resist film 41 for forming source contact holes is formed and, using the resist film 41 as a mask, the source contact holes 39 and the like are opened by dry etching. Subsequently, the resist film 41 that is no longer needed is entirely removed.

Next, as shown in FIG. 32, the silicon substrate is etched and then, by ion implantation, the P+ body contact regions 23 and the P+ chip peripheral contact region 32 are introduced. Examples of conditions for ion implantation that can be shown include an ion species of $BF_2$, an implantation energy in a preferred range around, e.g., 30 keV, and a dose in a preferred range around the order of, e.g., $10^{15}/cm^2$ (a concentration is on the order of, e.g., about $10^{19}/cm^3$).

Next, as shown in FIG. 33, an aluminum-based metal layer is deposited by sputtering or the like via a barrier metal film of TiW or the like and patterned to form the metal source electrode 5, the guard ring electrode 3, and the like.

Then, as necessary, a final passivation film such as, e.g., an inorganic final passivation film or an organic-inorganic final passivation film is formed in an upper layer, and pad openings and gate openings are formed therein. As the final passivation film, a single-layer film such as an inorganic final passivation film or an organic-inorganic final passivation film may be formed or, besides, an organic-inorganic final passivation film or the like may also be formed over an under-layer inorganic final passivation film.

Next, a back grinding treatment is performed to reduce the original wafer thickness (e.g., about 750 micrometers) to, e.g., about 80 to 280 micrometers (i.e., a thickness less than 300 micrometers).

In addition, over the back surface 1b of the wafer 1, the metal back-surface drain electrode 24 (see FIGS. 7, 25, and 26) is deposited by sputtering film deposition. The back-surface metal electrode film 24 includes, e.g., a back-surface titanium film (diffusion preventing layer of gold and nickel), a back-surface nickel film (adhesive layer to a chip bonding member), a back-surface gold layer (oxidation preventing layer of nickel) which are mentioned in order of increasing distance from the wafer 1, and the like. Thereafter, the wafer 1 is divided into individual chips, resulting in a device as shown in FIG. 1.

5. Description of Variations of Individual Components in Semiconductor Devices of First and Second Embodiments of Present Invention (See Mainly FIGS. 34 to 41)

In this section, a description will be given to variations of the individual components forming the devices of the first and third sections.

Figure 34:
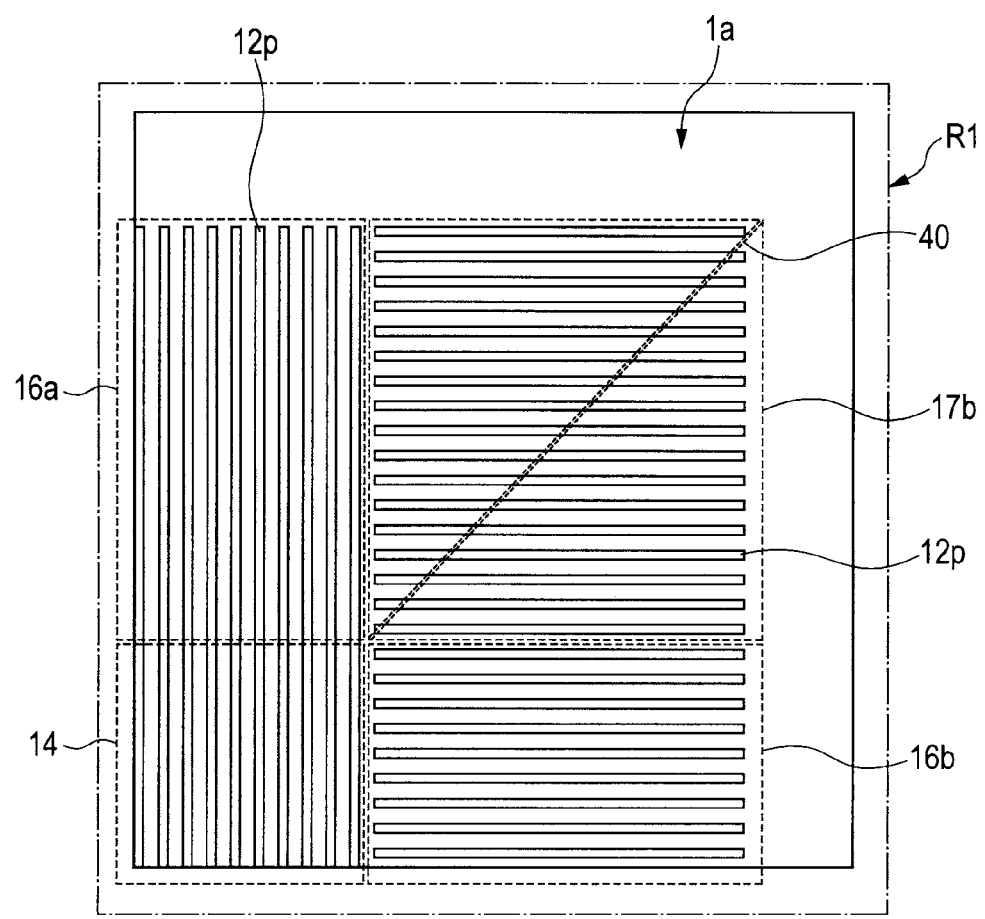
FIG. 34 is a top view (closer to a real equivalent) of a local portion of the chip which is the cut-away region R1 of the chip corner portion corresponding to FIG. 3 or 23 for illustrating a variation (asymmetrical standard arrangement) of individual components (column layout) in the semiconductor device of each of the first and second embodiments of the first part of the present invention.
Figure 35:
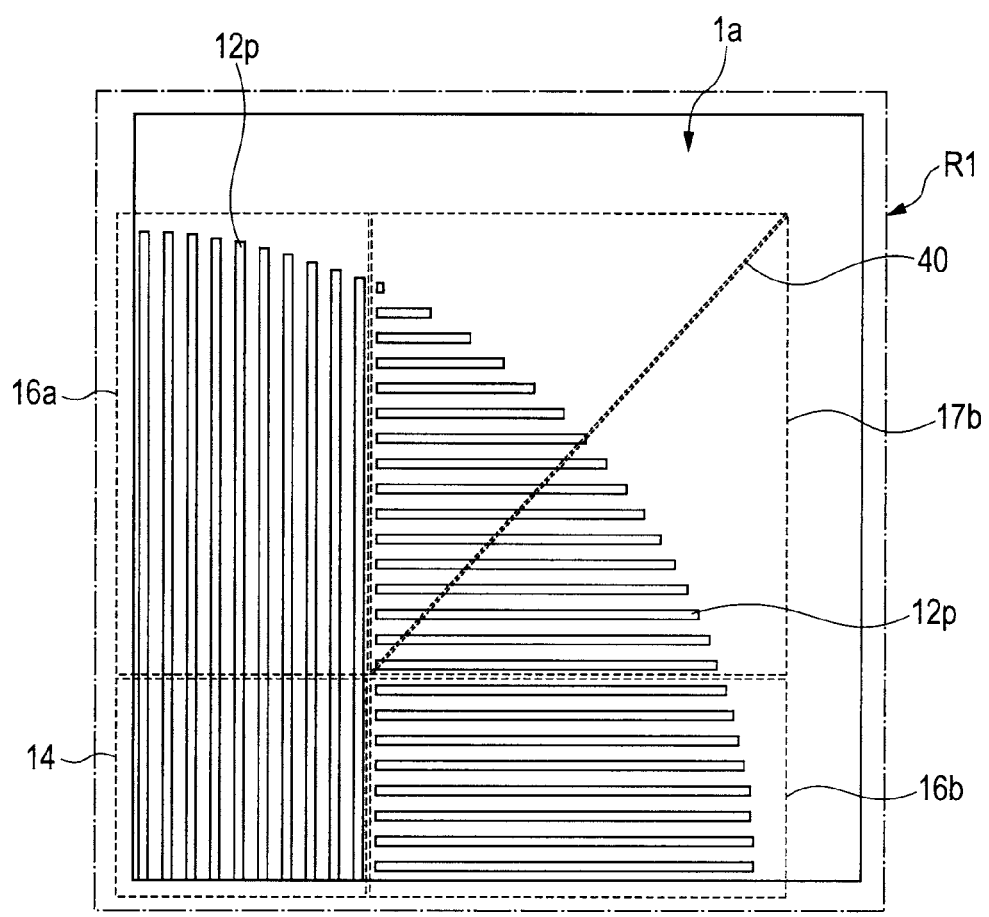
FIG. 35 is a top view (closer to the real equivalent) of the local portion of the chip which is the cut-away region R1 of the chip corner portion corresponding to FIG. 3 or 23 for illustrating a variation (asymmetrical trimmed arrangement) of the individual components (column layout) in the semiconductor device of each of the first and second embodiments of the first part of the present invention.
Figure 36:
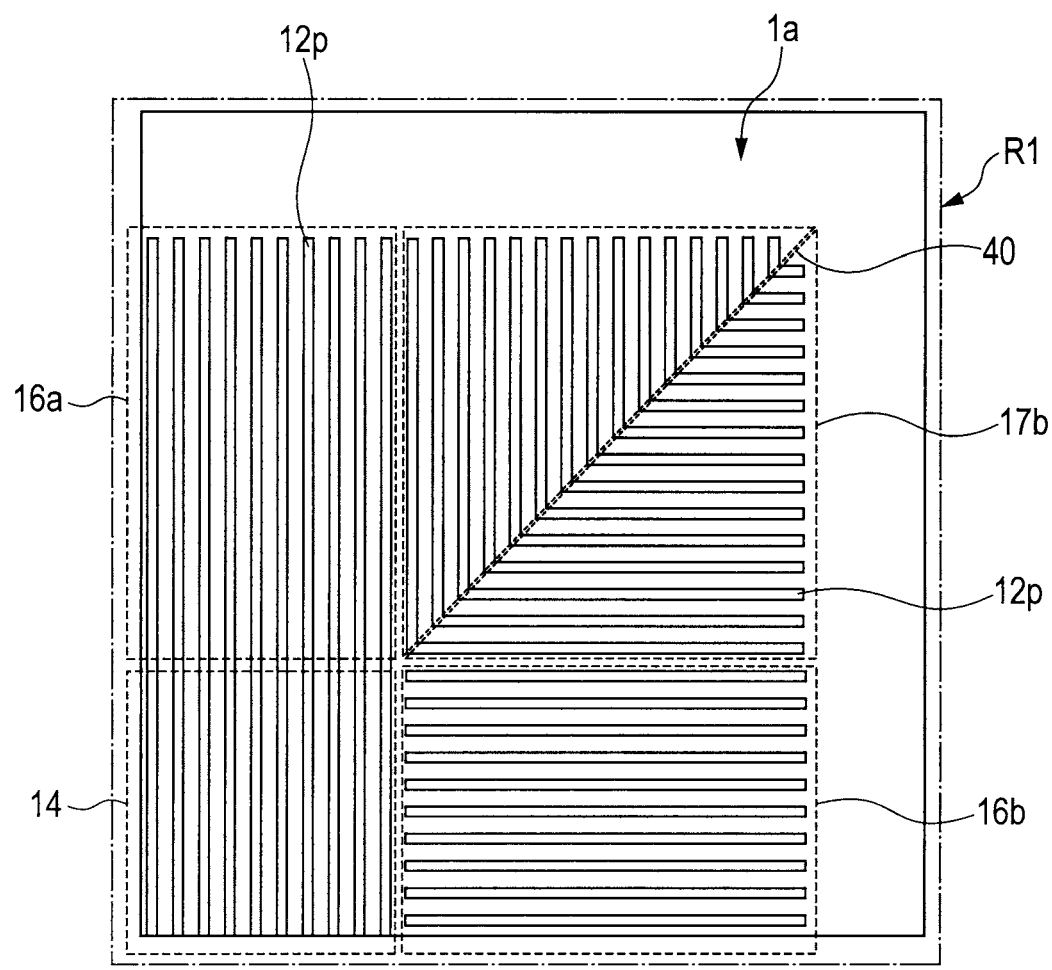
FIG. 36 is a top view (closer to the real equivalent) of the local portion of the chip which is the cut-away region R1 of the chip corner portion corresponding to FIG. 3 or 23 for illustrating a variation (symmetrical L-shaped arrangement) of the individual components (column layout) in the semiconductor device of each of the first and second embodiments of the first part of the present invention.

(1) Variations of Column Layout (See Mainly FIGS. 34 to 36).

FIG. 34 is a top view (closer to a real equivalent) of a local portion of the chip which is the cut-away region R1 of the chip corner portion corresponding to FIG. 3 or 23 for illustrating a variation (asymmetrical standard arrangement) of the individual components (column layout) in the semiconductor device of each of the first and second embodiments of the present invention. FIG. 35 is a top view (closer to the real equivalent) of the local portion of the chip which is the cut-away region R1 of the chip corner portion corresponding to FIG. 3 or 23 for illustrating a variation (asymmetrical trimmed arrangement) of the individual components (column layout) in the semiconductor device of each of the first and second embodiments of the present invention. FIG. 36 is a top view (closer to the real equivalent) of the local portion of the chip which is the cut-away region R1 of the chip corner portion corresponding to FIG. 3 or 23 for illustrating a variation (symmetrical L-shaped arrangement) of the individual components (column layout) in the semiconductor device of each of the first and second embodiments of the present invention. Based on these drawings, a description will be given to variations of the column layout.

FIG. 34 shows an "asymmetrical standard column layout" corresponding to the column layouts of FIGS. 3 and 23. Here, the wording "asymmetrical" shows that, when a diagonal line 40 of the semiconductor chip or the peripheral corner region is assumed to be a line-symmetry axis, the column layout is not substantially line-symmetrical. As shown in FIG. 34, in this example, the peripheral super-junction region basically has a 3D-Resurf structure. However, into the peripheral corner region 17b (17a, 17c, or 17d), symmetry in the peripheral side region 16b has been extended without being lost (having the same symmetry) so that, in terms of symmetry around the active-cell-portion super-junction structure 14, the layout has low symmetry. In this portion, the layout no longer has a pure 3D-Resurf structure, and may possibly reduce a breakdown voltage.

To solve the problem, the "asymmetrical trimmed column layout" shown in FIG. 35 has been proposed. In the column layout, the outsides of the P columns 12p have been trimmed to provide a configuration substantially matching the shape of an equi-potential surface (more precisely, a line of intersection of the equipotential surface and the top surface 1a of the chip 2) in a Blocking Mode. This achieves the effect of improving macroscopic symmetry in each of the peripheral corner regions 17a, 17b, 17c, and 17d and reducing the risk of a reduction in breakdown voltage in this portion.

Thus, in the example of FIG. 35, the macroscopic symmetry can be relatively easily improved. However, the line symmetry has been impaired, and the risk of a reduction in breakdown voltage due to the impaired line symmetry remains.

By contrast, FIG. 36 shows a "symmetrical L-shaped column layout", in which line symmetry with respect to the line-symmetry axis 40 has been given to the P columns 12p in the peripheral corner region 17b (17a, 17c, or 17d) to ensure microscopic symmetry.

These variations can be combined with the example of the first or third section and with each of the following variations of the other components.

(2) Variations of Placement and Shape of P⁻-Type Surface Resurf Region, Relationship Thereof with P Columns, Etc. (See Mainly FIGS. 37 to 39)

Figure 37:
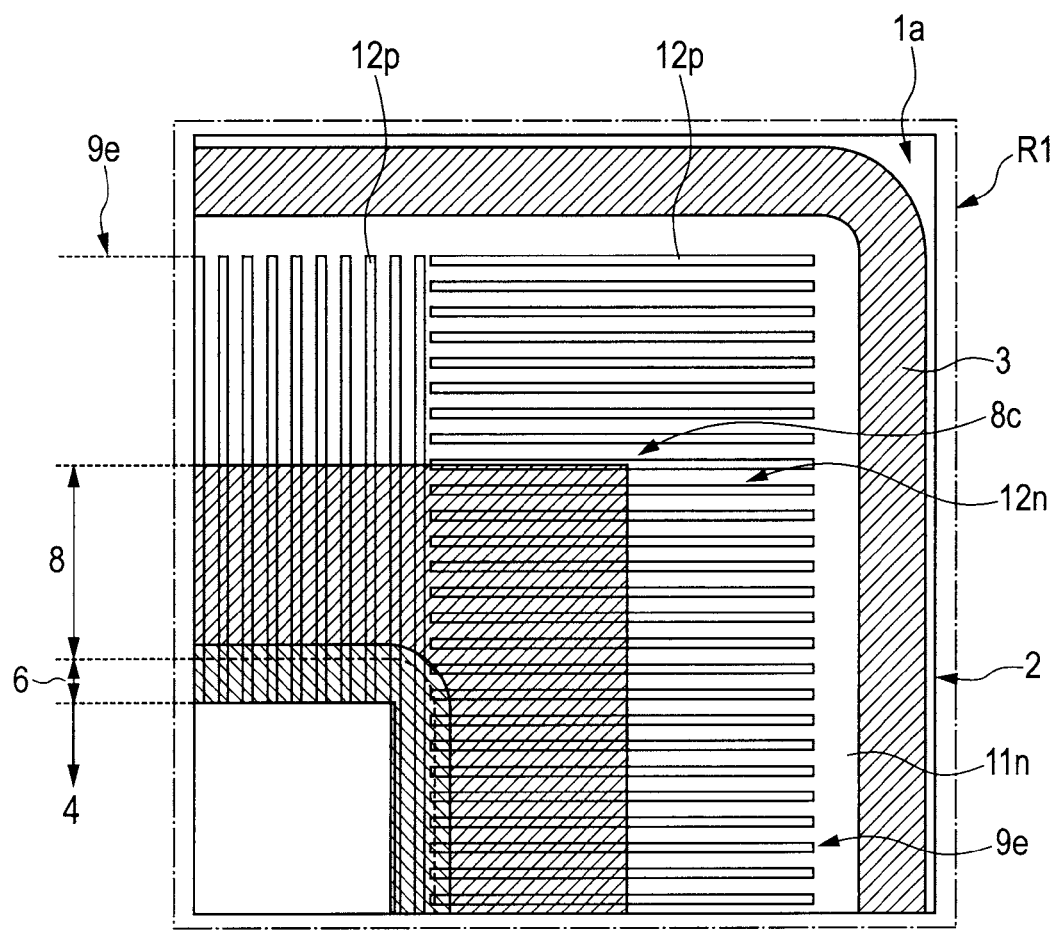
FIG. 37 is a top view (closer to the real equivalent) of the local portion of the chip which is the cut-away region R1 of the chip corner portion corresponding to FIG. 3 or 23 showing a combination of the asymmetrical standard column layout of FIG. 34 and a rectangular P−-type surface resurf region.
Figure 38:
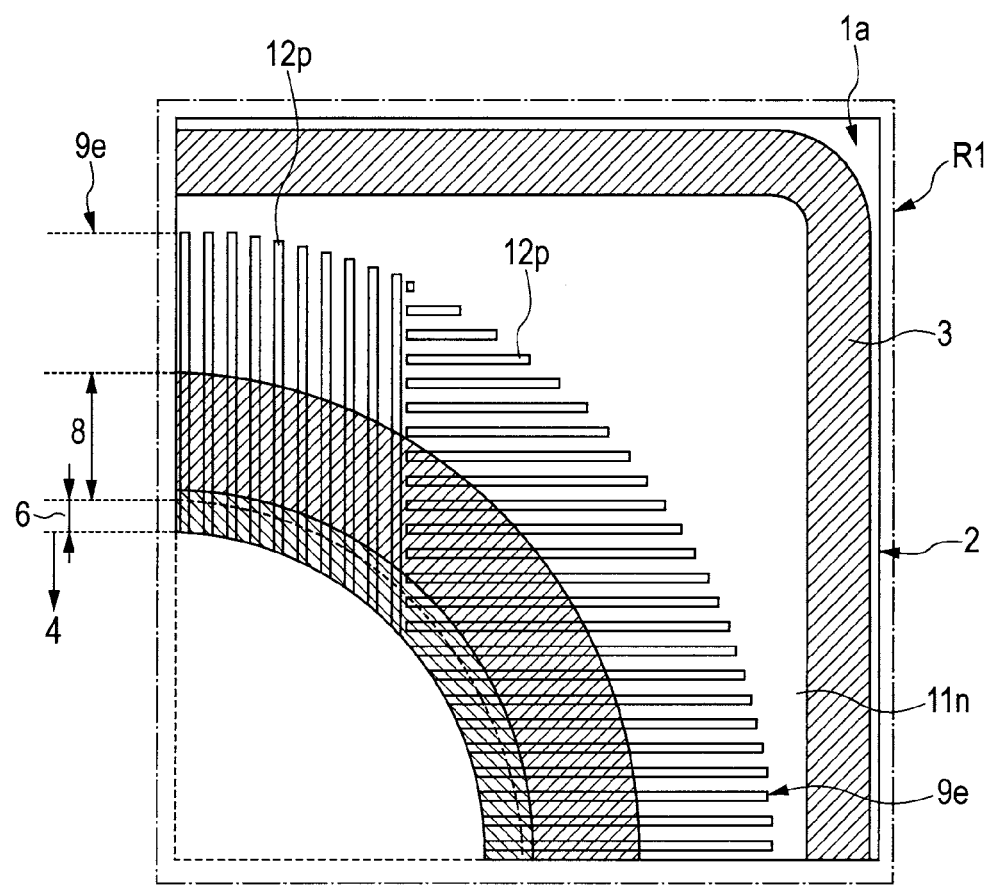
FIG. 38 is a top view (closer to the real equivalent) of the local portion of the chip which is the cut-away region R1 of the chip corner portion corresponding to FIG. 3 or 23 showing a combination of the asymmetrical trimmed column layout of FIG. 35 and the rectangular P−-type surface resurf region.
Figure 39:
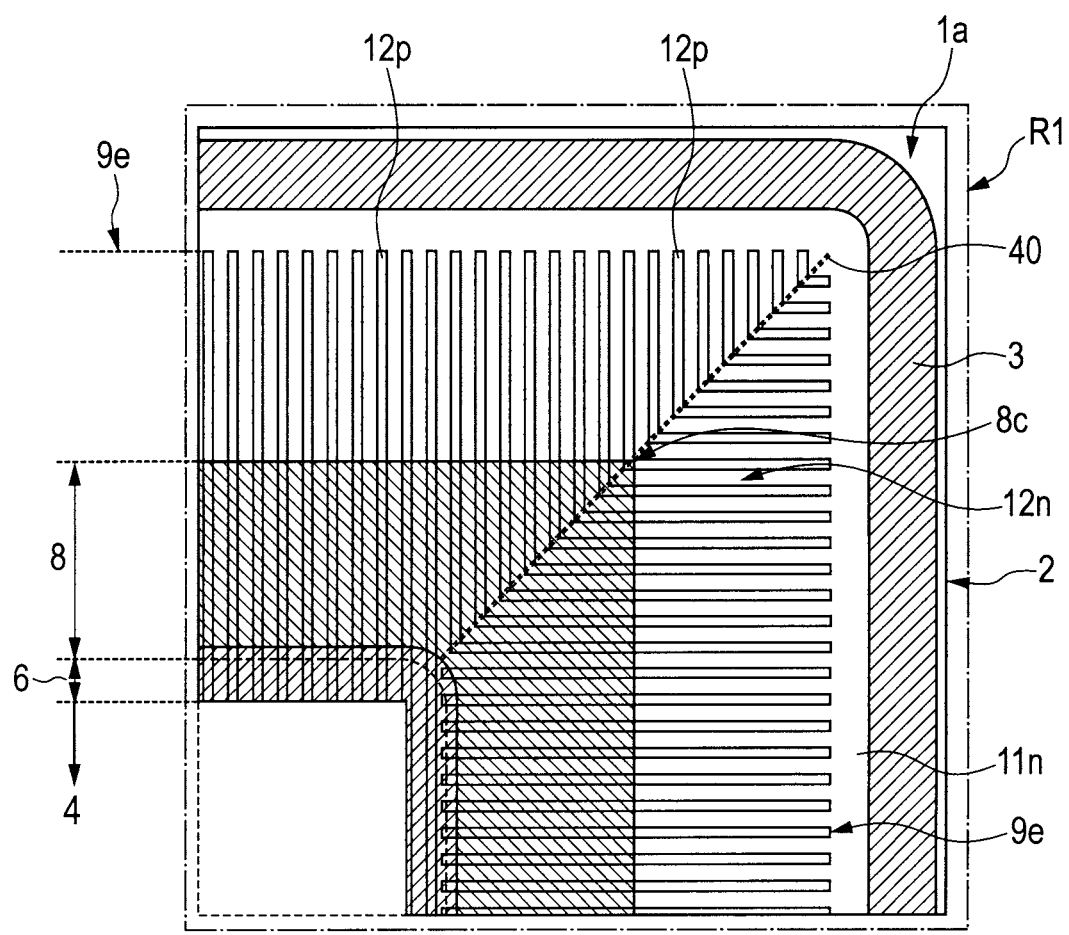
FIG. 39 is a top view (closer to the real equivalent) of the local portion of the chip which is the cut-away region R1 of the chip corner portion corresponding to FIG. 3 or 23 showing a combination of the symmetrical L-shaped column layout of FIG. 36 and the rectangular P−-type surface resurf region.

FIG. 37 is a top view (closer to the real equivalent) of the local portion of the chip which is the cut-away region R1 of the chip corner portion corresponding to FIG. 3 or 23 showing a combination of the asymmetrical standard column layout of FIG. 34 and a rectangular P⁻-type surface resurf region. FIG. 38 is a top view (closer to the real equivalent) of the local portion of the chip which is the cut-away region R1 of the chip corner portion corresponding to FIG. 3 or 23 showing a combination of the asymmetrical trimmed column layout of FIG. 35 and the rectangular P⁻-type surface resurf region. FIG. 39 is a top view (closer to the real equivalent) of the local portion of the chip which is the cut-away region R1 of the chip corner portion corresponding to FIG. 3 or 23 showing a combination of the symmetrical L-shaped column layout of FIG. 36 and the rectangular P⁻-type surface resurf region. Based on these drawings, a description will be given to variations of the placement and shape of the P⁻-type surface resurf region, the relationship thereof with the P columns, and the like.

FIG. 37 shows the variation corresponding to the column layouts of FIGS. 3 and 23 (round-corner P⁻-type surface resurf region). As shown in FIG. 37, in this variation (right-angled-corner P⁻-type surface resurf region), the corner of the P⁻-type surface resurf region 8 has a point 8c and is angular (right-angled). The advantage of the right-angled-corner P⁻-type surface resurf region 8 is that a match can be achieved between the symmetry of the P⁻-type surface resurf region 8 in the peripheral corner region 17b (17a, 17c, or 17d) and the symmetry (macroscopic symmetry) of the super-junction structure in the peripheral corner region.

Note that the corner point 8c is preferably over one of the P columns 12p. If the corner point 8c is over any of the N columns 12n, a point of a real PN junction is formed therein to result in the risk of inducing undesired electric field concentration. However, since the risk is considered to be normally relatively small, the corner point 8c may also be placed over any of the N columns 12n.

The variation of FIG. 38 is obtained by applying the round-corner P⁻-type surface resurf region to the asymmetrical trimmed column layout of FIG. 35. The round-corner P⁻-type surface resurf region is advantageous in terms of having no corner point, and also has the advantage of being enhanced in macroscopic symmetry when combined with an asymmetrical trimmed column layout.

The variation of FIG. 39 is obtained by applying the right-angled-corner P⁻-type surface resurf region to the symmetrical L-shaped column layout of FIG. 36. The variation is advantageous in that it can achieve a match between the symmetry of the P⁻-type surface resurf region 8 in the peripheral corner region 17b (17a, 17c, or 17d) and the symmetry (macroscopic symmetry) of the super-junction structure in the peripheral corner region and also simultaneously satisfy line symmetry with respect to the line-symmetry axis 40.

These variations have been described specifically in this section, but can be combined with the example of the first or third section and with each of the variations of the other components in this section.

Figure 40:
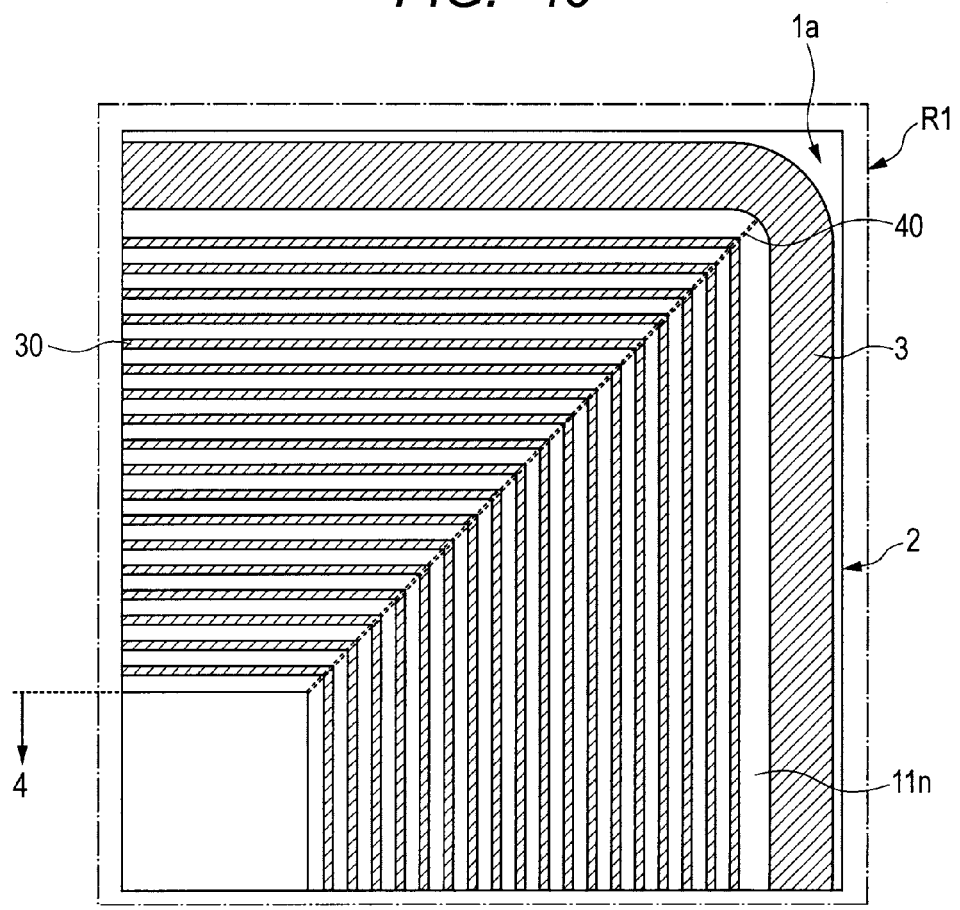
FIG. 40 is a top view (closer to the real equivalent) of the local portion of the chip which is the cut-away region R1 of the chip corner portion corresponding to FIG. 3 or 23 for illustrating a variation (right-angle bent corner portion arrangement) of the individual components (layout of floating field plates) in the semiconductor device of the second embodiment of the present invention.
Figure 41:
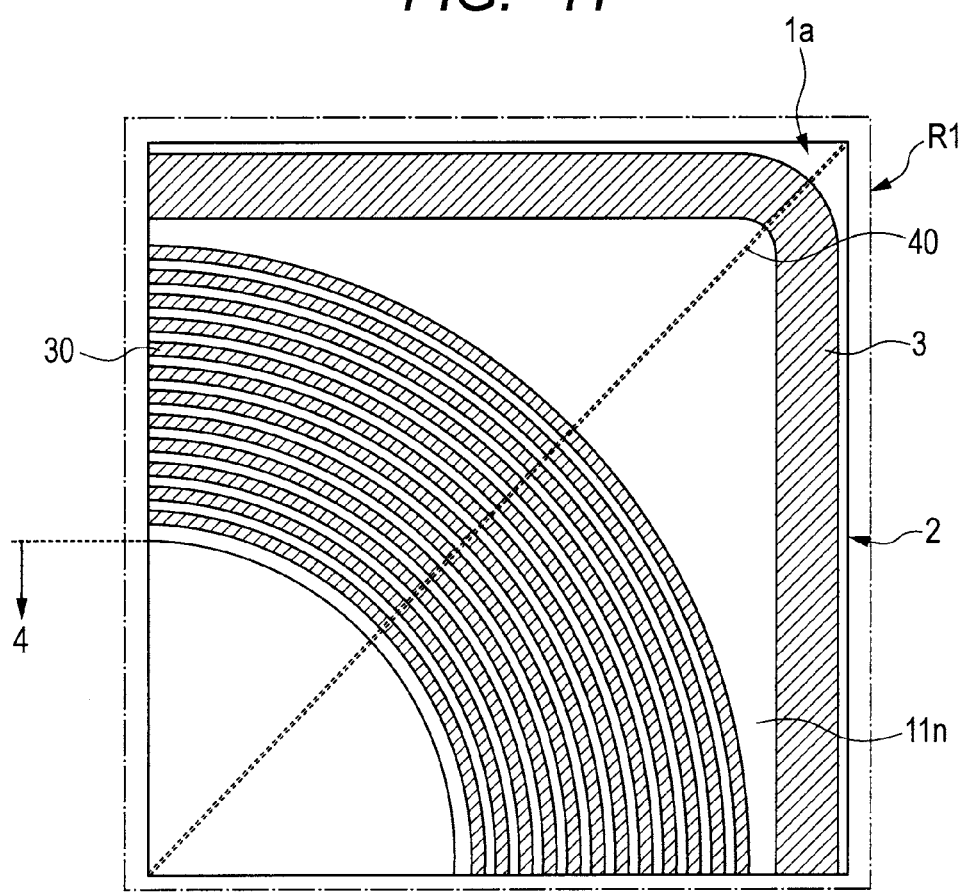
FIG. 41 is a top view (closer to the real equivalent) of the local portion of the chip corresponding to the cut-away region R1 of the chip corner portion corresponding to FIG. 3 or 23 for illustrating a variation (roundly curved corner portion arrangement) of the individual components (layout of floating field plates) in the semiconductor device of the second embodiment of the present invention.

(3) Variations of Shape, Placement, Etc. of Floating Field Plates (See Mainly FIGS. 40 and 41)

FIG. 40 is a top view (closer to the real equivalent) of the local portion of the chip which is the cut-away region R1 of the chip corner portion corresponding to FIG. 3 or 23 for illustrating a variation (right-angle bent corner portion arrangement) of the individual components (layout of floating field plates) in the semiconductor device of the second embodiment of the present invention. FIG. 41 is a top view (closer to the real equivalent) of the local portion of the chip corresponding to the cut-away region R1 of the chip corner portion corresponding to FIG. 3 or 23 for illustrating a variation (roundly curved corner portion arrangement) of the individual components (layout of floating field plates) in the semiconductor device of the second embodiment of the present invention. Based on these drawings, a description will be given to variations of the shape, placement, and the like of the floating field plates.

The "layout of floating field plates with right-angle bent corner portions" shown in FIG. 40 is an extraction of the layout of the floating field plates 30 and the like illustrated in FIG. 23. As shown herein, the plan configurations of the floating field plates 30 are globally rectangles. The corner portions of the floating field plates 30 may be right-angled or rounded, but are normally substantially line-symmetrical (need not necessary be so, though) with respect to the diagonal line (line-symmetry axis) 40 of the semiconductor chip or the peripheral corner region. Therefore, by achieving a match between the symmetry of the P⁻-type surface resurf region 8 in the peripheral corner region 17b (17a, 17c, or 17d) and the symmetry of the two-dimensional layout of the floating field plates 30 in the peripheral corner region, it is possible to reduce the risk of an undesired reduction in breakdown voltage. That is, it is useful to combine the floating field plate layout of FIG. 40 with the right-angle bent corner portions with FIG. 37 or FIG. 39.

By also achieving a match between the symmetry (macroscopic symmetry) of the super-junction structure in the peripheral corner region 17*b* (17*a*, 17*c*, or 17*d*) and the symmetry of the two-dimensional layout of the floating field plates 30 in the peripheral corner region, it is possible to reduce the risk of an undesired reduction in breakdown voltage. That is, it is useful to combine, e.g., the floating field plate layout with the right-angle bent corner portions of FIG. 40 with FIG. 35 or 36.

The example of FIG. 23 is a combination of the floating field plate layout with the right-angle bent corner portions, the round-corner P⁻-type surface resurf region, and the asymmetrical standard column layout. The macroscopic symmetry of the floating field plate layout and the column layout is relatively high, but the degree of matching between the macroscopic symmetry thereof and the symmetry in the P⁻-type surface resurf region is low.

On the other hand, in a combination of the floating field plate layout with the right-angle bent corner portions and FIG. 35, the macroscopic symmetry of the floating field plate layout and the column layout is low, but the line symmetry thereof is improved.

Next, in a combination of the floating field plate layout with the right-angle bent corner portions and FIG. 36, the macroscopic symmetry of the floating field plate layout and the column layout as well as the line symmetry thereof are improved.

FIG. 41 shows another variation (floating field plate layout with roundly curved corner portions) of the floating field plate layout of FIG. 40, in which the corner portions of the floating field plates 30 having rectangular ring shapes are rounded. Therefore, the layout of FIG. 41 is particularly preferably combined with the column layout of FIG. 35 or the P⁻-type surface resurf region 8 of FIG. 38.

These variations that have been specifically described in this section can also be combined with the example of the first or second section and with each of the variations of the other components in this section.

6. Consideration and Supplemental Description of Each of Embodiments (See Mainly FIGS. 42 to 45)

Figure 42:
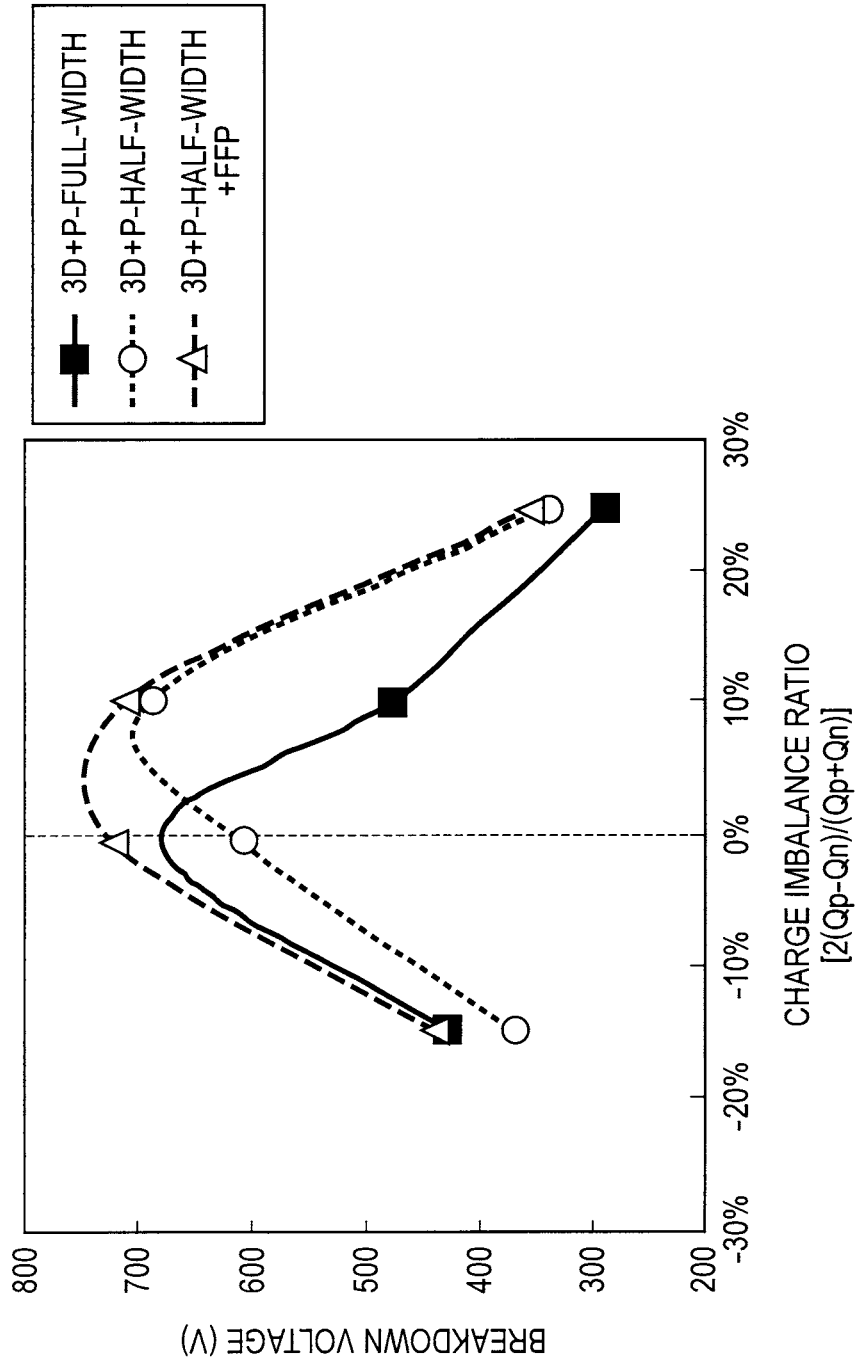
FIG. 42 is a data plot diagram showing the charge balance ratio dependence of a source/drain breakdown voltage in each of the semiconductor devices (power MOSFETs each having the super-junction structure and a half-width P−-type surface resurf region) of each of the first and second embodiments of the first part of the present invention and a semiconductor device (power MOSFET having a super-junction structure and a full-width P−-type surface resurf region) of a comparative example.
Figure 43:
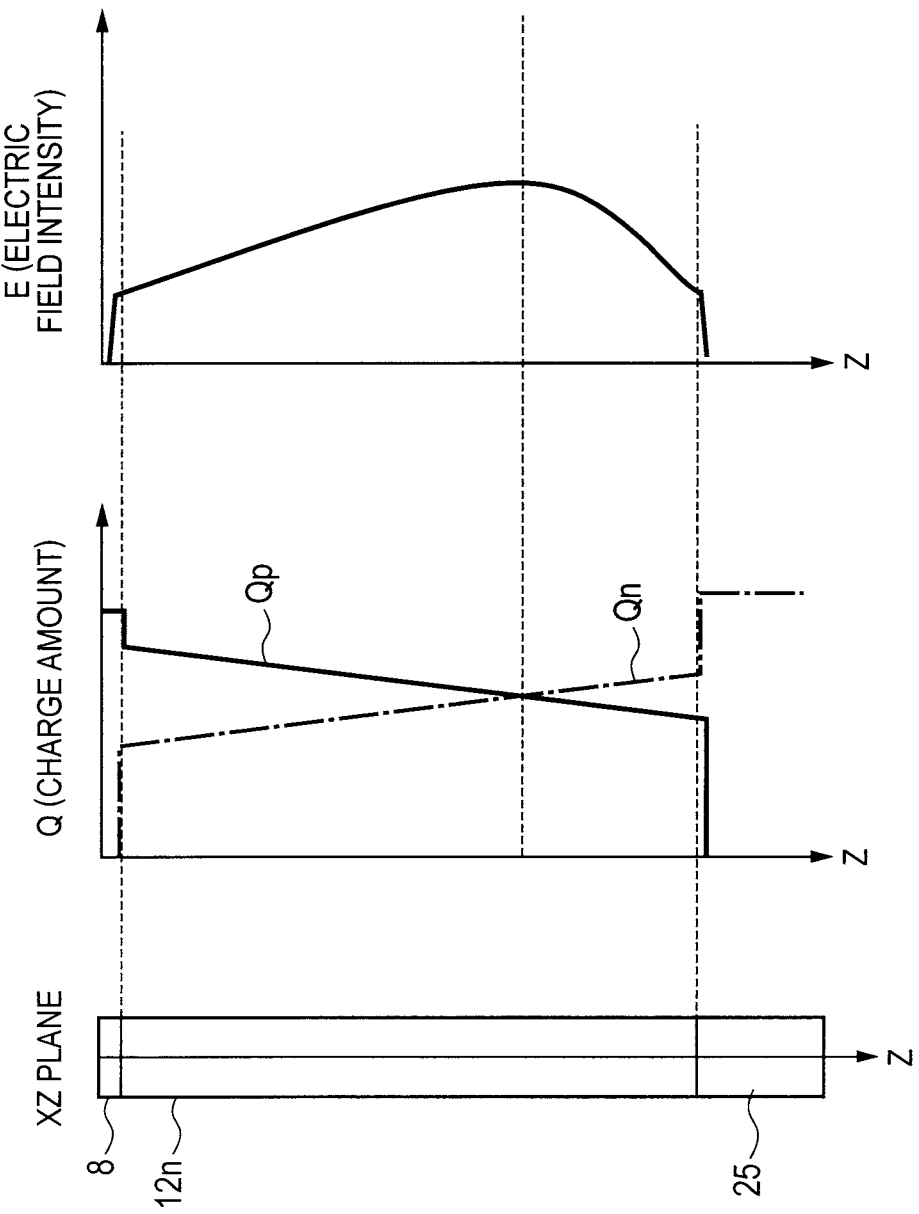
FIG. 43 is an illustrative view showing a relationship between an electric field intensity distribution and a peripheral charge amount in a vertical direction (thickness direction of the chip) at the middle of a P column or the like in a peripheral portion of the chip.
Figure 44:
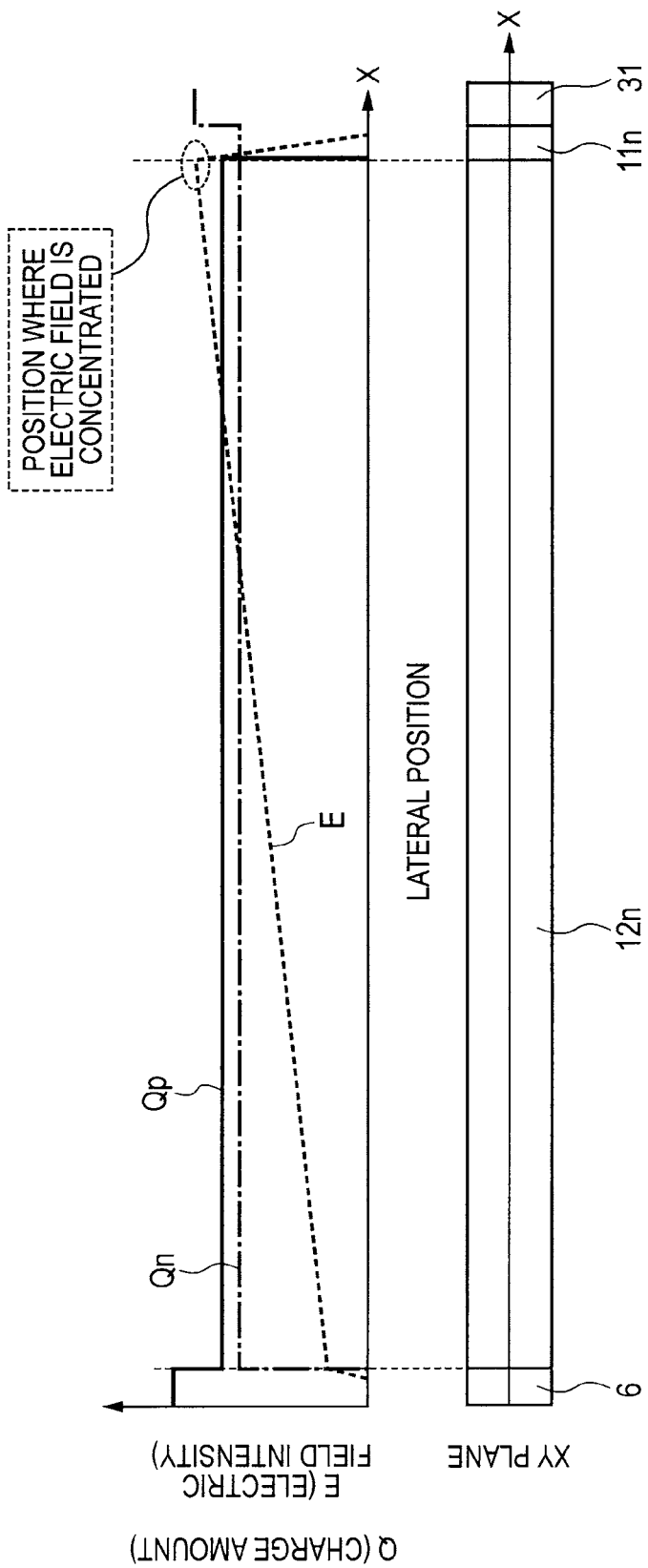
FIG. 44 is an illustrative view showing a relationship between an electric field intensity distribution and a peripheral charge amount in a middle portion of a surface region of the P column or the like in the peripheral portion of the chip.
Figure 45:
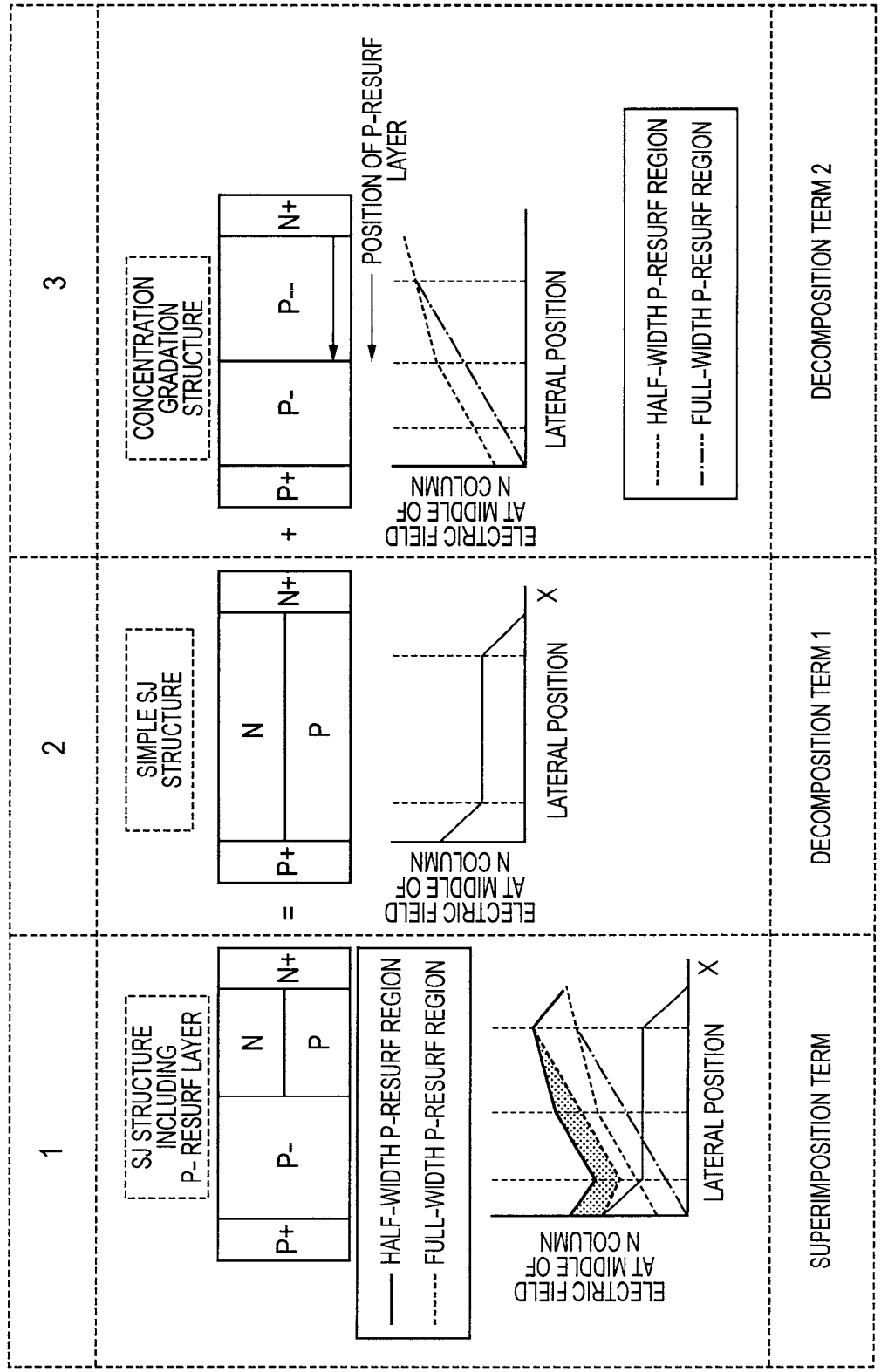
FIG. 45 is an illustrative view for illustrating the principle of an improvement in breakdown voltage resulting from the use of the full-width P⁻-type surface resurf region.

FIG. 42 is a data plot diagram showing the charge balance ratio dependence of a source/drain breakdown voltage in each of the semiconductor devices (power MOSFETs each having the super-junction structure and a half-width P⁻-type surface resurf region) of each of the first and second embodiments of the present invention and a semiconductor device (power MOSFET having a super-junction structure and a full-width P⁻-type surface resurf region) of a comparative example. FIG. 43 is an illustrative view showing a relationship between an electric field intensity distribution and a peripheral charge amount in a vertical direction (thickness direction of the chip) at the middle of a P column or the like in a peripheral portion of the chip. FIG. 44 is an illustrative view showing relationship between an electric field intensity distribution and a peripheral charge amount in a middle portion of a surface region of the N column or the like in the peripheral portion of the chip. FIG. 45 is an illustrative view for illustrating the principle of an improvement in breakdown voltage resulting from the use of the full-width P⁻-type surface resurf region. Based on these drawings, a supplemental description will be given to every aspect of the present invention and each of the embodiments thereof.

(1) Effects of Half-Width P⁻ Surface Resurf Region and Floating Field Plates on Breakdown Voltage, Etc. (See Mainly FIG. 42)

According to the study conducted by the present inventors, to ensure a breakdown voltage required of a power MOSFET and provide a stable device, it is considered to be desirable to design the power MOSFET such that, if a breakdown is assumed to occur, the breakdown occurs in a two-dimensionally wide inner area of an active cell region (reaching the middle of the depth of a drift region and extending over a relatively wide width). To achieve the desirable design, it is necessary to minimize the possibility of a breakdown in an outer end portion of the active cell region, i.e., in the vicinity of a P-type main junction or in an edge termination area around a chip.

From this viewpoint, in each of the foregoing embodiments, the 3D-Resurf structure in which the degree of freedom with which a depletion layer extends is 3 in principle is used in the main area of the peripheral super-junction region (edge termination area), while in the active cell region, the degree of freedom with which the depletion layer extends is 2. Therefore, theoretically, a breakdown voltage in the edge termination area should be equal to a breakdown voltage in the active cell region. However, it is considered that, in a real device, the breakdown voltage in the edge termination area is about 80% at most of the breakdown voltage in the active cell region if no measures are taken. Accordingly, even in the peripheral 3D-Resurf structure, the breakdown voltage may unexpectedly decrease due to local electric field concentration, the lack of charge balance, or the like.

FIG. 42 shows a data plot diagram of the charge balance dependence of the source/drain breakdown voltage in each of the power MOSFETs of the first embodiment (FIG. 3), the second embodiment (FIG. 23), and the comparative example (full-width P⁻ surface resurf region). Here, the circles (o) correspond to FIG. 3, the triangles correspond to FIG. 23, and the squares correspond to a configuration corresponding to FIG. 3 in which the entire outer peripheral end of the P⁻-type surface resurf region has been extended to the vicinity of the outer end portion of the peripheral super-junction region (i.e., comparative example). As can be seen from FIG. 42, in each of the devices of the embodiments, a region ("less perceptible region" where the charge balance dependence of the source/drain breakdown voltage is less perceptible) is relatively wide on the side on which a charge amount in the P column is larger than a charge amount in the N column. On the other hand, in the comparative example, the width of the less perceptible region is relatively narrow.

(2) Description of Relationship Between Breakdown Voltage in Edge Termination Area and P⁻ Surface Resurf Region, Etc. (See Mainly FIGS. 43 and 44)

FIG. 43 schematically shows charge distributions and an electric field intensity distribution in a thickness direction in the semiconductor substrate of the power MOSFET having the (full-width or half-width) P⁻ surface resurf region of the first embodiment (FIG. 3). In FIG. 43, the columnar figure on the left-hand side represents a given unit N column in the P-surface resurf region, which has been extracted therefrom. The middle line of the figure is assumed to be a Z-axis and, on the right-hand side, E(Z), i.e., an electric field intensity distribution in the thickness direction is shown. Charge distributions $Q_n$ and $Q_p$ corresponding to the respective half widths of the unit P column and the unit N column are shown in the middle. In the trench fill method, as shown in FIG. 43 (in the middle thereof), as the position lowers, a heat treatment time in epitaxial growth is longer and a boron concentration is lower so that the charge distribution $Q_p$ in the P column is more sparse as it goes down. Even when a profile is obtained in which the boron concentration in the P column is relatively flat with respect to the depth direction, due to the tapered trench, the charge distribution Qp in the P column is similarly more sparse as it goes down. Therefore, the electric field intensity distribution E(Z) in the depth direction becomes a relatively ideal one having a peak electric field intensity at a middle depth.

On the other hand, an electric field intensity distribution E(x) along the X-axis at the surface of the middle portion of the P column (along the longitudinal direction of the P column) in the peripheral super-junction region when the P− surface resurf region is the full-width P-surface resurf region (comparative example) is shown in the upper part of FIG. 44. In addition, the distributions Qp and Qn of the charge amounts in the P column and the N column adjacent to each other are also shown. Originally, the P-surface resurf region has been introduced so as to avoid the concentration of an electric field on the vicinity of the P-type main junction (end portion of the P body region) by allowing the depletion layer to easily extend along the surface in the blocking mode. However, in the full-width P-surface resurf region, on the contrary, the electric field tends to be concentrated on the vicinity of the interface between the tip portion of the P− surface resurf region and the N-type drift region. This causes a reduction in breakdown voltage in a chip peripheral portion on the side on which the charge amount in the P column is larger than the charge amount in the N column. Accordingly, in each of the embodiments of the present invention, the half-width P− surface resurf region is introduced as a preferred example to thereby avoid reduction in breakdown voltage in the vicinity of the channel stop region at the N-type chip edge.

(3) Description of Improvement in Breakdown Voltage Due to Half-Width P− Surface Resurf Region (See Mainly FIG. 45)

A brief description will be given to the reason that reduction in breakdown voltage in the vicinity of the channel stopper at the chip edge can be avoided by thus introducing the half-width P− surface resurf region.

FIG. 45 illustrates the mechanism of an improvement in breakdown voltage based on the principle of superimposition of an electric field or the like. As a device model corresponding to the first embodiment, the pair of adjacent P column and N column near the lower portion of FIG. 44 and the vicinities of the both ends thereof are extracted, which can be represented as the upper figure in the first column of FIG. 45. The device can be decomposed into a simple super-junction structure (the second column of FIG. 45) and a concentration gradation structure (the third column of FIG. 45). The respective electric field intensity distributions in the first decomposition term and the second decomposition term are as shown in the lower figures of the second and third columns of FIG. 45. A combined electric field intensity distribution obtained through superimposition thereof is as shown in the lower figure of the first column of FIG. 45. The area of the shaded portion of the combined electric field intensity distribution corresponds to an improvement in breakdown voltage. That is, in the half-width P− surface resurf region, the electric field intensity in the vicinities of the tip portion of the surface resurf region having half the width of the full-width P− surface resurf region and the P-type main junction increases so that a part of the electric field held in the vicinity of the channel stop region at the N-type chip edge is held in an inner region.

4. Summary

While the invention achieved by the present inventors has been specifically described heretofore based on the embodiments thereof, the present invention is not limited thereto. It will be appreciated that various changes and modifications can be made in the invention within the scope not departing from the gist thereof.

For example, each of the foregoing embodiments has been described specifically by using the MOS structure having the planar gate structure as an example, but the present invention is not limited thereto. It will be appreciated that the present invention is exactly similarly applicable to a trench gate structure of a U-MOSFET or the like. Also, as the layout of the gate electrodes of the MOSFET, the example in which the gate electrodes are arranged in stripes parallel with the pn columns has been shown, but the present invention is applicable to various layouts in which the gate electrodes are arranged in directions orthogonal to the pn columns or arranged in a grid-like configuration.

Note that, in each of the foregoing embodiments, the example has been specifically described in which the N-channel device is formed mainly in the upper surface of the N epitaxial layer over the N+ single-crystal silicon substrate. However, the present invention is not limited thereto, and a P channel device may also be formed in the upper surface of the N epitaxial layer over the P+ single-crystal silicon substrate.

Each of the foregoing embodiments has been described specifically using the power MOSFET as an example, but the present invention is not limited thereto. It will be appreciated that the present invention is also applicable to power devices each having a super-junction structure, i.e., diodes, bipolar transistors (including an IGBT), and the like. It will also be appreciated that the present invention is also applicable to semiconductor integrated circuit devices having such power MOSFETs, diodes, bipolar transistors, and the like embedded therein, and so forth.

Also, in each of the foregoing embodiments, the trench fill method has been mainly described specifically as a forming method of the super-junction structure, but the present invention is not limited thereto. It will be appreciated that, e.g., a multi-epitaxial method or the like can also be used.

In each of the foregoing embodiments, the device formed in the semiconductor substrate has been mainly described specifically, but the present invention is not limited thereto. It will be appreciated that the present invention is also applicable substantially without any modification to devices formed in a GaAs-based semiconductor substrate, a silicon-carbide-based semiconductor substrate, and a silicon-nitride-based semiconductor device.

<Second Part: Portion Mainly Related to 2D-Resurf Structure>

0. Outline of Second Part

In a power-type semiconductor active element such as a power MOSFET which is resin-molded, even if it shows an excellent source/drain breakdown voltage characteristic in a chip state (or in a mounting form other than resin molding), when it is molded with a resin, a breakdown voltage characteristic may noticeably deteriorate. In a mounting form other than resin molding also, a problem arises that, due to a shift in an amount of interfacial charge over a chip or the like, the source/drain breakdown voltage characteristic becomes unstable.

According to the result of the study conducted by the present inventors, a Floating Field Ring normally used in Edge Termination and a field plate coupled thereto have problems such that constraints on a super-junction structure and layout increase and an electric field reducing means other than a floating field plate is inconvenient to use.

The following is a brief description of the outline of a representative embodiment of the invention disclosed in the second part.

That is, according to an aspect of the present invention in the second part, in a power-type resin-molded semiconductor active element in which a drift region of a first conductivity type has a super-junction structure, the position of a floating field ring provided on the outside periphery of an active region is inwardly shifted to be located such that, in a main portion, the inner end of the floating field ring is proximate to the inner end of a column of a second conductivity covered therewith.

The following is a brief description of an effect obtained according to the representative embodiment of the invention disclosed in the second part.

That is, in a power-type resin-molded semiconductor active element in which a drift region of a first conductivity type has a super-junction structure, the position of a floating field ring provided on the outside periphery of an active region is inwardly shifted to be located such that, in a main portion, the inner end of the floating field ring is proximate to the inner end of a column of a second conductivity covered therewith. Therefore, the effect of pushing back the extending depletion layer causes a "Walk-out" phenomenon in the depletion layer, thereby allowing the prevention of the deterioration of the breakdown voltage due to electric field concentration in an end portion of the super-junction structure.

1. Description of Example of Package Structure of Power MOSFET with Super-Junction Structure, Etc. as Semiconductor Device of Each Embodiment of Present Invention (See Mainly FIGS. 46 to 48)

Here, to specifically show a package form, a description will be given by using a TO-3P type as a typical resin-molded package as an example. However, it will be appreciated that a TO-220 type, another resin-molded package, or a package form other than a resin-molded package may also be used.

Figure 46:
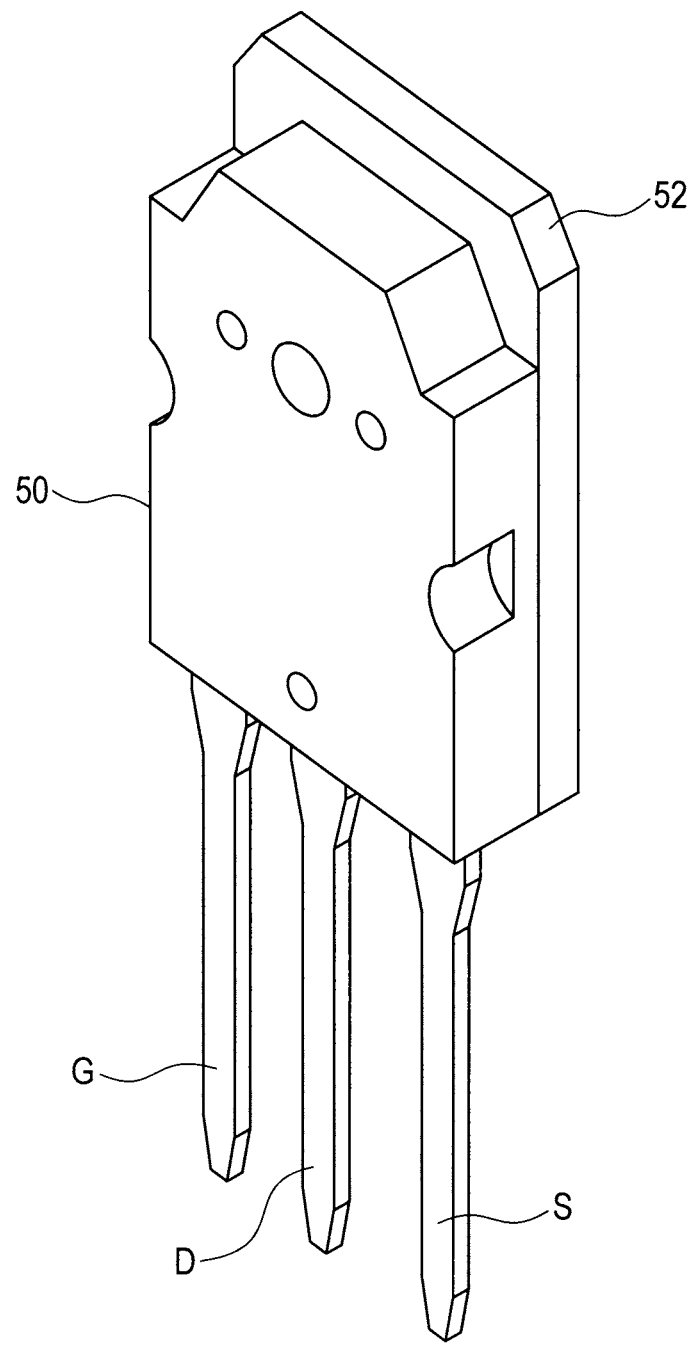
FIG. 46 is a perspective view of a package of a power MOSFET having a super-junction structure or the like as a semiconductor device of each of embodiments of a second part of the present invention.
Figure 47:
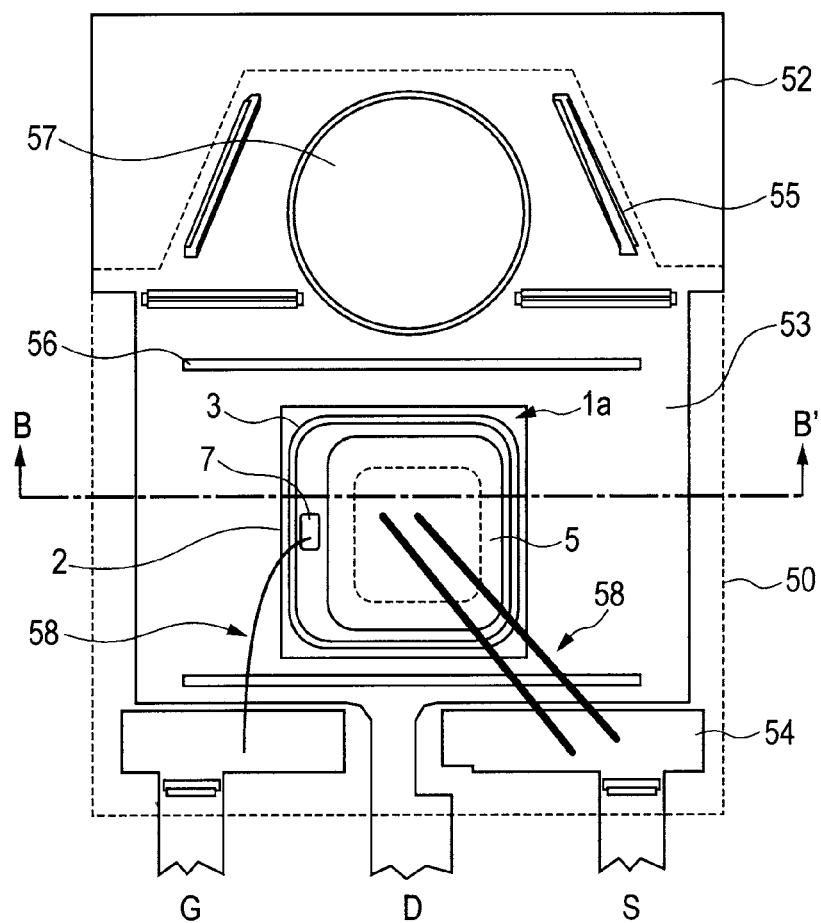
FIG. 47 is a main-portion top view of the package of FIG. 46 from which a mold resin has been removed.
Figure 48:
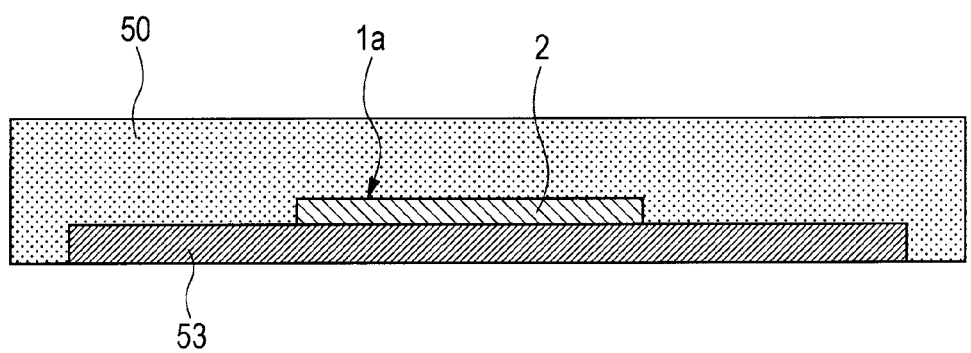
FIG. 48 is a cross-sectional view of the package (in a state molded with the mold resin) corresponding to the B-B' cross section of FIG. 47.

FIG. 46 is a perspective view of a package of a power MOSFET having a super-junction structure or the like as a semiconductor device of each of the embodiments of the present invention. FIG. 47 is a main-portion top view of the package of FIG. 46 from which a mold resin has been removed. FIG. 48 is a cross-sectional view of the package (in a state molded with the mold resin) corresponding to the B-B' cross section of FIG. 47. Based on these drawings, a description will be given to an example of the package structure of the power MOSFET having the super-junction structure or the like as the semiconductor device of each of the embodiments of the present invention.

As shown in FIGS. 46 to 48, the main body of the package is a resin-molded body 50, from which a header 52 (heat sink) made of, e.g., a copper-based metal upwardly protrudes. From the lower portion of the resin-molded body 50, a gate terminal G, a drain terminal D, and a source terminal S each also made of a copper-based metal protrude. A semiconductor chip 2 is die-bonded onto a die pad 53 made of a copper-based metal with a device surface 1a (first main surface) thereof facing upward. In the upper and lower surfaces of the die pad 53, slits 56 are provided. In the header 52 and a boundary portion between the header 52 and the die pad 53 (besides, in, e.g., base portions of outer leads or the like), grooves 55 are provided. The slits 56 and the grooves 55 are provided to ensure integrity between the resin-molded body 50 and these metal base materials. In a middle portion of the header 52, circular opening 57 for mounting or the like is provided. Over the device surface 1a of the semiconductor chip 2, a metal guard ring 3, a metal source electrode 5, a metal gate electrode 7, and the like each formed of an aluminum-based metal or the like are provided. Between these metal guard ring 3, metal source electrode 5, metal gate electrode 7, and the like and a plurality of wire bonding leads 54, bonding wires 58 such as, e.g., silver wires are coupled. The resin-molded body 50 is formed by transfer molding or the like using, e.g., a lead frame (examples of a main material thereof include oxygen-free copper, a copper-tin alloy, a copper-zirconium alloy, and the like) and a mold resin material (resin tablet). The mold resin material contains, e.g., an epoxy-based resin as a main resin material, a phenol novolac resin as a curing agent, a phosphorus- or amine-based compound as a catalyst, fused silica as a filler, a silicone resin as a flexibilizer, an epoxy-based silane compound as a coupling agent, carnauba wax or an ester compound as an internal mold release agent, a flame retardant, a coloring agent, and the like.

2. Description of Device Structure (Peripheral 2D Super-Junction and Shifted FFP) of Power MOSFET with Super-Junction Structure, Etc. as Example of Semiconductor Device of First Embodiment of present invention (see mainly FIGS. 49 to 55, 91, and 92)

In this example, a specific description will be given to a planar power MOSFET formed in a silicon-based semiconductor substrate and having a source/drain breakdown voltage of about 600 volts (with regard to the planar power MOSFET, the same also holds true in the following sections). However, it will be appreciated that the present invention is also applicable to a power MOSFET having another breakdown voltage value and other devices.

Figure 49:
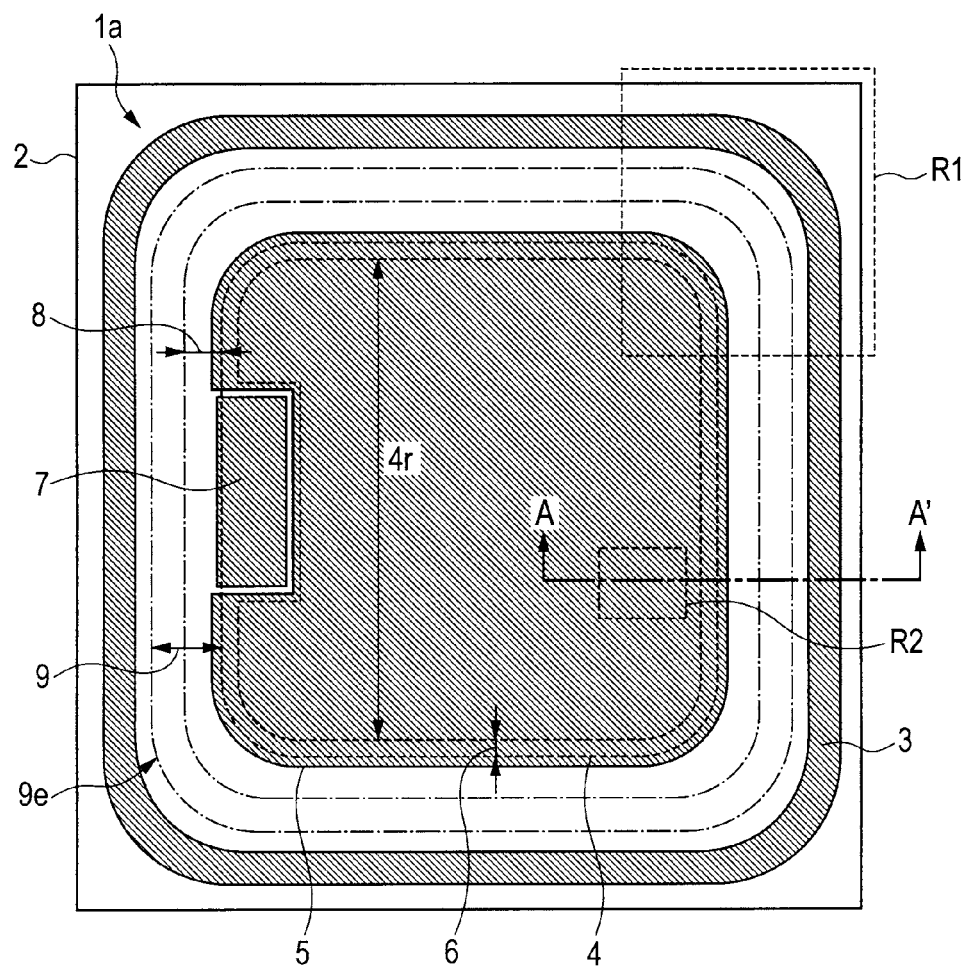
FIG. 49 is a top view of the entire chip (mainly of a surface region thereof) of a power MOSFET having a super-junction structure as an example of the semiconductor device according to the first embodiment of the second part of the present invention.
Figure 50:
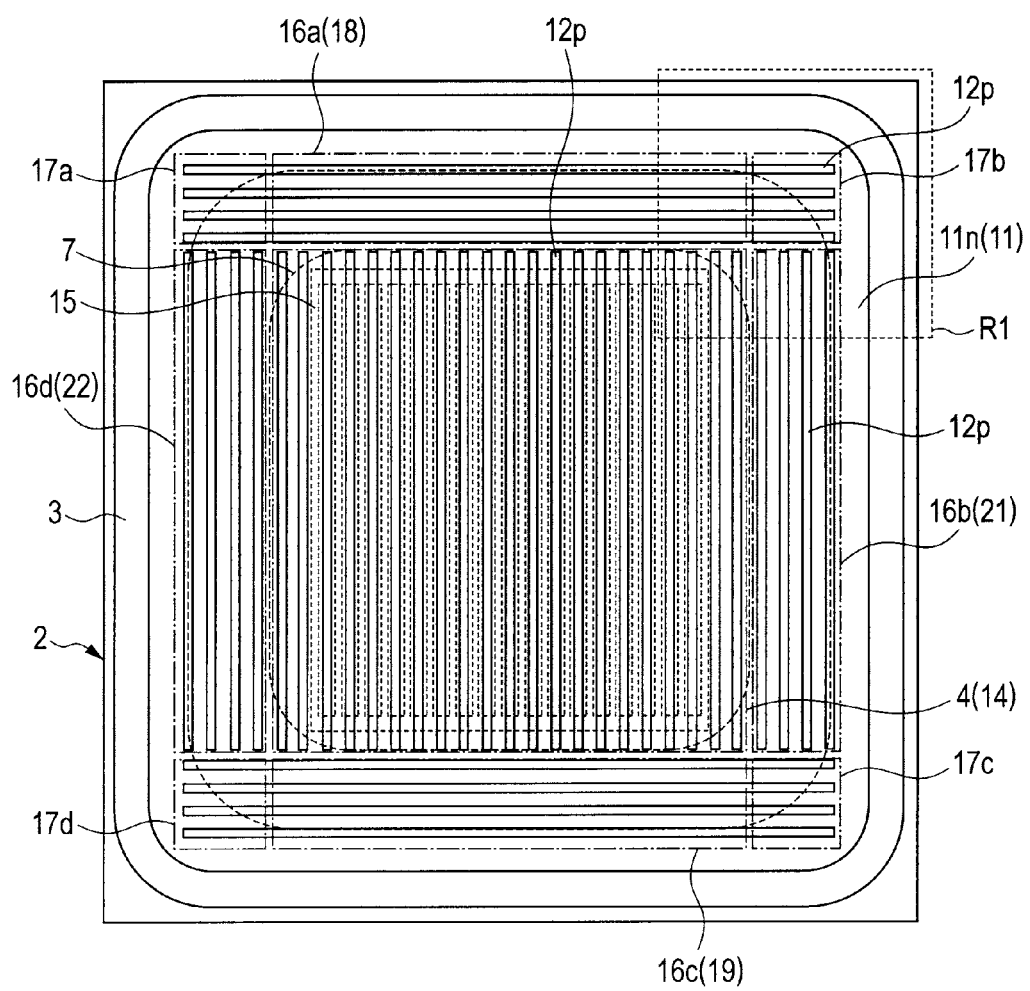
FIG. 50 is a top view of the entire chip (mainly of an impurity doped structure thereof or the like) of the power MOSFET having the super-junction structure as the example of the semiconductor device according to the first embodiment of the second part of the present invention.
Figure 51:
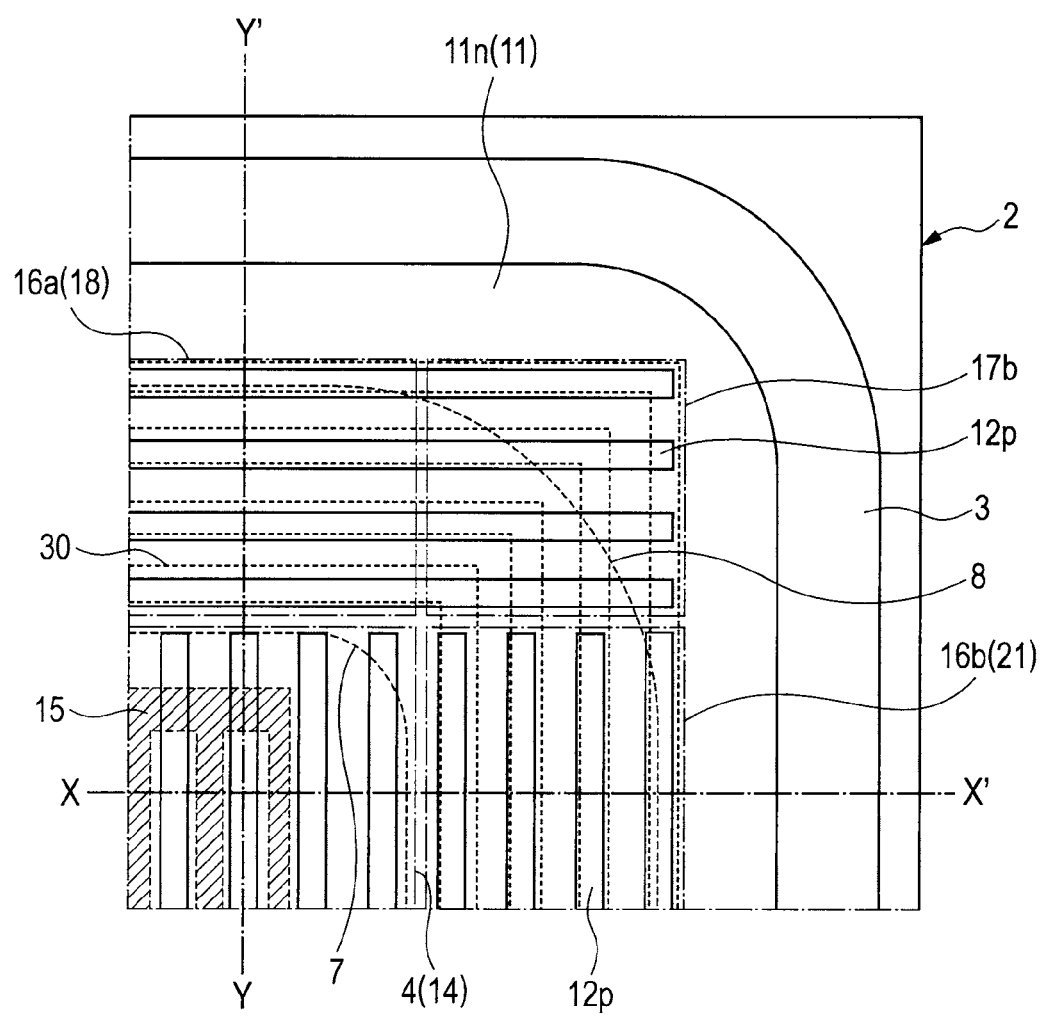
FIG. 51 is a top view of a local portion of the chip corresponding to a cut-away region R1 of the chip corner portion of FIG. 49.
Figure 52:
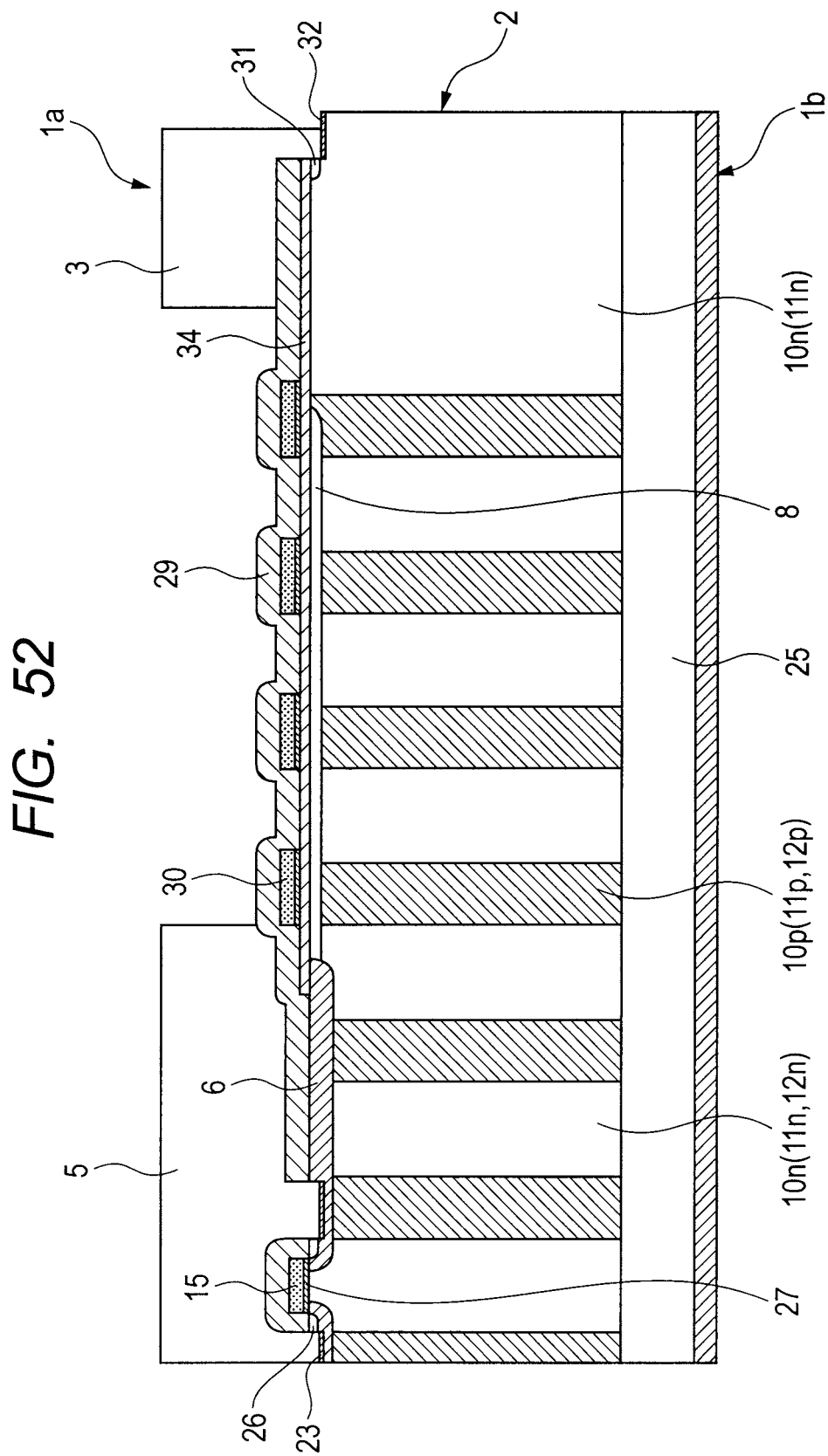
FIG. 52 is a cross-sectional view of a local portion of the chip corresponding to the X-X' cross section of FIG. 51.
Figure 53:
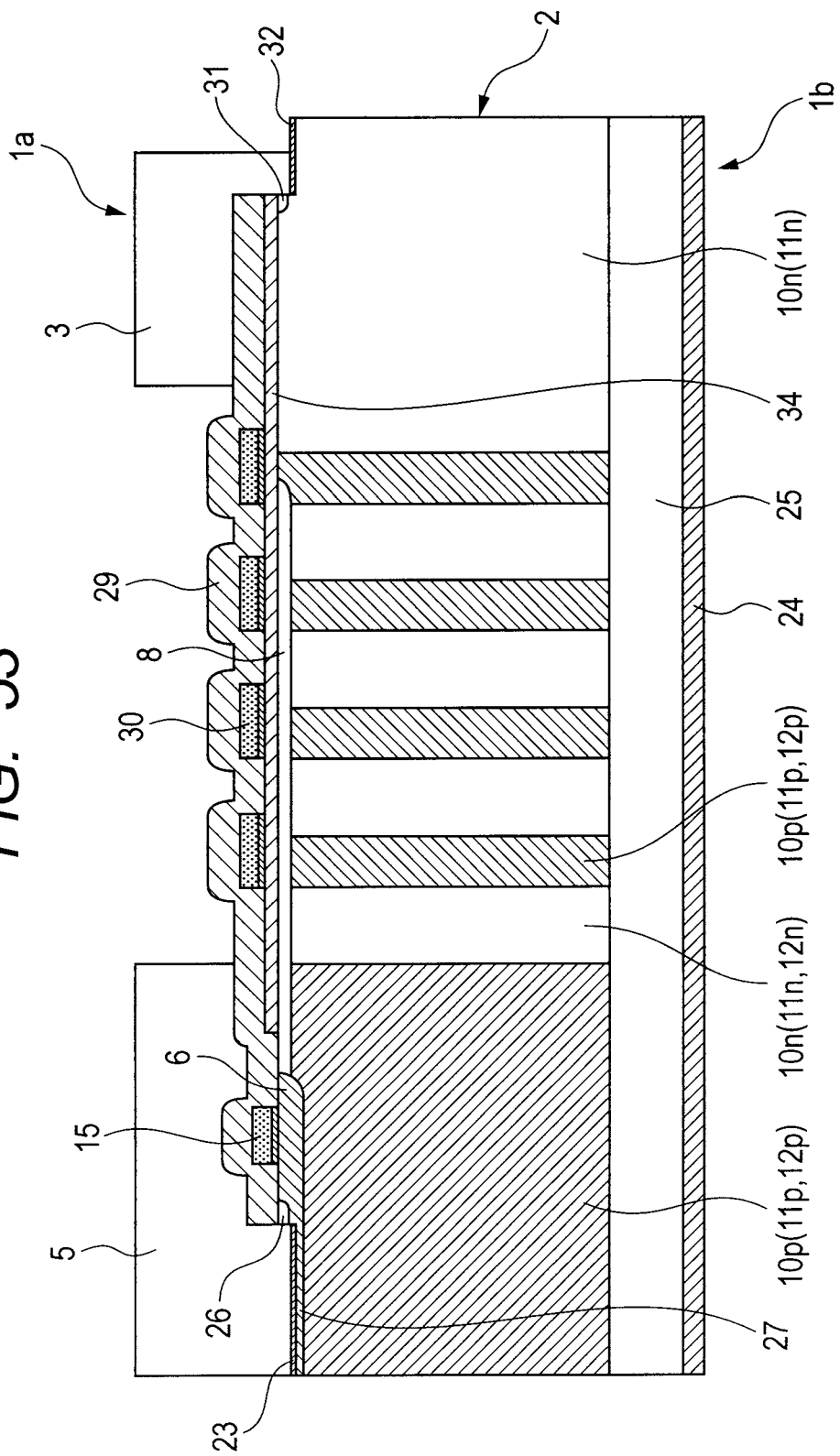
FIG. 53 is a cross-sectional view of a local portion of the chip corresponding to the Y-Y' cross section of FIG. 51.
Figure 54:
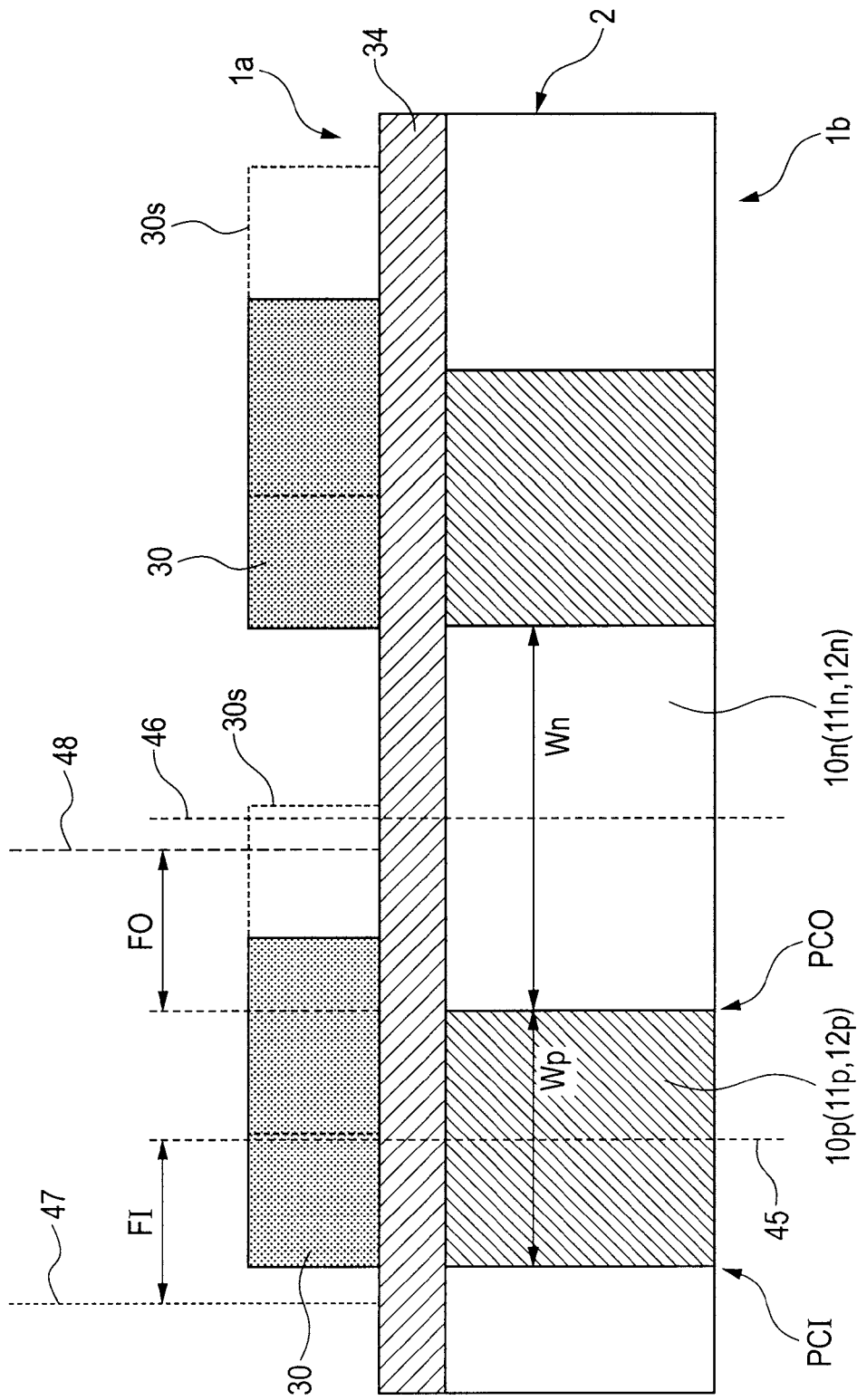
FIG. 54 is a device schematic cross-sectional view showing a positional relationship between the floating field plates and the P column regions of FIG. 51.
Figure 55:
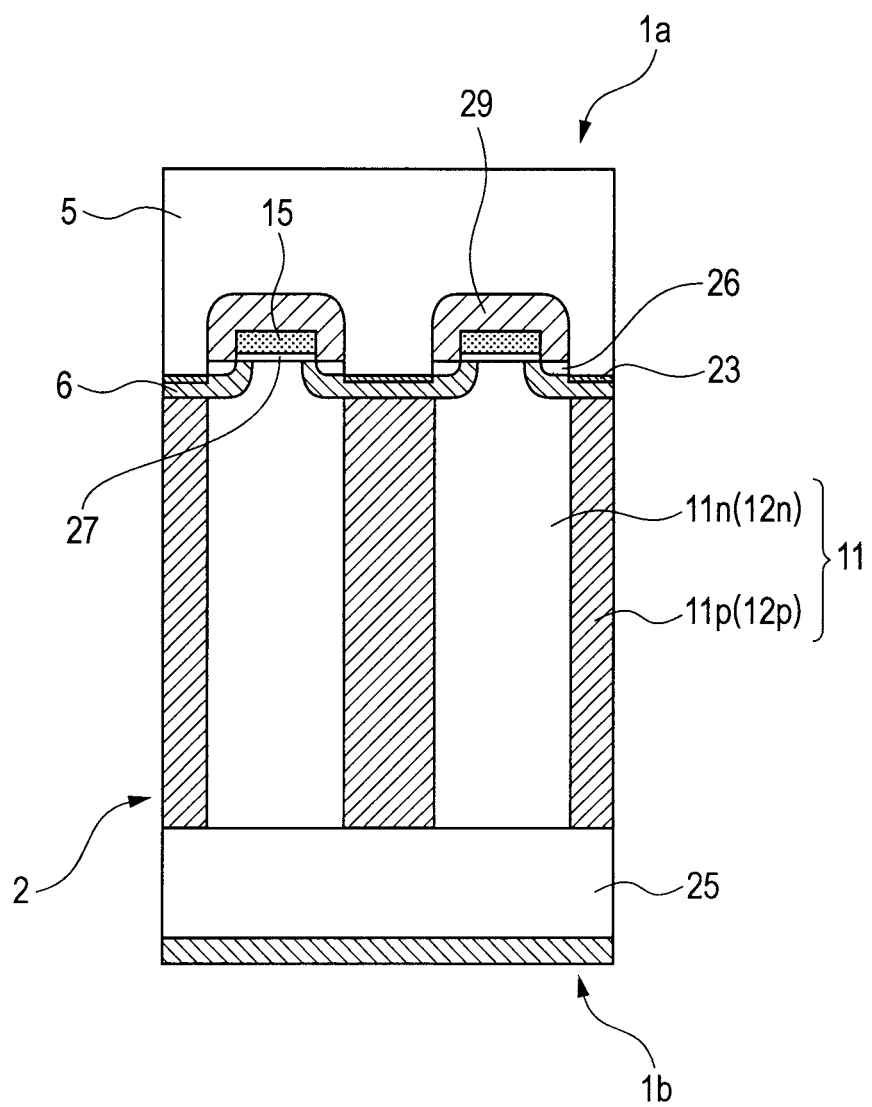
FIG. 55 is a cross-sectional view of a local portion of the chip (corresponding to two active cells) corresponding to the A-A' cross section of a cut-away region R2 of the active cell portion of FIG. 49.
Figure 91:
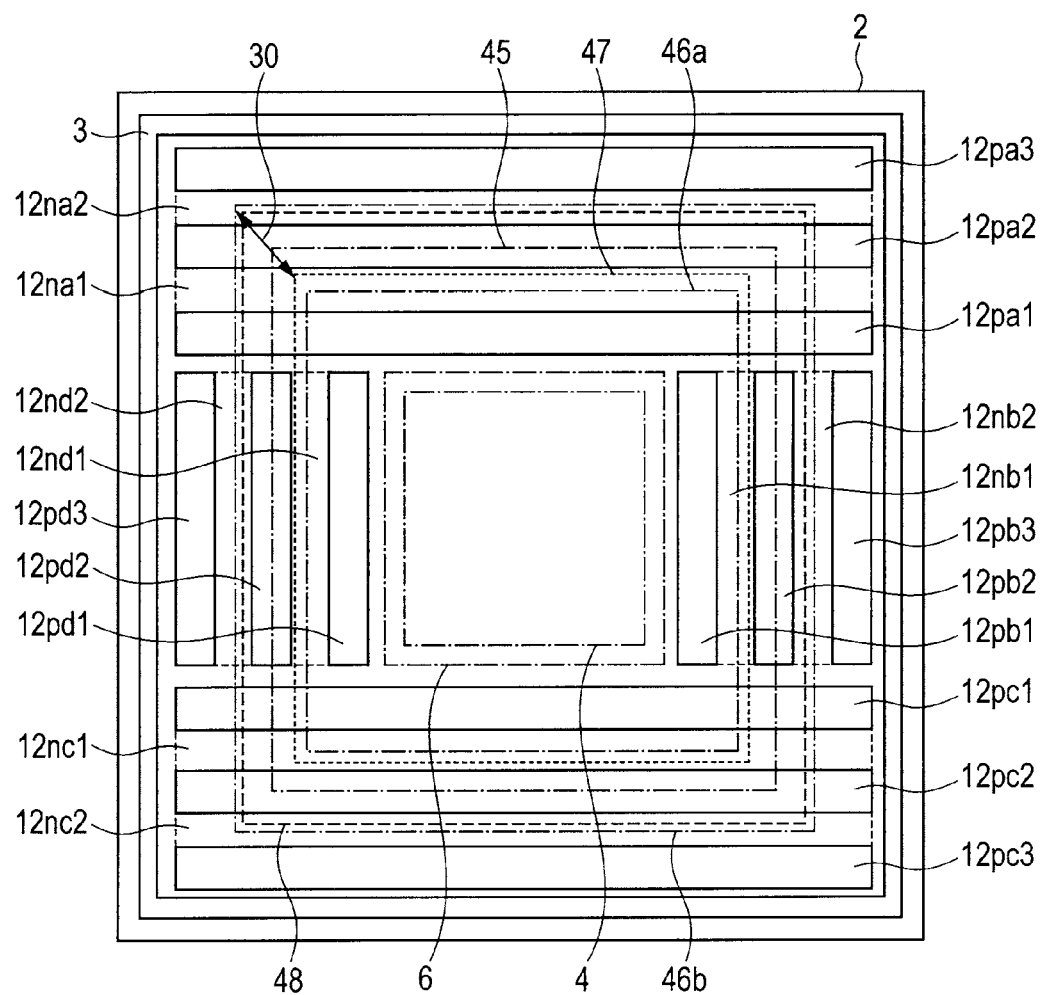
FIG. 91 is a (first) schematic top view of the chip for illustrating a structure of the semiconductor device of each of the first to third embodiments of the second part of the present invention.
Figure 92:
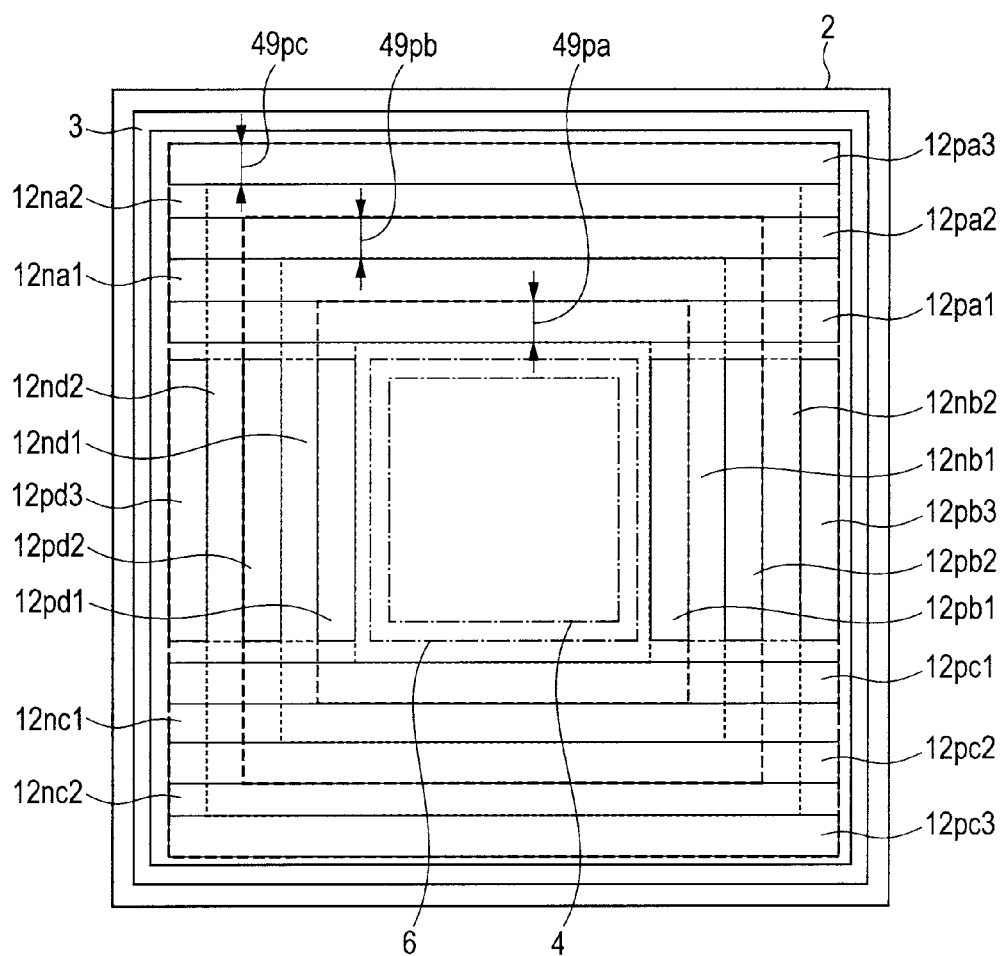
FIG. 92 is a (second) schematic top view of the chip for illustrating the structure of the semiconductor device of each of the first to third embodiments of the second part of the present invention.

FIG. 49 is a top view of the entire chip (mainly of a surface region thereof) of the power MOSFET having a super-junction structure as an example of the semiconductor device according to the first embodiment of the present invention. FIG. 50 is a top view of the entire chip (mainly of an impurity doped structure thereof or the like) of the power MOSFET having the super-junction structure as the example of the semiconductor device according to the first embodiment of the present invention. FIG. 51 is a top view of a local portion of the chip corresponding to a cut-away region R1 of the chip corner portion of FIG. 49. FIG. 52 is a cross-sectional view of a local portion of the chip corresponding to the X-X' cross section of FIG. 51. FIG. 53 is a cross-sectional view of a local portion of the chip corresponding to the Y-Y' cross section of FIG. 51. FIG. 54 is a device schematic cross-sectional view showing a positional relationship between the floating field plates and the P column regions of FIG. 51. FIG. 55 is a cross-sectional view of a local portion of the chip (corresponding to two active cells) corresponding to the A-A' cross section of a cut-away region R2 of the active cell portion of FIG. 49. FIG. 91 is a (first) schematic top view of the chip for illustrating a structure of the semiconductor device of each of the first to third embodiments of the present invention. FIG. 92 is a (second) schematic top view of the chip for illustrating the structure of the semiconductor device of each of the first to third embodiments of the present invention. Based on these drawings, a description will be given to a device structure (peripheral 2D super-junction and shifted FFP) of the power MOSFET having the super-junction structure or the like as the example of the semiconductor device of the first embodiment of the present invention.

First, a description will be given to a schematic layout of the upper surface of the chip (typically several millimeters square). As shown in FIG. 49, in the power MOSFET element chip 2 in which the elements are formed over a silicon-based semiconductor substrate (which is a wafer 1 before being divided into the individual chips 2) in the form of a square or rectangular plate, the metal source electrode 5 (aluminum-based electrode) located in a center portion occupies a major area. Under the metal source electrode 5, an active cell region 4 is provided, and the outer end portion thereof is a P-type main junction 6 (the outer edge portion of a P body region). Inside the P-type main junction 6, a repetitive structure portion 4r of the active cell region 4 is provided. Outside the ring-like P-type main junction 6, a P⁻-type surface resurf region 8 similarly having a ring-like shape and a peripheral super-junction region 9 (region where linear P columns 12p and an N-type drift region 11n located therebetween are periodically and substantially equidistantly arranged in a peripheral drift region 11 or a combined region thereof) are provided. Here, the outer end of the P⁻-type surface resurf region 8 is located in, e.g., the vicinity of an outer end 9e of the peripheral super-junction region 9.

Further, around the peripheral super-junction region 9, an aluminum-based metal guard ring 3 is provided. Between the aluminum-based metal guard ring 3 and the metal source electrode 5, a metal gate electrode 7 for retrieving polysilicon gate electrodes to the outside is provided. Note that, in FIG. 49 (the same also holds truer in FIGS. 50 and 51), the metal gate electrode 7 is exaggeratingly depicted wider than the real equivalent for easy understanding of a structure of the Edge Termination Area.

Next, a description will be given to a two-dimensional diffusion structure of the chip 2 and a device layout thereof. As shown in FIG. 50, in a center portion of the chip 1, the active cell region 4 (under which an active-cell-portion super-junction structure 14, i.e., a first super-junction structure exists) is provided. Inside the active cell region 4, a large number of linear polysilicon gate electrodes 15 are provided. In addition, outside the ring-like P-type main junction 6 which is the outer edge portion of the active cell region 4 and surrounds the active cell region 4, the ring-like P⁻-type surface resurf region 8 coupled to the P-type main junction 6 and surrounding the active cell region 4 is provided.

Next, a description will be given to a super-junction structure around the active-cell-portion super-junction structure 14, i.e., the first super-junction structure, i.e., the peripheral super-junction structure 9 (FIG. 49). In peripheral side regions 16a and 16c, a second super-junction structure 18 and a third super-junction structure 19 each of which is coupled to the active-cell-portion super-junction structure 14 and has the same orientation as that of the active-cell-portion super-junction structure 14 are provided. On the other hand, in peripheral side regions 16b and 16d, a fourth super-junction structure 21 and a fifth super-junction structure 22 each of which is not coupled to the active-cell-portion super-junction structure 14 and has an orientation orthogonal to that of the active-cell-portion super-junction structure 14 are provided. Note that, in the column layout, individual peripheral corner regions 17a, 17b, 17c, and 17d form periodic extension regions of the peripheral side regions 16b and 16d located therebelow or thereabove.

FIG. 51 shows a schematic enlarged view of the portion of FIG. 50 corresponding to the cutaway region R1 of the chip corner portion of FIG. 49 (in which the number of the P columns 12p is reduced to be smaller than in an actual situation to clearly show the relations among individual elements). As shown in FIG. 51, the outer end of the P⁻-type surface resurf region 8 is located in the vicinity of the outer end 9e of the peripheral super-junction region 9 around the entire periphery thereof. As shown in FIG. 49, the repetitive structure portion 4r in the active cell region is provided with a periodic structure (one-dimensional periodic structure) in which P+ body contact regions 23 and the polysilicon gate electrodes 15 alternately repeat. Additionally, in the peripheral super-junction region 9 (FIG. 49), a plurality of ring-like floating field plates 30 (FFPs) are provided so as to surround the active cell region 4.

FIG. 52 shows the X-X' cross section of FIG. 51, while FIG. 53 shows the Y-Y' cross section of FIG. 51. As shown in FIGS. 52 and 53, on the surface of an N+ drain region 25 (N-type single-crystal silicon substrate) of a back surface 1b of the chip 2, a metal back-surface drain electrode 24 is provided. Over the N+ drain region 25, the drift region 11 is provided and formed of the N columns 12n, the P columns 12b (P-type drift regions), the N-type drift region 11n, and the like. In the surface area of the drift region 11, the P-type main junction 6 (P well, P body region, or the outer edge portion thereof) is provided. In the P body region 6, N+ source regions 26, the P+ body contact regions 23, and the like are provided. Outside the P-type main junction 6, the P⁻-type surface resurf region 8 is provided to be coupled thereto. In the surface area of the N-type drift region 11n in an end portion of the chip 2, an N+ channel stop region 31, a P+ chip peripheral contact region 32, and the like are provided. Over a semiconductor surface between the pair of N+ source regions 26, the polysilicon gate electrode 15 is provided via a gate insulating film 27. Over the polysilicon gate electrode 15 and a field insulating film 34, an interlayer insulating film 29 is provided. Over the interlayer insulating film 29, aluminum-based electrode films including the metal source electrode 5 and the metal guard ring 3 are formed and each electrically coupled to the N+ drain region 25, the P+ body contact regions 23, the N+ channel stop region 31, the P+ chip peripheral contact region 32, or the like. Note that the width Wn (thickness) of the N column 12n and the width Wp (thickness) of the P column 12p are, e.g., about 6 micrometers and about 4 micrometers (see FIG. 54). The impurity (e.g., phosphorus) concentration of the N column 12n is, e.g., about $3.3 \times 10^{15}/\text{cm}^3$, and the impurity (e.g., boron) concentration of the P column 12p is, e.g., about $5.0 \times 10^{15}/\text{cm}^3$.

FIG. 54 is a main-portion cross-sectional view for illustrating a correlation between the positions or the like of each of the floating field plates 30 shown in FIGS. 51 to 53 and each of the P column regions 12p proximate to or covered by the floating field plates 30 in the main portion (portion mainly corresponding to the peripheral corner regions 17a, 17b, 17c, and 17d) of the peripheral super-junction region 9 (FIG. 49). As shown in FIG. 54, compared with a position 30s of a standard floating field plate, the position of the floating field plate 30 (FFP) mainly used in the present invention is shifted toward the active cell region 4 by about 20% of the pitch (which is, e.g., about 10 micrometers herein) of super-junctions or by about half the width Wp (which is, e.g., about 4 micrometers) of the P column 12p. This is obvious from a middle line 45 of the P column region 12p and a middle line 46 of the N column region 12n in the drawing. Note that, as a preferred example of the width of the floating field plate 30, a dimension equal to about half the width of the pitch of the super-junctions can be shown. Also, an example of the inner limit (in a preferred range) of the inner end of the floating field plate 30 is shown by an inner end limit 47, while an example of the outer limit (in a preferred range) of the outer end thereof is shown by an outer end limit 48. In correspondence thereto, a preferred range of the inner end of the floating field plate 30 is shown by a range FI of the inner end, while a preferred range of the outer end thereof is shown by a range FO of the outer end. As a more preferred example in terms of the relationship with the P column region 12p, a configuration can be shown in which the inner end of the floating field plate 30 and an inner end PCI of the P column region 12p substantially match, and the outer end of the floating field plate 30 covers an outer end PCO of the P column region 12p and further slightly outwardly extends (by, e.g., about 10% of the pitch of the super-junctions).

Figure 87:
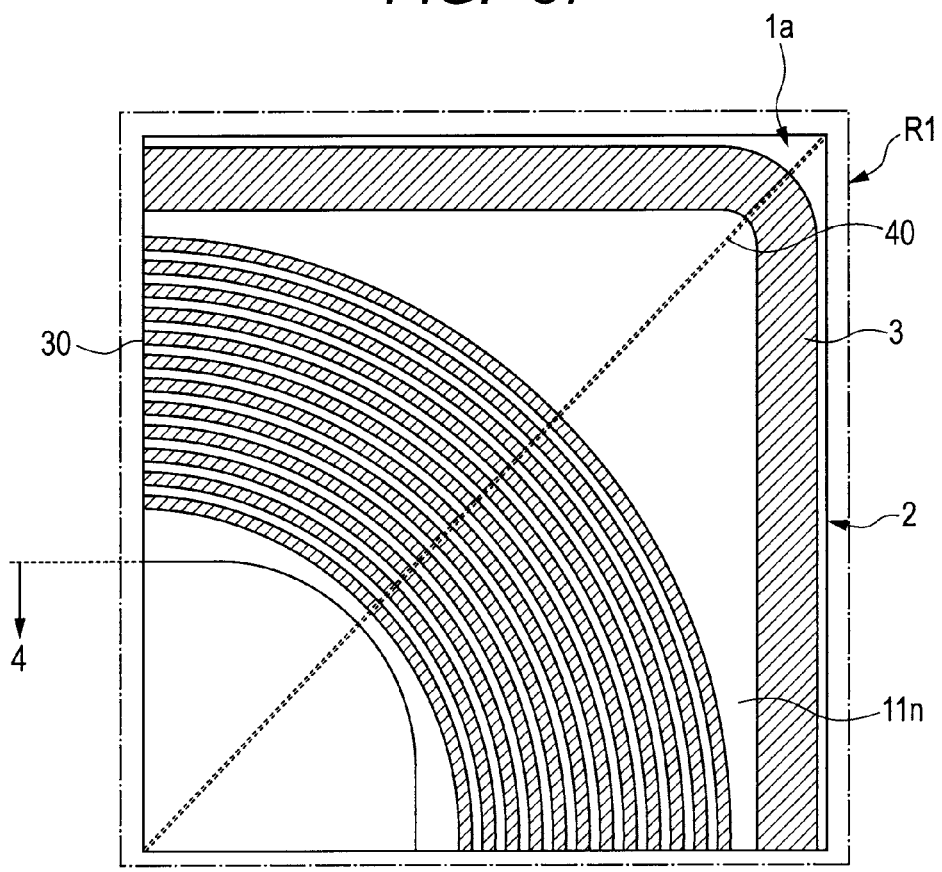
FIG. 87 is a top view (closer to the real equivalent) of the local portion of the chip corresponding to the cut-away region R1 of the chip corner portion of FIG. 50 for illustrating a variation (roundly curved corner portion arrangement) of the individual components (layout of floating field plates) in the semiconductor device of each of the first to third embodiments of the second part of the present invention.

On the other hand, FIGS. 91 and 92 show the two-dimensional positions or the like of the floating field plates and the P column regions (column regions of second conductivity type) in each of the portions which are shown in FIGS. 52 to 54 more schematically than in FIGS. 50 and 51 (in which the number of the P column regions is reduced to be smaller than in an actual situation to clearly show the mutual relations thereamong). As shown in FIGS. 91 and 92, P column regions 12pa1, 12pa2, and 12pa3 and N column regions 12na1 and 12na2 form a second super-junction structure 18, and P column regions 12pc1, 12pc2, and 12pc3 and N column regions 12nc1 and 12nc2 form a third super-junction structure 19. On the other hand, P column regions 12pb1, 12pb2, and 12pb3 and N column regions 12nb1 and 12nb2 form a fourth super-junction structure 21, and P column regions 12pd1, 12pd2, and 12pd3 and N column regions 12nd1 and 12nd2 form a fifth super-junction structure 22. Here, in the example of FIG. 51, the floating field plates 30 show ring shapes each in the form of a rectangular frame along a P column circular region 49pb (surrounding an inner P column circular region 49pa and surrounded by an outer P column circular region 49pc) formed along a group of the P column regions each having the same ordinal number when counted from the active cell region 4 in a radially outward direction, e.g., the P column regions 12pa2, 12pb2, 12pc2, and 12pd2. However, in the peripheral corner regions 17a, 17b, 17c, and 17d (FIG. 50) (i.e., in the regions other than the peripheral main portion including the peripheral side regions 16a, 16b, 16c, and 16d), an equipotential surface when a depletion layer expands is curved, and therefore the corner portions of the floating field plates 30 are not limited to right-angled shapes, and may also be curved, as shown in FIG. 87.

FIG. 55 shows the A-A' cross section (corresponding to 2 periods of the repetitive structure) of the cutaway region R2 of the active cell portion of FIG. 49. As shown in FIG. 55, on the surface of the N+ drain region 25 (N-type single-crystal silicon substrate) of the back surface 1b of the chip 2, the metal back-surface drain electrode 24 is provided. Over the N+ drift region 25, the drift region 11 is provided and formed of the N columns 12n (N-type drift region 11n) and the P columns 12p (P-type drift region 11p). In the surface area of the drift region 11, the P body region 6 is provided. In the P body region 6, N+ source regions 26, the P+ body contact regions 23, and the like are provided. Over the semiconductor surface between the pair of N+ source regions 26, the polysilicon gate electrode 15 is provided via the gate insulating film 27. Over the polysilicon gate electrode 15, the interlayer insulating film 29 is provided. Over the interlayer insulating film 29, the aluminum-based electrode films including the metal source electrode 5 are formed and electrically coupled to the N+ drain region 25 and the P+ body contact regions 23.

3. Description of Wafer Process Corresponding to Semiconductor Device of First Embodiment of Present Invention, Etc. (See Mainly FIGS. 56 to 70)

In this section, a process corresponding to the structures of the first and second sections will be described. However, these process steps are basically common to other structures so that the following description will not be repeated in principle for other structures.

Figure 56:
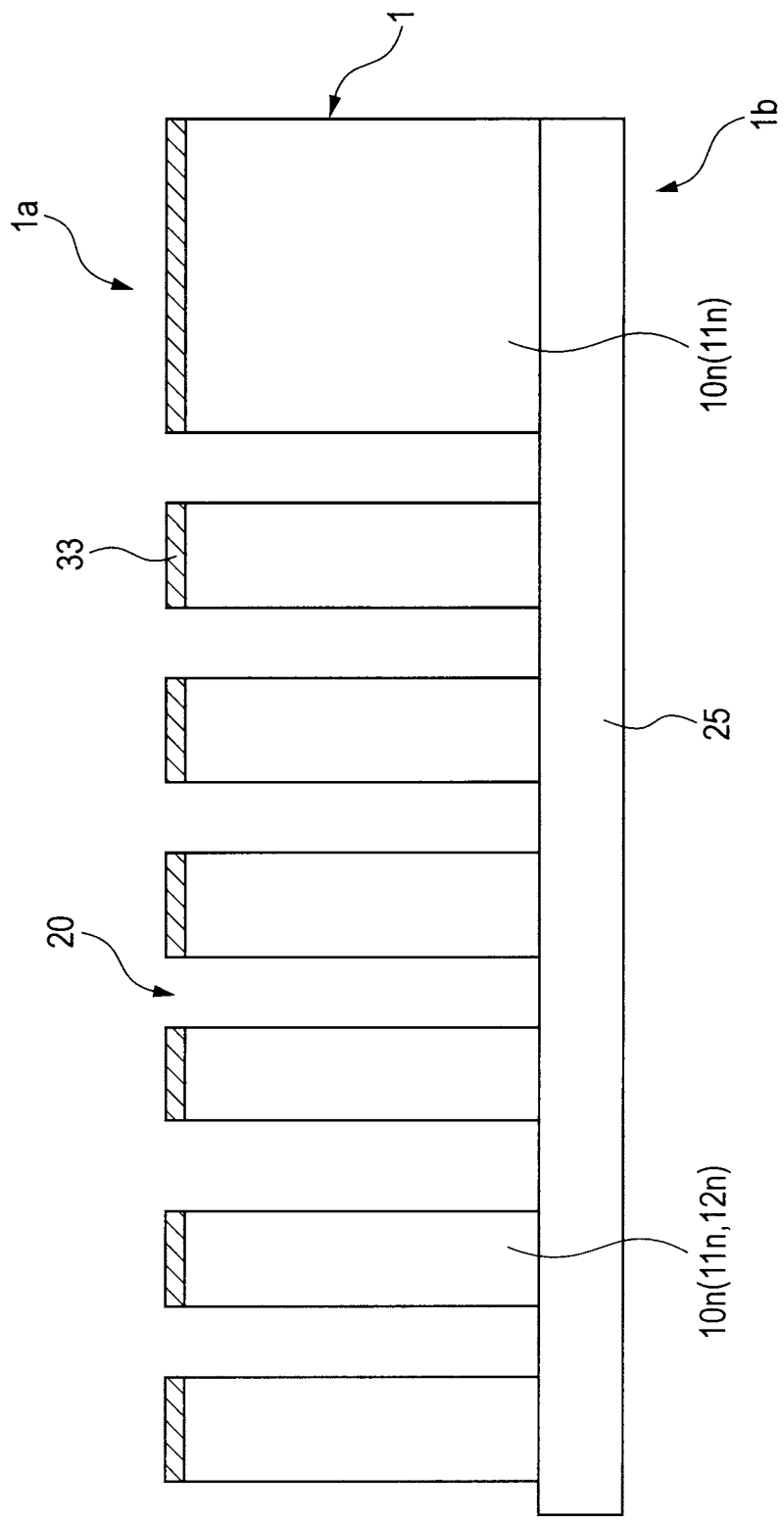
FIG. 56 is a wafer cross-sectional view of a device portion shown in FIG. 52 for illustrating a wafer process (step of forming trenches) corresponding to the semiconductor device of the first embodiment of the second part of the present invention.
Figure 57:
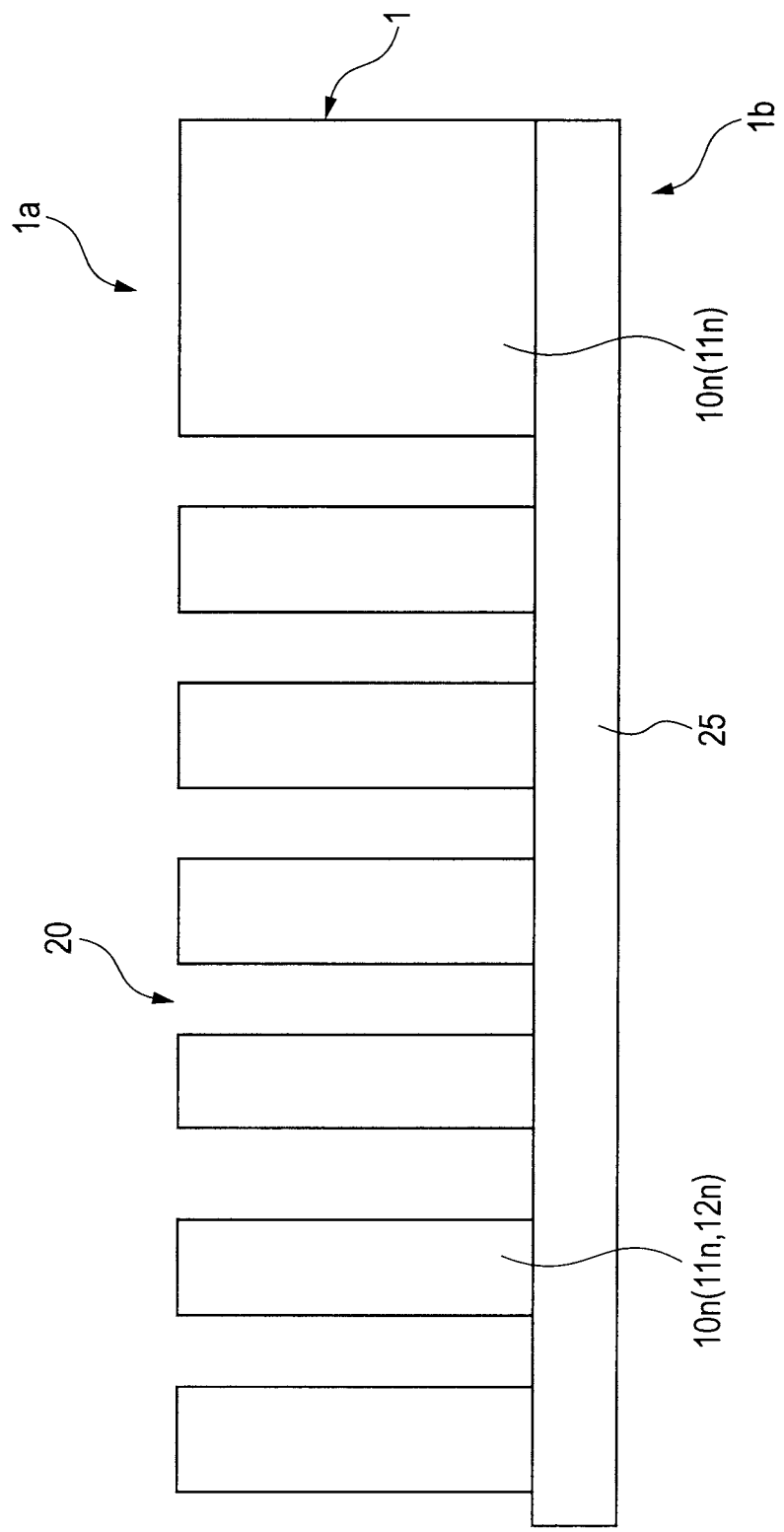
FIG. 57 is a wafer cross-sectional view of the device portion shown in FIG. 52 for illustrating the wafer process (step of removing a hard mask for forming the trenches) corresponding to the semiconductor device of the first embodiment of the second part of the present invention.
Figure 58:
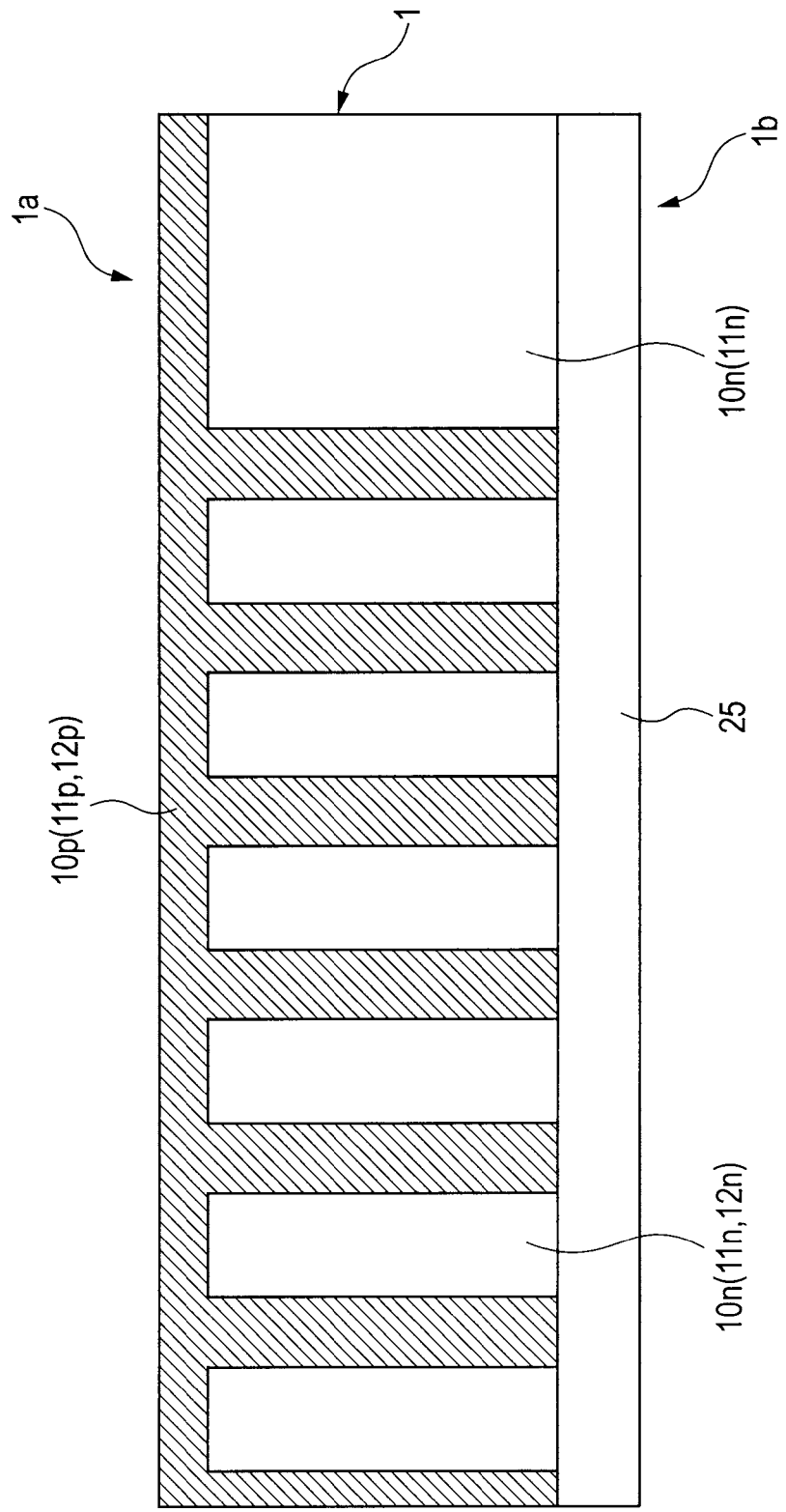
FIG. 58 is a wafer cross-sectional view of the device portion shown in FIG. 52 for illustrating the wafer process (step of filling the trenches with a P-type epitaxial layer) corresponding to the semiconductor device of the first embodiment of the second part of the present invention.
Figure 59:
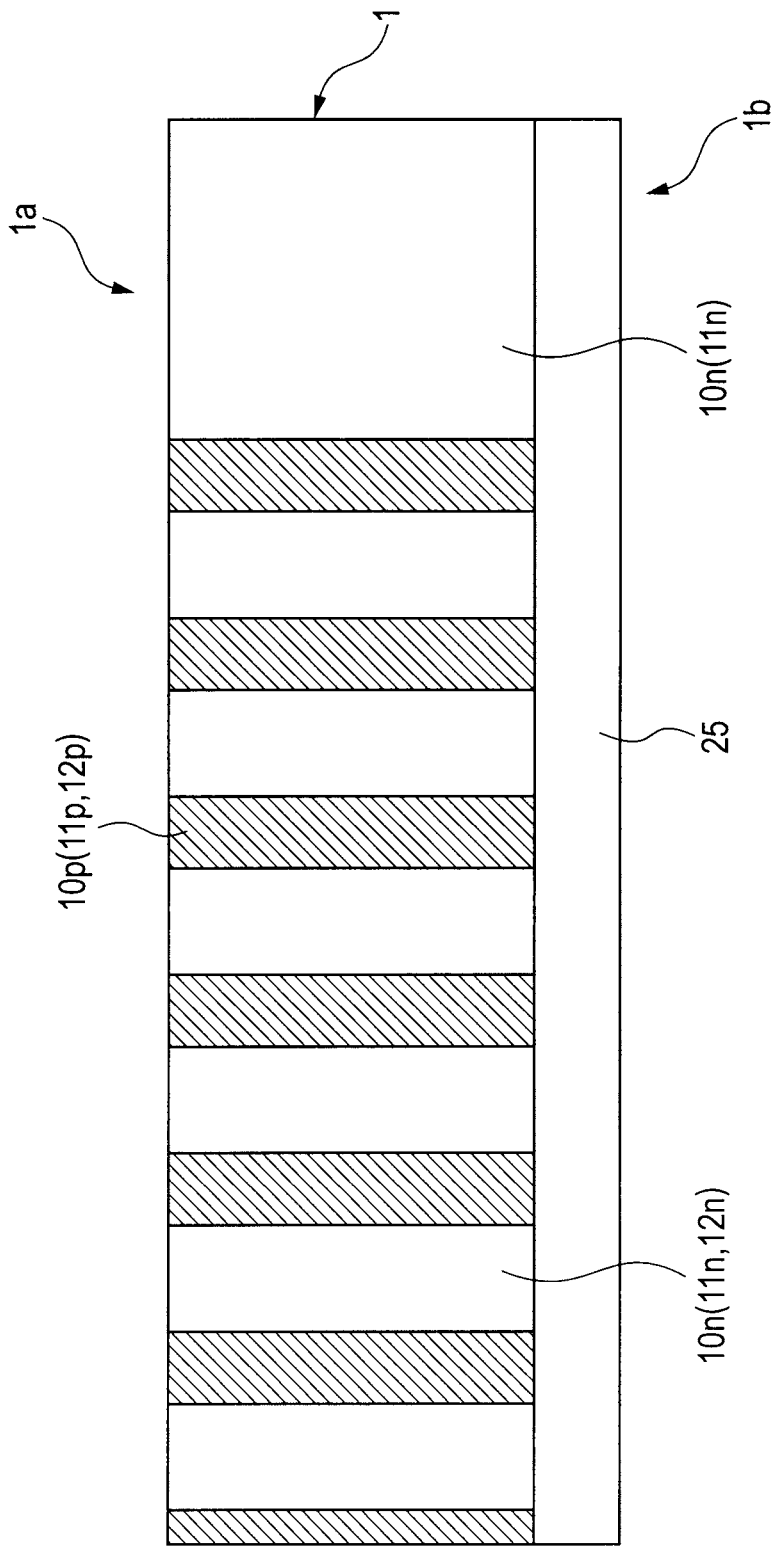
FIG. 59 is a wafer cross-sectional view of the device portion shown in FIG. 52 for illustrating the wafer process (CMP step) corresponding to the semiconductor device of the first embodiment of the second part of the present invention.
Figure 60:
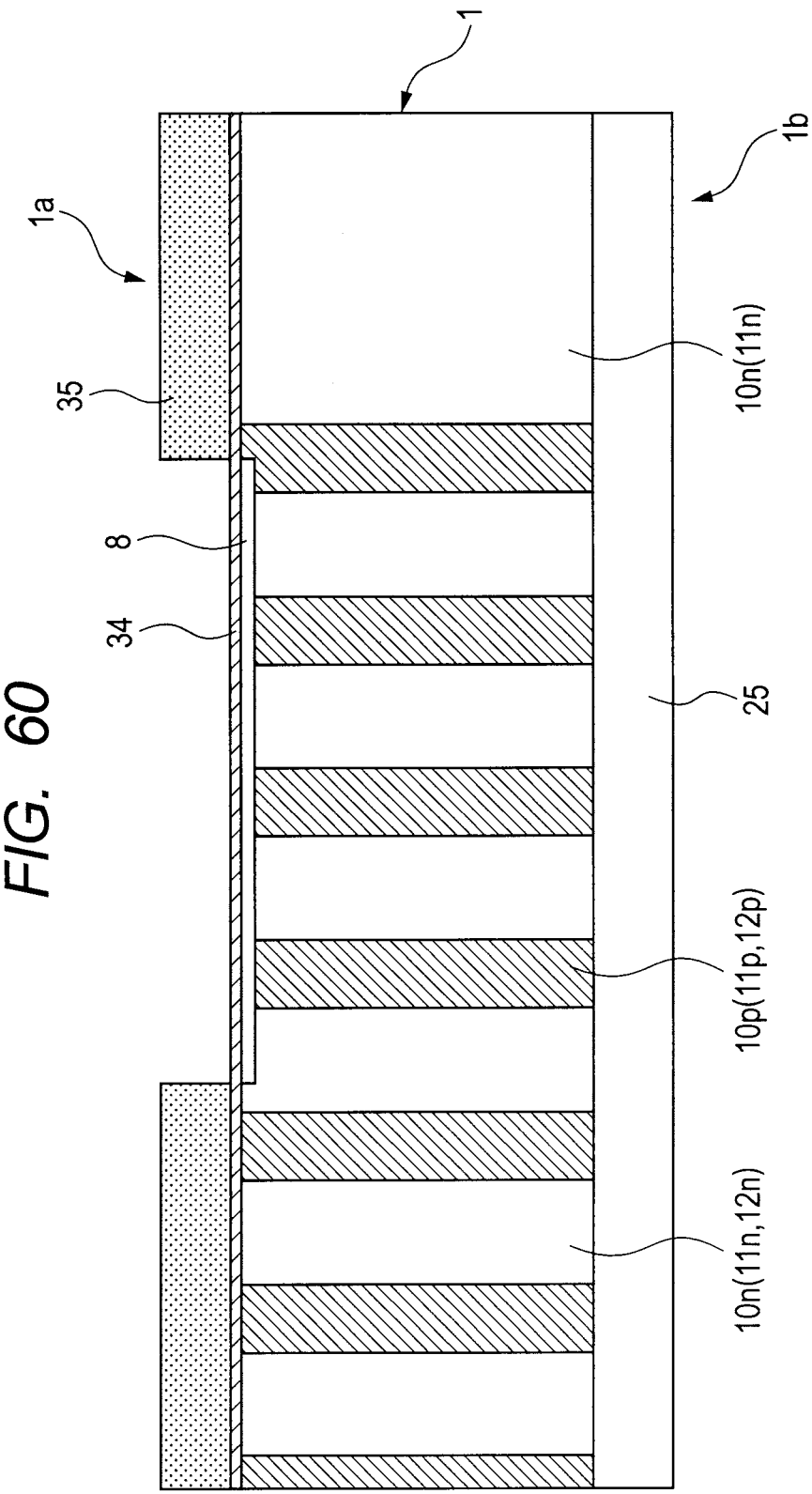
FIG. 60 is a wafer cross-sectional view of the device portion shown in FIG. 52 for illustrating the wafer process (step of introducing a P⁻-type surface resurf region) corresponding to the semiconductor device of the first embodiment of the second part of the present invention.
Figure 61:
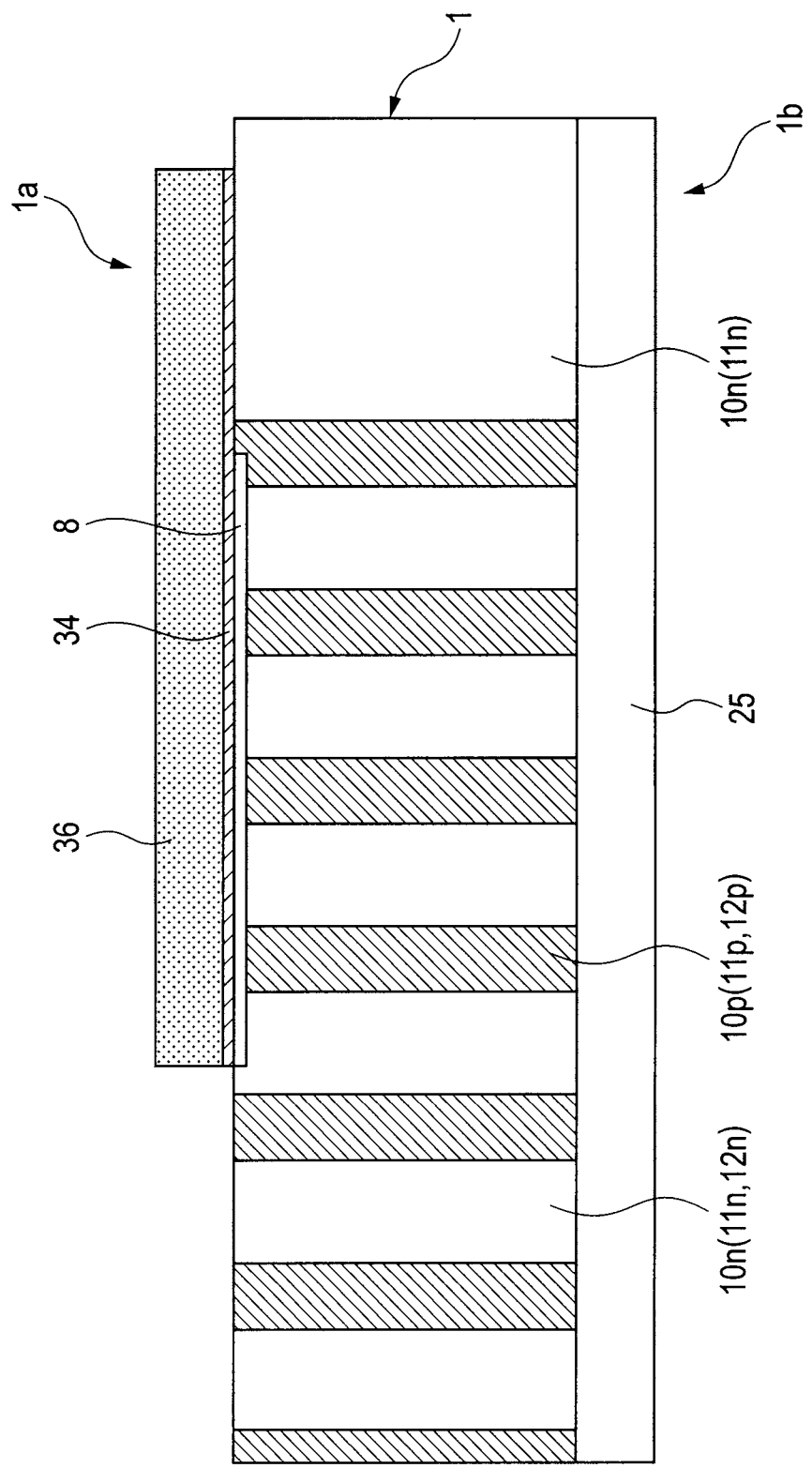
FIG. 61 is a wafer cross-sectional view of the device portion shown in FIG. 52 for illustrating the wafer process (step of patterning a field oxide film) corresponding to the semiconductor device of the first embodiment of the second part of the present invention.
Figure 62:
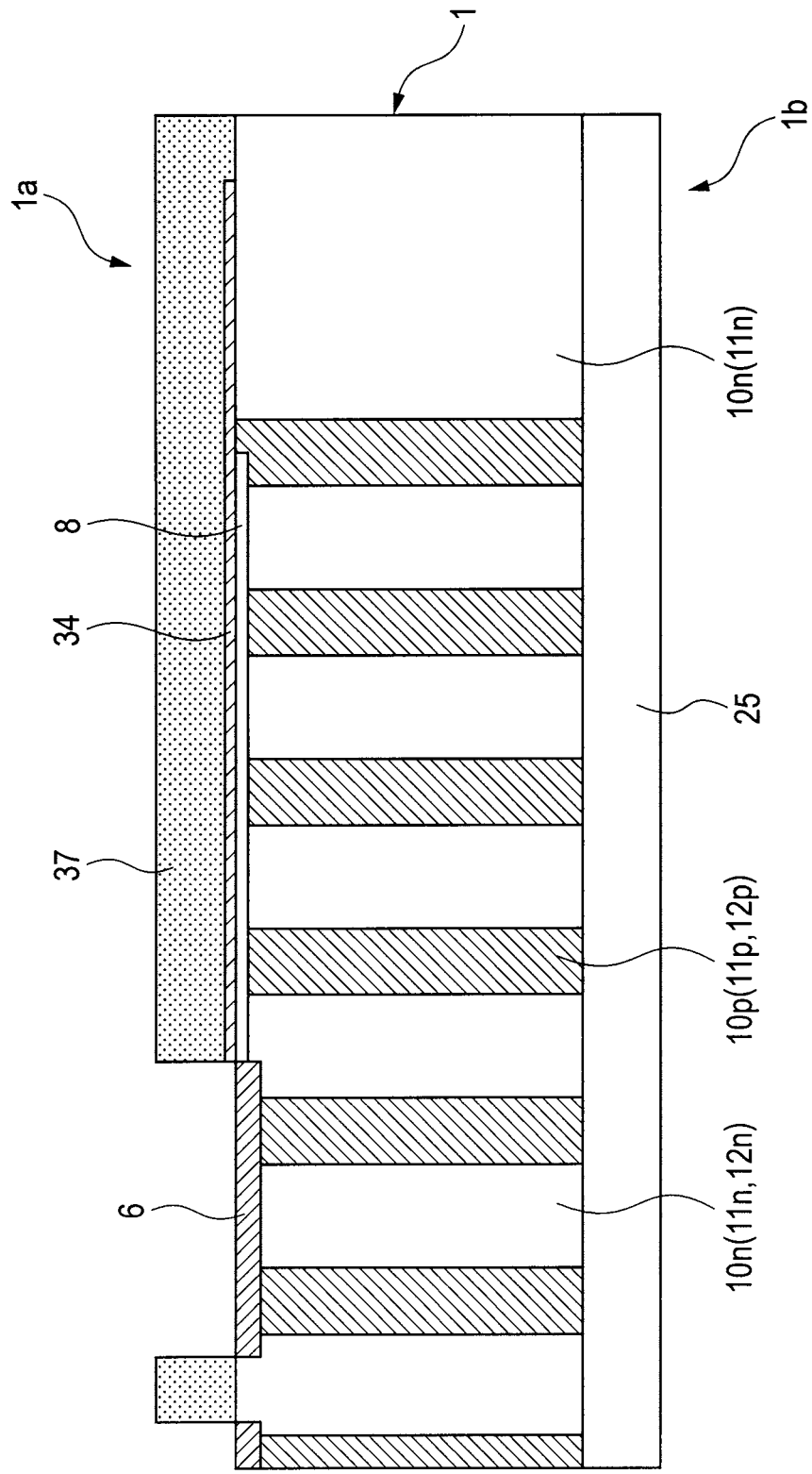
FIG. 62 is a wafer cross-sectional view of the device portion shown in FIG. 52 for illustrating the wafer process (step of introducing a P body region) corresponding to the semiconductor device of the first embodiment of the second part of the present invention.
Figure 63:
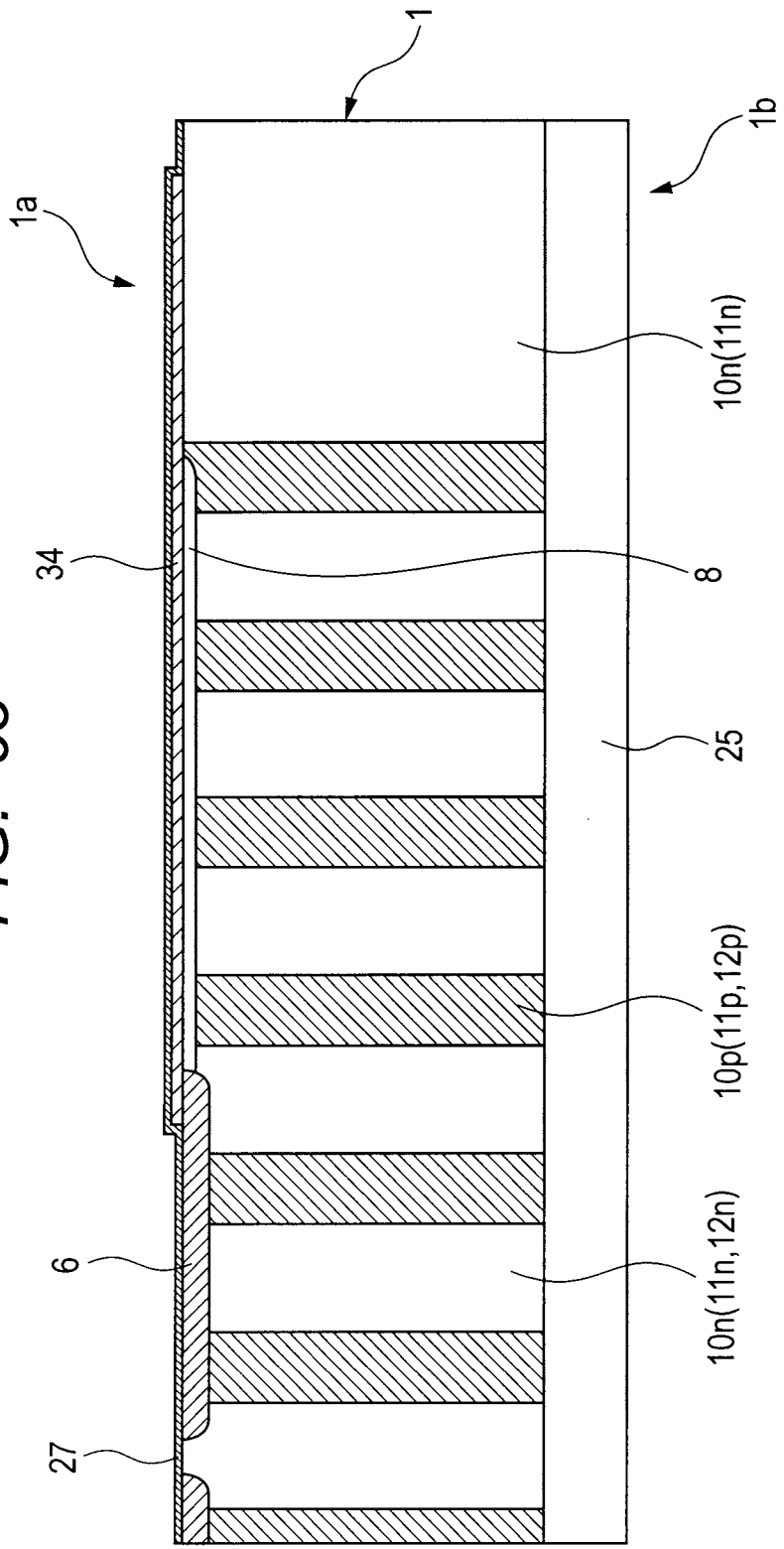
FIG. 63 is a wafer cross-sectional view of the device portion shown in FIG. 52 for illustrating the wafer process (step of forming a gate insulating film) corresponding to the semiconductor device of the first embodiment of the second part of the present invention.
Figure 64:
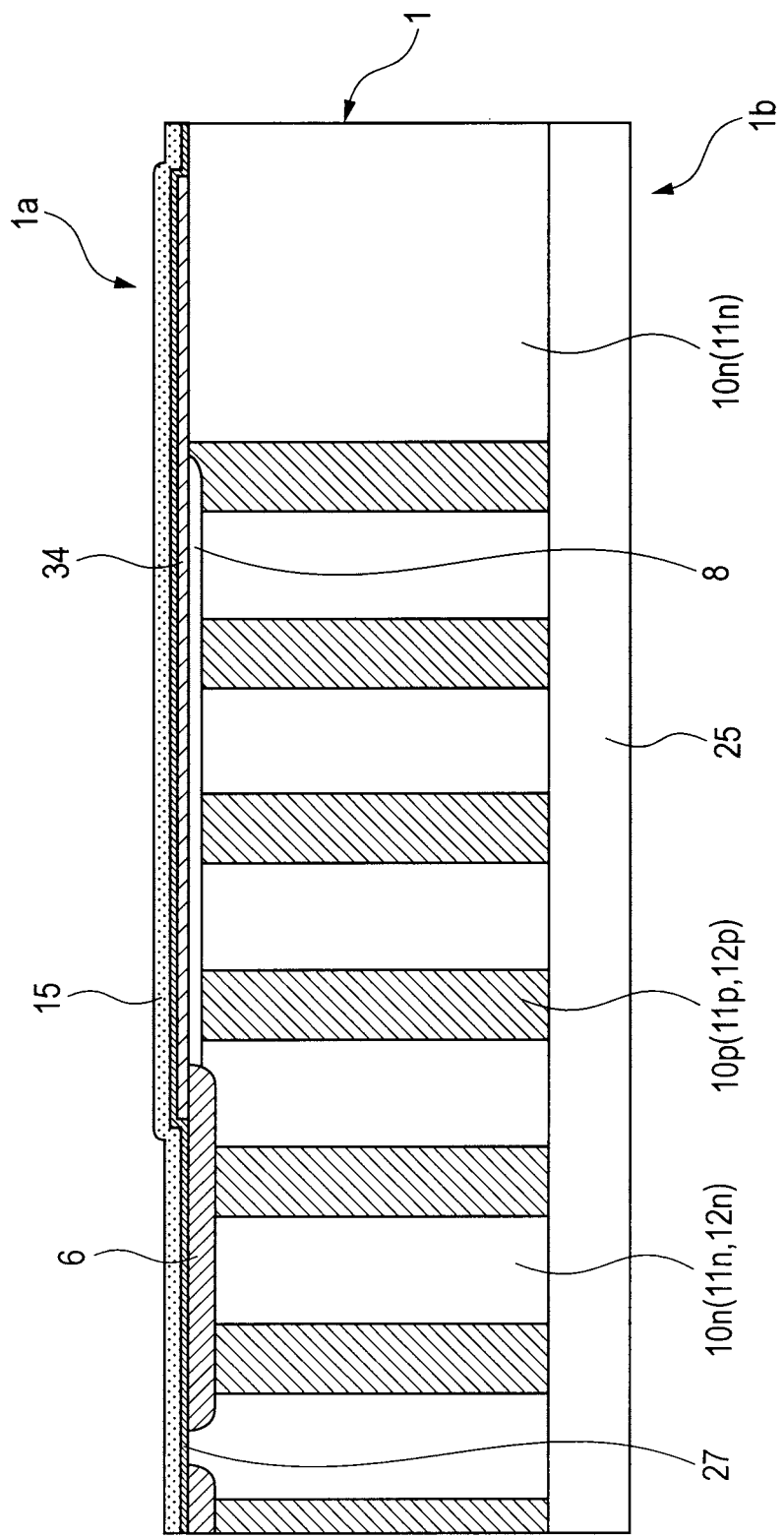
FIG. 64 is a wafer cross-sectional view of the device portion shown in FIG. 52 for illustrating the wafer process (step of forming a gate polysilicon film) corresponding to the semiconductor device of the first embodiment of the second part of the present invention.
Figure 65:
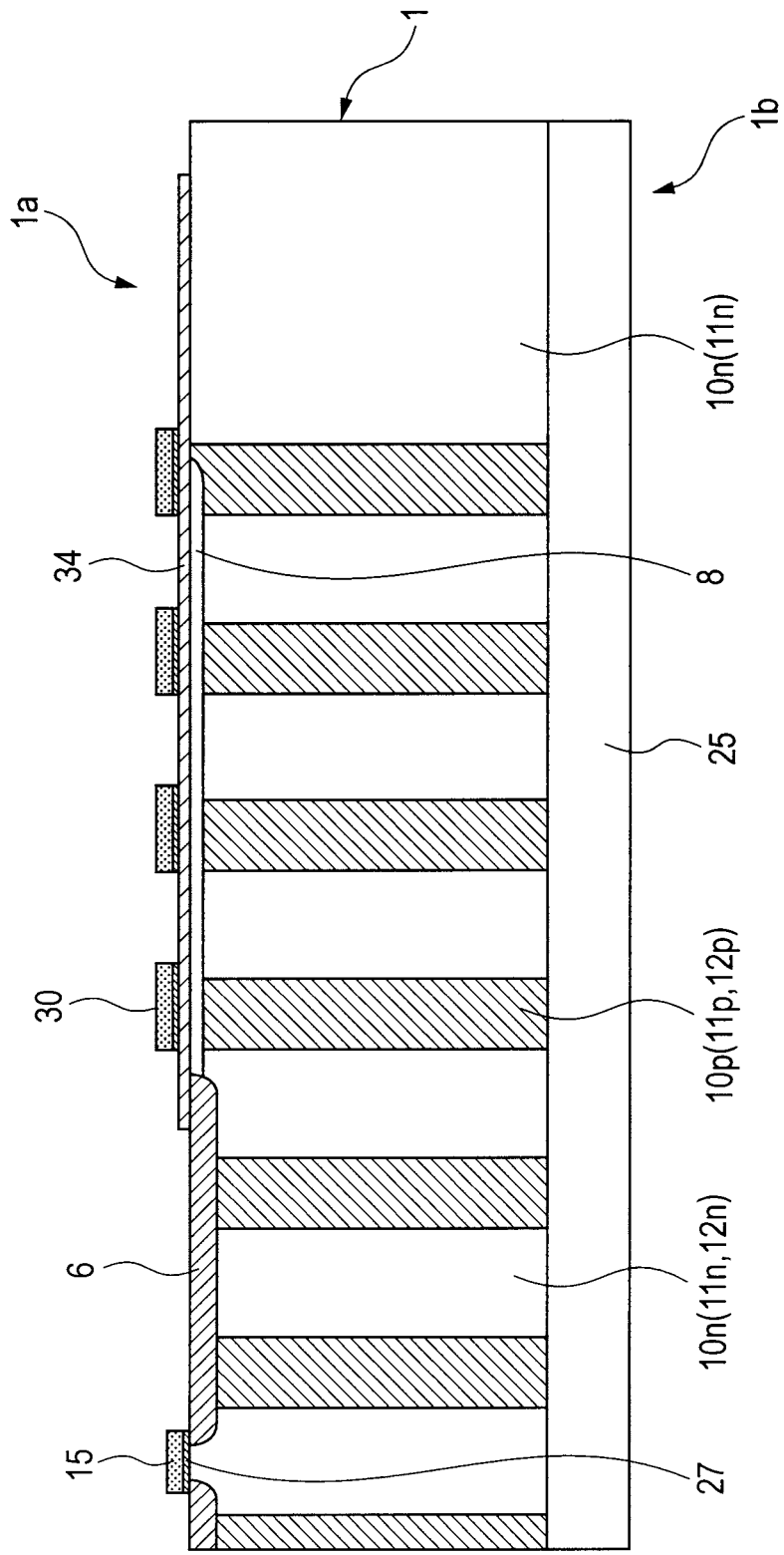
FIG. 65 is a wafer cross-sectional view of the device portion shown in FIG. 52 for illustrating the wafer process (step of patterning the gate polysilicon film into gate electrodes) corresponding to the semiconductor device of the first embodiment of the second part of the present invention.
Figure 66:
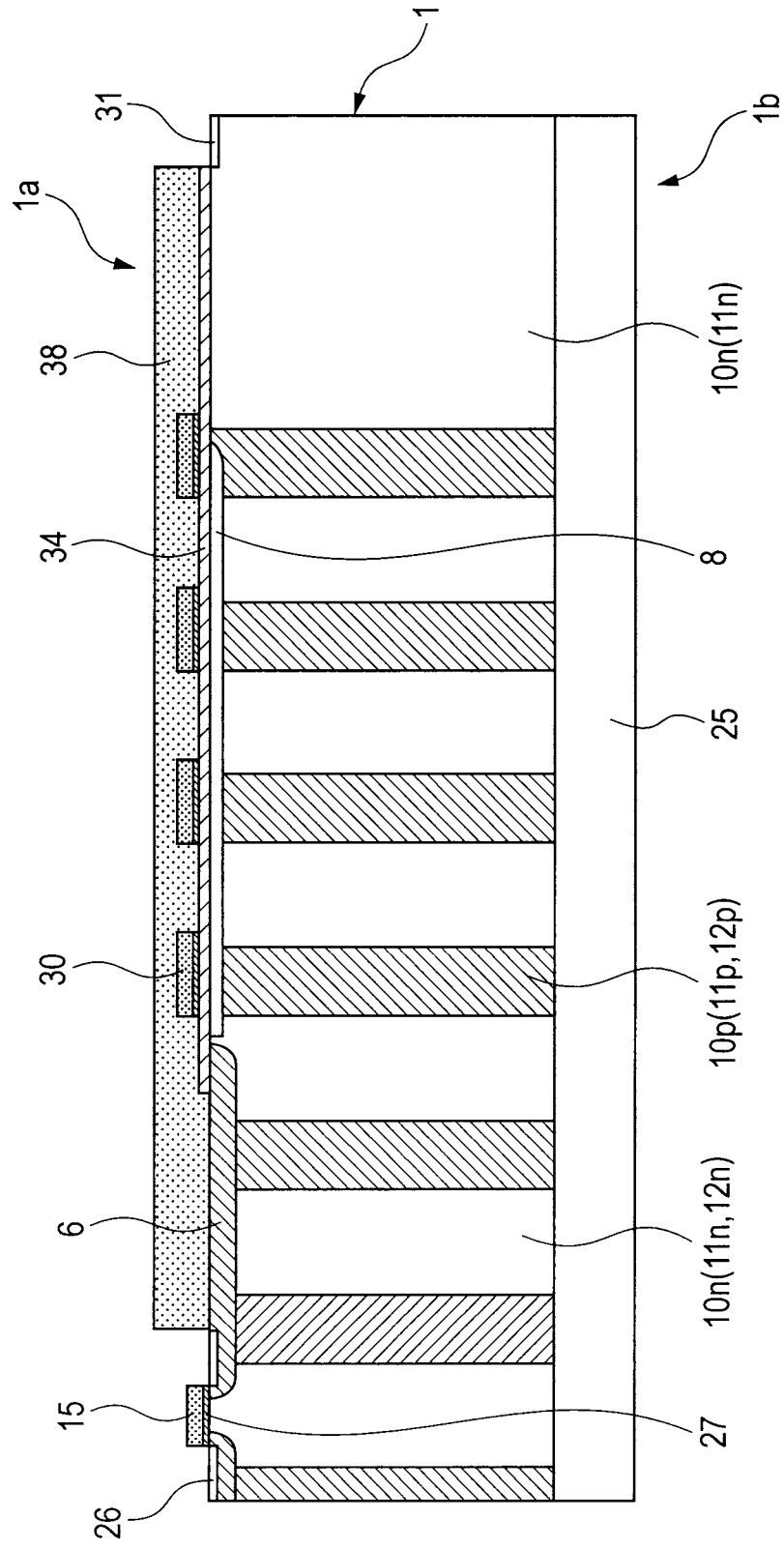
FIG. 66 is a wafer cross-sectional view of the device portion shown in FIG. 52 for illustrating the wafer process (step of forming source regions) corresponding to the semiconductor device of the first embodiment of the second part of the present invention.
Figure 67:
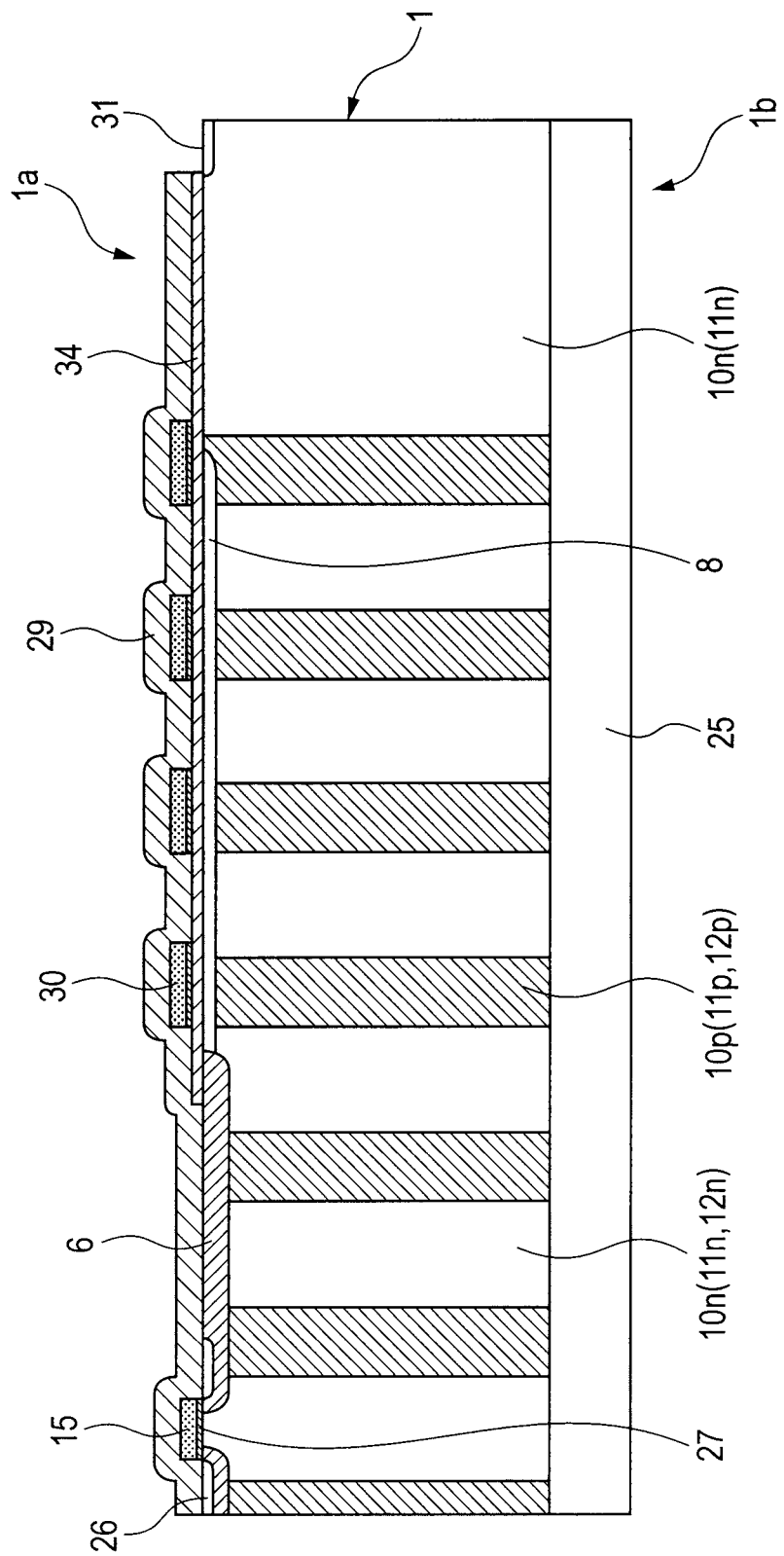
FIG. 67 is a wafer cross-sectional view of the device portion shown in FIG. 52 for illustrating the wafer process (step of forming an interlayer insulating film) corresponding to the semiconductor device of the first embodiment of the second part of the present invention.
Figure 68:
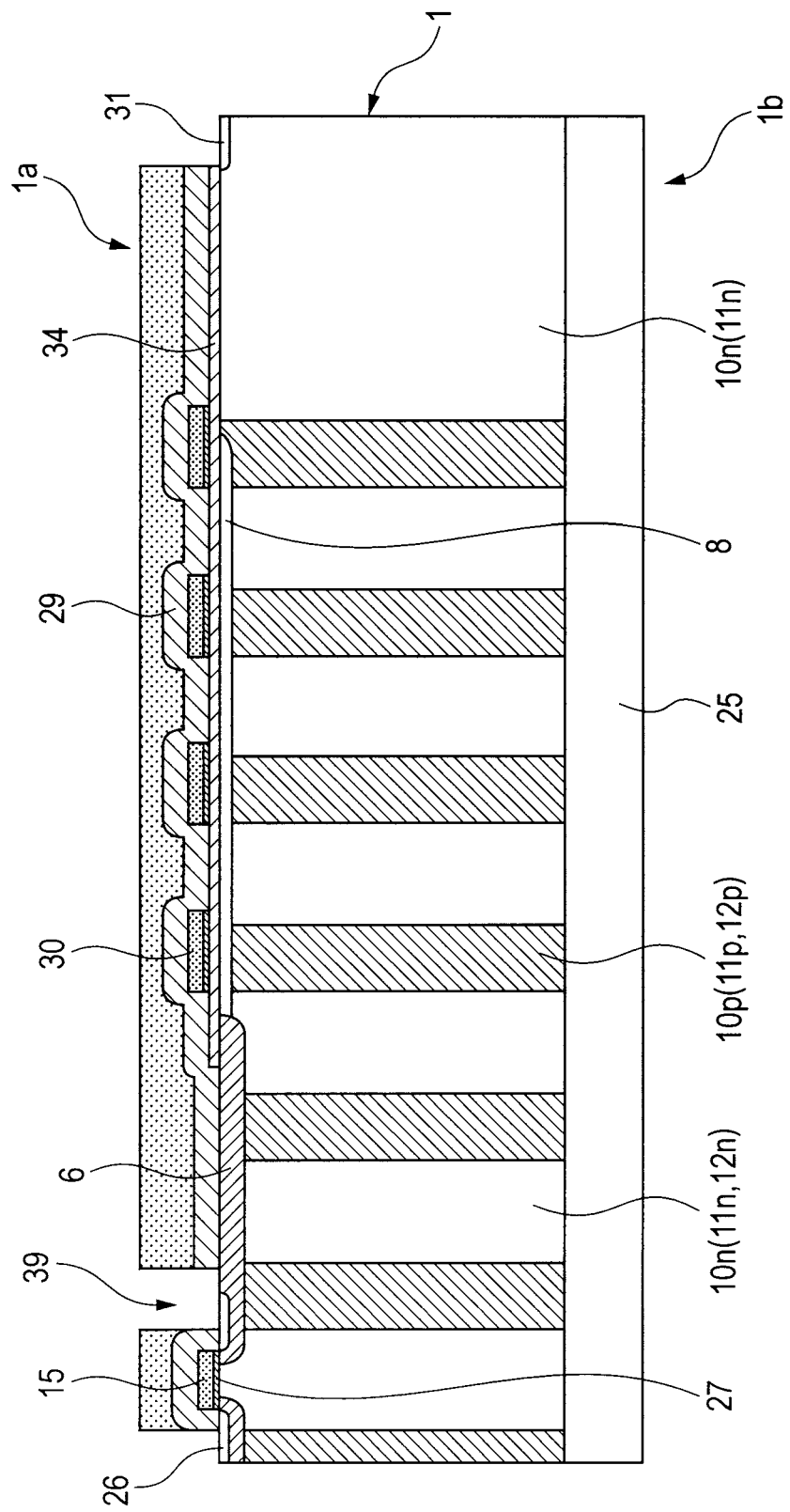
FIG. 68 is a wafer cross-sectional view of the device portion shown in FIG. 52 for illustrating the wafer process (step of forming contact holes) corresponding to the semiconductor device of the first embodiment of the second part of the present invention.
Figure 69:
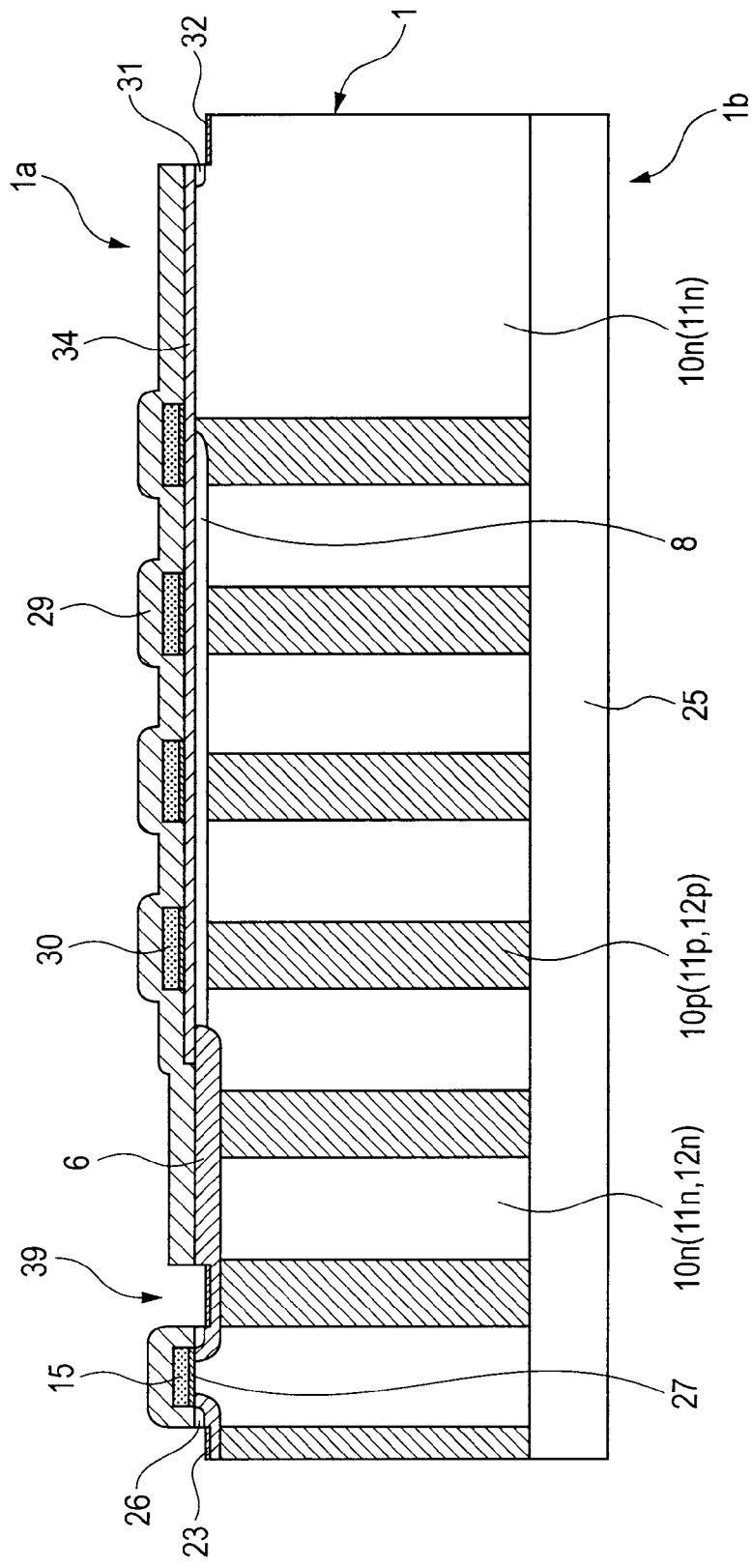
FIG. 69 is a wafer cross-sectional view of the device portion shown in FIG. 52 for illustrating the wafer process (step of extending the contact holes and introducing body contact regions) corresponding to the semiconductor device of the first embodiment of the second part of the present invention.
Figure 70:
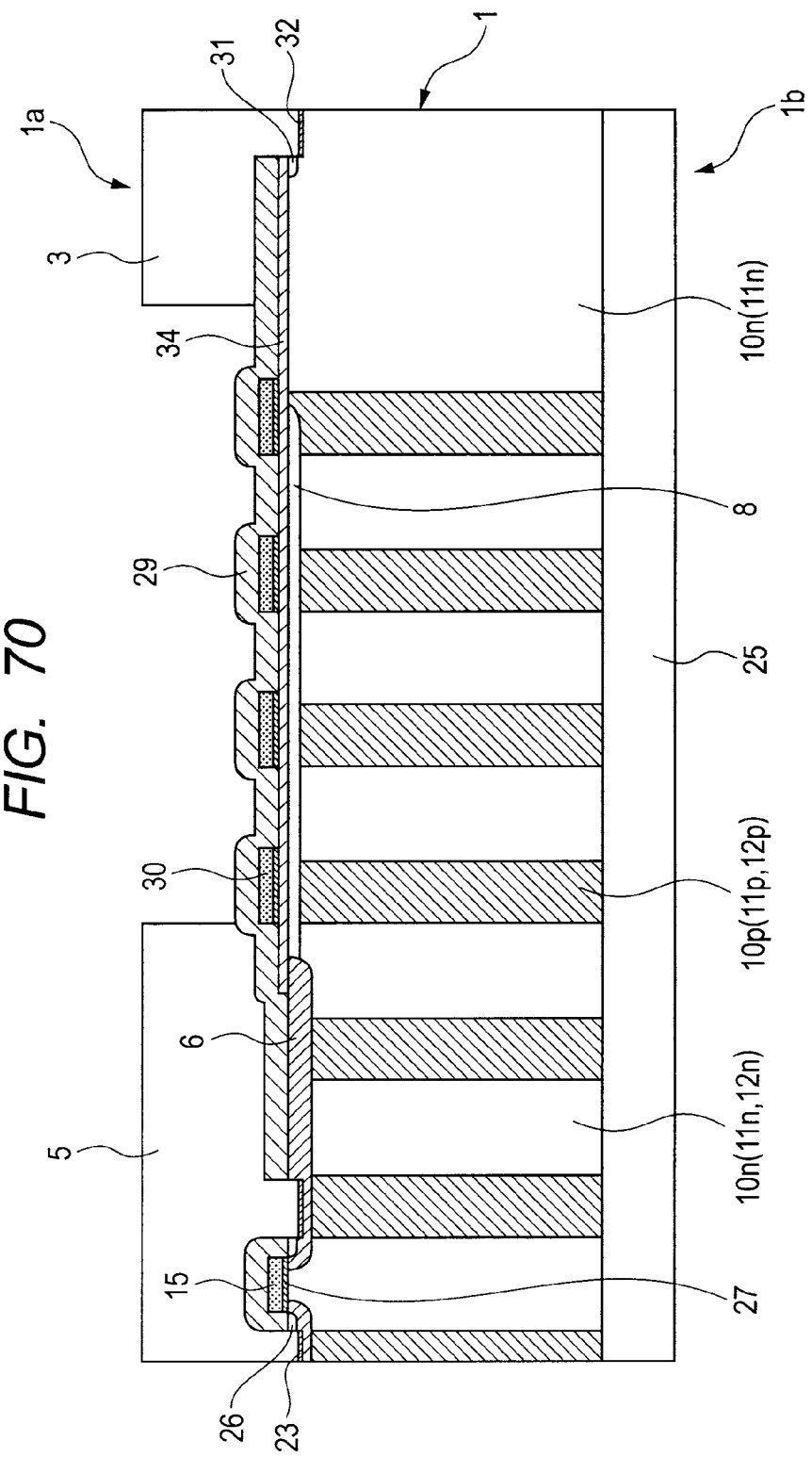
FIG. 70 is a wafer cross-sectional view of the device portion shown in FIG. 52 for illustrating the wafer process (step of forming an aluminum-based conductive film) corresponding to the semiconductor device of the first embodiment of the second part of the present invention.

FIG. 56 is a wafer cross-sectional view of a device portion shown in FIG. 7 for illustrating a wafer process (step of forming trenches) corresponding to the semiconductor device of the first embodiment of the present invention. FIG. 57 is a wafer cross-sectional view of the device portion shown in FIG. 52 for illustrating the wafer process (step of removing a hard mask for forming the trenches) corresponding to the semiconductor device of the first embodiment of the present invention. FIG. 58 is a wafer cross-sectional view of the device portion shown in FIG. 52 for illustrating the wafer process (step of filling the trenches with a P-type epitaxial layer) corresponding to the semiconductor device of the first embodiment of the present invention. FIG. 59 is a wafer cross-sectional view of the device portion shown in FIG. 52 for illustrating the wafer process (CMP step) corresponding to the semiconductor device of the first embodiment of the present invention. FIG. 60 is a wafer cross-sectional view of the device portion shown in FIG. 52 for illustrating the wafer process (step of introducing a P⁻-type surface resurf region) corresponding to the semiconductor device of the first embodiment of the present invention. FIG. 61 is a wafer cross-sectional view of the device portion shown in FIG. 52 for illustrating the wafer process (step of patterning a field oxide film) corresponding to the semiconductor device of the first embodiment of the present invention. FIG. 62 is a wafer cross-sectional view of the device portion shown in FIG. 52 for illustrating the wafer process (step of introducing a P body region) corresponding to the semiconductor device of the first embodiment of the present invention. FIG. 63 is a wafer cross-sectional view of the device portion shown in FIG. 52 for illustrating the wafer process (step of forming a gate insulating film) corresponding to the semiconductor device of the first embodiment of the present invention. FIG. 64 is a wafer cross-sectional view of the device portion shown in FIG. 52 for illustrating the wafer process (step of forming a gate polysilicon film) corresponding to the semiconductor device of the first embodiment of the present invention. FIG. 65 is a wafer cross-sectional view of the device portion shown in FIG. 52 for illustrating the wafer process (step of patterning the gate polysilicon film into gate electrodes) corresponding to the semiconductor device of the first embodiment of the present invention. FIG. 66 is a wafer cross-sectional view of the device portion shown in FIG. 52 for illustrating the wafer process (step of forming source regions) corresponding to the semiconductor device of the first embodiment of the present invention. FIG. 67 is a wafer cross-sectional view of the device portion shown in FIG. 52 for illustrating the wafer process (step of forming an interlayer insulating film) corresponding to the semiconductor device of the first embodiment of the present invention. FIG. 68 is a wafer cross-sectional view of the device portion shown in FIG. 52 for illustrating the wafer process (step of forming contact holes) corresponding to the semiconductor device of the first embodiment of the present invention. FIG. 69 is a wafer cross-sectional view of the device portion shown in FIG. 52 for illustrating the wafer process (step of extending the contact holes and introducing body contact regions) corresponding to the semiconductor device of the first embodiment of the present invention. FIG. 70 is a wafer cross-sectional view of the device portion shown in FIG. 52 for illustrating the wafer process (step of forming an aluminum-based conductive film) corresponding to the semiconductor device of the first embodiment of the present invention. Based on these drawings, a description will be given to a wafer process corresponding to the semiconductor device of the first embodiment of the present invention or the like.

First, as shown in FIG. 56, the semiconductor wafer 1 is prepared in which, over the N-type single-crystal silicon substrate 25 (which is, e.g., a 200 mm wafer but may also have a wafer diameter of 150 mm, 300 mm, or 450 mm) doped with, e.g., antimony (at a concentration of the order of, e.g., about $10^{18}/cm^3$ to $10^{19}/cm^3$), a phosphorus-doped N-epitaxial layer 10n (drift region at a concentration of the order of, e.g., about $10^{15}/cm^3$, which is a portion serving as the N-type drift region 11n and also partly serving as the N columns 12n) having a thickness of, e.g., about 45 micrometers is formed. Over a device surface 1a (main surface opposite to the back surface 1b) of the semiconductor wafer 1, a hard mask film 33 for forming P-type column trenches made of, e.g., P-TEOS (Plasma-Tetraethylorthosilicate) or the like is formed. Next, as shown in FIG. 56, using the hard mask 33 for forming P-type column trenches as a mask, the N epitaxial layer 10n and the like are dry-etched to form P-type column trenches 20. Examples of a dry etching atmosphere that can be shown include an atmosphere containing, e.g., Ar, $SF_6$, $O_2$, and so forth as main gas components. Examples of the range of the depth of dry etching that can be shown include a range of, e.g., about 40 to 55 micrometers. Note that the P-type column trenches 20 preferably reach the N-type single-crystal silicon substrate 25. However, the P-type column trenches 20 need not necessarily reach the N-type single-crystal silicon substrate 25 as long as they are proximate thereto.

Next, as shown in FIG. 57, the hard mask 33 that is no longer needed is removed.

Next, as shown in FIG. 58, filling epitaxial growth (in-trench epitaxial filling method) is performed with respect to the P-type column trenches 20 to form a P-type filling epitaxial layer 10p (dopant is boron at a concentration of the order of, e.g., about $10^{15}/cm^3$). The P-type epitaxial region 10p is a portion serving as the P-type drift region 11p and also serving as the P columns 12p. Examples of conditions for the filling epitaxial growth that can be shown include a processing pressure of, e.g., about $1.3 \times 10^4$ Pascal to $1.0 \times 10^5$ Pascal, a raw material gas of silicon tetrachloride, trichlorosilane, dichlorosilane, monosilane, or the like.

Next, as shown in FIG. 59, the P-type filling epitaxial layer 10p located outside the P-type column trenches 20 is removed by a planarizing step, e.g., CMP (Chemical Mechanical Polishing), while the surface 1a of the semiconductor wafer 1 is simultaneously planarized. Note that, here, a super-junction structure as shown in FIG. 11 may also be formed by a multi-epitaxial method besides the trench fill method.

Next, as shown in FIG. 60, the silicon oxide film 34 (field insulating film) is formed by thermal oxidation over substantially the entire top surface 1a of the semiconductor wafer 1, and a resist film 35 for introducing P⁻-type resurf region is formed thereover by lithography. Examples of the thickness of the field insulating film 34 that can be shown include about 350 nm.

Subsequently, using the resist film 35 for introducing P⁻-type resurf region as a mask, the P⁻-type surface resurf region 8 is introduced by ion implantation (of, e.g., boron). Examples of conditions for the ion implantation that can be shown include an ion species of boron, an implantation energy in a preferred range around, e.g., 200 keV, and a dose in a preferred range of, e.g., about $1 \times 10^{11}/cm^2$ to $1 \times 10^{12}/cm^2$. Thereafter, the resist film 35 that is no longer needed is removed.

Next, as shown in FIG. 61, over the top surface 1a of the semiconductor wafer 1, a resist film 36 for etching silicon oxide film is formed by lithography. Subsequently, using the resist film 36 as a mask, the field insulating film 34 is patterned by dry etching using, e.g., a fluorocarbon-based etching gas or the like. Thereafter, the resist film 36 that is no longer needed is entirely removed.

Next, as shown in FIG. 62, a resist film 37 for introducing P body region is formed over the top surface 1a of the semiconductor wafer 1 by lithography (typically, prior to the formation of the resist film 37, a protective film against ion implantation such as a thermal oxidation film of, e.g., about 10 nm is formed over the top surface 1a of the semiconductor wafer 1, but a depiction thereof is omitted to prevent complicated illustration, which is also the same in other portions). Subsequently, using the resist film 37 for introducing P body region as a mask, the P body region 6 is introduced by ion implantation. Examples of conditions for the ion implantation that can be shown include: (1) an ion species of boron, an implantation energy in a preferred range around, e.g., 200 keV, and a dose in a preferred range around the order of, e.g., $10^{13}/cm^2$, which are for a first step; and (2) an ion species of boron, an implantation energy in a preferred range around, e.g., 75 keV, and a dose in a preferred range around the order of, e.g., $10^{12}/cm^2$ (a concentration is on the order of, e.g., about $10^{17}/cm^3$), which are for a second step. Thereafter, the resist film 37 that is no longer needed is entirely removed.

Next, as shown in FIG. 63, over the top surface 1a of the semiconductor wafer 1, the gate oxide film 27 (gate insulating film) is formed. An exemplary thickness of the gate insulating film 27 that can be shown ranges from, e.g., about 50 nm to 200 nm, though it depends on a breakdown voltage. Examples of a film deposition method that can be shown include a CVD (Chemical Vapor Deposition), a thermal oxidation method, and the like. Note that, to wafer cleaning prior to gate oxidation, wet cleaning can be applied which uses, e.g., a first cleaning solution, i.e., a mixed solution of ammonia, hydrogen peroxide, and pure water at 1:1:5 (volume ratio) and a second cleaning solution, i.e., a mixed solution of hydrochloric acid, hydrogen peroxide, and pure water at 1:1:6 (volume ratio).

Next, as shown in FIG. 64, over the gate oxide film 27, a gate electrode polysilicon film 15 (having a thickness of, e.g., about 200 nm to 800 nm) is formed by, e.g., low-pressure CVD (Chemical Vapor Deposition).

Next, as shown in FIG. 65, the gate electrode polysilicon film 15 is patterned by dry etching into the gate electrodes 15 and the floating field plates 30 (FFPs).

Next, as shown in FIG. 66, a resist film 38 for introducing N+ source regions is formed by lithography and, using the resist film 38 as a mask, the N+ source regions 26 and the N+ channel stopper region 31 in the chip edge portion are introduced by ion implantation. Examples of conditions for the ion implantation that can be shown include an ion species of arsenic, an implantation energy in a preferred range around, e.g., 40 keV, and a dose in a preferred range around the order of, e.g., $10^{15}/cm^2$ (a concentration is on the order of, e.g., about $10^{20}/cm^3$). Thereafter, the resist film 38 that is no longer needed is entirely removed.

Next, as shown in FIG. 67, over substantially the entire surface of the top surface 1a of the semiconductor wafer 1, the PSG (Phospho-Silicate-Glass) film 29 (interlayer insulating film) is deposited by CVD or the like. Note that, as the interlayer insulating film 29, a BPSG film, a TEOS film, a SOG film, a HDP (High Density Plasma) silicon oxide film, a PSG film, or a laminate film of a plurality of any of the foregoing films may also be used besides the PSG film. Preferred examples of the total thickness of the interlayer insulating film 29 that can be shown include about 900 nm.

Next, as shown in FIG. 68, over the top surface 1a of the semiconductor wafer 1, a resist film 41 for forming source contact holes is formed and, using the resist film 41 as a mask, source contact holes 39 and the like are opened by dry etching. Subsequently, the resist film 41 that is no longer needed is entirely removed.

Next, as shown in FIG. 69, the silicon substrate is etched and then, by ion implantation, the P+ body contact regions 23 and the P+ chip peripheral contact region 32 are introduced. Examples of conditions for ion implantation that can be shown include an ion species of $BF_2$, an implantation energy in a preferred range around, e.g., 30 keV, and a dose in a preferred range around the order of, e.g., $10^{15}/cm^2$ (a concentration is on the order of, e.g., about $10^{19}/cm^3$).

Next, as shown in FIG. 70, an aluminum-based metal layer is deposited by sputtering or the like via a barrier metal film of TiW or the like and patterned to form the metal source electrode 5, the guard ring electrode 3, and the like.

Then, as necessary, a final passivation film such as, e.g., an inorganic final passivation film or an organic-inorganic final passivation film is formed in an upper layer, and pad openings and gate openings are formed therein. As the final passivation film, a single-layer film such as an inorganic final passivation film or an organic-inorganic final passivation film may be formed or, besides, an organic-inorganic final passivation film or the like may also be laminated over an under-layer inorganic final passivation film.

Next, a back grinding treatment is performed to reduce the original wafer thickness (e.g., about 750 micrometers) to, e.g., about 80 to 280 micrometers (i.e., a thickness less than 300 micrometers).

In addition, over the back surface 1b of the wafer 1, the metal back-surface drain electrode 24 (see FIGS. 52, 53, and 55) is deposited by sputtering film deposition. The back-surface metal electrode film 24 includes, e.g., a back-surface titanium film (diffusion preventing layer of gold and nickel), a back-surface nickel film (adhesive layer to a chip bonding material), a back-surface gold film (oxidation preventing layer of nickel) which are mentioned in order of increasing distance from the wafer 1, and the like. Thereafter, the wafer is divided into individual chips, which are subjected to transfer molding using a mold resin or the like, resulting in a packaged device as shown in FIG. 46.

4. Description of Device Structure (Peripheral 2D Super-Junction and N Rings) of Power MOSFET with Super-Junction Structure, Etc. as Example of Semiconductor Device of Second Embodiment of Present Invention (See Mainly FIGS. 71 to 74 and FIG. 92)

The RESURF structure described herein attains substantially the same object as described in the second section. Here, a description will be given to the case where the resurf structure is used alone, but it will be appreciated that the resurf structure may also be used in combination. When the resurf structure is used in combination, the effect thereof is accordingly enhanced.

Note that, structurally, the resurf structure is substantially the same as described in the second section except that the floating field plates 30 have been replaced with N ring regions 42n (ring regions of first conductivity type). Therefore, hereinbelow, a description will be given only to a different portion in principle.

Figure 71:
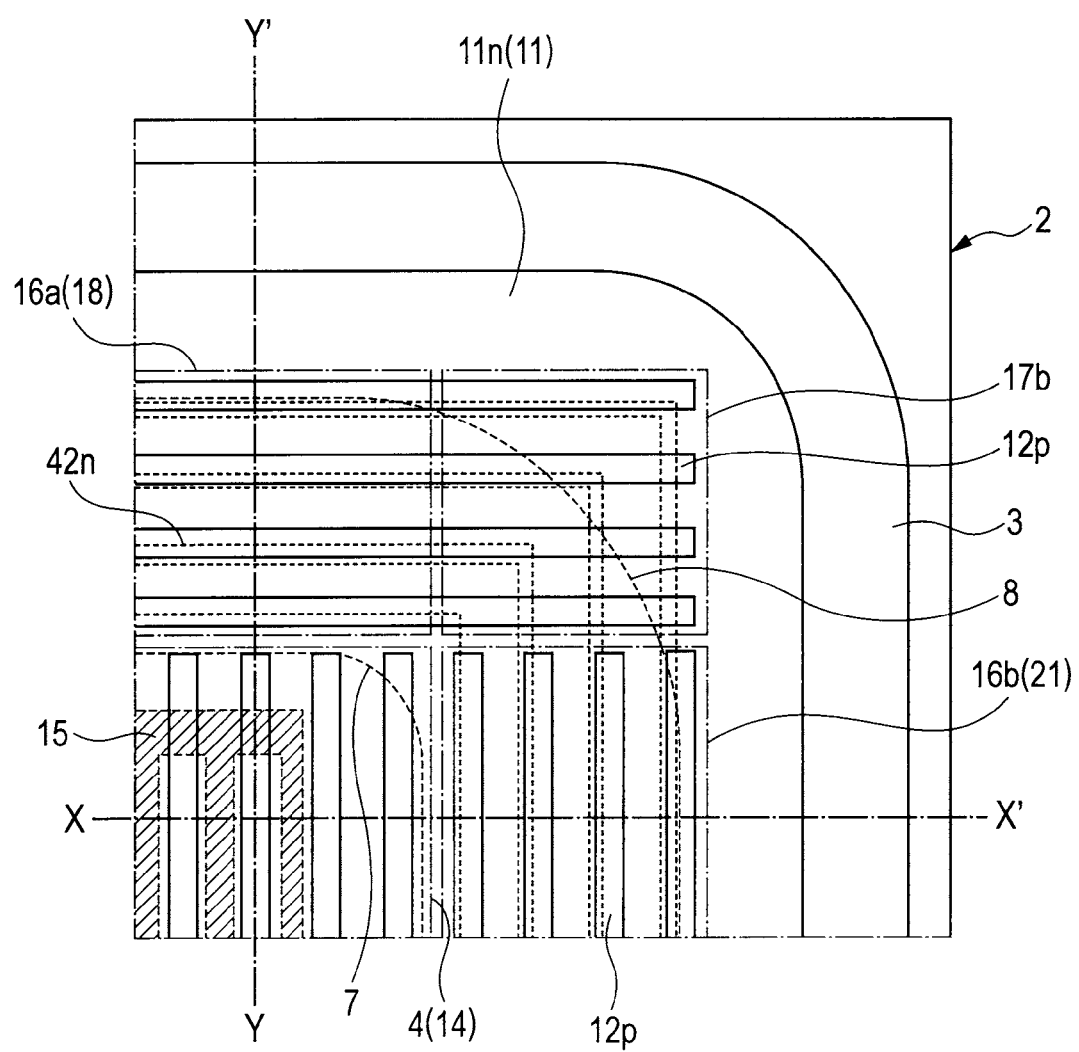
FIG. 71 is a top view of a local portion of a chip of a power MOSFET having a super-junction structure as an example of the semiconductor device of the second embodiment of the second part of the present invention corresponding to the cut-away region R1 of the chip corner portion of FIG. 49.
Figure 72:
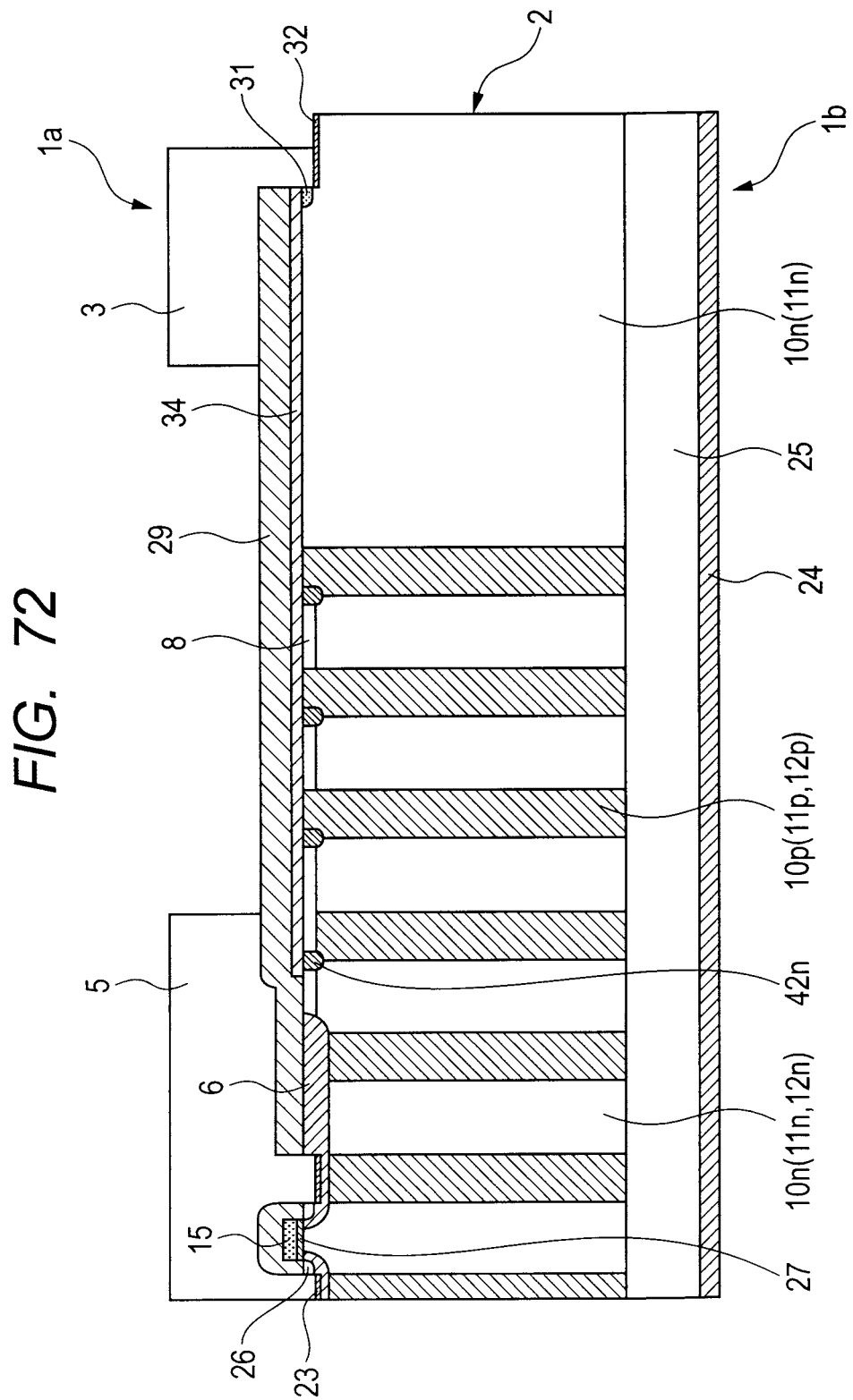
FIG. 72 is a cross-sectional view of a local portion of the chip corresponding to the X-X' cross section of FIG. 71.
Figure 73:
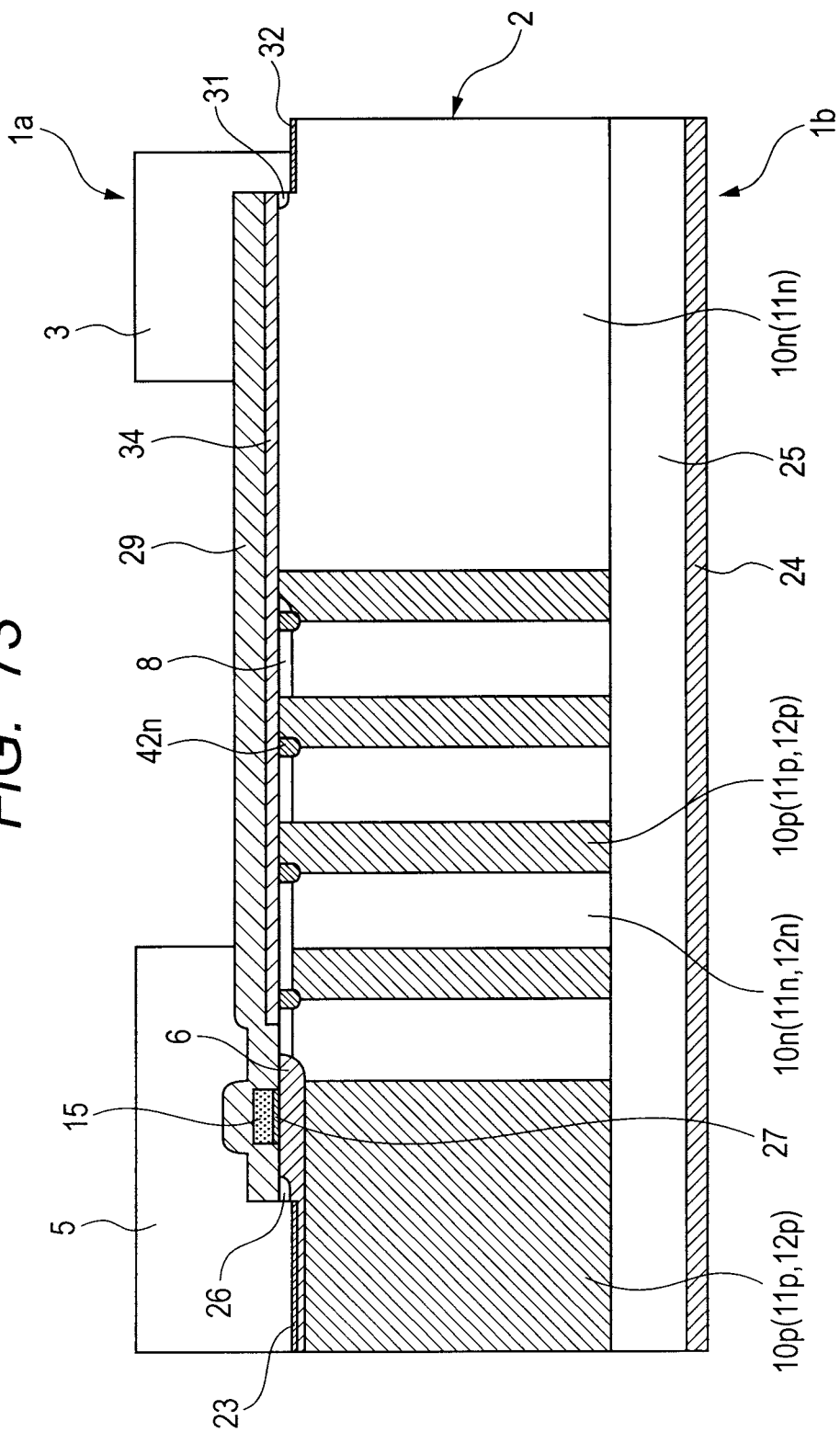
FIG. 73 is a cross-sectional view of a local portion of the chip corresponding to the Y-Y' cross section of FIG. 71.
Figure 74:
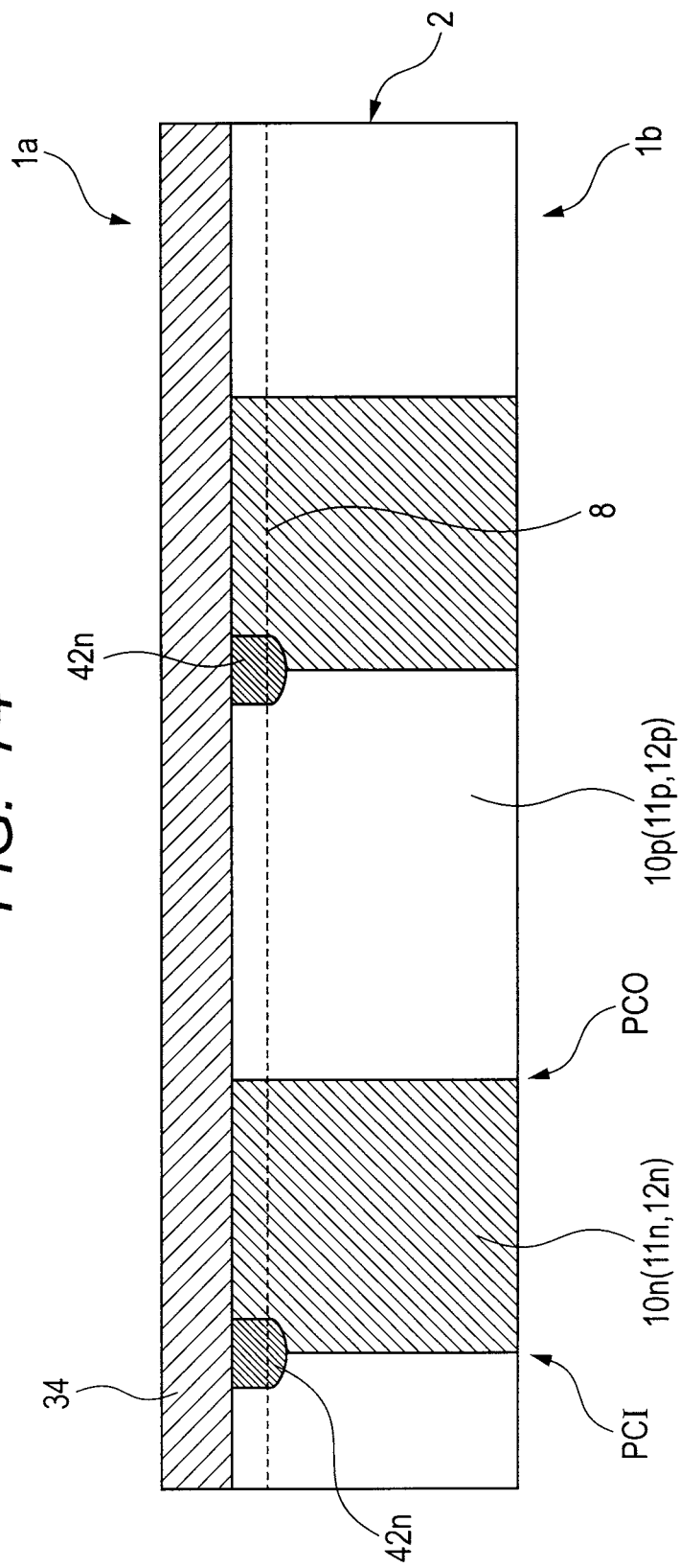
FIG. 74 is a device schematic cross-sectional view for illustrating a relationship between the N ring regions and P column regions of FIGS. 72 and 73.

FIG. 71 is a top view of a local portion of a chip of a power MOSFET having a super junction structure as an example of the semiconductor device of the second embodiment of the present invention corresponding to the cut-away region R1 of the chip corner portion of FIG. 49. FIG. 72 is a cross-sectional view of a local portion of the chip corresponding to the X-X' cross section of FIG. 71. FIG. 73 is a cross-sectional view of a local portion of the chip corresponding to the Y-Y' cross section of FIG. 71. FIG. 74 is a device schematic cross-sectional view for illustrating a relationship between the N ring regions and P column regions of FIGS. 72 and 73. Based on these drawings, a description will be given to a device structure (peripheral 2D super-junction and N rings) of the power MOSFET having the super-junction structure or the like as the example of the semiconductor device of the second embodiment of the present invention.

Figure 89:
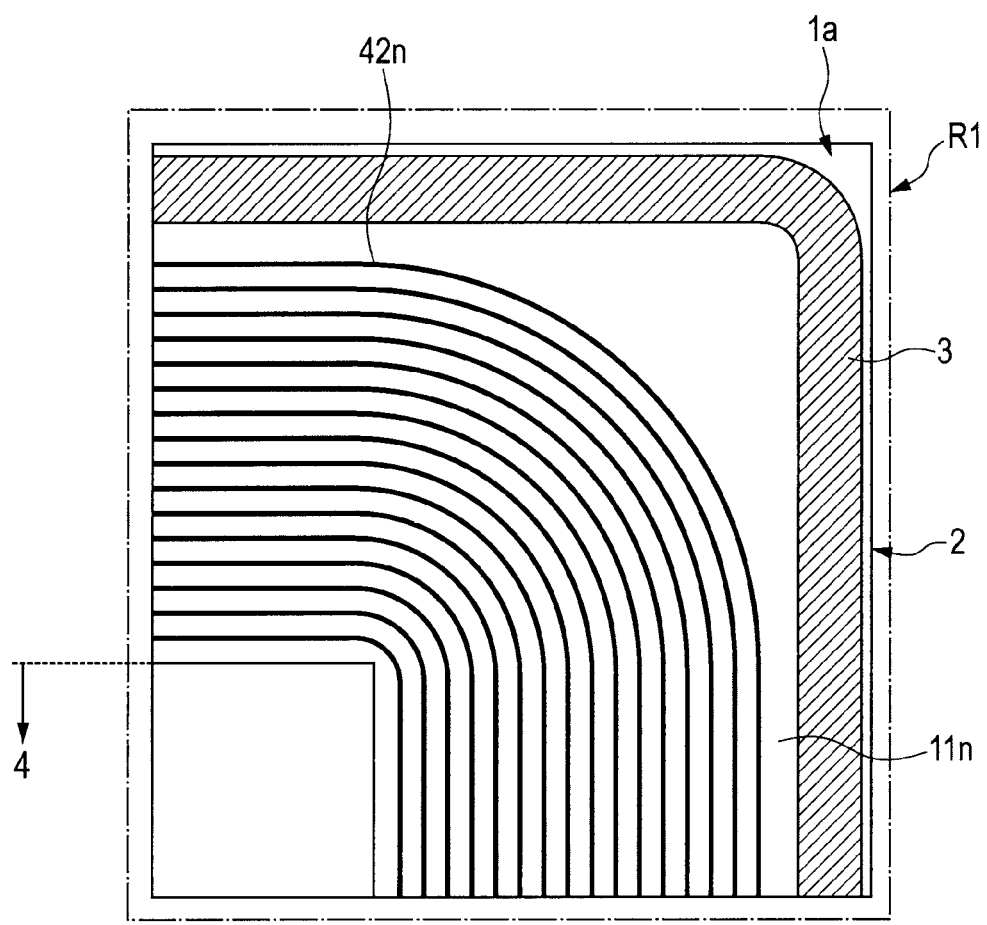
FIG. 89 is a top view (closer to the real equivalent) of the local portion of the chip corresponding to the cut-away region R1 of the chip corner portion of FIG. 50 for illustrating a variation (roundly curved corner portion arrangement) of the individual components (N ring regions) in the semiconductor device of each of the first to third embodiments of the second part of the present invention.

As shown in FIGS. 71 to 74 (see FIG. 92), along the inner end PCI of each of the P column circular regions 49pa, 49pb, and 49pc, the N ring region 42n (ring region of first conductivity type) showing a ring shape in the form of a rectangular frame is provided. However, in the peripheral corner regions 17a, 17b, 17c, and 17d (FIG. 50) (i.e., in the regions other than the peripheral main portion including the peripheral side regions 16a, 16b, 16c, and 16d), an equipotential surface when a depletion layer expands is curved, and therefore the corner portions of the N ring regions 42n are not limited to right-angled shapes, and may also be curved, as shown in FIG. 89.

The dose or impurity concentration in the N ring region 42n is higher than in the N column region 12n, and is preferably of such a level as to achieve complete depletion in a blocking mode, in the same manner as in the $P^-$-type surface resurf region 8. On the other hand, the depth of the N ring region 42n is of the same order as that of, e.g., the $P^-$-type surface resurface region 8.

5. Description of Wafer Process Corresponding to Semiconductor Device of Second Embodiment of Present Invention, Etc. (See Mainly FIGS. 75 and 76)

In this section, a description will be given to a main portion of a manufacturing process for the structure of the fourth section. As a whole, the manufacturing process is substantially the same as described in the third section. Therefore, hereinbelow, a description will be given only to a different portion in principle. That is, a different portion in terms of processing corresponds to FIG. 60.

Figure 75:
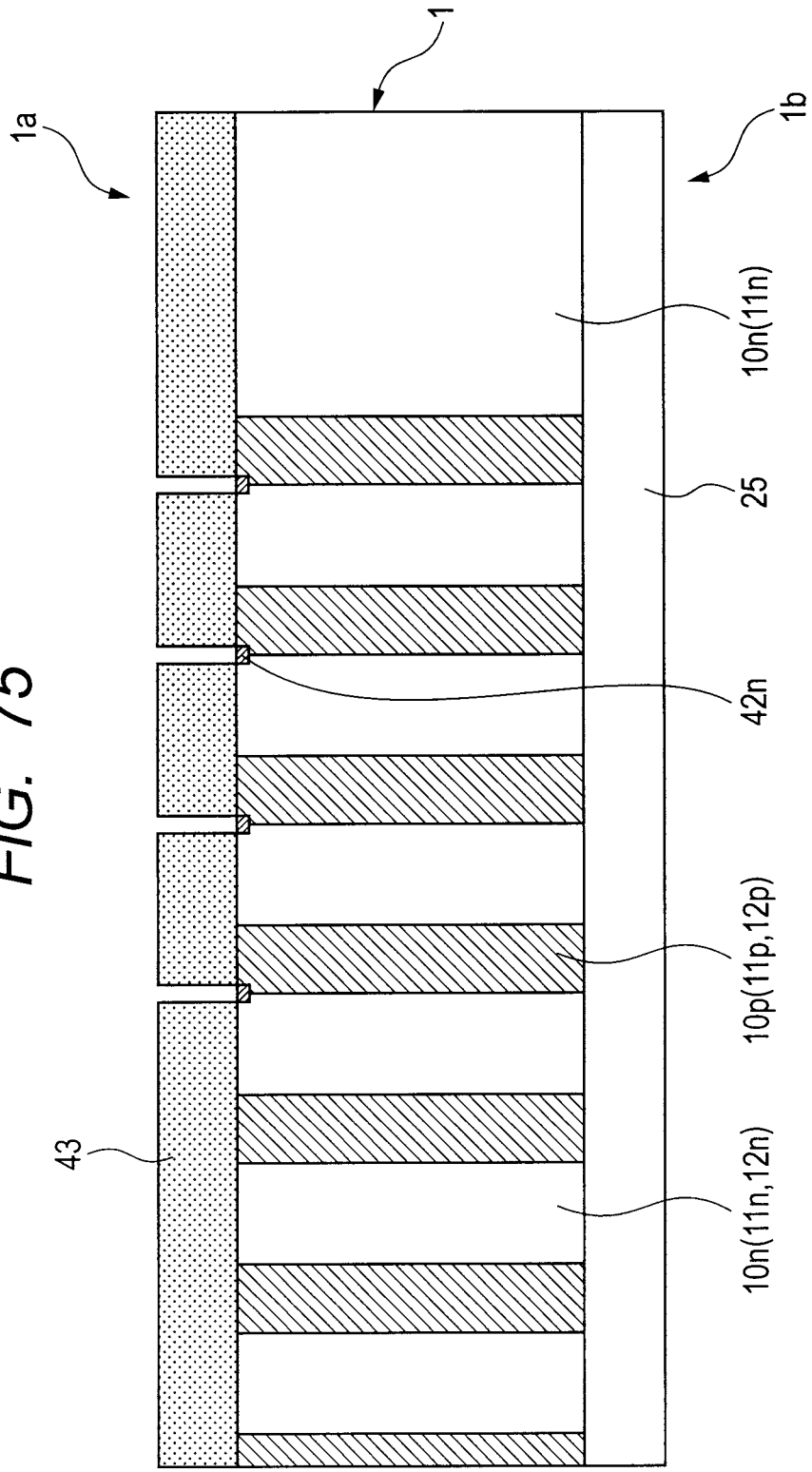
FIG. 75 is a wafer cross-sectional view of a device portion shown in FIG. 72 for illustrating a wafer process (step of introducing the N ring regions) corresponding to the semiconductor device of the second embodiment of the second part of the present invention.
Figure 76:
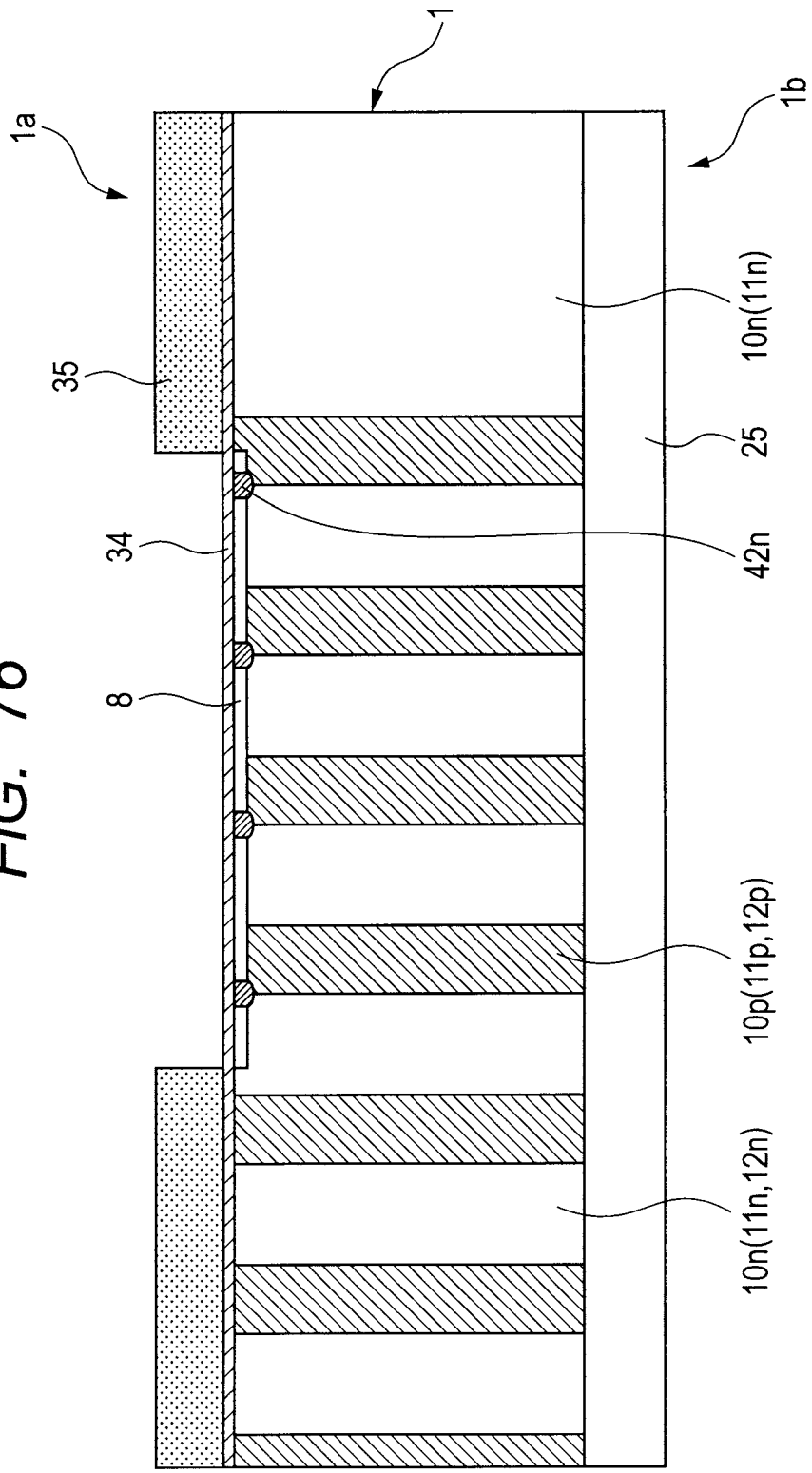
FIG. 76 is a wafer cross-sectional view of the device portion shown in FIG. 72 for illustrating the wafer process (step of introducing a P⁻-type surface resurf region) corresponding to the semiconductor device of the second embodiment of the second part of the present invention.

FIG. 75 is a wafer cross-sectional view of a device portion shown in FIG. 72 for illustrating a wafer process (step of introducing the N ring regions) corresponding to the semiconductor device of the second embodiment of the present invention. FIG. 76 is a wafer cross-sectional view of the device portion shown in FIG. 72 for illustrating the wafer process (step of introducing a $P^-$-type surface resurf region) corresponding to the semiconductor device of the second embodiment of the present invention. Based on these drawings, a description will be given to the wafer process corresponding to the semiconductor device of the second embodiment of the present invention and the like.

After the processing shown in FIG. 59 is completed, as shown in FIG. 75, a resist film 43 for introducing N rings is formed over substantially the entire device main surface 1a of the wafer 1. Then, by lithography or the like, the resist film 43 for introducing N rings is patterned. Using the patterned resist film 43 as a mask, the N ring regions 42n (ring regions of first conductivity type) are introduced by ion implantation or the like into the surface portions of the drift region 11 corresponding to the inner ends of the individual P column regions 12p (column regions of second conductivity type) in the peripheral portion (i.e., edge termination area). Preferred examples of conditions for the ion implantation that can be shown include an ion species of phosphorus, an implantation energy of, e.g., about 200 keV, and a dose of, e.g., about $5\times10^{12}/cm^2$ (in a preferred range of about $3\times10^{12}/cm^2$ to $7\times10^{12}/cm^2$). Thereafter, the resist film 43 that is no longer needed is entirely removed.

Next, as shown in FIG. 76, the silicon oxide film 34 (field insulating film) is formed by, e.g., thermal oxidation over substantially the entire device main surface 1a of the wafer 1 (examples of the thickness of the field insulating film 34 that can be shown include about 350 nm), and a resist film 35 for introducing $P^-$-type resurf region is formed thereover by lithography. Subsequently, using the resist film 35 for introducing P⁻-type resurf region as a mask, the P⁻-type surface resurf region 8 is introduced by ion implantation (of, e.g., boron). Examples of conditions for the ion implantation that can be shown include an ion species of boron, an implantation energy in a preferred range around, e.g., 200 keV, and a dose in a preferred range of, e.g., about $1 \times 10^{11}/cm^2$ to $1 \times 10^{12}/cm^2$. Thereafter, the resist film 35 that is no longer needed is removed. After that, the wafer process moves to the step of FIG. 61, and the process is similarly performed afterward.

6. Description of Device Structure (Peripheral 2D Super-Junction, N Rings, and P Rings) of Power MOSFET with Super-Junction Structure, Etc. as Example of Semiconductor Device of Third Embodiment of Present Invention (See Mainly FIGS. 77 to 80 and 92)

The example of the fourth section is effective in avoiding the influence of negative movable charges at the interface of a mold resin and around a passivation film. In this section, a description will be given to a resurf structure (P ring regions 42*p*) which is effective in avoiding the influence of positive movable charges at a similar interface or the like. Accordingly, if the major type (polarity) of the movable charges is negative, it may also be possible to use only the N ring regions 42*n*. Likewise, if the major type of the movable charges is positive, it may also be possible to use only the P ring regions 42*p* described herein.

The RESURF structure described herein attains substantially the same object as described in the second section. Here, a description will be given to the case where the resurf structure is used alone, but it will be appreciated that the resurf structure may also be used in combination. When the resurf structure is used in combination, the effect thereof is accordingly enhanced.

Note that, structurally, the resurf structure is substantially the same as described in the fourth section. Therefore, a description will be given herein only to a different portion in principle.

Figure 77:
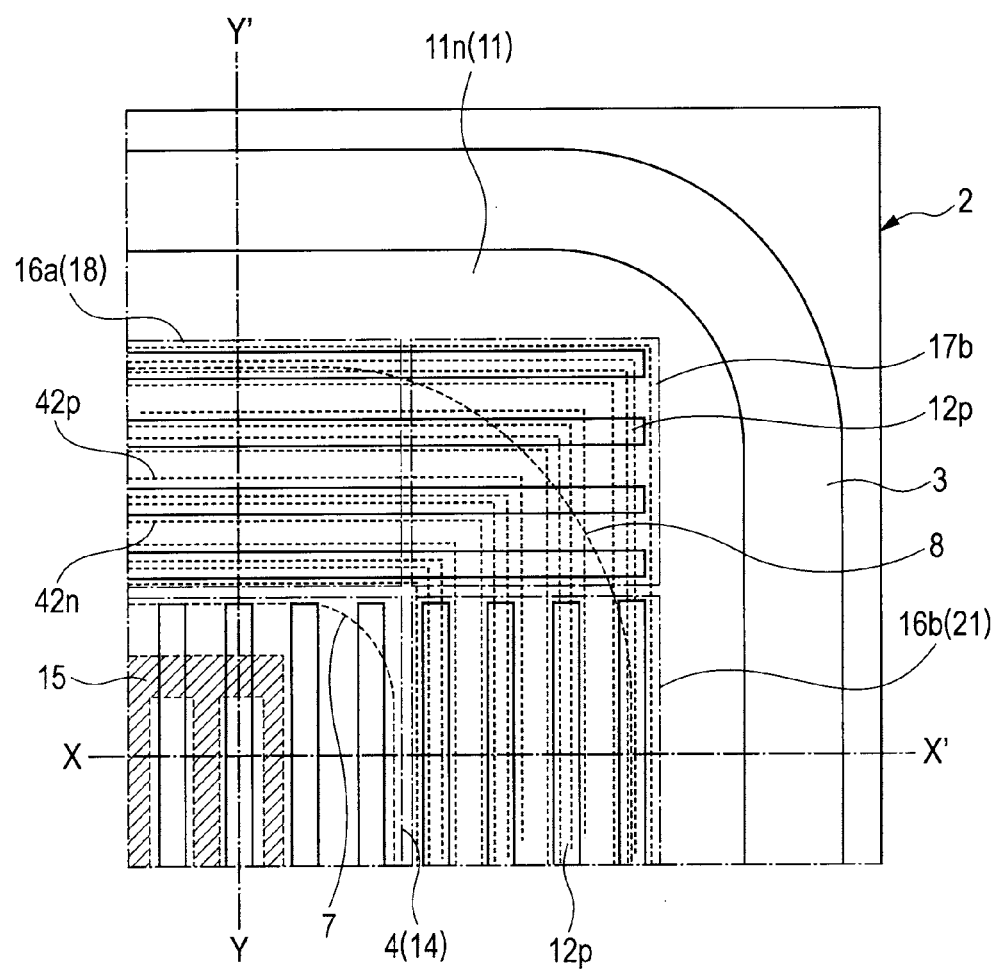
FIG. 77 is a top view of a local portion of a chip of a power MOSFET having a super-junction structure as an example of the semiconductor device of the third embodiment of the second part of the present invention corresponding to the cut-away region R1 of the chip corner portion of FIG. 49.
Figure 78:
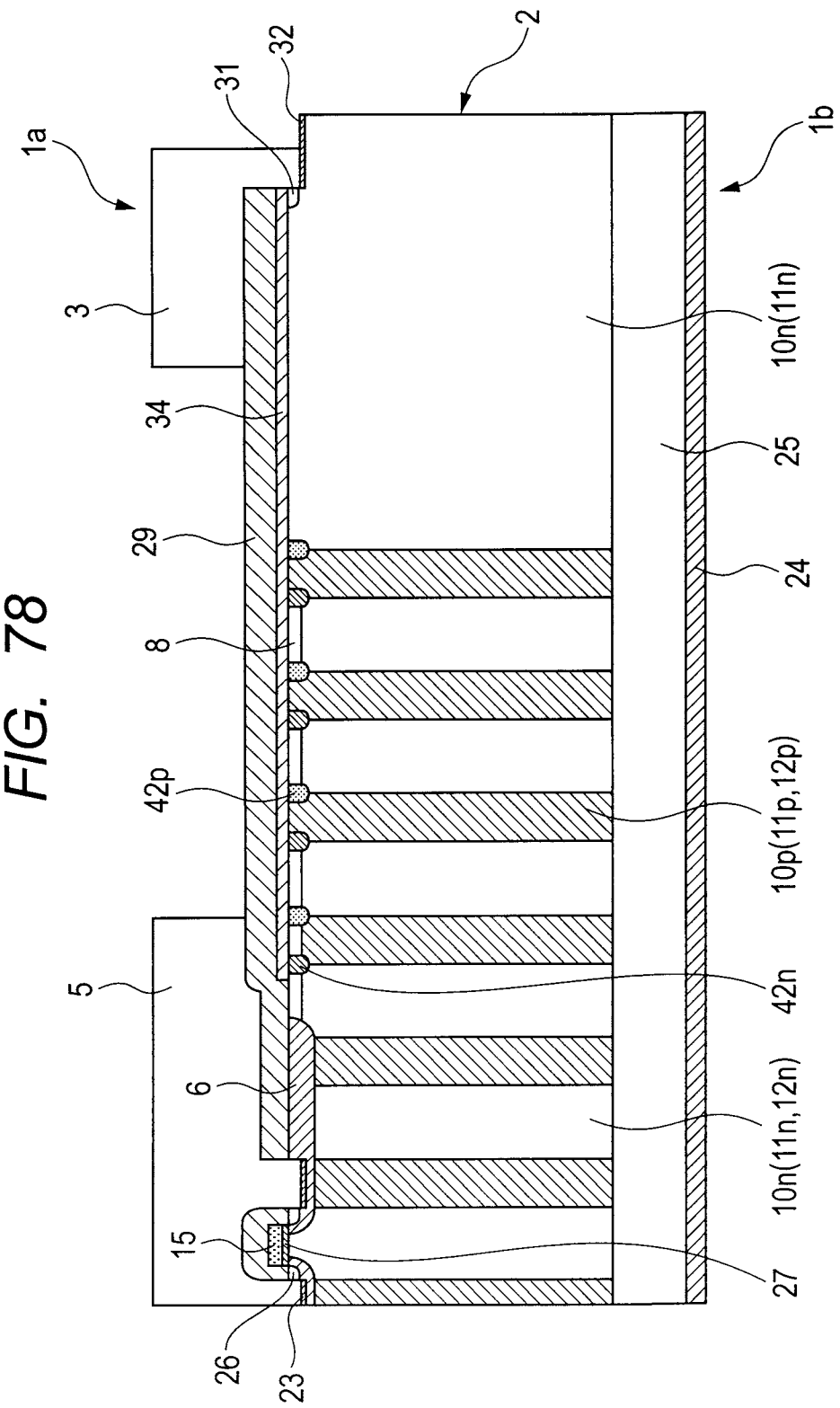
FIG. 78 is a cross-sectional view of a local portion of the chip corresponding to the X-X' cross section of FIG. 77.
Figure 79:
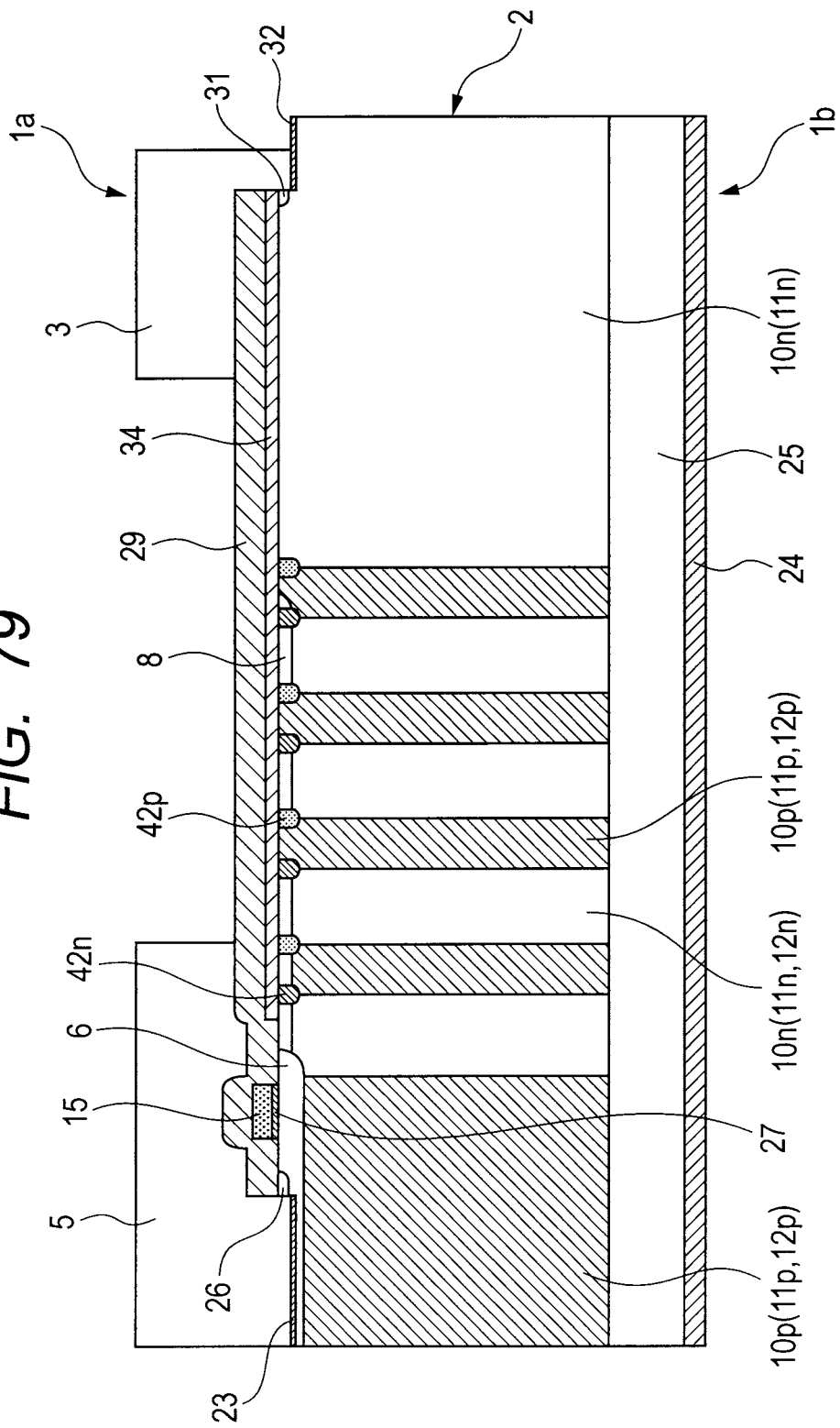
FIG. 79 is a cross-sectional view of a local portion of the chip corresponding to the Y-Y' cross section of FIG. 77.
Figure 80:
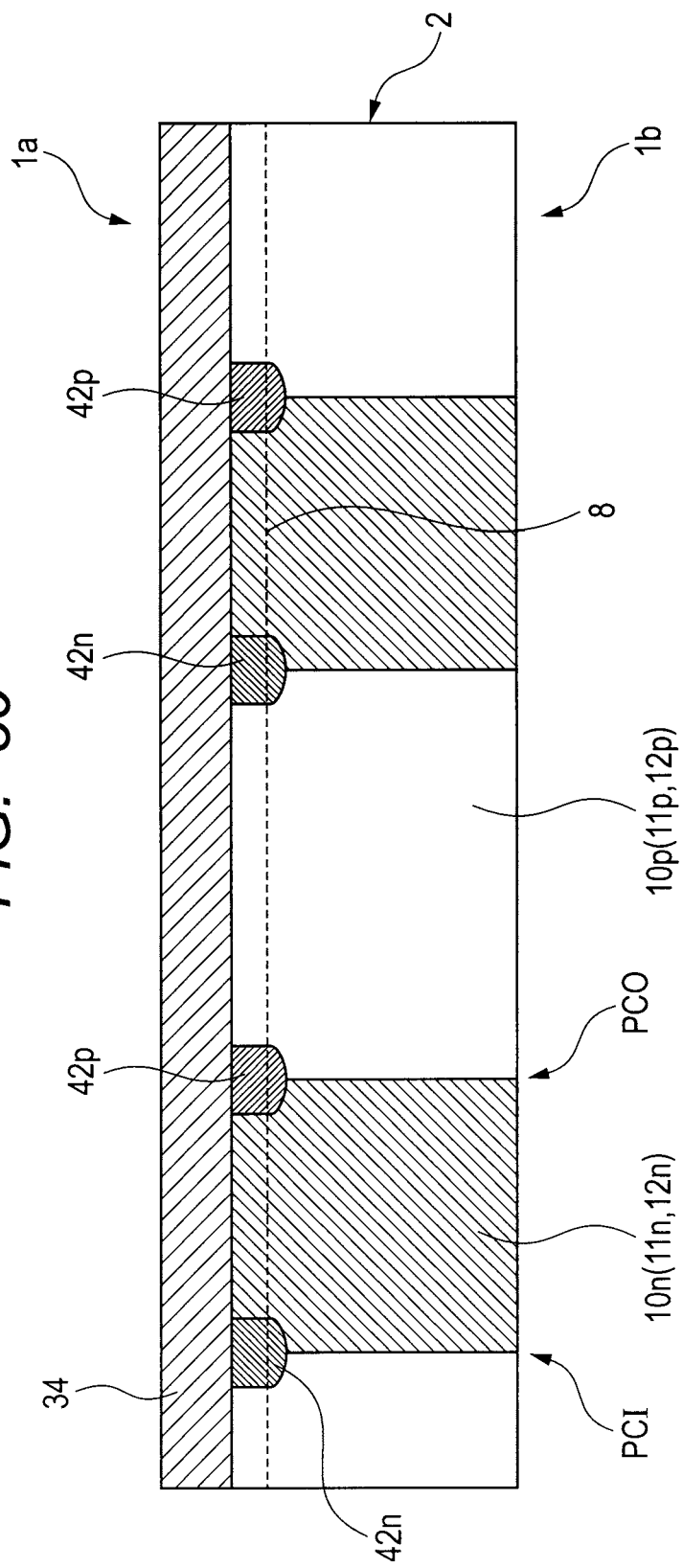
FIG. 80 is a device schematic cross-sectional view for illustrating a relationship between the N ring regions (P ring regions) and P column regions of FIGS. 78 and 79.

FIG. 77 is a top view of a local portion of a chip of a power MOSFET having a super-junction structure as an example of the semiconductor device of the third embodiment of the present invention corresponding to the cut-away region R1 of the chip corner portion of FIG. 49. FIG. 78 is a cross-sectional view of a local portion of the chip corresponding to the X-X' cross section of FIG. 77. FIG. 79 is a cross-sectional view of a local portion of the chip corresponding to the Y-Y' cross section of FIG. 77. FIG. 80 is a device schematic cross-sectional view for illustrating a relationship between the N ring regions (P ring regions) and P column regions of FIGS. 78 and 79. Based on these drawings, a description will be given to a device structure (peripheral 2D super-junction, N rings, and P rings) of the power MOSFET with the super-junction structure as the example of the semiconductor device of the third embodiment of the present invention.

As shown in FIGS. 77 to 80 (see FIG. 92), along the outer end PCO of each of the P column circular regions 49*pa*, 49*pb*, and 49*pc*, the P ring region 42*p* (ring region of second conductivity type) showing a ring shape in the form of a rectangular frame is provided. However, in the peripheral corner regions 17*a*, 17*b*, 17*c*, and 17*d* (FIG. 50) (i.e., in the regions other than the peripheral main portion including the peripheral side regions 16*a*, 16*b*, 16*c*, and 16*d*), an equipotential surface when a depletion layer expands is curved, and therefore the corner portions of the P ring regions 42*p* are not limited to right-angled shapes, and may also be curved, as shown in FIG. 89 (which shows an example of the N ring region 42*n*, but is also applicable to the P ring region 42*p* without substantial alteration).

The dose or impurity concentration in the P ring region 42*p* is higher than in the P column region 12*p* and the P⁻-type surface resurf region 8, and needs to be of such a level as to achieve complete depletion in a blocking mode, in the same manner as in the P⁻-type surface resurf region 8.

7. Description of Wafer Process Corresponding to Semiconductor Device of Second Embodiment of Present Invention, Etc. (See Mainly FIGS. 81 and 82)

In this section, a description will be given to a main portion of a manufacturing process for the structure of the sixth section. As a whole, the manufacturing process is substantially the same as described in the third and fifth sections. Therefore, hereinbelow, a description will be given only to a different portion in principle. That is, a different portion in terms of processing corresponds to FIG. 60. Note that, if the N ring regions 42*n* (ring regions of first conductivity type) are omitted, the step of FIG. 75 may be skipped appropriately.

Figure 81:
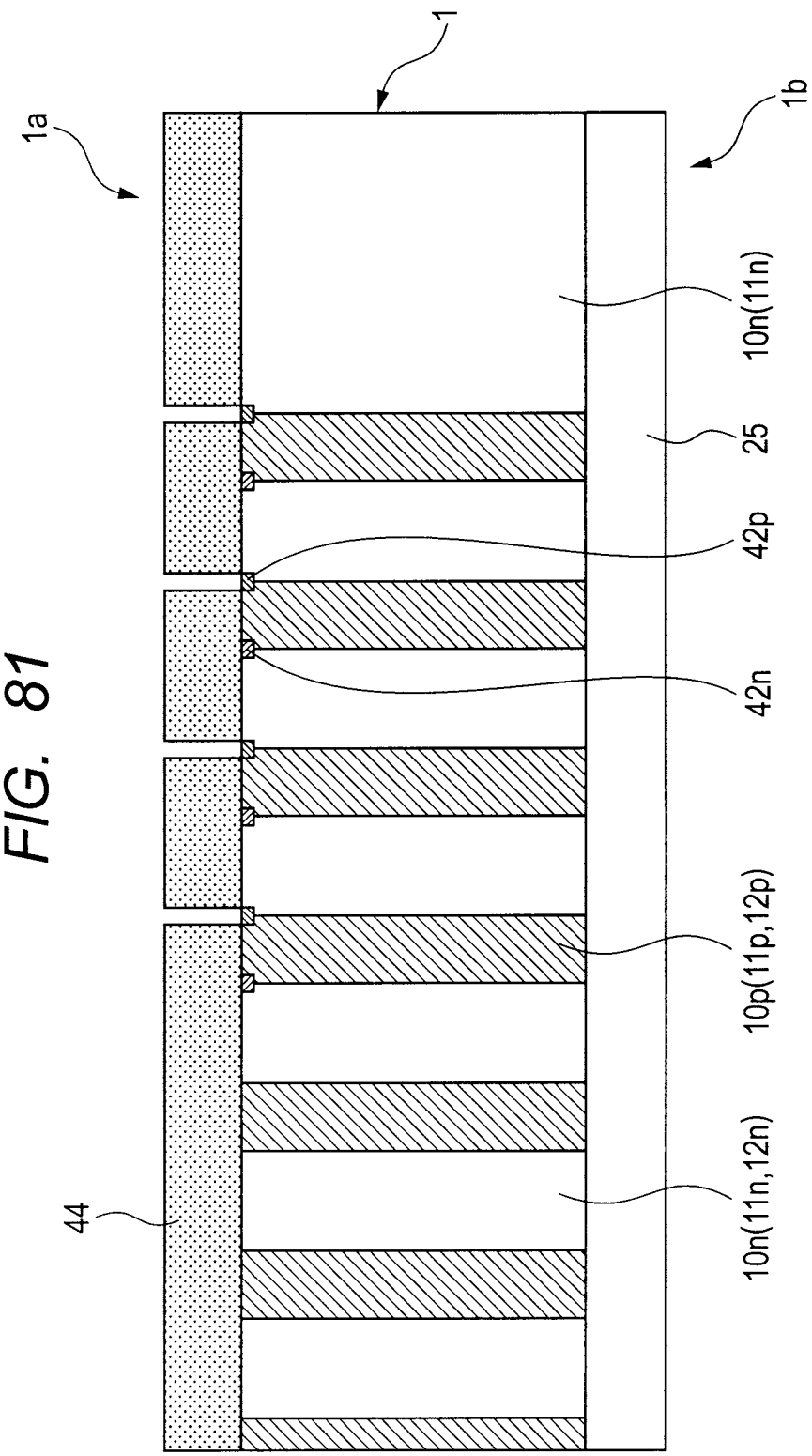
FIG. 81 is a wafer cross-sectional view of a device portion shown in FIG. 78 for illustrating a wafer process (step of introducing the P ring regions) corresponding to the semiconductor device of the third embodiment of the second part of the present invention.
Figure 82:
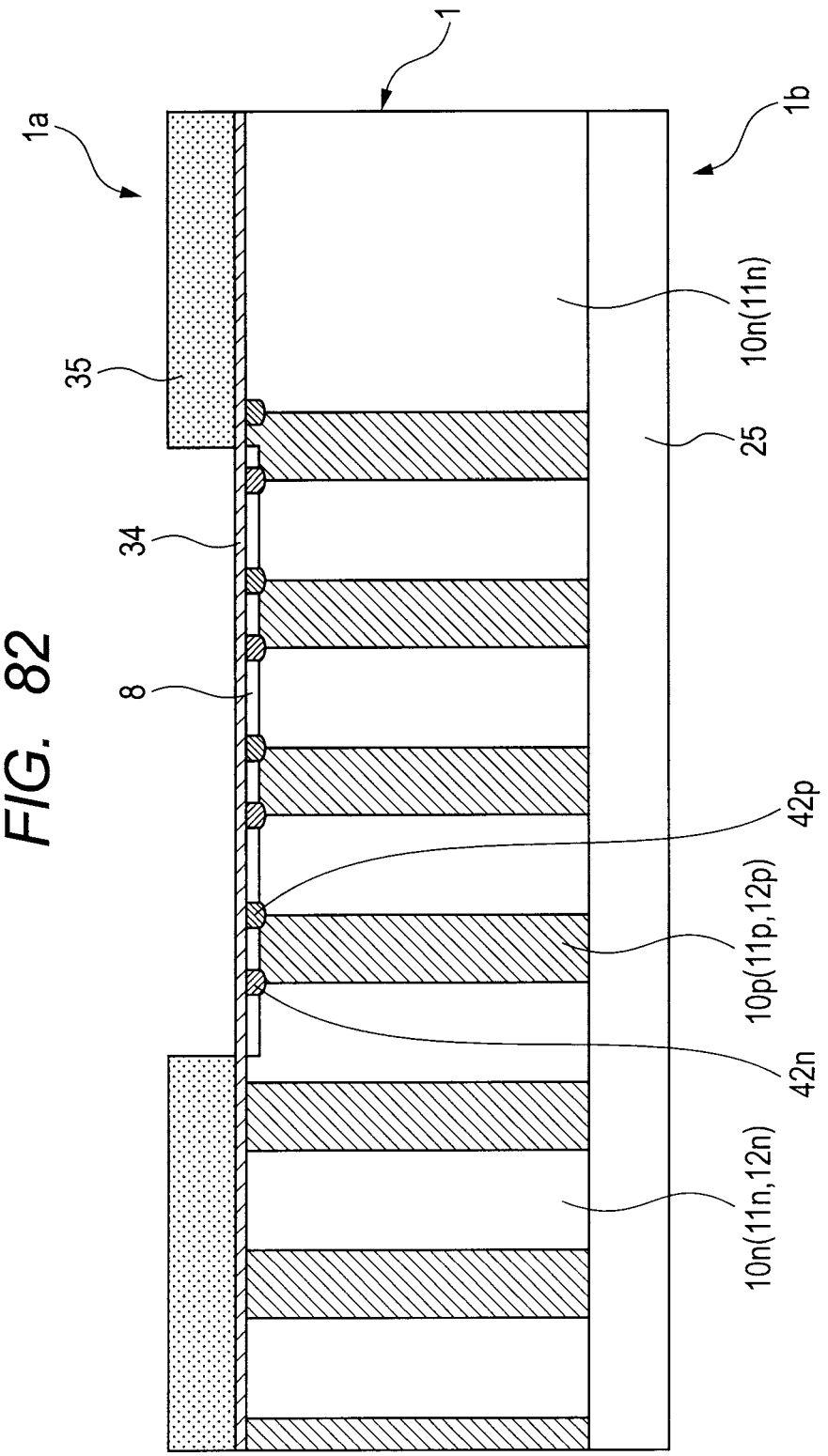
FIG. 82 is a wafer cross-sectional view of the device portion shown in FIG. 78 for illustrating the wafer process (step of introducing a P⁻-type surface resurf region) corresponding to the semiconductor device of the third embodiment of the second part of the present invention.

FIG. 81 is a wafer cross-sectional view of a device portion shown in FIG. 78 for illustrating a wafer process (step of introducing the P ring regions) corresponding to the semiconductor device of the third embodiment of the present invention. FIG. 82 is a wafer cross-sectional view of the device portion shown in FIG. 78 for illustrating the wafer process (step of introducing a P⁻-type surface resurf region) corresponding to the semiconductor device of the third embodiment of the present invention. Based on these drawings, a description will be given to the wafer process corresponding to the semiconductor device of the second embodiment of the present invention and the like.

After the processings shown in FIGS. 59 and 75 are completed, as shown in FIG. 81, a resist film 44 for introducing P rings is formed over substantially the entire device main surface 1*a* of the wafer 1. Then, by lithography or the like, the resist film 44 for introducing P rings is patterned. Using the patterned resist film 44 as a mask, the P ring regions 42*p* (ring regions of second conductivity type) are introduced by ion implantation or the like into the surface portions of the drift region 11 corresponding to the outer ends of the individual P column regions 12*p* (column regions of second conductivity type) in the peripheral portion (i.e., edge termination area). Preferred examples of conditions for the ion implantation that can be shown include an ion species of boron, an implantation energy of, e.g., about 200 keV, and a dose of, e.g., about $7 \times 10^{12}/cm^2$ (in a preferred range of about $5 \times 10^{12}/cm^2$ to $1 \times 10^{13}/cm^2$). Thereafter, the resist film 44 that is no longer needed is entirely removed.

Next, as shown in FIG. 82, the silicon oxide film 34 (field insulating film) is formed by, e.g., thermal oxidation over substantially the entire main surface 1*a* of the wafer 1 (examples of the thickness of the field insulating film 34 that can be shown include about 350 nm), and a resist film 35 for introducing P⁻-type resurf region is formed thereover by lithography. Subsequently, using the resist film 35 for introducing P⁻-type resurf region as a mask, the P⁻-type surface resurf region 8 is introduced by ion implantation (of, e.g., boron). Examples of conditions for the ion implantation that can be shown include an ion species of boron, an implantation energy in a preferred range around, e.g., 200 keV, and a dose in a preferred range of, e.g., about $1 \times 10^{11}/cm^2$ to $1 \times 10^{12}/cm^2$. Thereafter, the resist film 35 that is no longer needed is removed. After that, the wafer process moves to the step of FIG. 61, and the process is similarly performed afterward.

8. Description of Variations of Individual Components in Semiconductor Devices of First to Third Embodiments of Present Invention (See Mainly FIGS. 83 to 90 and Also FIGS. 91 and 92)

In this section, a description will be given to variations of the individual components forming the devices of the second, fourth, and sixth sections.

Figure 83:
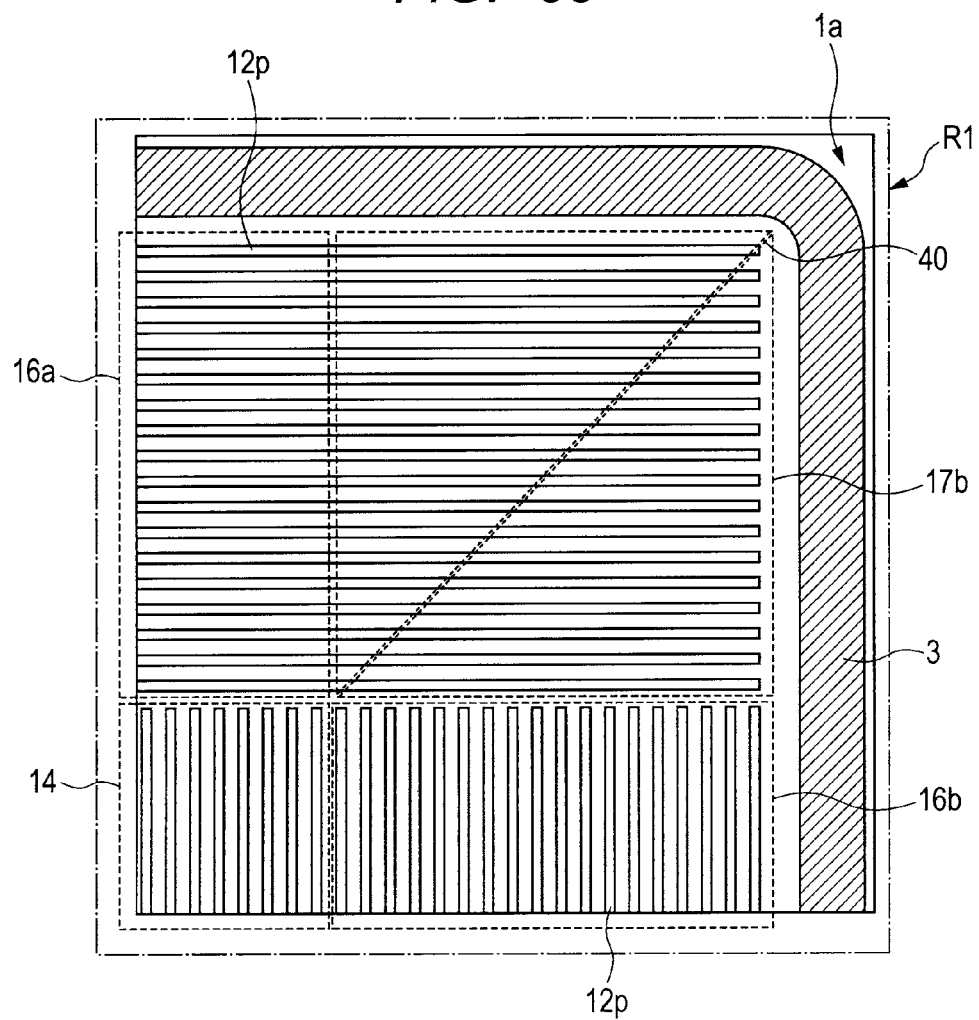
FIG. 83 is a top view (closer to a real equivalent) of the local portion of the chip corresponding to the cut-away region R1 of the chip corner portion of FIG. 50 for illustrating a variation (asymmetrical standard arrangement) of individual components (column layout) in the semiconductor device of each of the first to third embodiments of the second part of the present invention.
Figure 84:
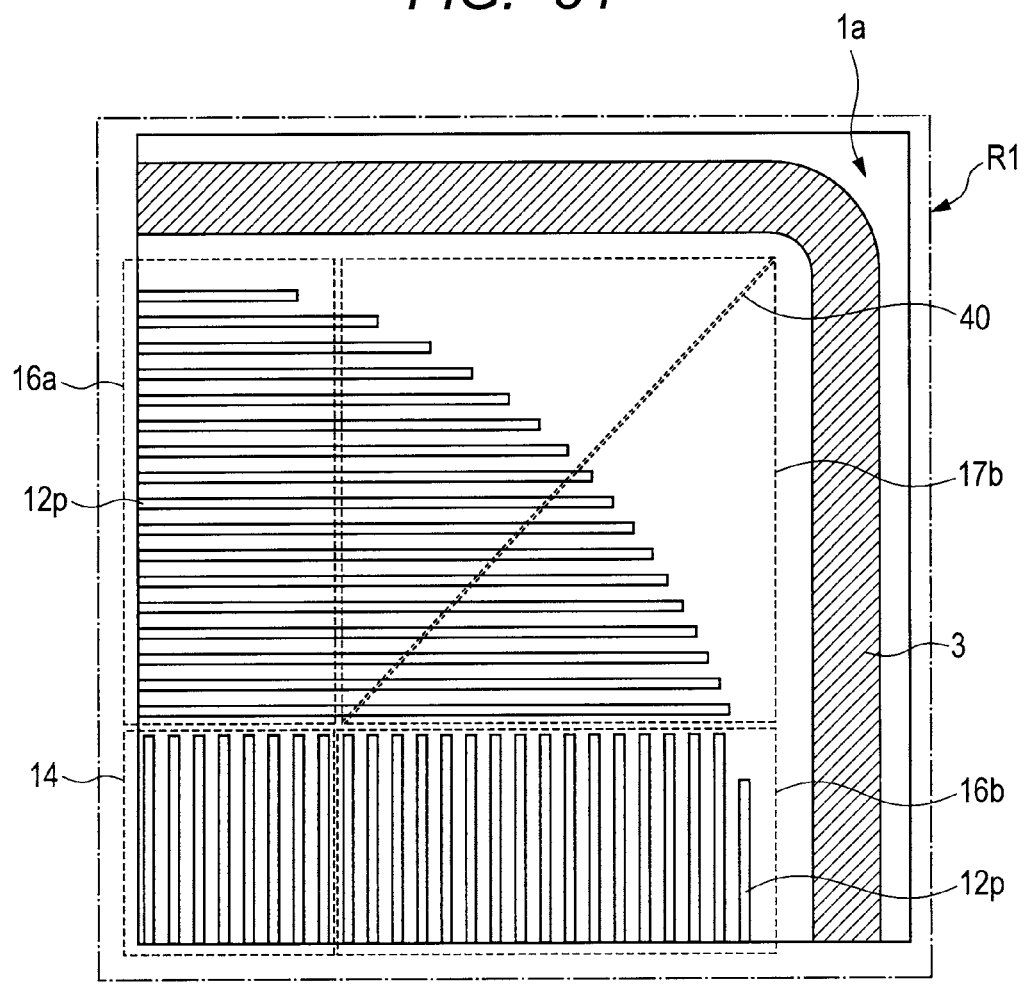
FIG. 84 is a top view (closer to the real equivalent) of the local portion of the chip corresponding to the cut-away region R1 of the chip corner portion of FIG. 50 for illustrating a variation (asymmetrical trimmed arrangement) of the individual components (column layout) in the semiconductor device of each of the first to third embodiments of the second part of the present invention.
Figure 85:
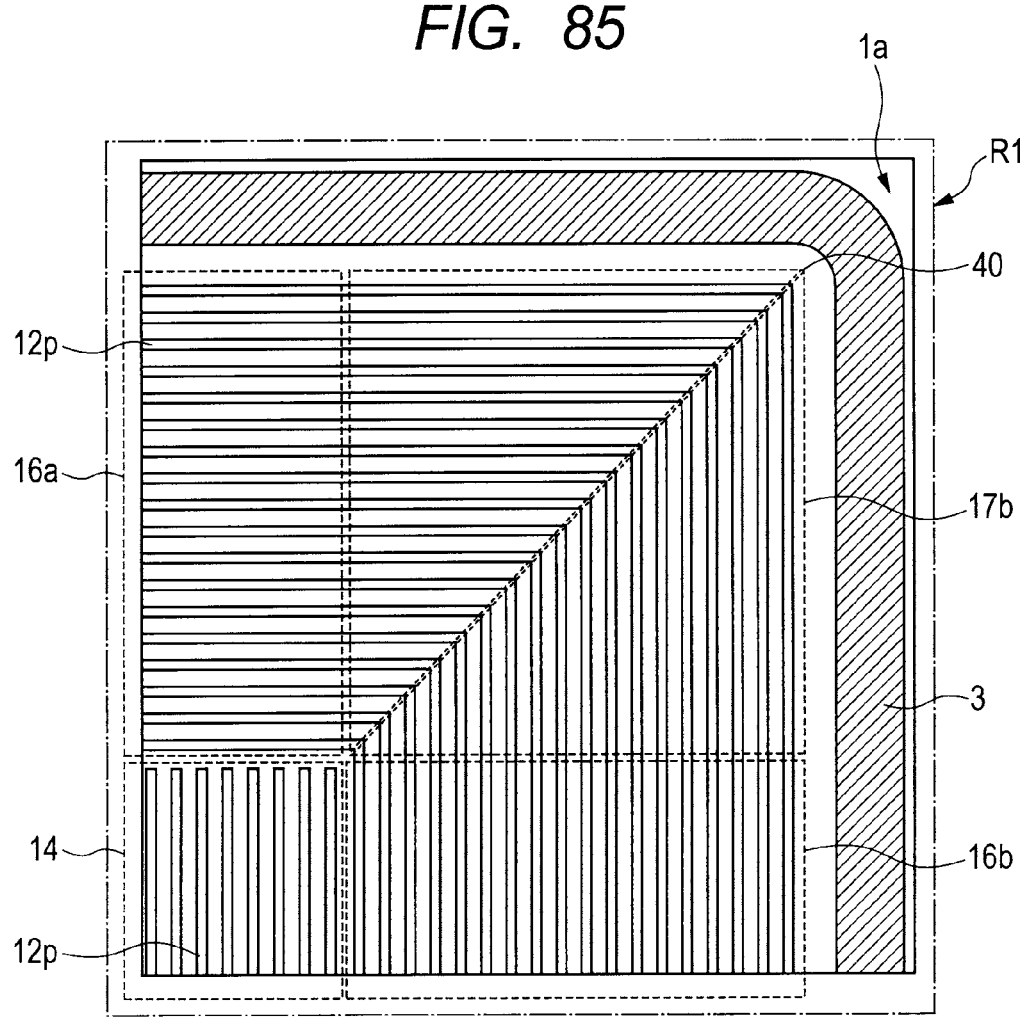
FIG. 85 is a top view (closer to the real equivalent) of the local portion of the chip corresponding to the cut-away region R1 of the chip corner portion of FIG. 50 for illustrating a variation (symmetrical L-shaped arrangement) of the individual components (column layout) in the semiconductor device of each of the first to third embodiments of the second part of the present invention.

(1) Variations of Column Layout (See Mainly FIGS. 83 to 85)

FIG. 83 is a top view (closer to a real equivalent) of the local portion of the chip corresponding to the cut-away region R1 of the chip corner portion of FIG. 50 for illustrating a variation (asymmetrical standard arrangement) of individual components (column layout) in the semiconductor device of each of the first to third embodiments of the present invention. FIG. 84 is a top view (closer to the real equivalent) of the local portion of the chip corresponding to the cut-away region R1 of the chip corner portion of FIG. 50 for illustrating a variation (asymmetrical trimmed arrangement) of the individual components (column layout) in the semiconductor device of each of the first to third embodiments of the present invention. FIG. 85 is a top view (closer to the real equivalent) of the local portion of the chip corresponding to the cut-away region R1 of the chip corner portion of FIG. 50 for illustrating a variation (symmetrical L-shaped arrangement) of the individual components (column layout) in the semiconductor device of each of the first to third embodiments of the present invention. Based on these drawings, a description will be given to the variations of the column layout.

FIG. 83 shows an "asymmetrical standard column layout" corresponding to the column layouts of FIGS. 50, 51, 71, and 77. Here, the wording "asymmetrical" shows that, when the diagonal line 40 of the semiconductor chip or the peripheral corner region is assumed to be a line-symmetry axis, the column layout is not substantially line-symmetrical. As shown in FIG. 83, in this example, the peripheral super-junction region basically has a 3D-Resurf structure. However, into the peripheral corner region 17b (17a, 17c, or 17d), symmetry in the peripheral side region 16b has been extended without being lost (having the same symmetry) so that, in terms of symmetry around the active-cell-portion super-junction structure 14, the layout has low symmetry. In this portion, the layout no longer has a pure 3D-Resurf structure, and may possibly reduce a breakdown voltage.

To solve the problem, the "asymmetrical trimmed column layout" shown in FIG. 84 has been proposed. In the column layout, the outsides of the P columns 12p have been trimmed to provide a configuration substantially matching the shape of an equi-potential surface (more precisely, a line of intersection of the equipotential surface and the top surface 1a of the chip 2) in a Blocking Mode. This achieves the effect of improving macroscopic symmetry in each of the peripheral corner regions 17a, 17b, 17c, and 17d and reducing the risk of a reduction in breakdown voltage in this portion.

Thus, in the example of FIG. 84, the macroscopic symmetry can be relatively easily improved. However, the line symmetry has been impaired, and the risk of a reduction in breakdown voltage due to the impaired line symmetry remains.

By contrast, FIG. 85 shows a "symmetrical L-shaped column layout", in which line symmetry with respect to the line-symmetry axis 40 has been given to the P columns 12p in the peripheral corner region 17b (17a, 17c, or 17d) to ensure microscopic symmetry.

These variations can be combined with the example of the second, fourth, or sixth section and with each of the following variations of the other components.

Figure 86:
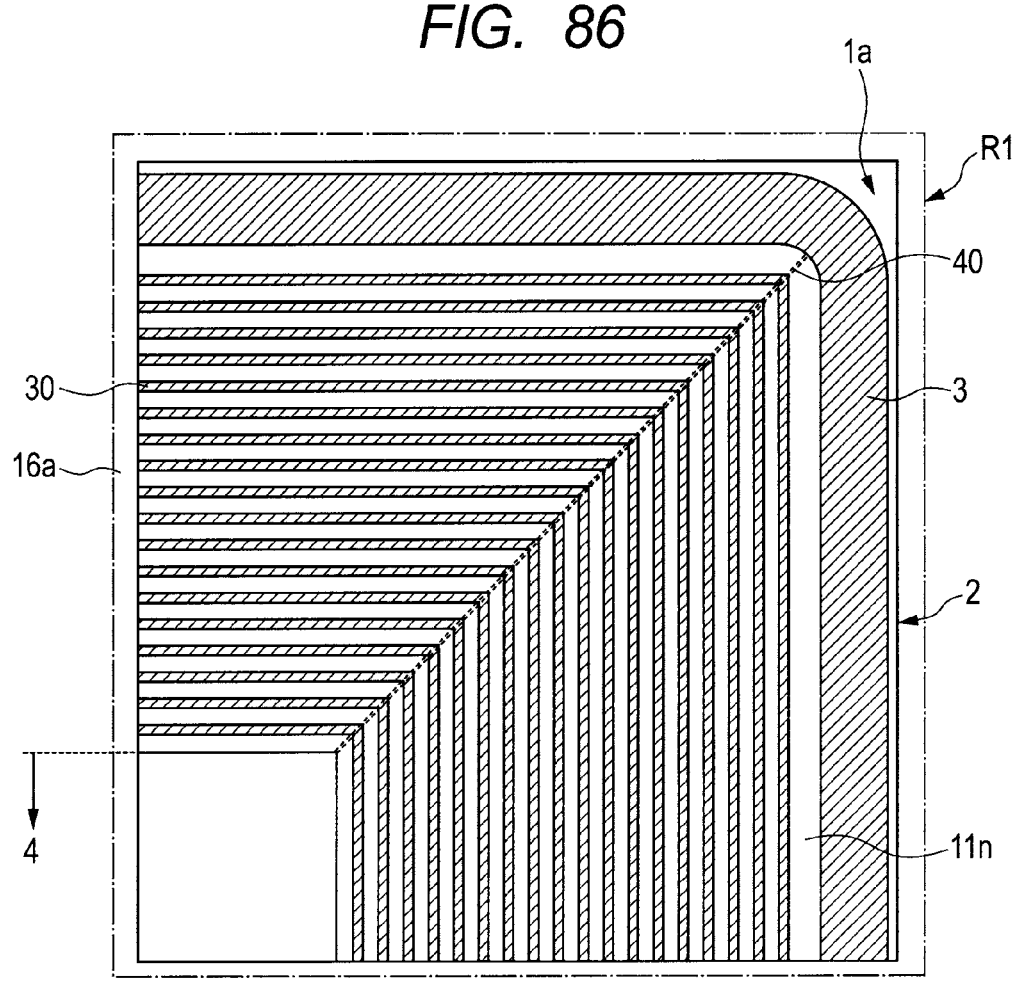
FIG. 86 is a top view (closer to the real equivalent) of the local portion of the chip corresponding to the cut-away region R1 of the chip corner portion of FIG. 50 for illustrating a variation (right-angle bent corner portion arrangement) of the individual components (layout of floating field plates) in the semiconductor device of each of the first to third embodiments of the second part of the present invention.

(2) Variations of Layout, Etc. of Floating Field Plates (See Mainly FIGS. 86 and 87)

FIG. 86 is a top view (closer to the real equivalent) of the local portion of the chip corresponding to the cut-away region R1 of the chip corner portion of FIG. 50 for illustrating a variation (right-angle bent corner portion arrangement) of the individual components (layout of floating field plates) in the semiconductor device of the first embodiment of the present invention. FIG. 87 is a top view (closer to the real equivalent) of the local portion of the chip corresponding to the cut-away region R1 of the chip corner portion of FIG. 50 for illustrating a variation (roundly curved corner portion arrangement) of the individual components (layout of floating field plates) in the semiconductor device of the first embodiment of the present invention. Based on these drawings, a description will be given to variations of the shapes, placement, and the like of the floating field plates.

The "layout of floating field plates with right-angle bent corner portions" shown in FIG. 86 is an extraction of the layout of the floating field plates 30 and the like illustrated in FIG. 51. As shown herein, the plan configurations of the floating field plates 30 are globally rectangles. The corner portions of the floating field plates may be right-angled or rounded, but are normally substantially line-symmetrical (need not necessary be so, though) with respect to the diagonal line (line-symmetry axis) 40 of the semiconductor chip or the peripheral corner region. Therefore, by achieving a match between the symmetry of the P$^-$-type surface resurf region 8 in the peripheral corner region 17b (17a, 17c, or 17d) and the symmetry of the two-dimensional layout of the floating field plates 30 in the peripheral corner region, it is possible to reduce the risk of an undesired reduction in breakdown voltage. That is, it is useful to combine the floating field plate layout of FIG. 86 with the right-angle bent corner portions with FIG. 83 or FIG. 85.

By also achieving a match between the symmetry (macroscopic symmetry) of the super-junction structure in the peripheral corner region 17b (17a, 17c, or 17d) and the symmetry of the two-dimensional layout of the floating field plates 30 in the peripheral corner region, it is possible to reduce the risk of an undesired reduction in breakdown voltage. That is, it is useful to combine, e.g., the floating field plate layout with the right-angle bent corner portions of FIG. 85 with FIG. 84 or 87.

The example of FIG. 51 is a combination of the floating field plate layout with the right-angle bent corner portions, the round-corner P$^-$-type surface resurf region, and the asymmetrical standard column layout. The macroscopic symmetry of the floating field plate layout and the column layout is relatively high, but the degree of matching between the macroscopic symmetry thereof and the symmetry in the P$^-$-type surface resurf region is low.

On the other hand, in a combination of the floating field plate layout with the right-angle bent corner portions and FIG. 84, the macroscopic symmetry of the floating field plate layout and the column layout is low, but the line symmetry thereof is improved.

Next, in a combination of the floating field plate layout with the right-angle bent corner portions and FIG. 40, the macroscopic symmetry of the floating field plate layout and the column layout as well as the line symmetry thereof are improved.

FIG. 87 shows another variation (floating field plate layout with roundly curved corner portions) of the floating field plate layout of FIG. 86, in which the corner portions of the floating field plates 30 having rectangular ring shapes are rounded. Therefore, the layout of FIG. 87 is particularly preferably combined with the column layout of FIG. 84.

These variations that have been specifically described in this section can also be combined with the example of the second, fourth, or sixth section and with each of the variations of the other components in this section.

(3) Layout of N Rings, Etc. (See Mainly FIGS. 88, 89, and 92)

Here, a description will be given only to the N ring regions 42*n* (ring regions of first conductivity type), but it will be appreciated that the description is also applicable to the P ring regions 42*p* (regions of second conductivity type) without substantial alteration.

Figure 88:
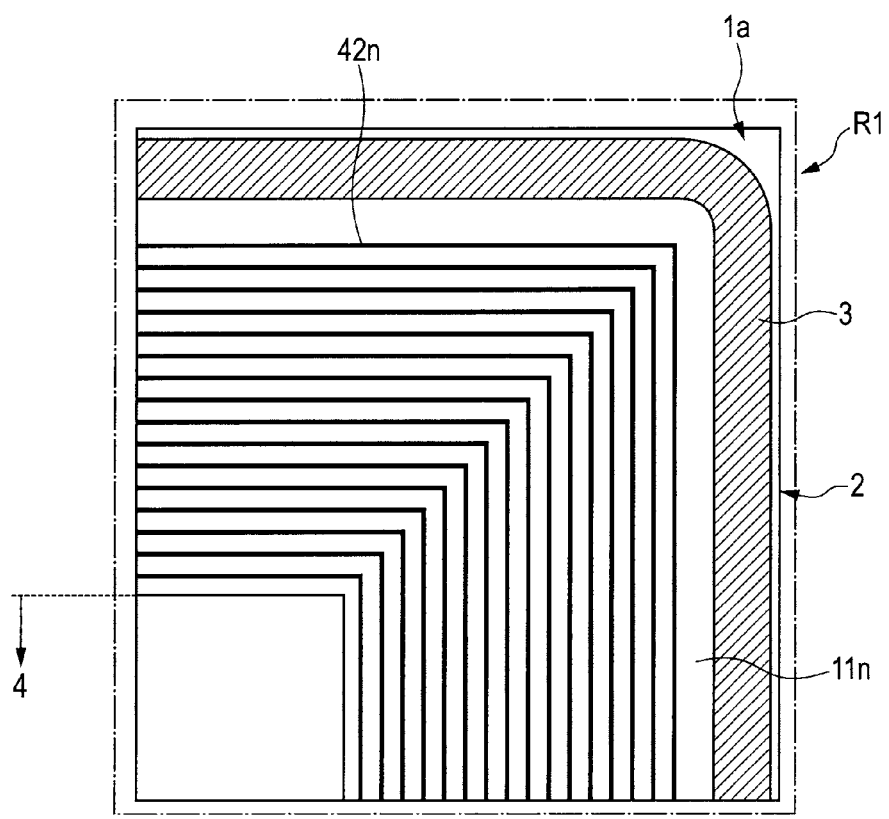
FIG. 88 is a top view (closer to the real equivalent) of the local portion of the chip corresponding to the cut-away region R1 of the chip corner portion of FIG. 50 for illustrating a variation (right-angle bent corner portion arrangement) of the individual components (N ring regions) in the semiconductor device of each of the first to third embodiments of the second part of the present invention.

FIG. 88 is a top view (closer to the real equivalent) of the local portion of the chip corresponding to the cut-away region R1 of the chip corner portion of FIG. 50 for illustrating a variation (right-angle bent corner portion arrangement) of the individual components (N ring regions) in the semiconductor device of each of the first to third embodiments of the present invention. FIG. 89 is a top view (closer to the real equivalent) of the local portion of the chip corresponding to the cut-away region R1 of the chip corner portion of FIG. 50 for illustrating a variation (roundly curved corner portion arrangement) of the individual components (N ring regions) in the semiconductor device of each of the first to third embodiments of the present invention. Based on these drawings, a description will be given to the layout of the N rings and the like.

As shown in FIGS. 71 and 88, the N ring regions 42*n* can be formed into rectangular shapes constantly extending along the inner ends PCI of the P column circular regions 49*pa*, 49*pb*, and 49*pc* and having corner portions bent at right angles, or can also be formed into rectangular shapes having rounded corner portions, as shown in FIG. 89. This is because, in the peripheral corner regions 17*a*, 17*b*, 17*c*, and 17*d* (FIG. 50), i.e., in the regions other than the peripheral main portion including the peripheral side regions 16*a*, 16*b*, 16*c*, and 16*d*, an equipotential surface when a depletion layer expands is curved.

These variations that have been specifically described in this section can also be combined with the example of the second, fourth, or sixth section and with each of the variations of the other components in this section.

Figure 90:
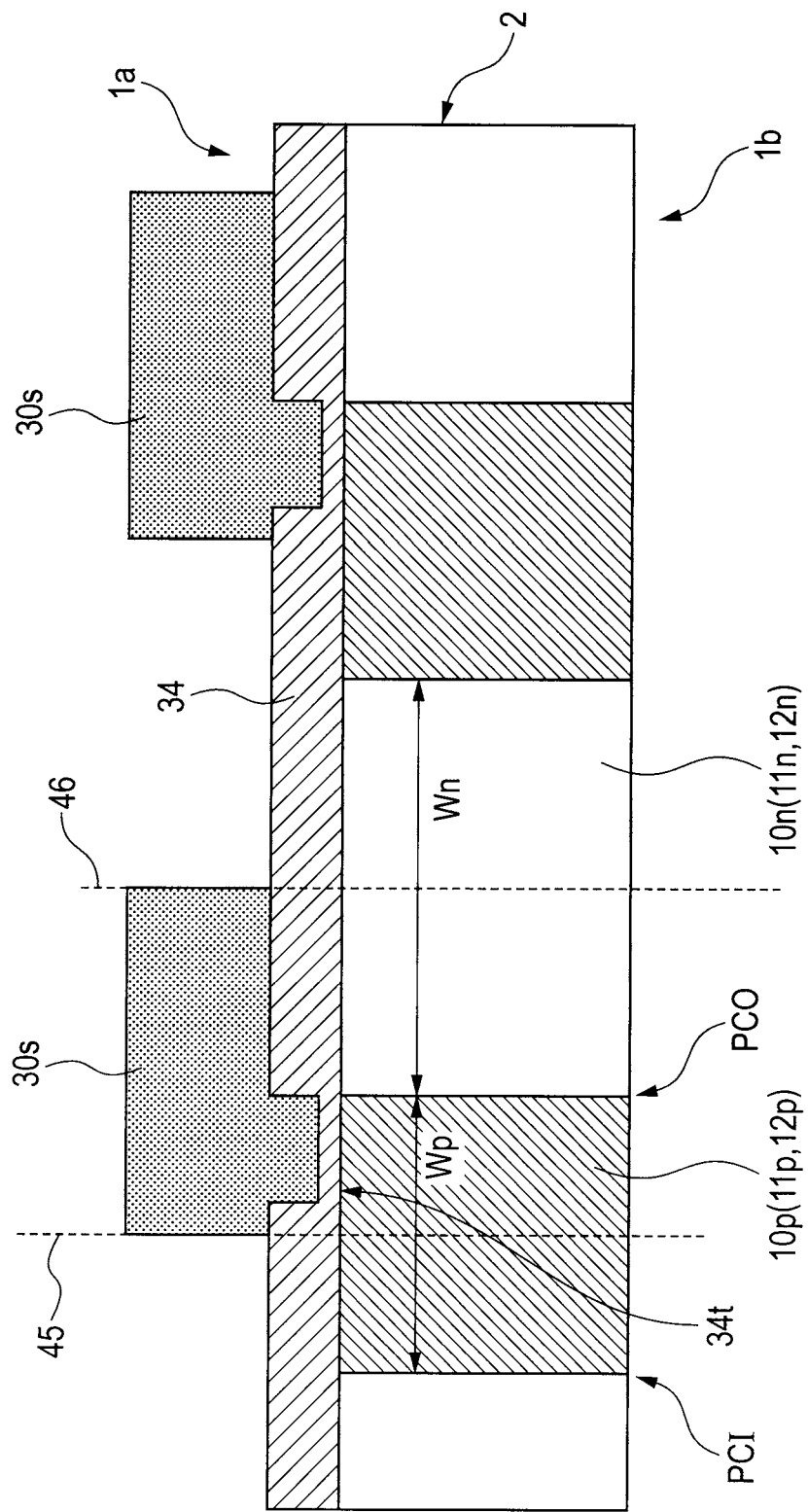
FIG. 90 is a device schematic cross-sectional view showing a positional relationship between the floating field plates and P column regions each shown in FIG. 52 or 70 or the like for illustrating a variation (stepped-insulating-film-type FFPs) of the individual components (floating field plates) in the semiconductor device of each of the first to third embodiments of the second part of the present invention.

(4) Variations of Cross-Sectional Shapes, Etc. of Floating Field Plates (See Mainly FIG. 90)

FIG. 90 is a device schematic cross-sectional view showing a positional relationship between the floating field plates and P column regions each shown in FIG. 52 or 70 or the like for illustrating a variation (stepped-insulating-film-type FFPs) of the individual components (floating field plates) in the semiconductor device of each of the first to third embodiments of the present invention. Based on the drawing, a description will be given to variations of cross-sectional shapes and the like of the floating field plates.

As shown in FIG. 90, the floating field plates 30*s* are basically the same as the standard floating field plates 30*s* shown in FIG. 54 in terms of the horizontal positions thereof, but are different therefrom in that the main portions thereof located over the P column regions 12*p* are formed over the portions of an insulating film 34*t* which are relatively thin compared with the other portion thereof. By thus doing so, the effect of pushing back the extending depletion layer is reinforced, and consequently an effect similar to that achieved by the shifted floating field plates 30 of FIG. 54 can be achieved.

9. Consideration and Supplemental Description of Each of Embodiments (See Mainly FIGS. 93 and 94)

Figure 93:
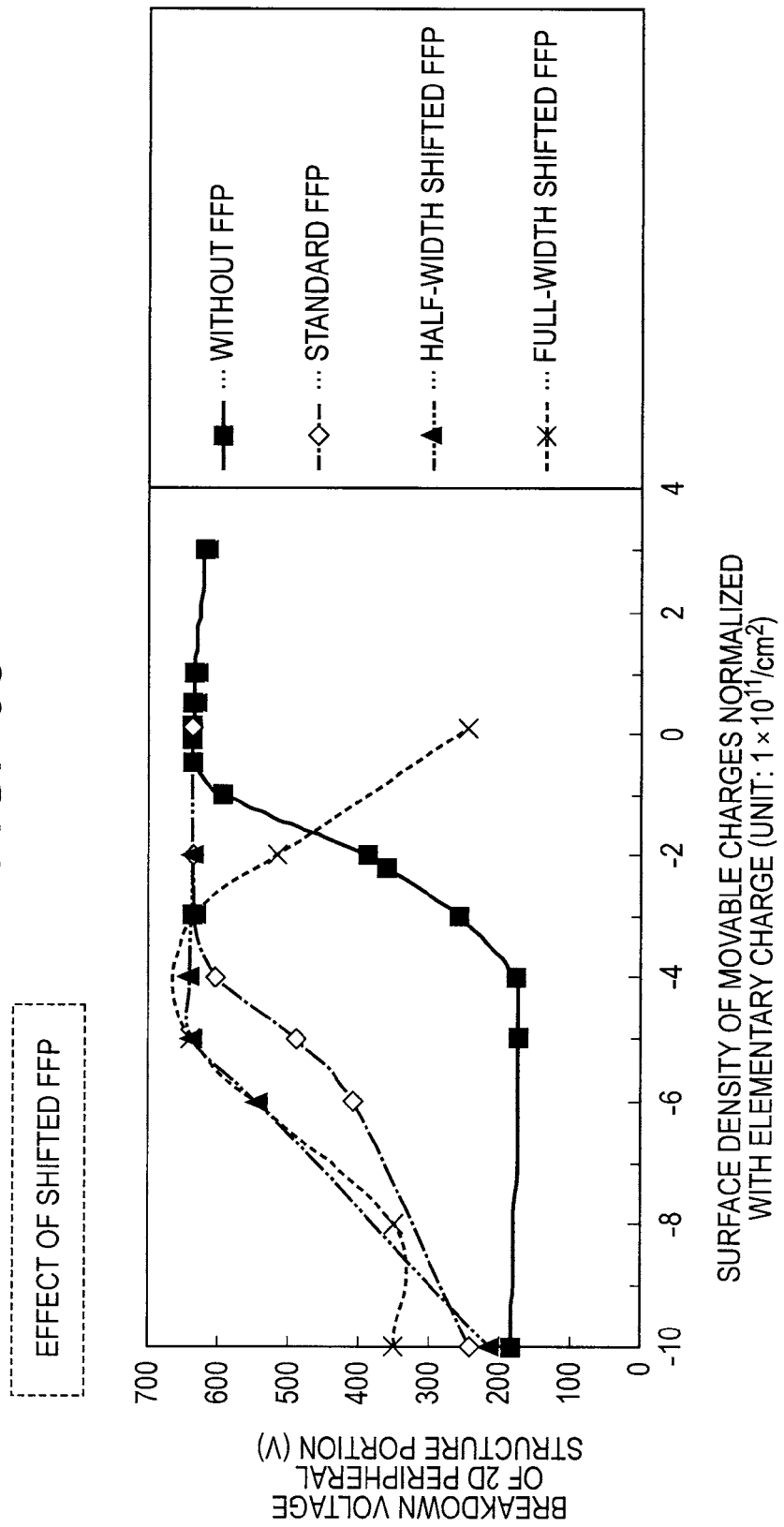
FIG. 93 is a data plot diagram for illustrating the effect of the shifted FFPs of the first embodiment of the second part of the present invention.
Figure 94:
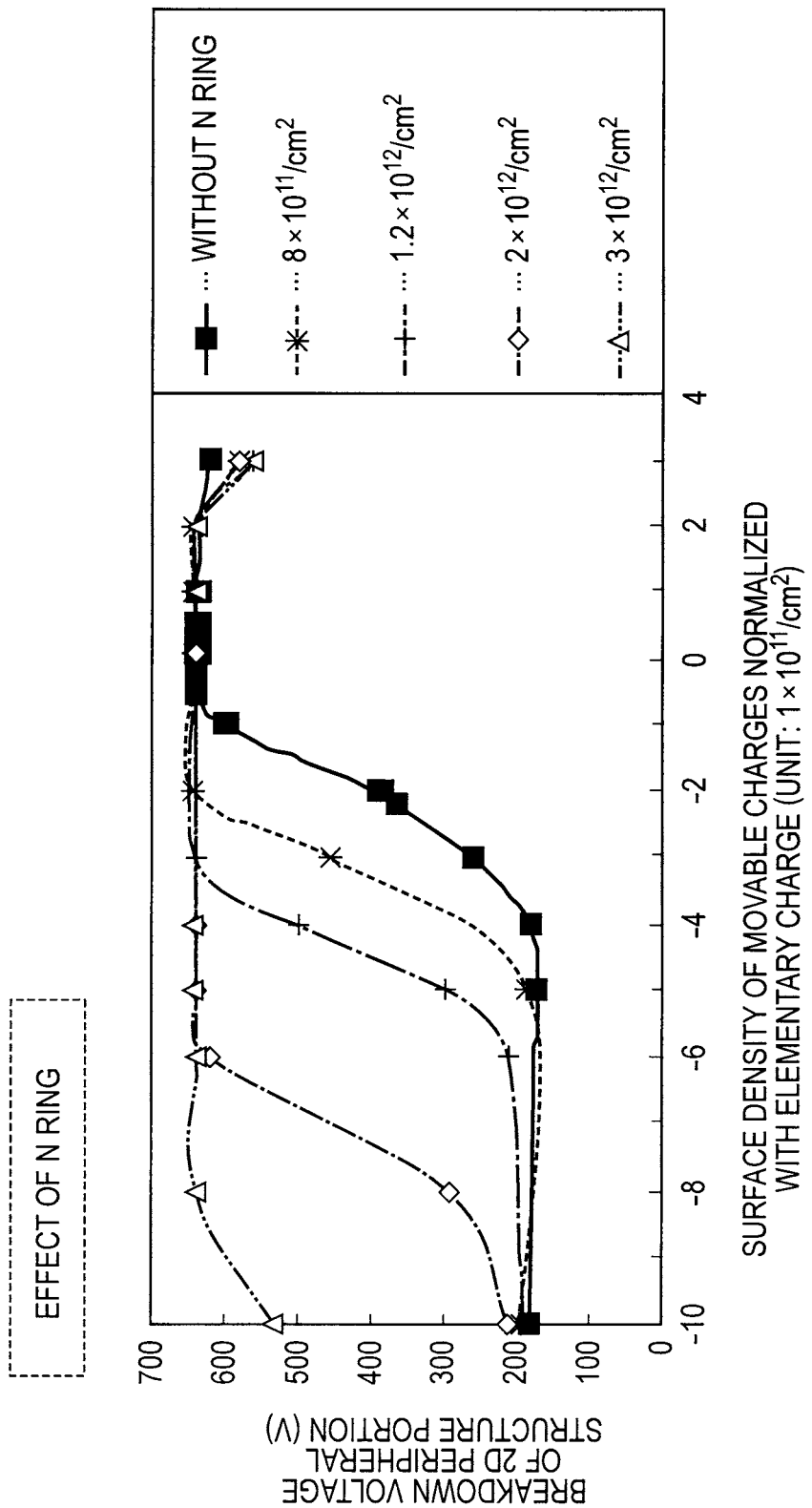
FIG. 94 is a data plot diagram for illustrating the effect of the N ring regions of the second embodiment of the second part of the present invention.

FIG. 93 is a data plot diagram for illustrating the effect of the shifted FFPs of the first embodiment of the present invention. FIG. 94 is a data plot diagram for illustrating the effect of the N ring regions of the second embodiment of the present invention. Based on these drawings, a consideration will be given to every aspect of the present invention and a supplemental description will be given to each of the embodiments thereof.

(1) Concerning Floating Field Plates (FFPs) (See Mainly FIG. 93)

In regard to FIG. 93, a description will be given first to each of samples. "Without FFP" is the sample obtained by removing the floating field plates from the chip shown in FIG. 51. "Standard FFP" is the sample corresponding to each of the standard floating field plates 30*s* of FIG. 54, which has the inner end thereof located in the vicinity of the center of the corresponding P column region 12*p* and the outer end thereof located in the vicinity of the center of the corresponding N column region 12*n*. "Half-Width Shifted FFP", i.e., the floating field plate of the first embodiment has the inner end thereof located in the vicinity of the inner end PCI of the corresponding P column region 12*p* (which is shifted inward, i.e., toward the active cell region 4 by half the width of the P column region 12*p*, compared with the standard FFP) and the outer end thereof extending beyond the outer end PCO of the P column region 12*p* and reaching a position slightly outside the P column region 12*p*. "Full-Width Shifted FFP" is the sample which is shifted inward, i.e., toward the active cell region 4 by a unit width corresponding to the width of the P column region 12*p*, compared with the standard FFP.

The abscissa axis of FIG. 93 shows a surface density of movable charges at an interface over the device surface 1*a* of the semiconductor chip 2 or the like. As can be seen from the drawing, in the sample without FFP, the source/drain breakdown voltage has severely deteriorated due to the presence of a small number of minus movable charges. It can be seen that, in the sample corresponding to the standard FFP, the point at which the source/drain voltage starts to drop is shifted in the negative charge density range. It can also be seen that, in the sample corresponding to the half-width shifted FFP, the point at which the source/drain breakdown voltage starts to drop is horizontally further shifted in the negative charge density range. However, in the sample corresponding to the full-width shifted FFP, the source/drain breakdown voltage does not vary so greatly in the negative charge density range, but the basic source/drain breakdown voltage (around zero charge) significantly drops. This may be conceivably because, due to a reverse field plate effect, electric field concentration has occurred.

Therefore, from the data shown above, it can considered that the inner end of the floating field plate is preferably located in the vicinity of the inner end PCI of the P column region 12*p*.

Note that, in general, a field plate such as a floating field plate (or a shifted floating field plate also) has the effect of providing a shield against the influence of charge at the interface of a mold resin or passivation film. The inner end portion of the shifted floating field plate described in the present application functions as a reverse field plate (i.e., pushes back the extending depletion layer). Therefore, it is possible to prevent the deterioration of the source/drain breakdown voltage due to a Walk-out phenomenon caused in the depletion layer by movable charges at the interface of the mold resin or passivation film.

(2) Concerning N Ring Regions and P Ring Regions (See Mainly FIG. 94)

A description will be given to each of the samples of FIG. 94. "Without N Ring" is the sample which is the same as the sample "Without FFP", while the other four samples are differentiated by the doses of phosphorus in the step of FIG. 75. As can be seen from the drawing, in the sample "without N ring", the source/drain breakdown voltage has severely deteriorated due to the presence of a small number of minus movable charges. However, it can be seen that, as the dose increases, the point at which the source/drain breakdown voltage starts to drop gradually shifts in the negative charge density range. It can also be seen that, in the range where the dose (of, e.g., phosphorus) is not less than $2\times10^{12}/cm^2$, especially not less than $3\times10^{12}/cm^2$, the source/drain breakdown voltage horizontally extends to a considerably low negative charge density. Accordingly, the lower limit of the dose of each of the N ring regions 42n can be considered to be about $2\times10^{12}/cm^2$ or $3\times10^{12}/cm^2$. As for the upper limit thereof, it needs to be lower than an upper limit concentration at which complete depletion occurs, and therefore the upper limit of the dose of the N ring region 42n can be considered to be about $7\times10^{12}/cm^2$.

The lower limit of the dose (of, e.g., boron) of each of the P ring regions 42p can also be considered to be about $3\times10^{12}/cm^2$ or $5\times10^{12}/cm^2$. As for the upper limit thereof, it needs to be lower than an upper limit concentration at which complete depletion occurs, and therefore the upper limit of the dose of the P ring region 42p can be considered to be about $1\times10^{13}/cm^2$.

Each of the N ring regions inhibits a hole inversion layer from being formed in the surface of the N column in the presence of negative-polarity movable charges at the interface of a resin or passivation film and enables the negative-polarity movable charges to pass through an equipotential surface in the region to thereby ensure the voltage supporting ability of each of the N columns. On the other hand, each of the P ring regions inhibits an electron accumulation layer from being formed in the surface of the N column in the presence of positive-polarity movable charges at the interface of a resin or passivation film to ensure the voltage supporting ability in the region.

10. Summary

While the invention achieved by the present inventors has been specifically described heretofore based on the embodiments thereof, the present invention is not limited thereto. It will be appreciated that various changes and modifications can be made in the invention within the scope not departing from the gist thereof.

For example, each of the foregoing embodiments has been described specifically by using the MOS structure having the planar gate structure as an example, but the present invention is not limited thereto. It will be appreciated that the present invention is exactly similarly applicable to a trench gate structure of a U-MOSFET or the like. Also, as the layout of the gate electrodes of the MOSFET, the example in which the gate electrodes are arranged in stripes parallel with the pn columns has been shown, but the present invention is applicable to various layouts in which the gate electrodes are arranged in directions orthogonal to the pn columns or arranged in a grid-like configuration.

Note that, in each of the foregoing embodiments, the example has been specifically described in which the N-channel device is formed mainly in the upper surface of the N epitaxial layer over the N+ single-crystal silicon substrate. However, the present invention is not limited thereto, and a P channel device may also be formed in the upper surface of the N epitaxial layer over the P+ single-crystal silicon substrate.

Each of the foregoing embodiments has been described specifically using the power MOSFET as an example, but the present invention is not limited thereto. It will be appreciated that the present invention is also applicable to power devices each having a super-junction structure, i.e., diodes, bipolar transistors (including an IGBT), and the like. It will also be appreciated that the present invention is also applicable to semiconductor integrated circuits having such power MOSFETs, diodes, bipolar transistors, and the like embedded therein, and so forth.

Also, in each of the foregoing embodiments, the trench fill method has been mainly described specifically as a forming method of the super-junction structure, but the present invention is not limited thereto. It will be appreciated that, e.g., a multi-epitaxial method or the like can also be used.

In each of the foregoing embodiments, the device formed in the semiconductor substrate has been mainly described specifically, but the present invention is not limited thereto. It will be appreciated that the present invention is also applicable substantially without any modification to devices formed in a GaAs-based semiconductor substrate, a silicon-carbide-based semiconductor substrate, and a silicon-nitride-based semiconductor device.

<Third Part: Portion Mainly Concerning Local Charge Balance>

0. Outline of Third Part

The present inventors have produced various power-type active elements such as a power MISFET (or power MOSFET) having a super-junction structure and performed simulation with regard thereto to study layouts which can constantly ensure a required breakdown voltage (such as source/drain breakdown voltage). As a result, with regard to an active cell portion or the like, an almost satisfactory super-junction structure has been able to be configured. However, it has become clear that electric field concentration is likely to occur in a chip peripheral portion and a breakdown has occurred in a region where charge balance is lost. That is, according to the result of the study conducted by the present inventors, in, e.g., a 2D peripheral resurf structure, charge balance is lost (loss of charge symmetry) in a gap between pairs of P columns extending from the left and right sides of corner portion, connecting portions therebetween (bent portions formed thereby), or the like. As a result, electric field concentration occurs in the periphery of the portion in question to result in a drop in breakdown voltage.

The following is a brief description of the outline of a representative embodiment of the invention disclosed in the present part.

That is, according to an aspect of the present invention in the present part, in a power MOSFET having a super-junction structure, the super-junction structure (i.e., corner-portion super-junction structure) in a corner portion of a semiconductor chip is laid out so as to maintain local charge balance.

The following is a brief description of an effect obtained according to the representative embodiment of the invention disclosed in the present part.

That is, in a power MOSFET having a super-junction structure, the super-junction structure in a corner portion of the semiconductor chip is laid out so as to maintain local charge balance. Therefore, it is possible to avoid undesired electric field concentration resulting from charge imbalance in the chip corner portion.

1. Description of Charge-Balanced-Type 2D Peripheral Resurf Structure, Etc. in Semiconductor Device of First Embodiment of Present Invention (See Mainly FIGS. 95 and 97)

The example of the second part relates to the non-charge-balanced-type 2D peripheral resurf structure (with the floating field plates), while the example of this section relates to a charge-balanced-type 2D peripheral resurf structure (without the floating field plates) corresponding to a charge-balanced version thereof. Accordingly, e.g., a package and the like are described in detail in the first section of the second part, a chip structure other than a P column layout in a chip corner portion and the like are described in detail in the second, fourth, sixth, and like sections of the second part, a process associated therewith is described in detail in the third, fifth, seventh, and like sections of the second part, and variations thereof and the like are described in detail in the eighth and like sections of the second part. Therefore, hereinbelow, a description will be given only to a different portion in principle.

Note that, in the third part, a specific description will be given to the case where a thickness Wn of an N column and a thickness Wp of a P column are different (i.e., the impurity concentrations of the two regions are different). However, it will be appreciated that the thickness Wn of the N column and the thickness Wp of the P column may be set substantially equal (i.e., the impurity concentrations of the two regions are substantially equal).

Figure 95:
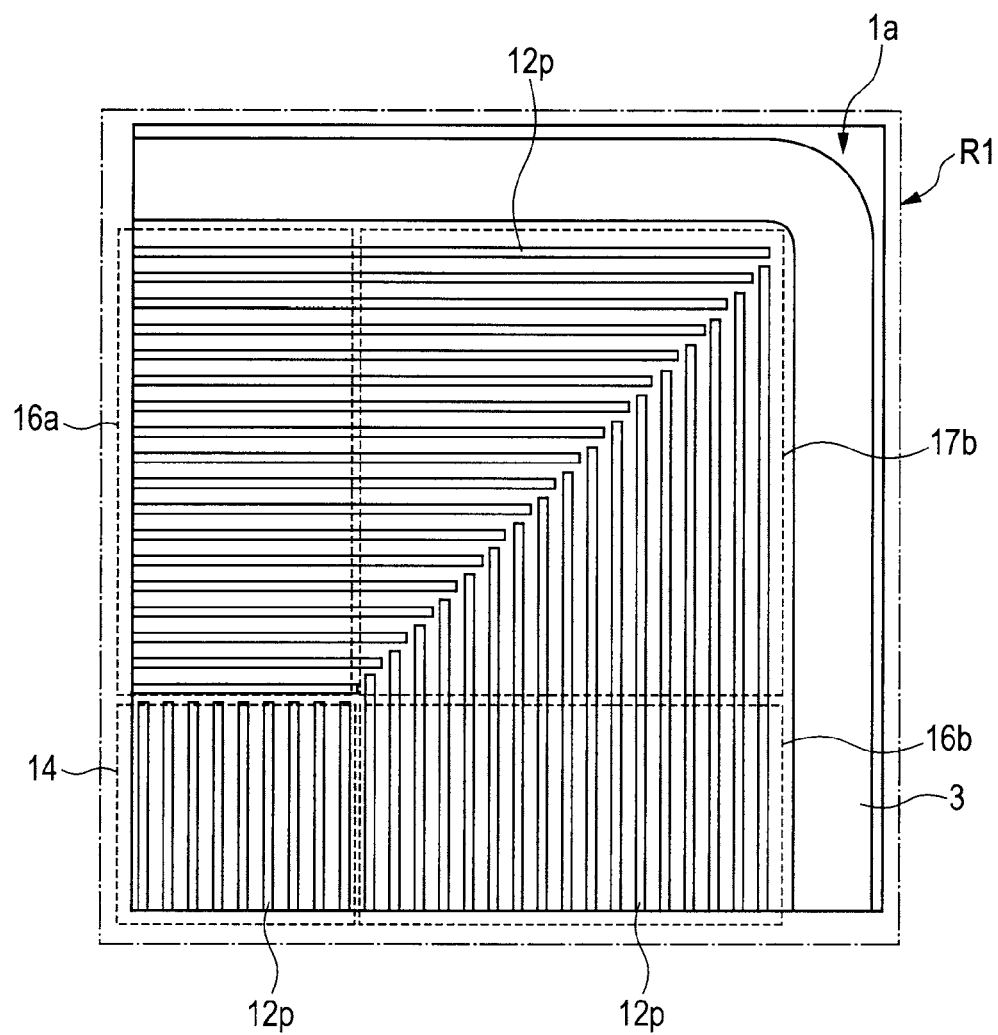
FIG. 95 is a top view of a cut-away region R1 of a chip corner portion for illustrating a charge-balanced-type 2D peripheral resurf structure in a semiconductor device of a first embodiment of a third part of the present invention.
Figure 96:
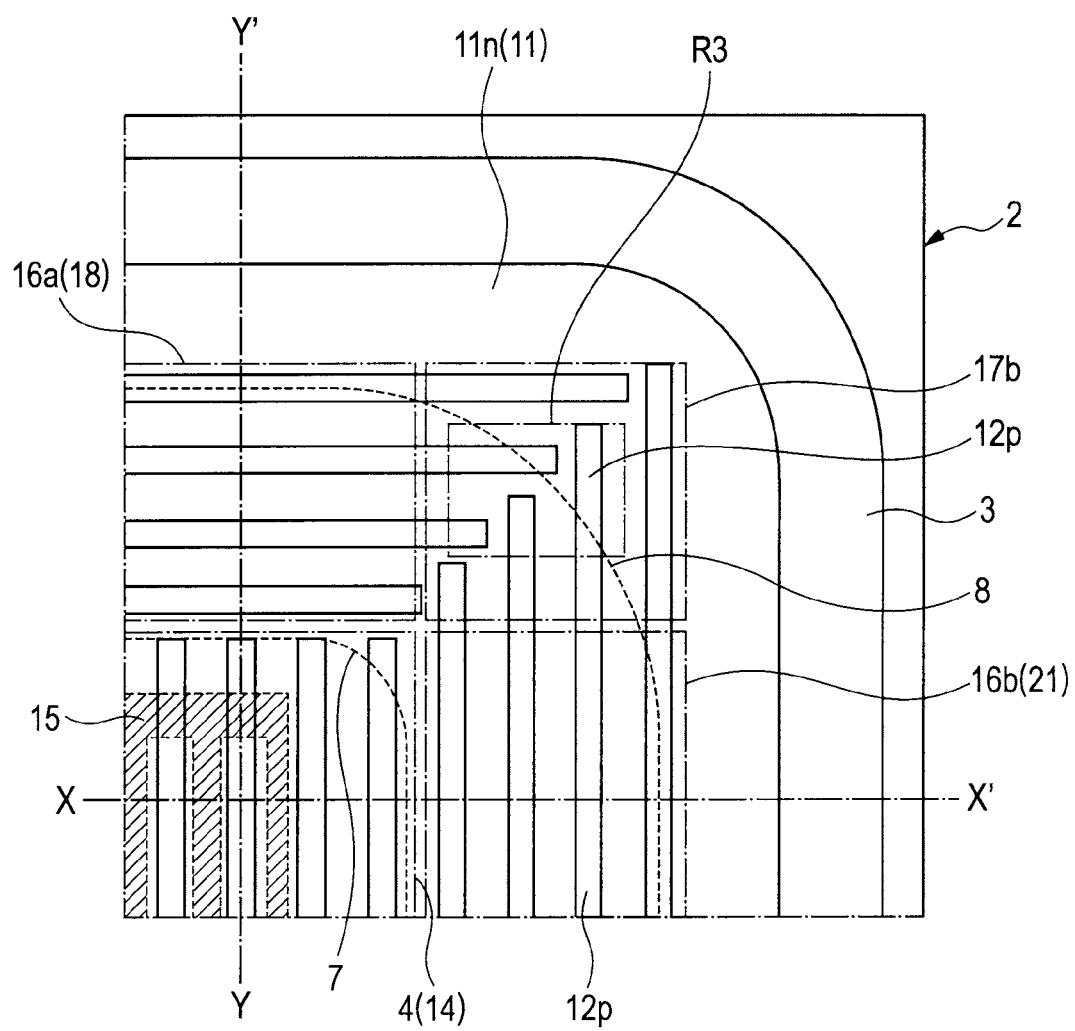
FIG. 96 is a schematic top view of the chip corner portion corresponding to FIG. 95.
Figure 97:
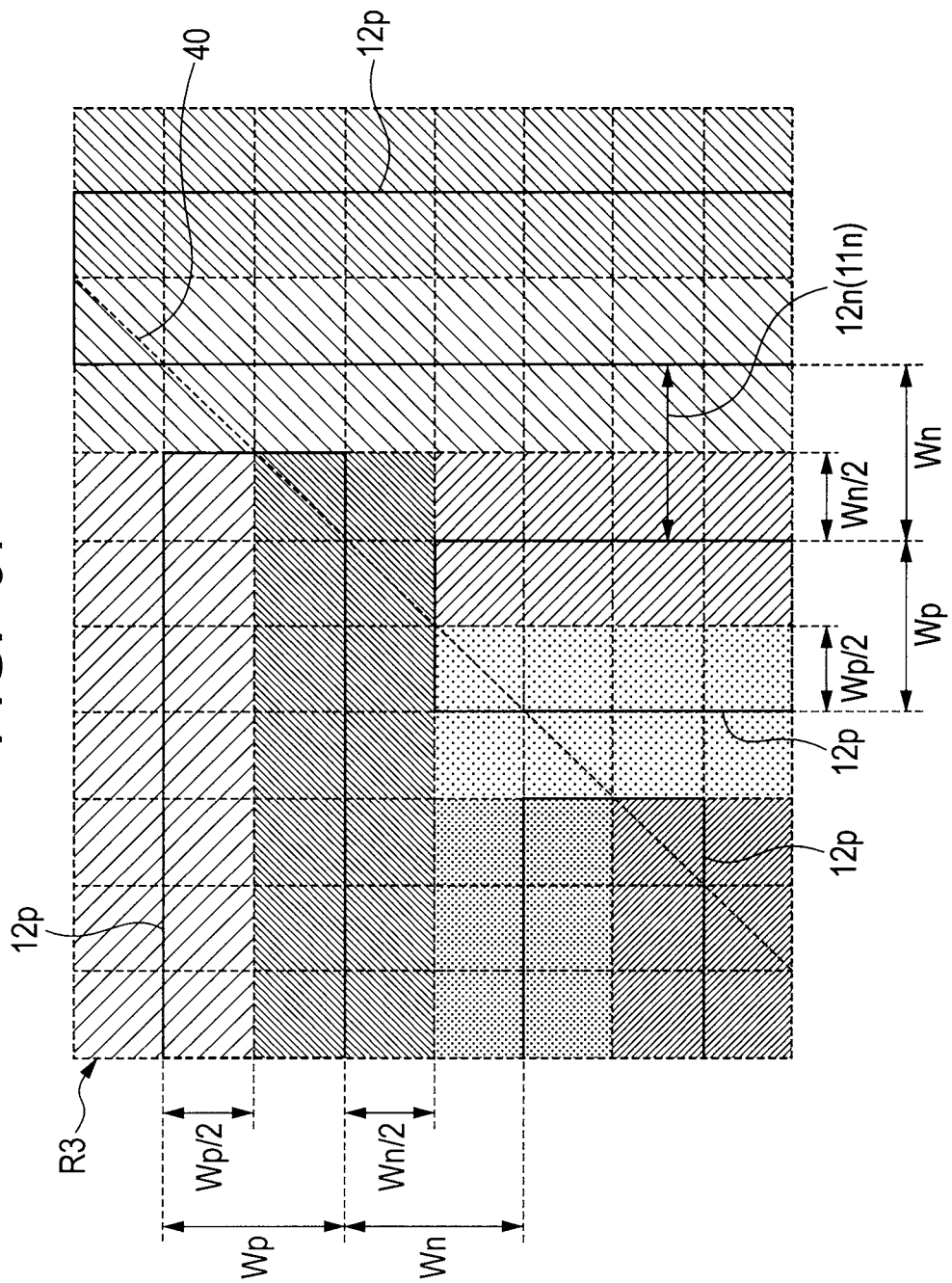
FIG. 97 is a locally enlarged view (for easier understanding of a charge balancing treatment, the width of each of N columns is reduced to provide an equal area when charge is balanced) corresponding to a partially cut-away region R3 of the corner portion of FIG. 96 subjected to the charge balancing treatment.

FIG. 95 is a top view of a cut-away region R1 of a chip corner portion for illustrating a charge-balanced-type 2D peripheral resurf structure in a semiconductor device of a first embodiment of a third part of the present invention. FIG. 96 is a schematic top view of the chip corner portion corresponding to FIG. 95. FIG. 97 is a locally enlarged view (for easier understanding of a charge balancing treatment, the width of each of N columns is reduced to provide an equal area when charge is balanced) corresponding to a partially cut-away region R3 of the corner portion of FIG. 96 subjected to the charge balancing treatment. Based on these drawings, a description will be given to a charge-balanced-type 2D peripheral resurf structure and the like in the semiconductor device of the first embodiment of the present invention.

For example, in a non-charge-balanced-type corner column layout as shown in FIG. 83 or 85 also, in the active-cell-portion super-junction structure 14 and the peripheral side regions 16a and 16b (16c and 16d), one-dimensional periodicity is held so that charge balance is relatively easy to hold. On the other hand, in the peripheral corner region 17b (17a, 17c, or 17d), two-dimensional layout is performed and, e.g., the P column regions 12p extending from the two sides come into proximity to each other in slightly spaced-apart relation or form a bent portion in the vicinity of the connection point therebetween (e.g., a layout substantially symmetrical with respect to a diagonal line as shown in FIG. 85, i.e., a quasi-symmetrical type). In another case, the super-junction structure is extended with the same symmetry from one side (e.g., an asymmetrical layout with respect to a diagonal line, as shown in FIG. 83, i.e., an asymmetrical type). As a result, in an asymmetrical non-charge-balanced-type corner column layout, the symmetry of a depletion layer is different from the symmetry of the column layout in the corner portion, and local charge imbalance tends to be induced by the difference. On the other hand, in a quasi-symmetrical non-charge-balanced-type corner column layout, the relationship with the symmetry of the depletion layer in the corner portion has been relatively improved but, around the portion where the P column regions are disconnected or form the bent portion, local charge imbalance tends to be induced. By contrast, the example of the present section is based on the quasi-symmetrical non-charge-balanced-type corner column layout, and performs a local charge balancing treatment around the portion where the P column regions are disconnected or form the bent portion.

FIG. 95 shows a P column layout in the charge-balanced-type chip corner portion. As shown in FIG. 95, the column layout is the same as the non-charge-balanced-type column layout in the active-cell-portion super-junction structure 14 and the peripheral side region 16a or 16b (16c or 16d). However, in the peripheral corner region 17b (17a, 17c, or 17d), compared with the non-charge-balanced-type bent layout (FIG. 85), the P column regions 12p are disconnected in a portion along a diagonal line 40. Also, the respective end portions of the individual P column regions 12p extending from the two sides are in mutually interengaged positional relation.

For easier understanding of the relation, FIG. 96 schematically shows a reduced number of the P column regions 12p. To describe the mutual relationship between the P column regions 12p extending in the X- and Y-directions, a partially cut-away region R3 in the corner portion subjected to the charge balancing treatment is enlargedly deformed and shown in FIG. 97. In FIG. 97, the thickness Wn of each of the N columns is displayed in reduced relation ("N column reduced display") such that the thickness Wn of the N column and the thickness Wp of each of the P columns are substantially the same in the drawing (only in this drawing, Wn=Wp is apparently satisfied). Accordingly, the amount of charge included in the same area is equal. As shown in FIG. 97, in the charge-balanced-type corner column layout, the respective amounts of charge in the similarly hatched half-width regions (belt-like regions having the widths Wn/2 and Wp/2 each corresponding to half the thickness of the column) on both sides of the longitudinal side of the P column region 12p have the same absolute value and the opposite signs. Therefore, if the hatched portions are laid out in such an amount as to occupy the entire region (e.g., the peripheral corner region 17b), local charge balance is consequently held. It will be understood that, for this purpose, the middle of the shorter side of the P column region 12p may be located appropriately on the diagonal line 40 of the semiconductor chip or the peripheral corner region and the most proximate distance between the proximate P column regions 12p may be set appropriately to about one-half Wn/2 of the thickness of the N column.

Note that, as shown in FIG. 96 or the like, it is desirable that the corner-portion super-junction structure does not contain a micro-column, i.e., a minute P column region 12p. This is because, if a micro-column exists, when filling is performed according to a trench epitaxial filling method, the micro-column has a filling property different from those of the other macroscopic P column regions 12p, and consequently a process window which allows the filling property to be excellently retained is reduced. Here, the "micro-column" refers to the P column region 12p having a length which is less than double the width or thickness Wp thereof. Also, the "macroscopic column" refers to the P column region 12p having a length which is not less than double the width or thickness Wp thereof.

2. Description of Charge-Balanced-Type 3D Peripheral Resurf Structure, Etc. in Semiconductor Device of Second Embodiment of Present Invention (See Mainly FIGS. 98 to 100)

The example of the first part relates to the non-charge-balanced-type 3D peripheral resurf structure (with the half-width P⁻-type surface resurf region), while the example of this section relates to a charge-balanced-type 3D peripheral resurf structure (without the half-width P⁻-type surface resurf region) corresponding to a charge-balanced version thereof. Accordingly, e.g., a chip structure other than a P column layout in a chip corner portion and the like are described in detail in the first, third, and like sections of the first part, a process associated therewith is described in detail in the second, fourth, and like sections of the first part, and variations thereof and the like are described in detail in the fifth and like sections of the first part. Therefore, hereinbelow, a description will be given only to a different portion in principle.

Note that, e.g., the package and the like are substantially the same as described in the first section of the second part.

Figure 98:
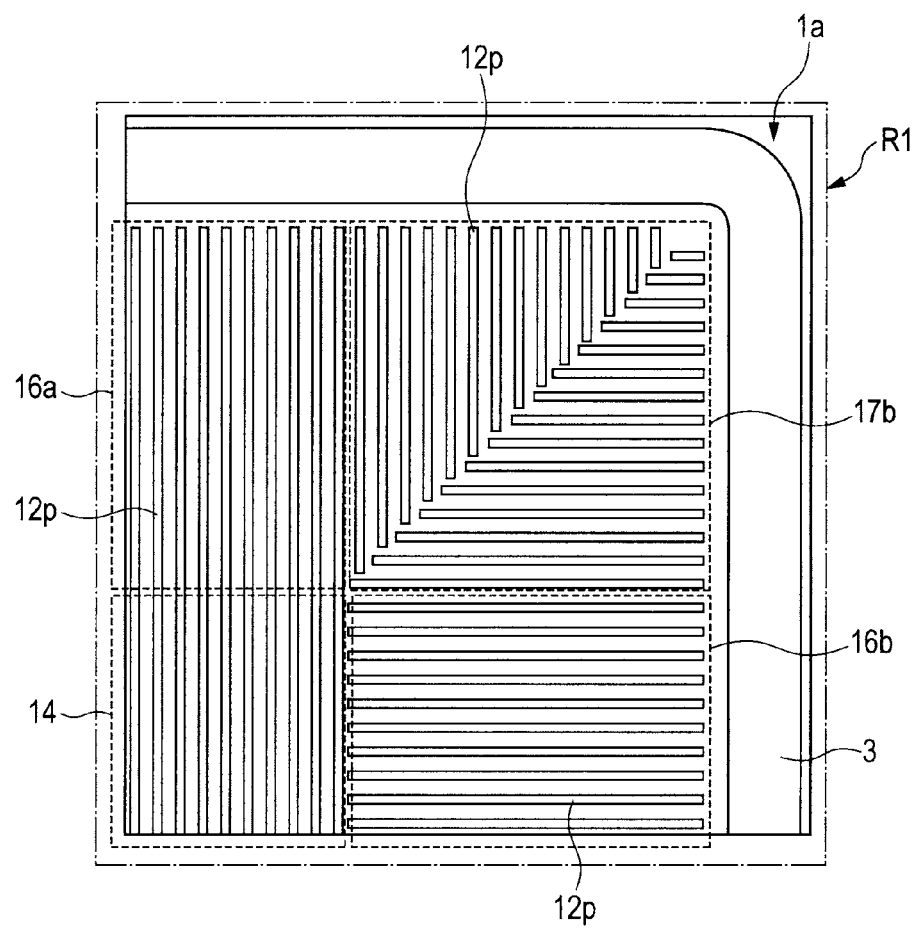
FIG. 98 is a top view of the cut-away region R1 of the chip corner portion for illustrating a charge-balanced-type 3D peripheral resurf structure in a semiconductor device of a second embodiment of the third part of the present invention.
Figure 99:
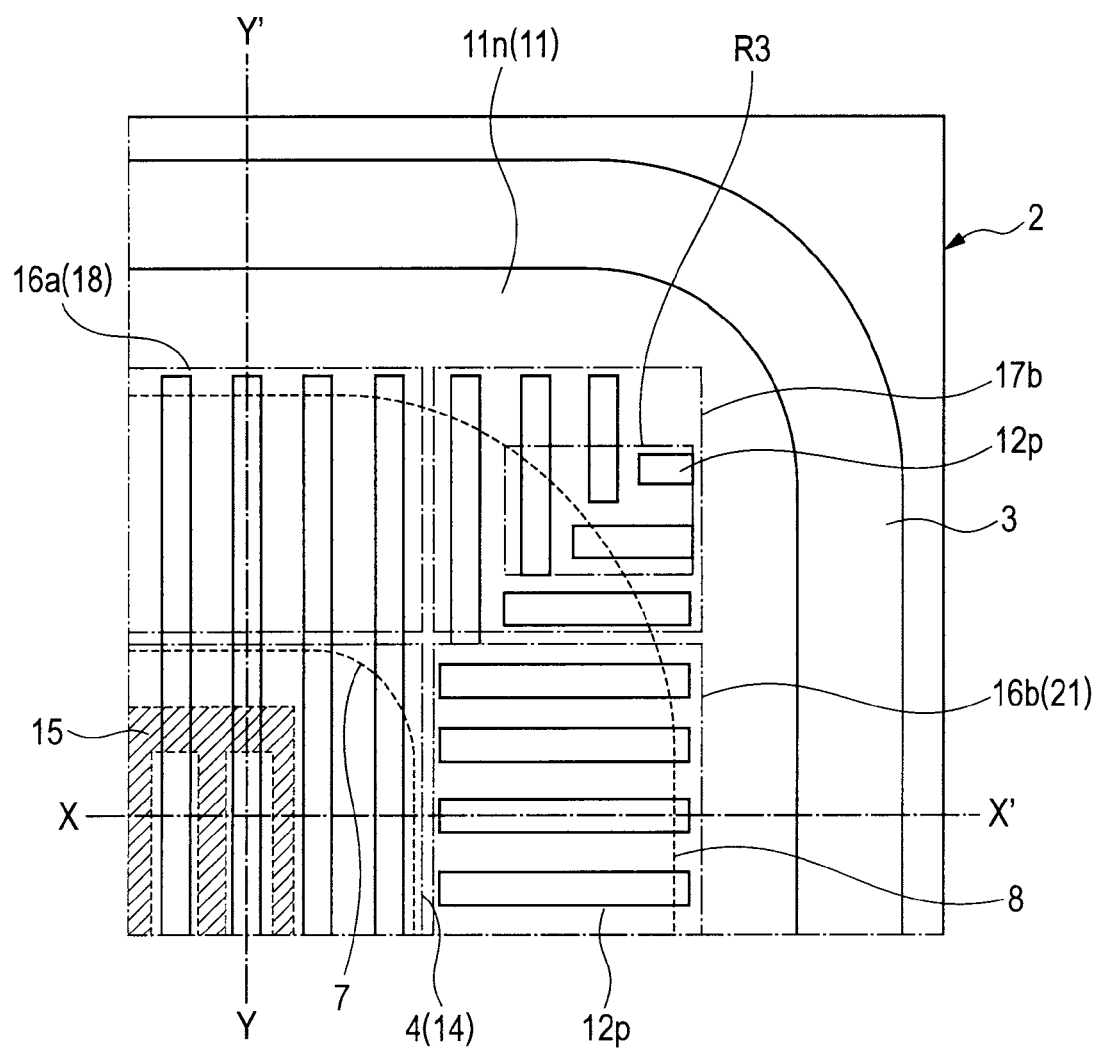
FIG. 99 is a schematic top view of the chip corner portion corresponding to FIG. 98.
Figure 100:
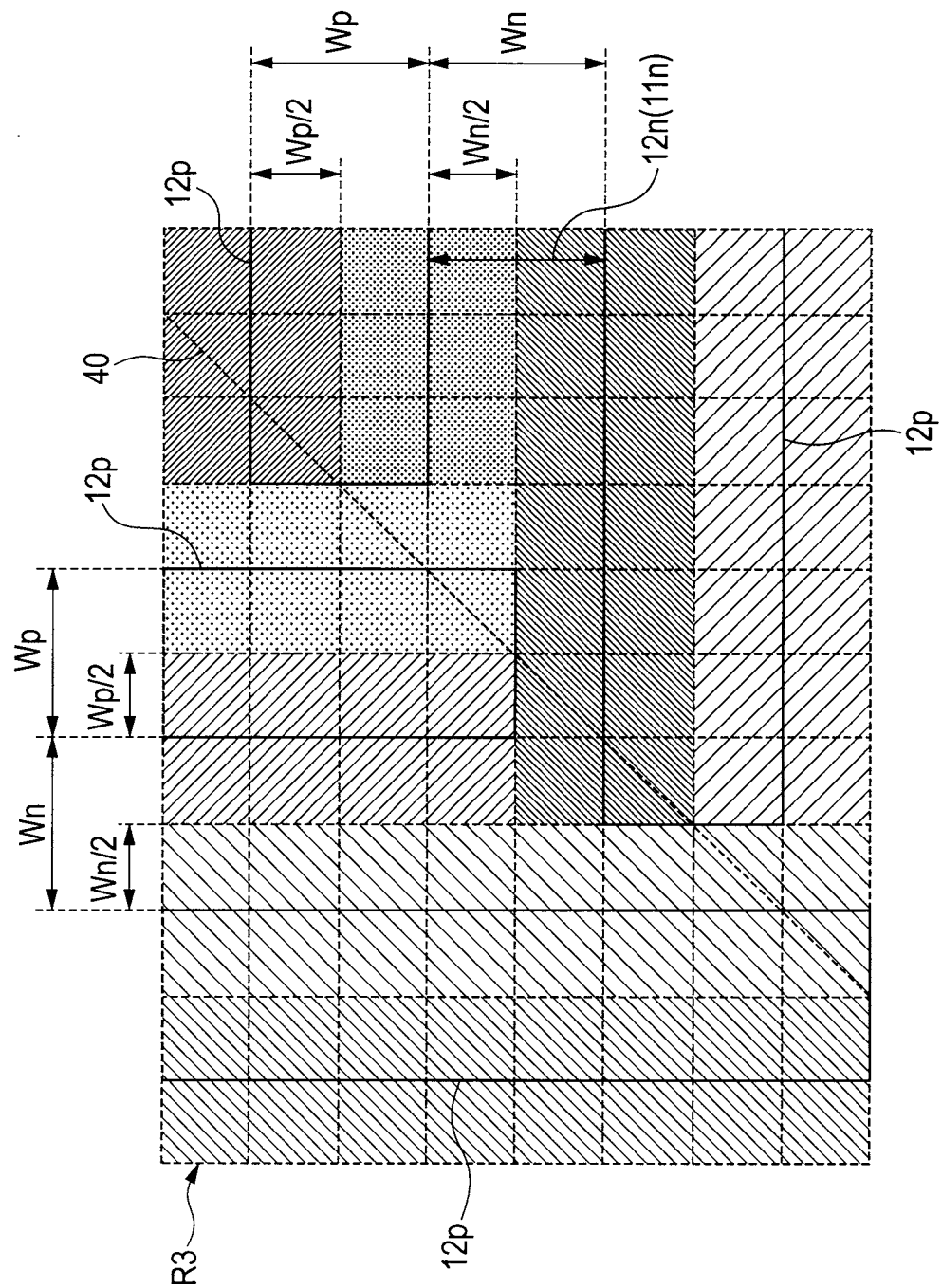
FIG. 100 is, a locally enlarged view (for easier understanding of the charge balancing treatment, the width of each of the N columns is reduced to provide an equal area when charge is balanced) corresponding to the partially cut-away region R3 of the corner portion of FIG. 99 subjected to the charge balancing treatment.

FIG. 98 is a top view of the cut-away region R1 of the chip corner portion for illustrating a charge-balanced-type 3D peripheral resurf structure in a semiconductor device of a second embodiment of the third part of the present invention. FIG. 99 is a schematic top view of the chip corner portion corresponding to FIG. 98. FIG. 100 is a locally enlarged view (for easier understanding of the charge balancing treatment, the width of each of the N columns is reduced to provide an equal area when charge is balanced, i.e., "N column reduced display" is performed) corresponding to the partially cut-away region R3 of the corner portion of FIG. 99 subjected to the charge balancing treatment. Based on these drawings, description will be given to a charge-balanced-type 3D peripheral resurf structure and the like in the semiconductor device of the second embodiment of the present invention.

For example, in a non-charge-balanced-type corner column layout as shown in FIG. 34 or 36 also, in the active cell portion super-junction structure 14 and the peripheral side regions 16a and 16b (16c and 16d), one-dimensional periodicity is held so that charge balance is relatively easy to hold. On the other hand, in the peripheral corner region 17b (17a, 17c, or 17d), two-dimensional layout is performed and, e.g., the L-shaped P column regions 12p are repeatedly arranged to be substantially symmetrical with respect to the diagonal line (e.g., a quasi-symmetrical type as shown in FIG. 36). Alternatively, the super-junction structure is extended with the same symmetry from one side (e.g., an asymmetrical layout with respect to a diagonal line, as shown in FIG. 34, i.e., an asymmetrical type). As a result, in an asymmetrical non-charge-balanced-type corner column layout, the symmetry of a depletion layer is different from the symmetry of the column layout in the corner portion, and a local charge imbalance tends to be induced by the difference. On the other hand, in a quasi-symmetrical non-charge-balanced-type corner column layout, the relationship with the symmetry of the depletion layer in the corner portion has been relatively improved but, around the portion where the P column regions are disconnected or form the bent portion, local charge imbalance tends to be induced. By contrast, the example of the present section is based on the quasi-symmetrical non-charge-balanced-type corner column layout, and performs a local charge balancing treatment around the portion where the P column regions are disconnected or form the bent portion.

FIG. 98 shows a P column layout in the charge-balanced-type chip corner portion. As shown in FIG. 98, the column layout is the same as the non-charge-balanced-type column layout in the active-cell-portion super-junction structure 14 and the peripheral side region 16a or 16b (16c or 16d). However, in the peripheral corner region 17b (17a, 17c, or 17d), compared with the non-charge-balanced-type bent layout (FIG. 36), the P column regions 12p are disconnected in a portion along a diagonal line 40. Also, the respective end portions of the individual P column regions 12p extending from the two sides are in mutually interlocking positional relation.

For easier understanding of the relation, FIG. 99 schematically shows a reduced number of the P column regions 12p. To describe the mutual relationship between the P column regions 12p extending in the X- and Y-directions, a partially cut-away region R3 in the corner portion subjected to the charge balancing treatment is enlargedly deformed and shown in FIG. 100. In FIG. 100, the thickness Wn of each of the N columns is displayed in reduced relation ("N column reduced display") such that the thickness Wn of the N column and the thickness Wp of each of the P columns are substantially the same in the drawing (only in this drawing, Wn=Wp is apparently satisfied). Accordingly, the amount of charge included in the same area is equal. As shown in FIG. 100, in the charge-balanced-type corner column layout, the respective amounts of charge in the similarly hatched half-width regions (belt-like regions having the widths Wn/2 and Wp/2 each corresponding to half the thickness of the column) on both sides of the longitudinal side of the P column region 12p have the same absolute value and the opposite signs. Therefore, if the hatched portions are laid out in such an amount as to occupy the entire region (e.g., the peripheral corner region 17b), local charge balance is consequently held. It will be understood that, for this purpose, the middle of the shorter side of the P column region 12p may be located appropriately on the diagonal line 40 of the semiconductor chip or the peripheral corner region and the most proximate distance between the proximate P column regions 12p may be set appropriately to about one-half Wn/2 of the thickness of the N column.

3. Description of First Variation of Above Second Embodiment (3D Peripheral Resurf Structure and Half-Width Surface Resurf Layer) (See Mainly FIG. 101)

The example of the section is obtained by using a half-width P⁻-type surface resurf region, in place of the full-width P⁻-type surface resurf region, in the example descried in the second section. As for the half-width P⁻-type surface resurf region, it is described in detail in the first part so that the description thereof is not repeated herein.

Figure 101:
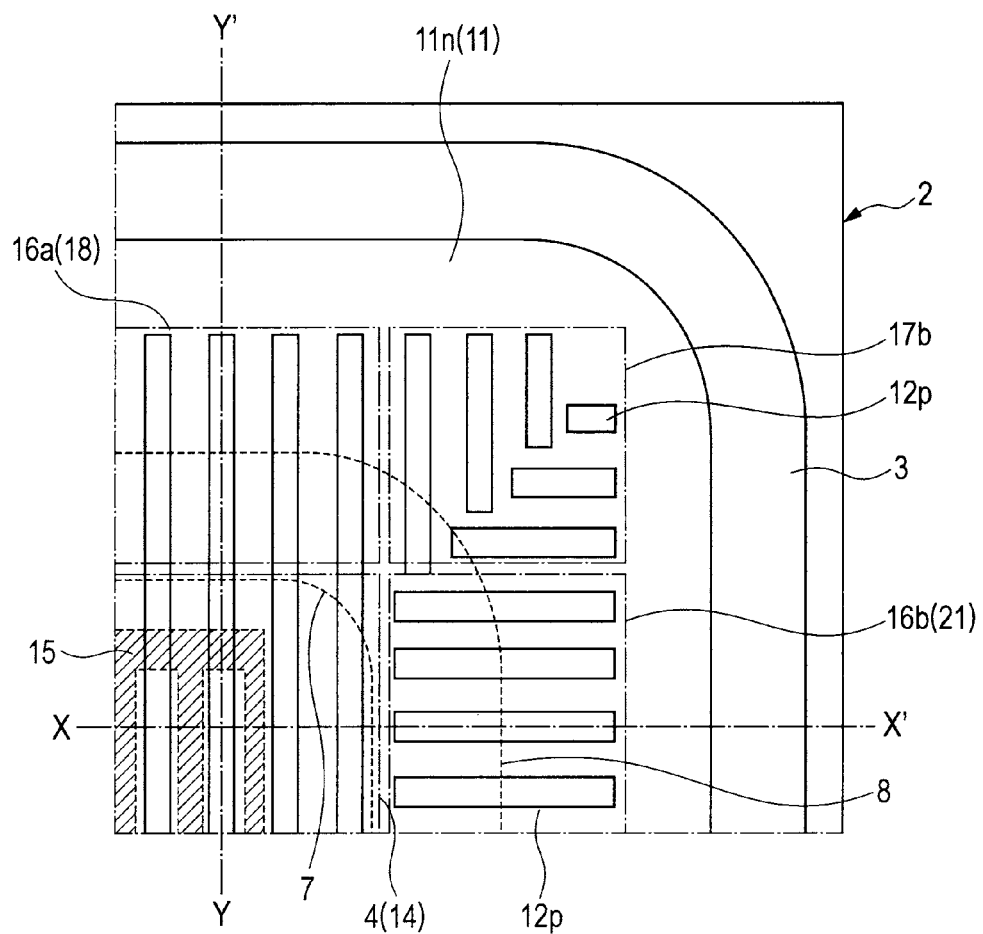
FIG. 101 is a schematic top view of a chip corner portion for illustrating a first variation (3D peripheral resurf structure and half-width surface resurf layer) of the second embodiment of the third part of the present invention.

FIG. 101 is a schematic top view of a chip corner portion for illustrating a first variation (3D peripheral resurf structure and half-width surface resurf layer) of the second embodiment of the third part of the present invention. Based on the drawing, a description will be given to a first variation (3D peripheral resurf structure and half-width surface resurf layer) of the second embodiment described above.

As shown in FIG. 101, the layout of the P column regions 12p in the peripheral corner region 17b (17a, 17c, or 17d) is of charge-balanced type, and the half-width P⁻-type surface resurf region 8 is used.

4. Description of Second Variation of Each of Above First and Second Embodiments (Trimming of Super-Junction Corner Portion) (See Mainly FIGS. 102 and 103)

The example of this section relates to trimming of the corner of the charge-balanced-type 2D peripheral resurf structure of the second part corresponding to FIG. 84 and trimming of the corner of the charge-balanced-type 3D peripheral resurf structure of the first part corresponding to FIG. 35.

Figure 102:
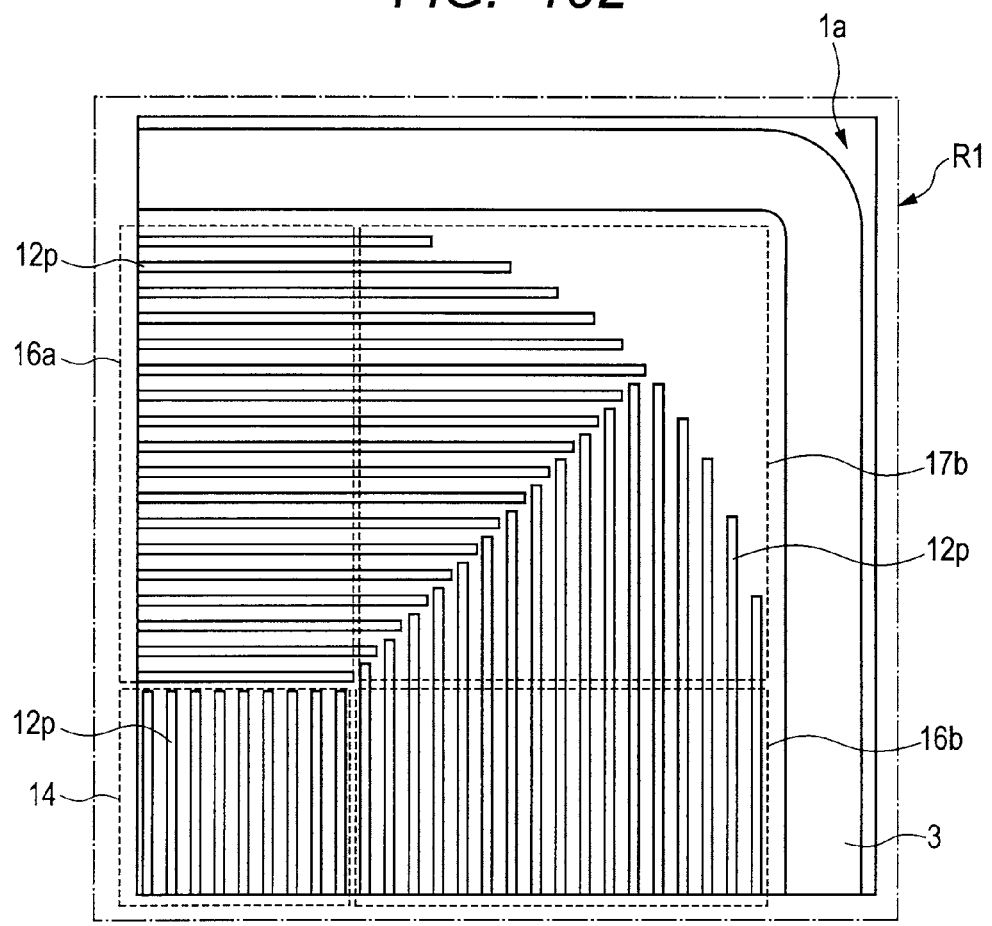
FIG. 102 is a top view of the cut-away region R1 of a chip corner portion for illustrating a charge-balanced-type 2D peripheral resurf structure in a second variation (trimming of a super-junction corner portion) of the first embodiment of the third part of the present invention.
Figure 103:
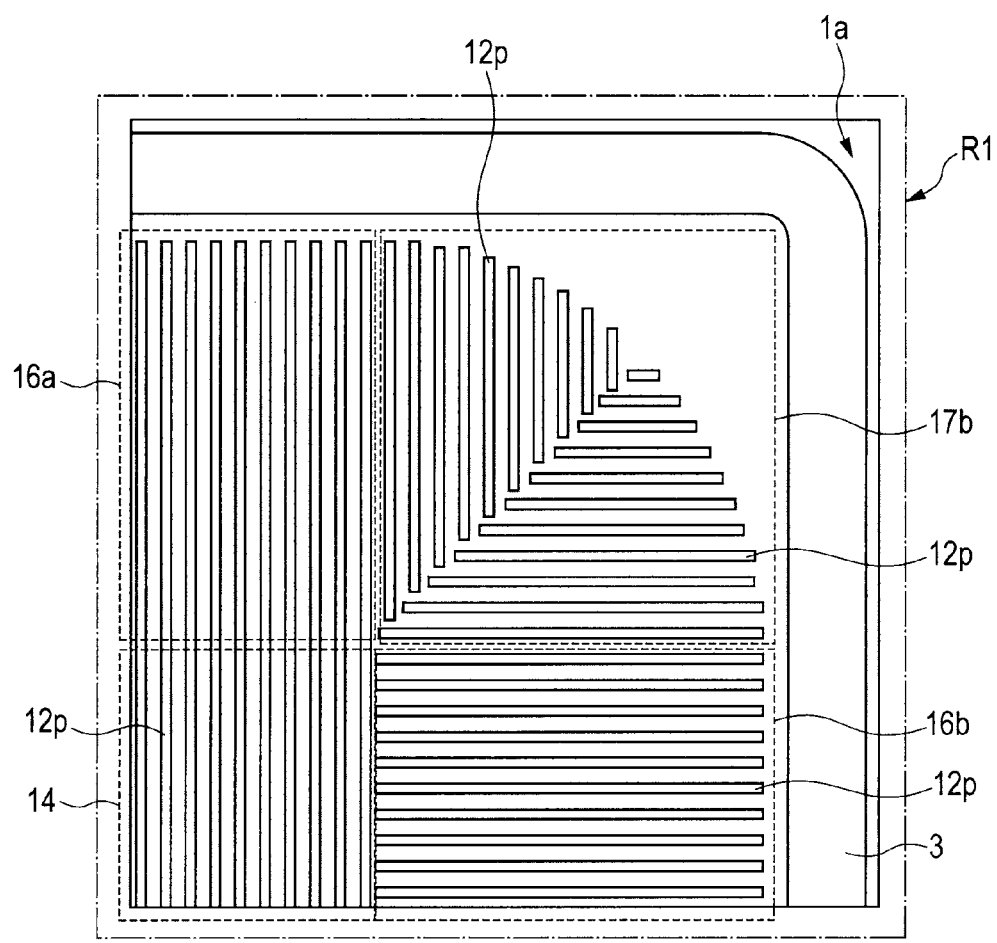
FIG. 103 is a top view of the cut-away region R1 of a chip corner portion for illustrating a charge-balanced-type 3D peripheral resurf structure in a second variation (trimming of the super-junction corner portion) of the second embodiment of the third part of the present invention.

FIG. 102 is a top view of the cut-away region R1 of a chip corner portion for illustrating a charge-balanced-type 2D peripheral resurf structure in a second variation (trimming of a super-junction corner portion) of the first embodiment of the third part of the present invention. FIG. 103 is a top view of the cut-away region R1 of a chip corner portion for illustrating a charge-balanced-type 3D peripheral resurf structure in a second variation (trimming of the super-junction corner portion) of the second embodiment of the third part of the present invention. Based on these drawings, a description will be given to a second variation (trimming of super-junction corner portions) of each of the first and second embodiments described above.

(1) Trimming of Corners of Charge-Balanced-Type 2D Peripheral Resurf Structure (See Mainly FIG. 102)

A charge-balanced-type 2D peripheral resurf structure as shown in FIG. 95 has a relatively excellent relationship with the symmetry of a depletion layer in a chip corner portion. However, the shape of the envelope of an extended portion of the P column region 12p is different from the shape of an equipotential line in the depletion layer and, in that portion, charge balance may be lost. To prevent this, as shown in FIG. 102, a trimming treatment is performed here with respect to the extended portion of the P column region 12*p* of FIG. 95 in accordance with the shape of the equipotential line in the depletion layer in the chip surface.

(2) Trimming of Corners of Charge-Balanced-Type 3D Peripheral Resurf Structure (See Mainly FIG. 103)

A charge-balanced-type 3D peripheral resurf structure as shown in FIG. 98 has a relatively excellent relationship with the symmetry of a depletion layer in a chip corner portion. However, the shape of the envelope of an extended portion of the P column region 12*p* is different from the shape of an equipotential line in the depletion layer and, in that point, charge balance may be lost. To prevent this, as shown in FIG. 103, a trimming treatment is performed here with respect to the extended portion of the P column region 12*p* of FIG. 98 in accordance with the shape of the equipotential line in the depletion layer in the chip surface.

5. Description of Third Variation of Each of Above First and Second Embodiments (Combination with Floating Field Plates) (See Mainly FIGS. 104 and 105)

The example of this section relates to the application of floating field plates to the charge-balanced-type 2D peripheral resurf structure corresponding to the second section of the second part and the application of floating field plates to the charge-balanced-type 3D peripheral resurf structure corresponding to the third section of the first part.

Figure 104:
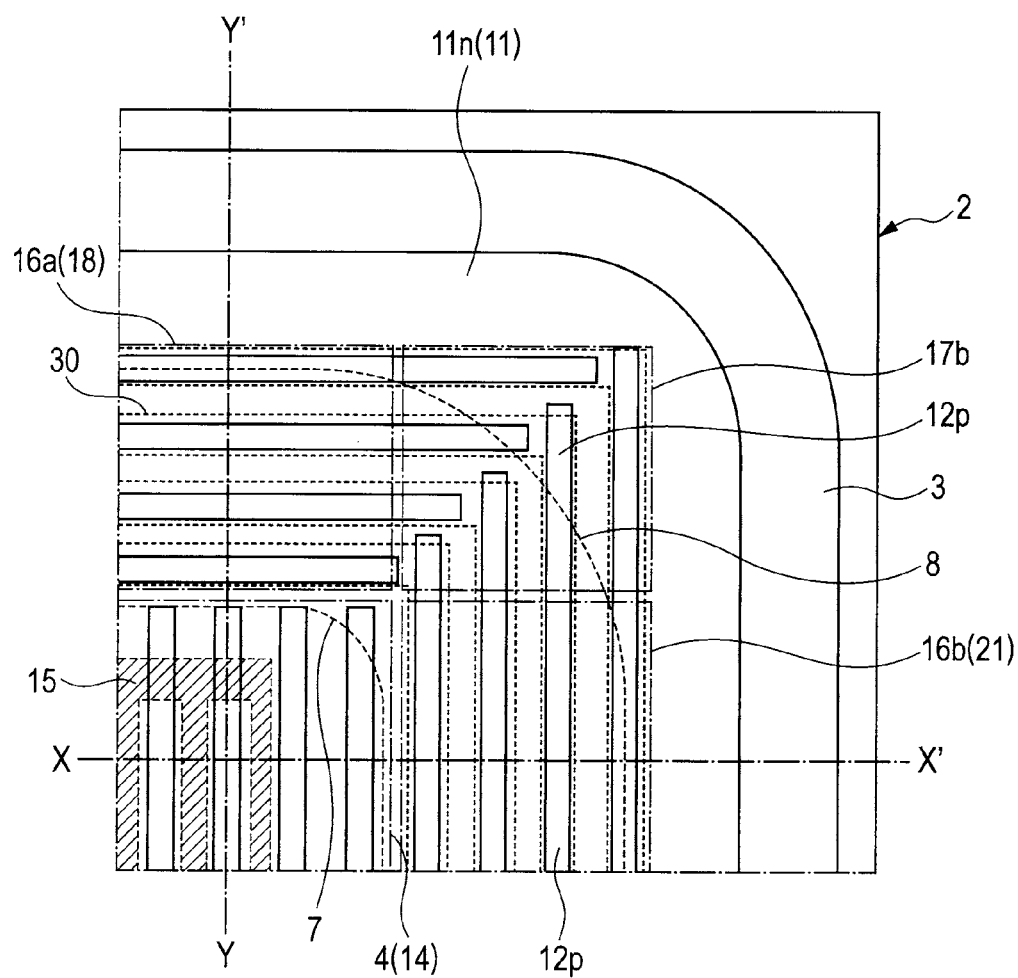
FIG. 104 is a schematic top view of a chip corner portion for illustrating a third variation (combination with floating field plates) of the first embodiment of the third part of the present invention.
Figure 105:
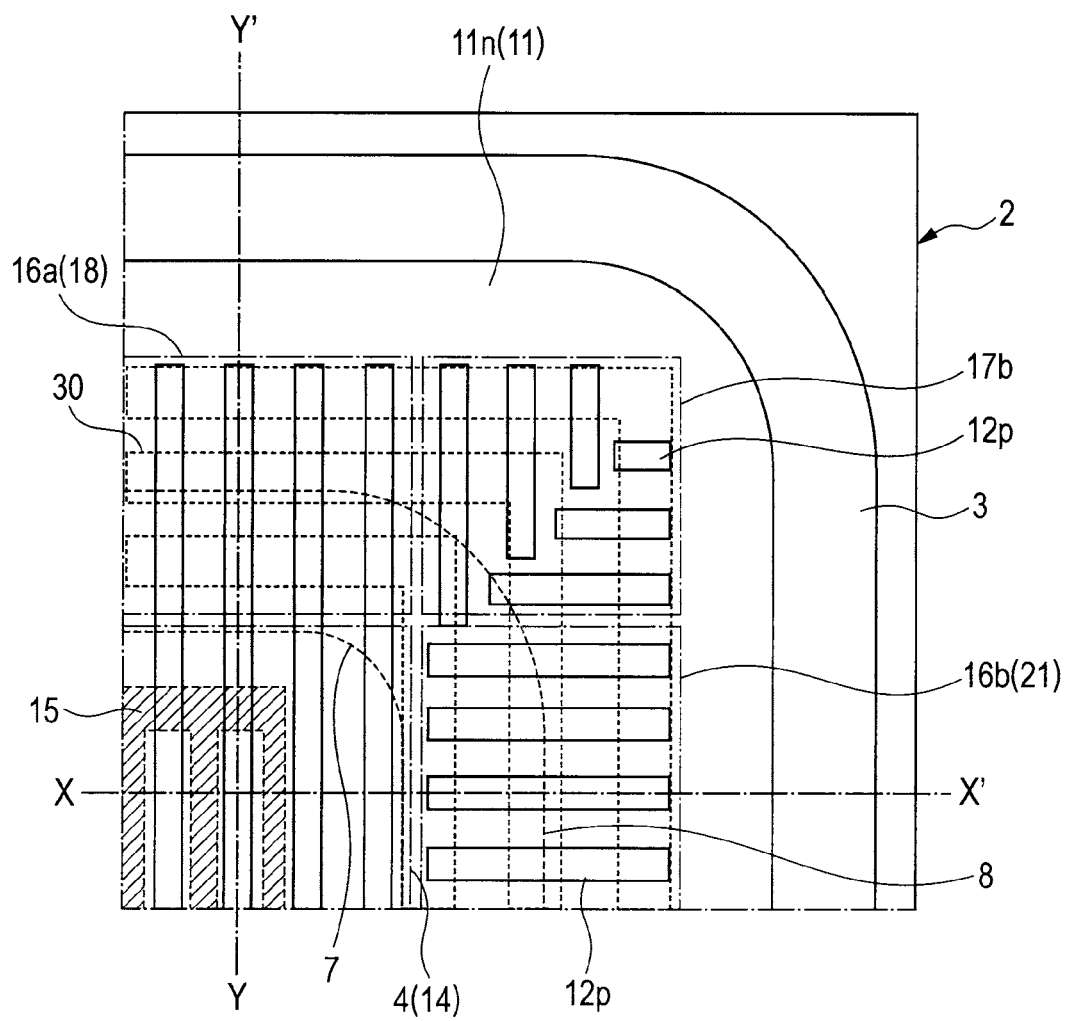
FIG. 105 is a schematic top view of a chip corner portion for illustrating a third variation (combination with floating field plates) of the second embodiment of the third part of the present invention.

FIG. 104 is a schematic top view of a chip corner portion for illustrating a third variation (combination with floating field plates) of the first embodiment of the third part of the present invention. FIG. 105 is a schematic top view of a chip corner portion for illustrating a third variation (combination with floating field plates) of the second embodiment of the third part of the present invention. Based on these drawings, a description will be given to a third variation (combination with the floating field plates) of each of the first and second embodiments described above.

(1) Application of FFPs to Charge-Balanced-Type 2D Peripheral Resurf Structure (See Mainly FIG. 104)

As shown in FIG. 104, this example is obtained by applying the charge-balanced-type P column region layout in the chip corner portion of FIG. 95 to the 2D peripheral resurf structure having the full-width P⁻-type surface region 8 and the floating field plates 30 described in the second section of the second part.

(2) Application of FFPs to Charge-Balanced-Type 3D Peripheral Resurf Structure (See Mainly FIG. 105)

As shown in FIG. 105, this example is obtained by applying the charge-balanced-type P column region layout in the chip corner portion of FIG. 98 and the floating field plates 30 (the application of the floating field plates 30 is obviously arbitrary) to the 3D peripheral resurf structure having the half-width P⁻-type surface region 8 described in the first section of the first part.

6. Description of Fourth Variation of Above First Embodiment (Combination with N Rings or P Rings) (See Mainly FIG. 106)

The example of the fourth or sixth section of the second part relates the non-charge-balanced-type 2D peripheral resurf structure, while the example of this section relates to the charge-balanced-type 2D peripheral resurf structure corresponding to the charge-balanced version thereof. Accordingly, e.g., a package and the like are described in detail in the first section of the second part, a chip structure other than a P column layout in a chip corner portion and the like are described in detail in the fourth, sixth, and like sections of the second part, a process associated therewith is described in detail in the fifth, seventh, and like sections of the second part, and variations thereof and the like are described in detail in the eighth and like sections of the second part. Therefore, hereinbelow, a description will be given only to a different portion in principle.

Note that, here, a description will be given to an example having both N ring regions and P ring regions but, obviously, it is sufficient if at least one of the N ring regions and the P ring regions is provided.

Figure 106:
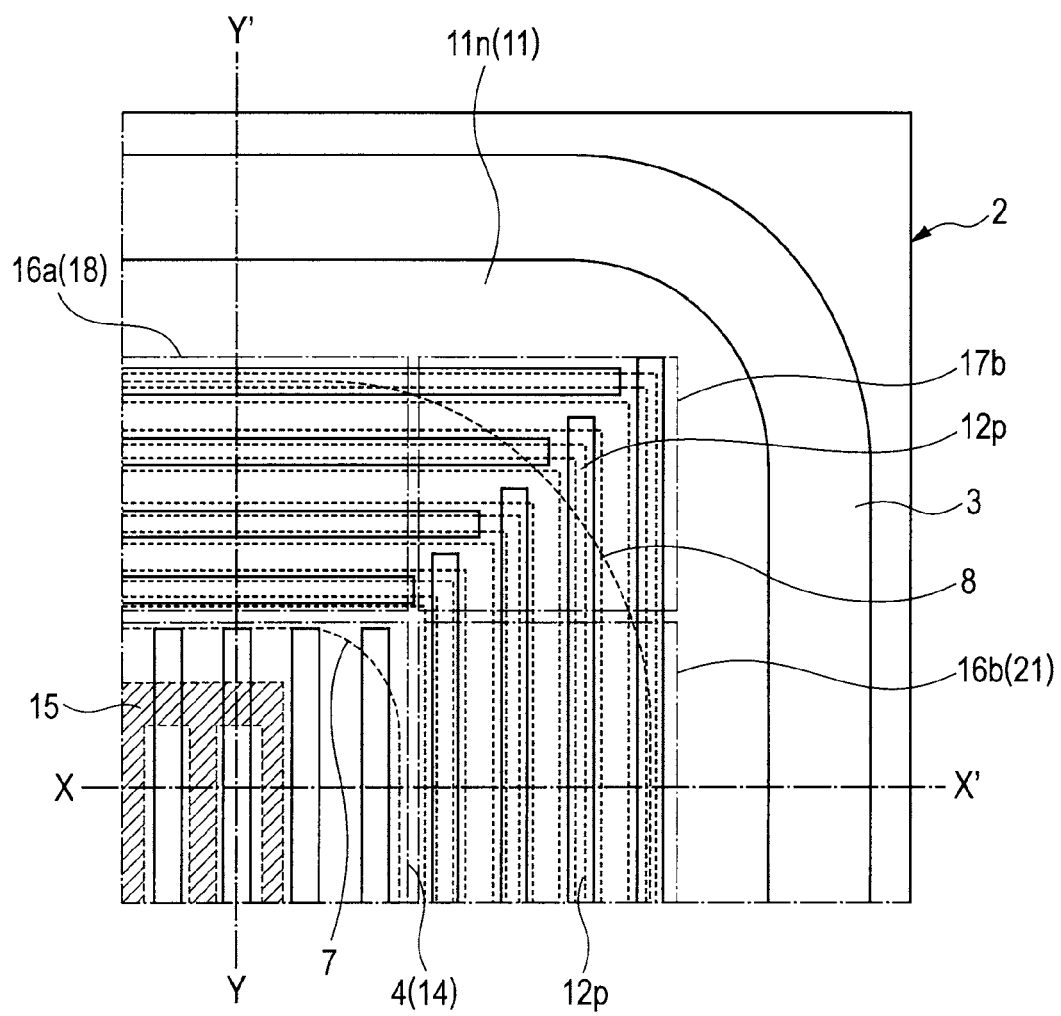
FIG. 106 is a schematic top view of a chip corner portion for illustrating a fourth variation (combination with N rings or P rings) of the first embodiment of the third part of the present invention.

FIG. 106 is a schematic top view of a chip corner portion for illustrating a fourth variation (combination with N rings or P rings) of the first embodiment of the third part of the present invention. Based on the drawing, a description will be given to a fourth variation (combination with the N rings or P rings) of the first embodiment described above.

As shown in FIG. 106, the example of this section is obtained by applying the charge-balanced-type P column region layout in the chip corner portion illustrated in FIG. 95 to the 2D peripheral resurf structure having the N ring regions 42*n* and the P ring regions 42*p* of the sixth section of the second part. Note that, to the resulting structure, floating field plates as described in the article (1) of the fifth section may further be applied.

7. Consideration and Supplemental Description of Each of Embodiments (See Mainly FIGS. 107 to 109)

Figure 107:
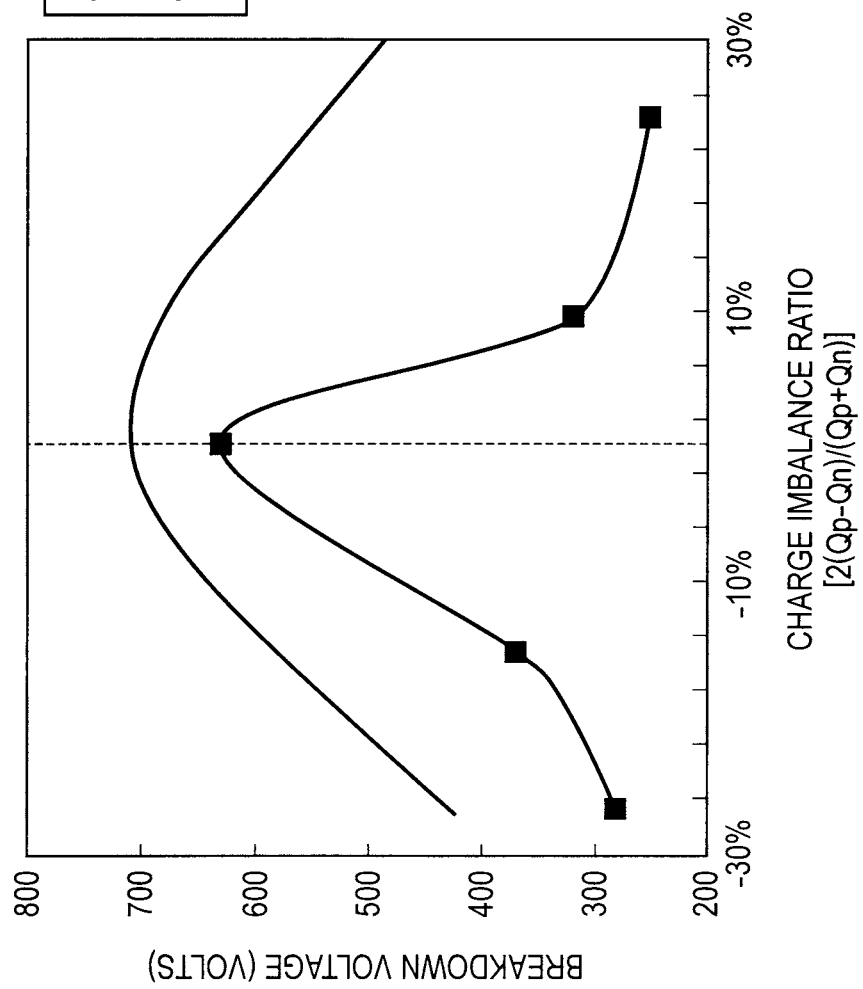
FIG. 107 is a data plot diagram (including the result of simulation in a cell portion) showing a relationship between charge balance and breakdown voltage in a non-charge-balanced-type 2D peripheral resurf structure.
Figure 108:
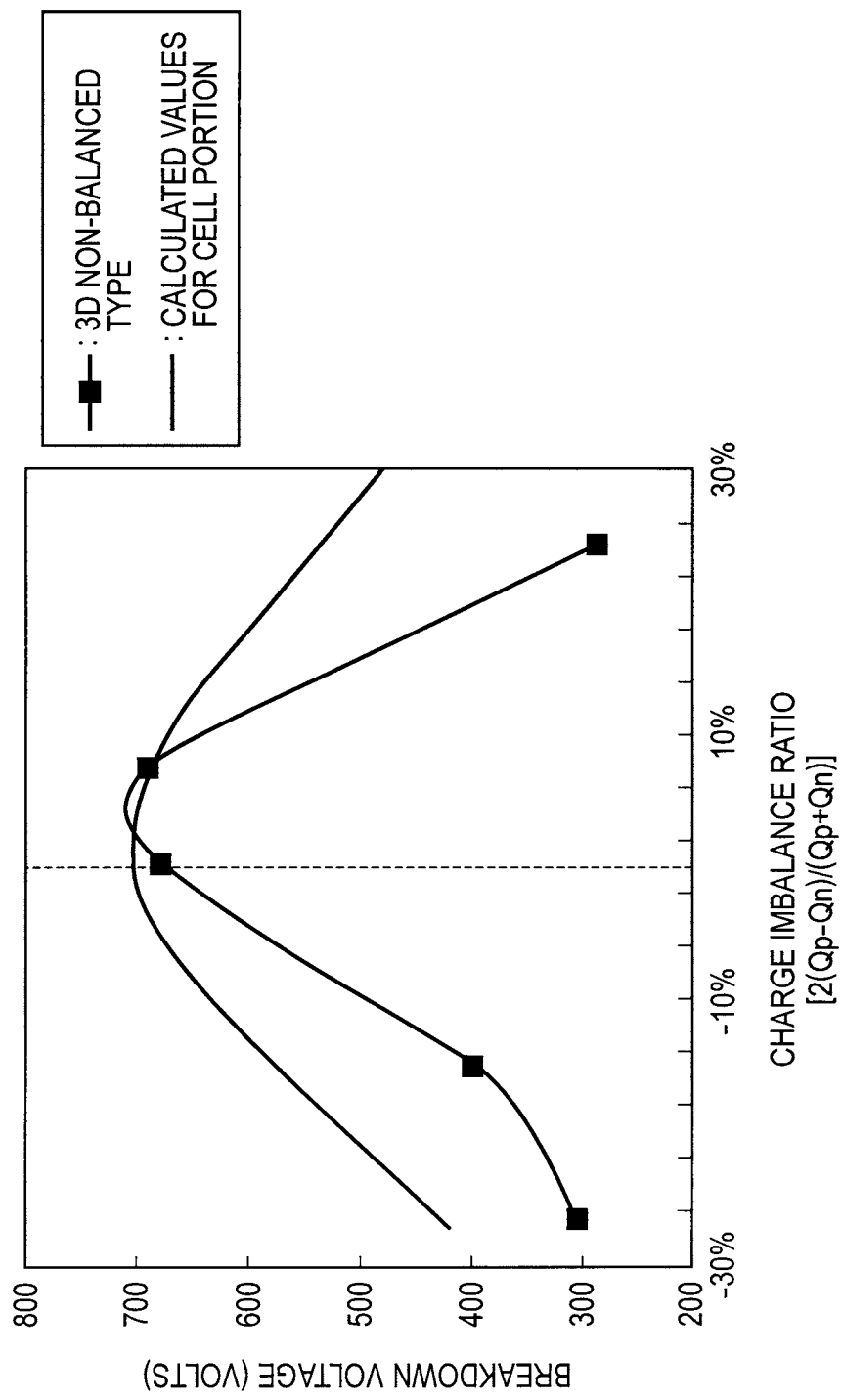
FIG. 108 is a data plot diagram (including the result of simulation in a cell portion) showing a relationship between charge balance and breakdown voltage in a non-charge-balanced-type 3D peripheral resurf structure.
Figure 109:
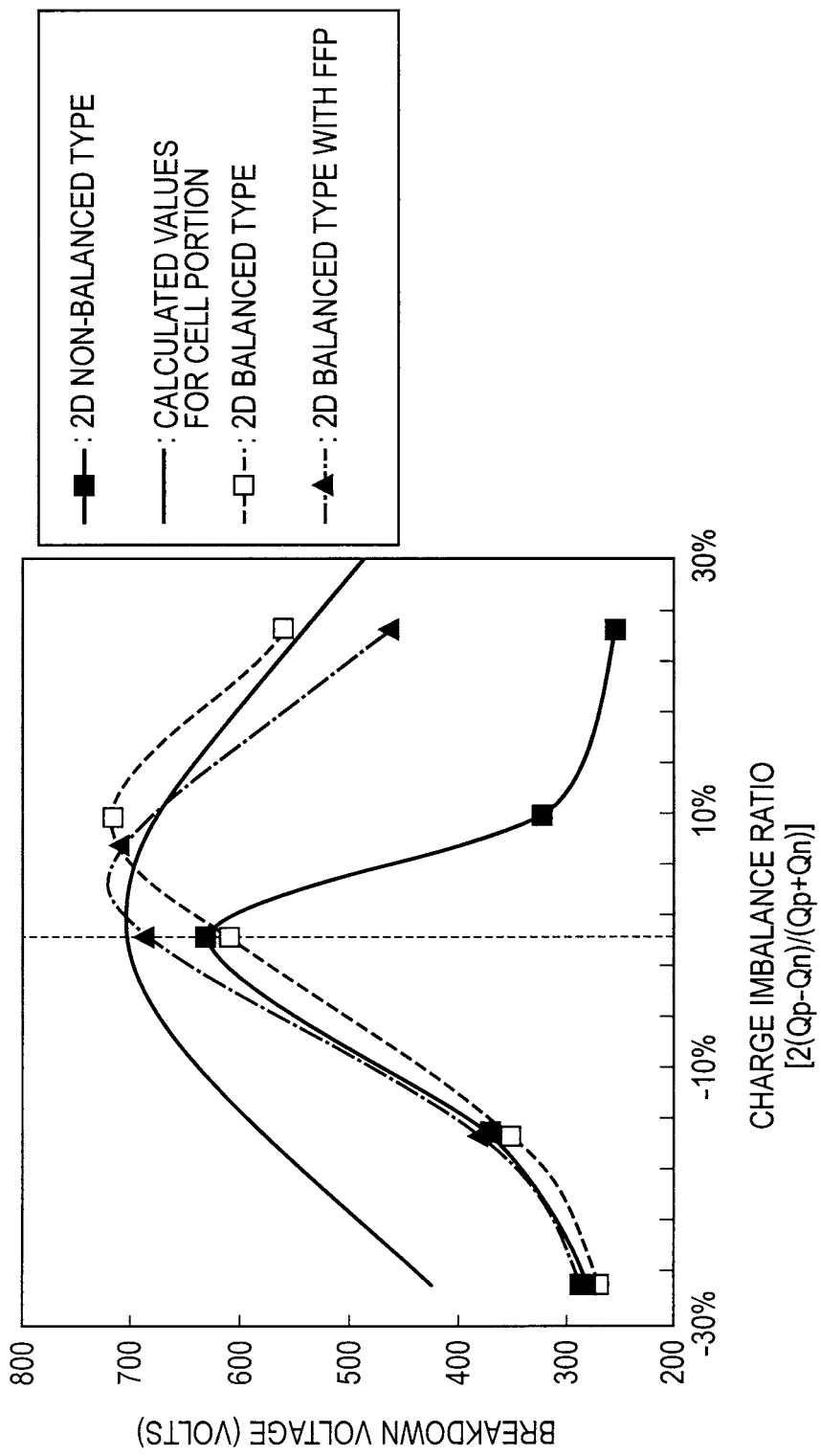
FIG. 109 is a data plot diagram (including the result of simulation in a cell portion) showing a relationship between charge balance and breakdown voltage in each of various 2D peripheral resurf structures.

FIG. 107 is a data plot diagram (including the result of simulation in a cell portion) showing a relationship between charge balance and breakdown voltage in a non-charge-balanced-type 2D peripheral resurf structure. FIG. 108 is a data plot diagram (including the result of simulation in a cell portion) showing a relationship between charge balance and breakdown voltage in a non-charge-balanced-type 3D peripheral resurf structure. FIG. 109 is a data plot diagram (including the result of simulation in a cell portion) showing a relationship between charge balance and breakdown voltage in each of various 2D peripheral resurf structures. Based on these drawings, a consideration and a supplemental description will be given to each of the embodiments thereof.

In FIG. 107, the solid line with no dot represents the result of simulation in an active cell portion (i.e., calculated values for the cell portion) as reference data, and data shown by the black squares represents the charge imbalance ratio dependence of the breakdown voltage of the portion in question in a typical 2D peripheral resurf structure (i.e., a 2D non-balanced type) as shown in, e.g., FIG. 50. From the drawing, it will be understood that, in the typical 2D peripheral resurf structure, there is a significant drop in breakdown voltage particularly in the corner portion when the charge amount Qp in the P column is excessive.

In FIG. 108, the solid line with no dot represents the result of simulation in an active cell portion (i.e., calculated values for the cell portion) as reference data, and data shown by the black squares represents the charge imbalance ratio dependence of the breakdown voltage of the portion in question in a typical 3D peripheral resurf structure (i.e., a 3D non-balanced type) as shown in, e.g., FIG. 2. From the drawing, it will be understood that, in the typical 3D peripheral resurf structure, there is a significant drop in breakdown voltage particularly in the corner portion when the charge amount Qn in the N column is excessive, though it is not so significant as in the 2D peripheral resurf structure.

In FIG. 109, the solid line with no dot represents the result of simulation in an active cell portion (i.e., calculated values for the cell portion) as reference data, and data shown by the black squares represents the charge imbalance ratio dependence of the breakdown voltage of the portion in question in a typical 2D peripheral resurf structure (i.e., a 2D non-balanced type) as shown in, e.g., FIG. 50. On the other hand, data shown by the white squares represents the charge imbalance ratio dependence of the breakdown voltage of the portion in question in a charge-balanced-type 2D peripheral resurf structure (i.e., a 2D balanced type) as shown in, e.g., FIG. 96, while data shown by the black triangles represents the charge imbalance ratio dependence of the breakdown voltage of the portion in question in a charge-balanced-type 2D peripheral resurf structure having floating field plates (FFPs) (i.e., a 2D balanced type with FFPs) as shown in, e.g., FIG. 104. From the drawings, it will be understood that, in each of the 2D peripheral resurf structures of the 2D balanced type and the 2D balance typed with FFPs, the deterioration of the breakdown voltage when the charge amount Qp in the P column is excessive has been considerably improved.

8. Summary

While the invention achieved by the present inventors has been specifically described heretofore based on the embodiments thereof, the present invention is not limited thereto. It will be appreciated that various changes and modifications can be made in the invention within the scope not departing from the gist thereof.

For example, each of the foregoing embodiments has been described specifically by using the MOS structure having the planar gate structure as an example, but the present invention is not limited thereto. It will be appreciated that the present invention is exactly similarly applicable to a trench gate structure of a U-MOSFET or the like. Also, as the layout of the gate electrodes of the MOSFET, the example in which the gate electrodes are arranged in stripes parallel with the pn columns has been shown, but the present invention is applicable to various layouts in which the gate electrodes are arranged in directions orthogonal to the pn columns or arranged in a grid-like configuration.

Note that, in each of the foregoing embodiments, the example has been specifically described in which the N-channel device is formed mainly in the upper surface of the N epitaxial layer over the N+ single-crystal silicon substrate. However, the present invention is not limited thereto, and a P channel device may also be formed in the upper surface of the N epitaxial layer over the P+ single-crystal silicon substrate.

Each of the foregoing embodiments has been described specifically using the power MOSFET as an example, but the present invention is not limited thereto. It will be appreciated that the present invention is also applicable to power devices each having a super-junction structure, i.e., diodes, bipolar transistors (including an IGBT), and the like. It will also be appreciated that the present invention is also applicable to semiconductor integrated circuit devices having such power MOSFETs, diodes, bipolar transistors, and the like embedded therein, and so forth.

Also, in each of the foregoing embodiments, the trench fill method has been mainly described specifically as a forming method of the super-junction structure, but the present invention is not limited thereto. It will be appreciated that, e.g., a multi-epitaxial method or the like can also be used.

In each of the foregoing embodiments, the device formed in the semiconductor substrate has been mainly described specifically, but the present invention is not limited thereto. It will be appreciated that the present invention is also applicable substantially without any modification to devices formed in a GaAs-based semiconductor substrate, a silicon-carbide-based semiconductor substrate, and a silicon-nitride-based semiconductor device.

What is claimed is:

1. A semiconductor device, comprising:
(a) a semiconductor chip having a first main surface provided with a source electrode of a power MOSFET and a second main surface provided with a drain electrode of the power MOSFET;
(b) a drift region of a first conductivity type provided in substantially the entire first main surface of the semiconductor chip;
(c) a substantially rectangular active cell region provided substantially at a middle portion of the first main surface, peripheral side regions provided outside the active cell region along individual sides of the active cell region, and peripheral corner regions provided between adjacent peripheral side regions;
(d) a first super-junction structure having a first orientation and provided in substantially the entire surface of the cell region and in the drift region;
(e) second and third super-junction structures each having substantially the same width and orientation as those of the first super-junction structure and provided in the drift region of each of the peripheral side regions on opposite sides of the active cell region in a direction of the first orientation of the first super-junction structure so as to be coupled to the first super-junction structure;
(f) fourth and fifth super-junction structures each having an orientation substantially orthogonal to that of the first super-junction structure and provided in the drift region of each of the peripheral side regions on opposite sides of the active cell region in a direction orthogonal to the first orientation of the first super-junction structure;
(g) a main junction region of a second conductivity type which is at an outer end portion of the active cell region and provided in a surface of the drift region so as to surround the active cell region; and
(h) a surface resurf region of the second conductivity type provided in the surface of the drift region so as to be coupled to an outer end of the main junction region and surround the main junction region,
wherein, for each of the peripheral side regions, in plan view, an outer end of the surface resurf region is located at or near a middle between the outer end of the main junction region and an outer end of a peripheral super-junction region formed of the second to fifth super-junction structures.

2. A semiconductor device according to claim 1,
wherein, for each of the peripheral side regions, in the plan view, the outer end of the surface resurf region is located substantially at the middle between the outer end of the main junction region and the outer end of the peripheral super-junction region formed of the second to fifth super-junction structures.

3. A semiconductor device according to claim 2,
wherein the first to fifth super-junction structures are formed by a trench epitaxial filling method.

4. A semiconductor device according to claim 3,
wherein a plurality of floating field plates are provided over the peripheral super-junction region formed of the second to fifth super-junction structures so as to encircle the active region.

5. A semiconductor device according to claim 4,
wherein each of the floating field plates has a rectangular frame shape in the plan view, each field plate having corner portions that are each bent at a right angle.

6. A semiconductor device according to claim 5,
wherein each of the peripheral corner regions is provided with a corner-portion super-junction structure which is substantially line-symmetrical with respect to a diagonal line of the semiconductor chip extending through the corner-portion super-junction structure so as to divide the peripheral corner region into two subregions, one of the subregions is adjacent to one of the fourth and fifth super-junction structures and has substantially the same width and orientation as those of the fourth super-junction structure, and the other of the subregions is adjacent to one of the second and third super-junction structures and has substantially the same width and orientation as those of the second super-junction structure.

7. A semiconductor device according to claim 5, wherein each of the peripheral corner regions is provided with a corner-portion super-junction structure having substantially the same width and orientation as those of the fourth super-junction structure.

8. A semiconductor device according to claim 7, wherein, for each of the peripheral corner regions, the corner-portion super-junction structure is trimmed at an outer portion thereof such that a length of columns of the corner-portion super-junction varies in the direction orthogonal to the first orientation so as to leave an outer portion of the peripheral corner region without a super-junction structure.

9. A semiconductor device according to claim 4, wherein each of the floating field plates shows a rectangular frame shape in the plan view, each field plate having corner portions that are each roundly curved.

10. A semiconductor device, comprising:

(a) a semiconductor chip having a first main surface provided with a source electrode of a power MOSFET and a second main surface provided with a drain electrode of the power MOSFET;

(b) a drift region of a first conductivity type provided in substantially the entire first main surface of the semiconductor chip;

(c) a substantially rectangular active cell region provided substantially at a middle portion of the first main surface, peripheral side regions provided outside the active cell region along individual sides of the active cell region, and peripheral corner regions between adjacent peripheral side regions;

(d) a first super-junction structure having a first orientation and provided in substantially the entire surface of the cell region and in the drift region;

(e) second and third super-junction structures each having substantially the same width and orientation as those of the first super-junction structure and provided in the drift region of each of the peripheral side regions on opposite sides of the active cell region in a direction of the first orientation of the first super-junction structure so as to be coupled to the first super-junction structure;

(f) fourth and fifth super-junction structures each having an orientation substantially orthogonal to that of the first super-junction structure and provided in the drift region of each of the peripheral side regions on opposite sides of the active cell region in a direction orthogonal to the first orientation of the first super-junction structure;

(g) a main junction region of a second conductivity type which is at an outer end portion of the active cell region and provided in a surface of the drift region so as to surround the active cell region;

(h) a surface resurf region of the second conductivity type provided in the surface of the drift region so as to be coupled to an outer end of the main junction region and surround the main junction region; and (i) a plurality of corner-portion super-junction structures, each corner-portion super-junction structure being provided in a respective one of the peripheral corner regions such that said corner-portion super-junction structure is substantially line-symmetrical with respect to a diagonal line of the semiconductor chip extending through the corner-portion super-junction structure so as to divide the peripheral corner region into two subregions, wherein the subregions adjacent to one of the fourth and fifth super-junction structures have substantially the same width and orientation as those of the fourth super-junction structure, and the subregions adjacent to one of the second and third super-junction structures have substantially the same width and orientation as those of the second super-junction structure.

11. A semiconductor device according to claim 10, wherein, for each of the peripheral side regions, in plan view, an outer end of the surface resurf region is located at or near a middle between the outer end of the main junction region and an outer end of a peripheral super-junction region formed of the second to fifth super-junction structures.

12. A semiconductor device according to claim 10, wherein, for each of the peripheral side regions, in plan view, an outer end of the surface resurf region is located substantially at a middle between the outer end of the main junction region and an outer end of a peripheral super-junction region formed of the second to fifth super-junction structures.

13. A semiconductor device according to claim 12, wherein the first to fifth super-junction structures are formed by a trench epitaxial filling method.

14. A semiconductor device according to claim 13, wherein a plurality of floating field plates are provided over the peripheral super-junction region formed of the second to fifth super-junction structures so as to encircle the active region.

15. A semiconductor device, comprising:

(a) a semiconductor chip having a first main surface provided with a source electrode of a power MOSFET and a second main surface provided with a drain electrode of the power MOSFET;

(b) a drift region of a first conductivity type provided in substantially the entire first main surface of the semiconductor chip;

(c) a substantially rectangular active cell region provided substantially at a middle portion of the first main surface, peripheral side regions provided outside the active cell region along individual sides of the active cell region, and peripheral corner regions provided between adjacent peripheral side regions;

(d) a first super-junction structure having a first orientation and provided in substantially the entire surface of the cell region and in the drift region;

(e) second and third super-junction structures each having substantially the same width and orientation as those of the first super-junction structure and provided in the drift region of each of the peripheral side regions on opposite sides of the active cell region in a direction of the first orientation of the first super-junction structure so as to be coupled to the first super-junction structure;

(f) fourth and fifth super-junction structures each having an orientation substantially orthogonal to that of the first super-junction structure and provided in the drift region of each of the peripheral side regions on opposite sides of the active cell region in a direction orthogonal to the first orientation of the first super-junction structure;

(g) a main junction region of a second conductivity type which is at an outer end portion of the active cell region and provided in a surface of the drift region so as to surround the active cell region;

(h) a surface resurf region of the second conductivity type provided in the surface of the drift region so as to be coupled to an outer end of the main junction region and surround the main junction region; and (i) a corner-portion super-junction structure provided in each of the peripheral corner regions, having substantially the same width and orientation as those of the fourth super-junction structure, wherein each corner-portion super-junction structure is trimmed at an outer portion thereof such that a length of columns of the corner-portion super-junction varies in the direction orthogonal to the first orientation so as to leave an outer portion of each peripheral corner region without a super-junction structure.

16. A semiconductor device according to claim 15,
wherein, for each of the peripheral side regions, in plan view, an outer end of the surface resurf region is located at or near a middle between the outer end of the main junction region and an outer end of a peripheral super-junction region formed of the second to fifth super-junction structures.

17. A semiconductor device according to claim 15,
wherein, for each of the peripheral side regions, in plan view, an outer end of the surface resurf region is located substantially at a middle between the outer end of the main junction region and an outer end of a peripheral super-junction region formed of the second to fifth super-junction structures.

18. A semiconductor device according to claim 17,
wherein the first to fifth super-junction structures are formed by a trench epitaxial filling method.

19. A semiconductor device according to claim 18,
wherein a plurality of floating field plates are provided over the peripheral super-junction region formed of the second to fifth super-junction structures so as to encircle the active region.

* * * * *